(12) United States Patent
Motozuka et al.

(10) Patent No.: US 11,283,498 B2
(45) Date of Patent: *Mar. 22, 2022

(54) COMMUNICATION APPARATUS AND COMMUNICATION METHOD

(71) Applicant: Panasonic Intellectual Property Corporation of America, Torrance, CA (US)

(72) Inventors: Hiroyuki Motozuka, Kanagawa (JP); Masataka Irie, Kanagawa (JP); Takenori Sakamoto, Kanagawa (JP); Naganori Shirakata, Kanagawa (JP); Yao Huang Gaius Wee, Singapore (SG); Michael Hong Cheng Sim, Singapore (SG); Lei Huang, Singapore (SG)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/217,765

(22) Filed: Mar. 30, 2021

(65) Prior Publication Data

US 2021/0218446 A1 Jul. 15, 2021

Related U.S. Application Data

(63) Continuation of application No. 16/847,221, filed on Apr. 13, 2020, now Pat. No. 10,998,951, which is a (Continued)

(30) Foreign Application Priority Data

Apr. 15, 2016 (JP) .............................. JP2016-082154
Jun. 6, 2016 (JP) .............................. JP2016-112661

(Continued)

(51) Int. Cl.
*H04B 7/06* (2006.01)
*H04B 7/0491* (2017.01)
(Continued)

(52) U.S. Cl.
CPC .......... *H04B 7/0491* (2013.01); *H03M 13/09* (2013.01); *H04B 7/0617* (2013.01);
(Continued)

(58) Field of Classification Search
CPC .. H04B 7/0491; H04B 7/0617; H04B 7/0682; H04B 7/088; H04B 7/0695;
(Continued)

(56) References Cited

U.S. PATENT DOCUMENTS 10,659,120 B2 * 5/2020 Motozuka ............ H04B 7/0695
2004/0246922 A1 12/2004 Ruan et al.
(Continued)

FOREIGN PATENT DOCUMENTS

EP 2894927 A1 7/2015
WO 2014/183081 A2 11/2014

OTHER PUBLICATIONS

Eitan et al IEEE 802.11-16/0416r01, "Short SSW Format for 11ay". Mar. 14, 2016. (Year: 2016).*
(Continued)

*Primary Examiner* — Kevin M Burd
(74) *Attorney, Agent, or Firm* — Seed IP Law Group LLP

(57) ABSTRACT

A communication apparatus includes a PHY frame generating circuit that generates a PHY frame including either of a short Sector Sweep frame and a Sector Sweep frame; and an array antenna that selects, based on the PHY frame, any sector from among a plurality of sectors and transmits the PHY frame. In a case where, in the PHY frame including the short Sector Sweep frame, a Direction field of the short Sector Sweep frame indicates Initiator Sector Sweep, the
(Continued)

PHY frame generating circuit replaces a Short Sector Sweep Feedback field indicating a number of a selected best short Sector Sweep with a Short Scrambled Basic Service Set ID field indicating an abbreviated address generated from an address of a destination communication apparatus.

14 Claims, 104 Drawing Sheets

Related U.S. Application Data continuation of application No. 16/156,485, filed on Oct. 10, 2018, now Pat. No. 10,659,120, which is a continuation of application No. PCT/JP2017/013900, filed on Apr. 3, 2017.

(30) Foreign Application Priority Data

| Jul. 13, 2016 | (JP) | JP2016-138493 |
| Jul. 21, 2016 | (JP) | JP2016-143578 |
| Aug. 12, 2016 | (JP) | JP2016-158834 |
| Sep. 1, 2016 | (JP) | JP2016-171220 |

(51) Int. Cl.
| *H03M 13/09* | (2006.01) |
| *H04W 84/12* | (2009.01) |
| *H04W 88/02* | (2009.01) |
| *H04L 1/00* | (2006.01) |
| *H04B 7/08* | (2006.01) |
| *H04W 48/16* | (2009.01) |
| *H04L 1/08* | (2006.01) |

(52) U.S. Cl.
CPC ......... *H04B 7/0682* (2013.01); *H04B 7/0695* (2013.01); *H04B 7/088* (2013.01); *H04L 1/0041* (2013.01); *H04L 1/0061* (2013.01); *H04W 48/16* (2013.01); *H04W 84/12* (2013.01); *H04W 88/02* (2013.01); *H04L 1/08* (2013.01)

(58) Field of Classification Search
CPC ....... H04L 1/0041; H04L 1/0061; H04L 1/08; H03M 13/09; H04W 48/16; H04W 84/12; H04W 88/02
USPC ......................................................... 375/262
See application file for complete search history.

(56) References Cited

U.S. PATENT DOCUMENTS

| 2016/0105229 A1 | 4/2016 | Trainin et al. |
| 2017/0302349 A1 | 10/2017 | Sun et al. |
| 2019/0068271 A1 | 2/2019 | Lou et al. |

OTHER PUBLICATIONS

IEEE 802.11ad(TM)—2012 IEEE Standard for Information Technology—Telecommunications and information exchange between systems Local and metropolitan area networks—Specific requirements Part 11: Wireless LAN Medium Access Control (MAC) and Physical Layer (PHY) Specifications Amendment 3: Enhancements for Very High Throughput in the 60 GHz Band, Dec. 28, 2012.
IEEE 802.11-16/0416r01, "Short SSW Format for 11ay", Mar. 14, 2016.
International Search Report of PCT application No. PCT/JP2017/013900 dated Jun. 20, 2017.
Motozuka et al., "IEEE P802.11 Wireless LANs, 6.9.1 Short SSW packet related text for D0.1," Jan. 11, 2017, 5 pages.
Indian Examination Report dated Oct. 22, 2021 for related Indian Patent Application No. 201847038481, 6 pages.

\* cited by examiner

FIG. 9

Address table for AP1 (For transmission)

| ID (Not transmitted) | RA | TA | Addressing (Hash value) |
|---|---|---|---|
| AP1-STA1 | MAC address of STA1 | MAC address of AP1 | h1 |
| AP1-STA2 | MAC address of STA2 | MAC address of AP1 | h2 |
| AP1-STA3 | MAC address of STA3 | MAC address of AP1 | h3 |
| AP1-STA4 | MAC address of STA4 | MAC address of AP1 | h4 |
| AP1-STA5 | MAC address of STA5 | MAC address of AP1 | h5 |
| AP1-STA6 | MAC address of STA6 | MAC address of AP1 | h6 |
| AP1-STA7 | MAC address of STA7 | MAC address of AP1 | h1 |

FIG. 10

Address table for AP1 (For reception)

| ID (Not transmitted) | RA | TA | Addressing (Hash value) |
|---|---|---|---|
| STA1-AP1 | MAC address of AP1 | MAC address of STA1 | h11 |
| STA2-AP1 | MAC address of AP1 | MAC address of STA2 | h12 |
| STA3-AP1 | MAC address of AP1 | MAC address of STA3 | h4 |
| STA4-AP1 | MAC address of AP1 | MAC address of STA4 | h14 |
| STA5-AP1 | MAC address of AP1 | MAC address of STA5 | h15 |
| STA6-AP1 | MAC address of AP1 | MAC address of STA6 | h16 |
| STA7-AP1 | MAC address of AP1 | MAC address of STA7 | h17 |

FIG. 11

Address table for STA1 (For transmission)

| ID (Not transmitted) | RA | TA | Addressing (Hash value) |
|---|---|---|---|
| STA1-AP1 | MAC address of STA1 | MAC address of AP1 | h1 |

FIG. 12

| Address table for STA1 (For reception) | | | |
|---|---|---|---|
| ID (Not transmitted) | RA | TA | Addressing (Hash value) |
| AP1-STA1 | MAC address of AP1 | MAC address of STA1 | h11 |

FIG. 13

Address table for AP1 (For transmission)

| ID (Not transmitted) | RA | TA | Hashed addressing (for SI=1 to 15) | | | | | | | | | | | | | | | |
|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 |
| AP1-STA1 | MAC address of STA1 | MAC address of AP1 | h111 | h121 | h131 | h141 | h151 | h161 | h171 | h181 | h191 | h201 | h211 | h221 | h231 | h241 | h251 |
| AP1-STA2 | MAC address of STA2 | MAC address of AP1 | h112 | h122 | h195 | h142 | h152 | h162 | h172 | h182 | h192 | h202 | h212 | h222 | h232 | h242 | h252 |
| AP1-STA3 | MAC address of STA3 | MAC address of AP1 | h113 | h123 | h133 | h143 | h153 | h163 | h173 | h183 | h193 | h203 | h213 | h223 | h233 | h243 | h253 |
| AP1-STA4 | MAC address of STA4 | MAC address of AP1 | h114 | h124 | h134 | h144 | h154 | h164 | h174 | h184 | h194 | h204 | h214 | h224 | h234 | h244 | h254 |
| AP1-STA5 | MAC address of STA5 | MAC address of AP1 | h115 | h125 | h135 | h145 | h155 | h165 | h175 | h185 | h195 | h205 | h215 | h225 | h235 | h245 | h255 |
| AP1-STA6 | MAC address of STA6 | MAC address of AP1 | h116 | h126 | h136 | h146 | h156 | h166 | h176 | h186 | h196 | h206 | h216 | h226 | h236 | h246 | h256 |
| AP1-STA7 | MAC address of STA7 | MAC address of AP1 | h117 | h127 | h137 | h147 | h157 | h167 | h177 | h187 | h197 | h207 | h217 | h227 | h237 | h247 | h257 |

FIG. 14

| Address table for AP1 (For reception) | | | Hashed addressing (for SF=1 to 16) | | | | | | | | | | | | | | | |
|---|---|---|---|---|---|---|---|---|---|---|---|---|---|---|---|---|---|---|
| ID (Not transmitted) | RA | TA | 1 | 2 | 3 | 4 | 5 | 6 | 7 | 8 | 9 | 10 | 11 | 12 | 13 | 14 | 15 |
| STA1-AP1 | MAC address of AP1 | MAC address of STA1 | h311 | h321 | h331 | h341 | h351 | h361 | h371 | h381 | h391 | h401 | h411 | h421 | h431 | h441 | h451 |
| STA2-AP1 | MAC address of AP1 | MAC address of STA2 | h312 | h322 | h332 | h342 | h352 | h362 | h372 | h382 | h392 | h402 | h412 | h422 | h432 | h442 | h452 |
| STA3-AP1 | MAC address of AP1 | MAC address of STA3 | h313 | h323 | h333 | h343 | h353 | h363 | h373 | h383 | h393 | h403 | h413 | h423 | h433 | h443 | h453 |
| STA4-AP1 | MAC address of AP1 | MAC address of STA4 | h314 | h324 | h334 | h344 | h354 | h364 | h374 | h384 | h394 | h404 | h414 | h424 | h434 | h444 | h454 |
| STA5-AP1 | MAC address of AP1 | MAC address of STA5 | h315 | h325 | h335 | h345 | h355 | h365 | h375 | h385 | h395 | h405 | h415 | h425 | h435 | h445 | h455 |
| STA6-AP1 | MAC address of AP1 | MAC address of STA6 | h316 | h326 | h336 | h346 | h356 | h366 | h376 | h386 | h396 | h406 | h416 | h426 | h436 | h446 | h456 |
| STA7-AP1 | MAC address of AP1 | MAC address of STA7 | h317 | h327 | h337 | h347 | h357 | h367 | h377 | h387 | h397 | h407 | h417 | h427 | h437 | h447 | h457 |

FIG. 15

Address table for STA1 (For transmission)

| ID (Not transmitted) | PA | TA | Hashed addressing (for SI=1 to 15) | | | | | | | | | | | | | | |
|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 |
| STA1-AP1 | MAC address of AP1 | MAC address of STA1 | h311 | h321 | h331 | h341 | h351 | h361 | h371 | h381 | h391 | h401 | h411 | h421 | h431 | h441 | h451 |

FIG. 16

Address table for STA1 (For reception)

| ID (Not transmitted) | RA | TA | Hashed addressing (for SI=1 to 15) | | | | | | | | | | | | | | | |
|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 |
| AP1-STA1 | MAC address of STA1 | MAC address of AP1 | h111 | h121 | h131 | h141 | h151 | h161 | h171 | h181 | h191 | h201 | h211 | h221 | h231 | h241 | h251 |

FIG. 30

| Short SSW frame | Packet Type | Addressing | CDOWN | RF Chain ID | Short SSW Feedback | Direction | Initial BF | FCS |
|---|---|---|---|---|---|---|---|---|
| Bits: | 2 | 16 | 11 | 2 | 11 | 1 | 1 | 4 |

FIG. 34

| Address table for STA1 (For reception) | | | Hashed addressing (for SI=1 to 15) | | | | | | | | | | | | | | | |
|---|---|---|---|---|---|---|---|---|---|---|---|---|---|---|---|---|---|---|
| ID (Not transmitted) | RA | TA | 1 | 2 | 3 | 4 | 5 | 6 | 7 | 8 | 9 | 10 | 11 | 12 | 13 | 14 | 15 |
| AP1-STA1 | MAC address of STA1 | MAC address of AP1 | h111 | h121 | h131 | h141 | h151 | h161 | h171 | h181 | h191 | h201 | h211 | h221 | h231 | h241 | h251 |
| AP1-unknown | unknown | MAC address of AP1 | h511 | h521 | h531 | h541 | h551 | h561 | h571 | h581 | h591 | h601 | h611 | h621 | h631 | h641 | h651 |

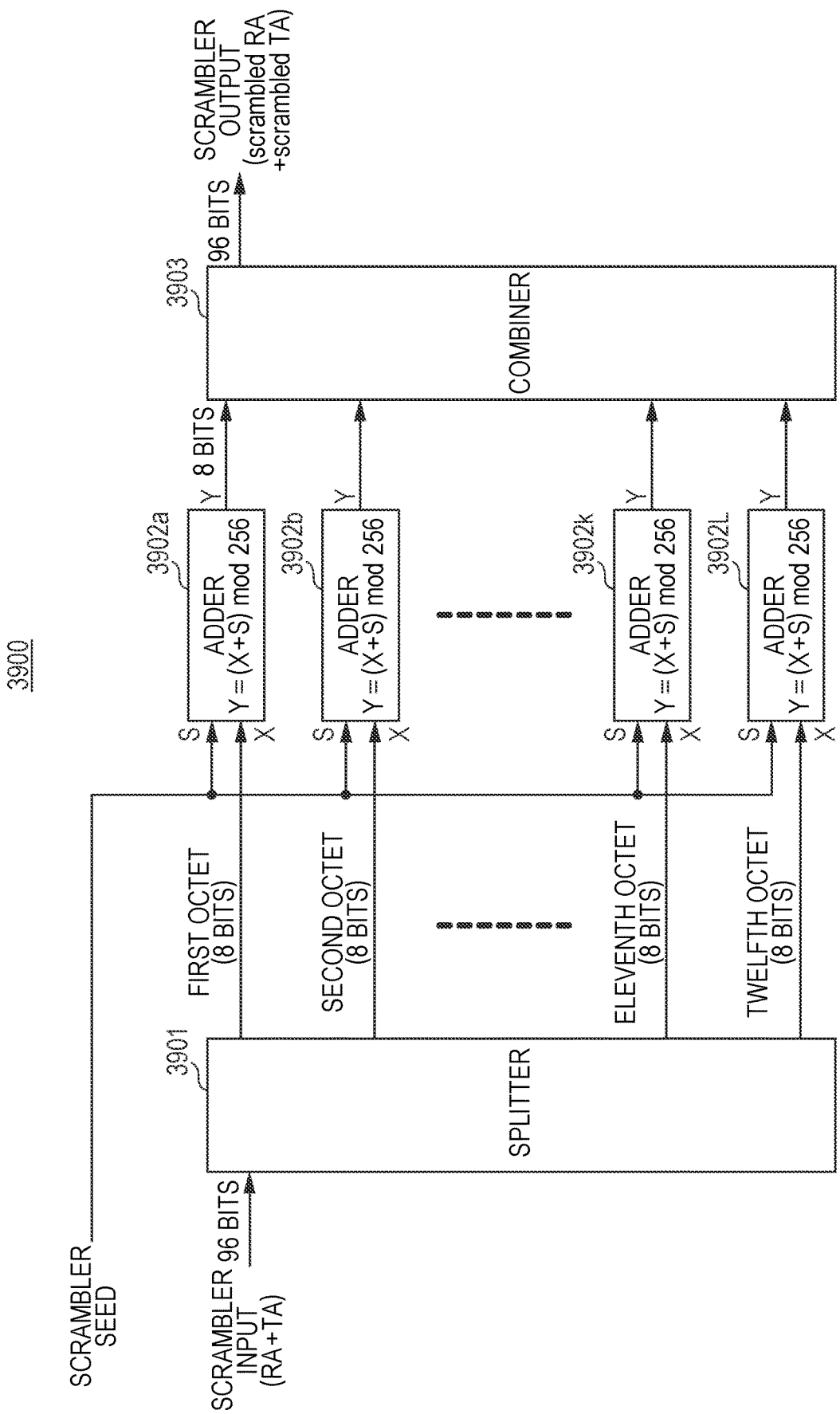

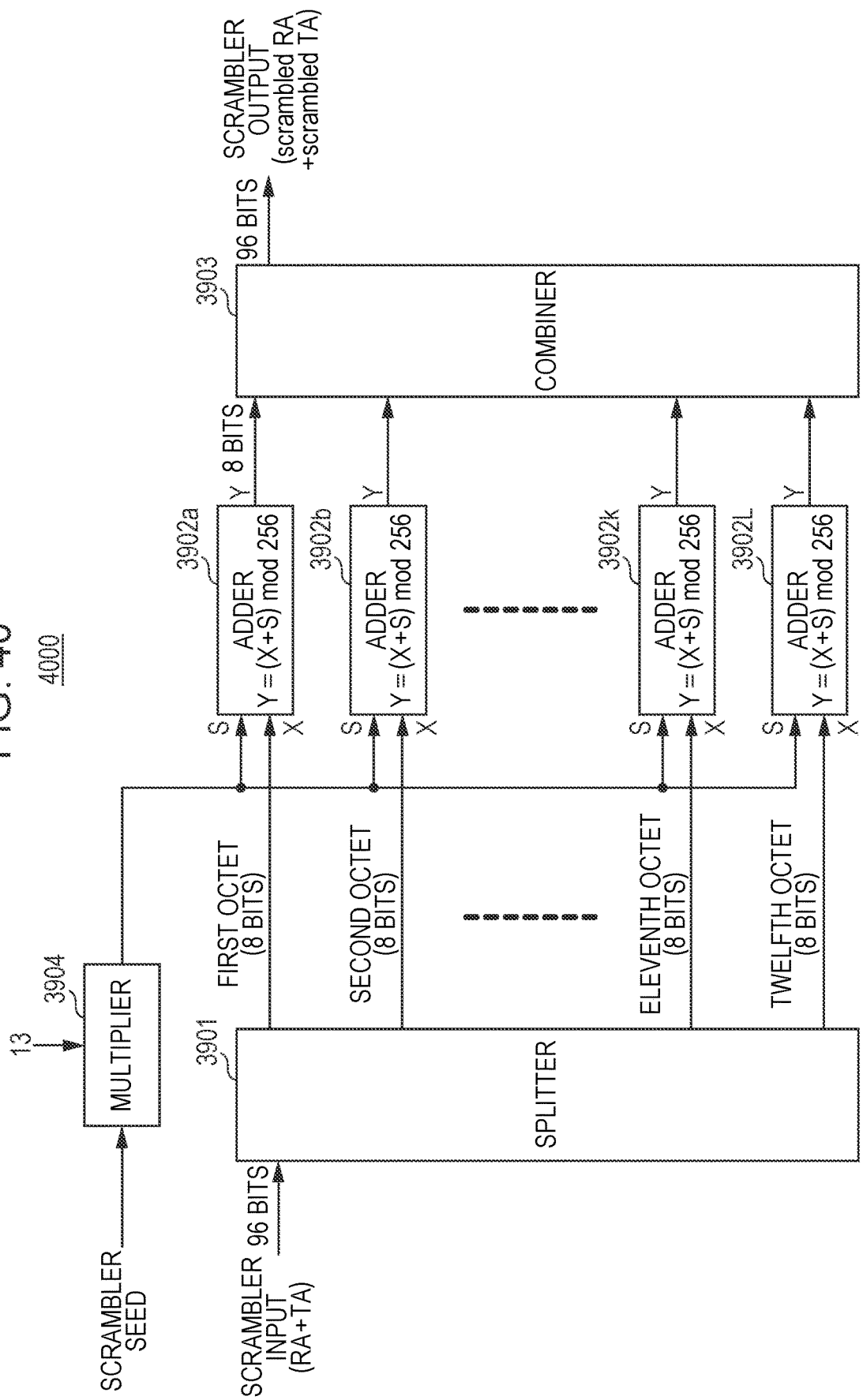

FIG. 41

| Seed | FIRST ADDRESS (RA1, TA1) | FIRST CRC | SECOND ADDRESS (RA2, TA2) | SECOND CRC |
|---|---|---|---|---|
| 0 | 2B-A7-D2-7E-4D-08-4B-B7-23-B2-AA-02 | 8465 | 72-76-B7-68-E0-A7-94-DC-36-CA-7F-D9 | 8465 |
| 1 | 2C-A8-D3-7F-4E-09-4C-B8-24-B3-AB-03 | 4F39 | 73-77-B8-69-E1-A8-95-DD-37-CB-80-DA | C446 |
| 2 | 2D-A9-D4-80-4F-0A-4D-B9-25-B4-AC-04 | BC9A | 74-78-B9-6A-E2-A9-96-DE-38-CC-81-DB | F560 |
| 3 | 2E-AA-D5-81-50-0B-4E-BA-26-B5-AD-05 | 30C3 | 75-79-BA-6B-E3-AA-97-DF-39-CD-82-DC | 0A4C |
| 4 | 2F-AB-D6-82-51-0C-4F-BB-27-B6-AE-06 | BB0D | 76-7A-BB-6C-E4-AB-98-B0-3A-CE-83-DD | 1CD1 |
| 5 | 30-AC-D7-83-52-0D-50-BC-28-B7-AF-07 | 1B0B | 77-7B-BC-6D-E5-AC-99-E1-3B-CF-84-DE | CB13 |
| 6 | 31-AD-D8-84-53-0E-51-BD-29-B8-B0-08 | 12B3 | 78-7C-BD-6E-E6-AD-9A-E2-3C-D0-85-DF | 7C0C |
| 7 | 32-AE-D9-85-54-0F-52-BE-2A-B9-B1-09 | 708A | 79-7D-BE-6F-E7-AE-9B-E3-3D-D1-86-E0 | B7A4 |
| 8 | 33-AF-DA-86-55-10-53-BF-2B-BA-B2-0A | 98AC | 7A-7E-BF-70-E8-AF-9C-E4-3E-D2-87-E1 | C3B8 |
| 9 | 34-B0-DB-87-56-11-54-C0-2C-BB-B3-0B | 4B18 | 7B-7F-C0-71-E9-B0-9D-E5-3F-D3-88-E2 | 8D22 |
| A | 35-B1-DC-88-57-12-55-C1-2D-BC-B4-0C | CA90 | 7C-80-C1-72-EA-B1-9E-E6-40-D4-89-E3 | 2EC2 |
| B | 36-B2-DD-89-58-13-56-C2-2E-BD-B5-0D | F289 | 7D-81-C2-73-EB-B2-9F-E7-41-D5-8A-E4 | D1EE |
| C | 37-B3-DE-8A-59-14-57-C3-2F-BE-B6-0E | 7947 | 7E-82-C3-74-EC-B3-A0-E8-42-D6-8B-E5 | FCB1 |
| D | 38-B4-DF-8B-5A-15-58-C4-30-BF-B7-0F | 839D | 7F-83-C4-75-ED-B4-A1-E9-43-D7-8C-E6 | 2B73 |
| E | 39-B5-E0-8C-5B-16-59-C5-31-C0-B8-10 | 4F8A | 80-84-C5-76-EE-B5-A2-EA-44-D8-8D-E7 | B9B1 |
| F | 3A-B6-E1-8D-5C-17-5A-C6-32-C1-B9-11 | 25B3 | 81-85-C6-77-EF-B6-A3-EB-45-D9-8E-E8 | 4C71 |

FIG. 49

| Short SSW frame | Packet Type | Addressing | CDOWN | RF Chain ID | Short SSW Feedback | Direction | A-BFT TX | FCS |
|---|---|---|---|---|---|---|---|---|
| Bits: | 2 | 16 | 11 | 2 | 11 | 1 | 1 | 4 |

FIG. 60

| Short SSW frame | Packet Type | FCS of Grant frame | CDOWN | RF Chain ID | Short SSW Feedback | Direction | Announced | FCS |
|---|---|---|---|---|---|---|---|---|
| Bits: | 2 | 16 | 11 | 2 | 11 | 1 | 1 | 4 |

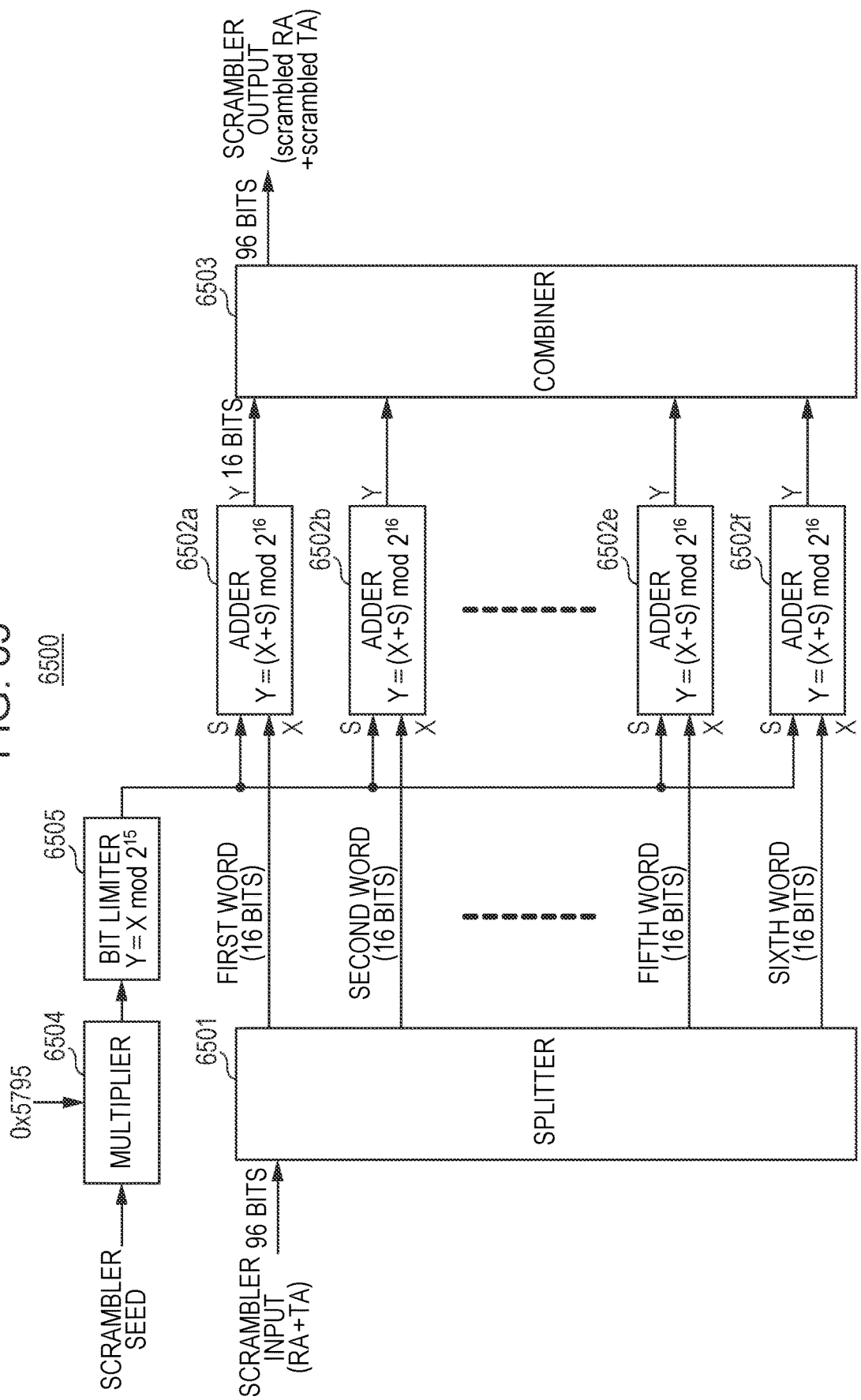

FIG. 66A

| Seed | Scramble Pattern (hex) | Seed | Scramble Pattern (hex) |
|---|---|---|---|
| 0 | 00 | 8 | 18 |
| 1 | 43 | 9 | 5B |
| 2 | 06 | A | 1E |
| 3 | 49 | B | 61 |
| 4 | 0C | C | 24 |
| 5 | 4F | D | 67 |
| 6 | 12 | E | 2A |
| 7 | 55 | F | 6D |

FIG. 66B

| Seed | Scramble Pattern (hex) | Seed | Scramble Pattern (hex) |
|---|---|---|---|
| 0 | 00 | 8 | 2B |
| 1 | 53 | 9 | 4D |
| 2 | 65 | A | 35 |
| 3 | 36 | B | 56 |
| 4 | 69 | C | 63 |
| 5 | 6A | | |
| 6 | 2D | | |
| 7 | 4B | | |

FIG. 67

| Seed | Scramble Pattern (hex) | Seed | Scramble Pattern (hex) |
|---|---|---|---|
| 0 | 0000 | 8 | 3CA8 |
| 1 | 5795 | 9 | 143D |
| 2 | 2F2A | A | 6BD2 |
| 3 | 06BF | B | 4367 |
| 4 | 5E54 | C | 1AFC |
| 5 | 35E9 | D | 7291 |
| 6 | 0D7E | E | 4A26 |
| 7 | 6513 | F | 21BB |

FIG. 83

| CDOWN | Length | TXTIME [ns] |
|---|---|---|
| 0 | 6 | 8,946 |
| 1 | 33 | 18,982 |
| 2 | 70 | 30,473 |
| 3 | 107 | 38,909 |
| 4 | 133 | 48,800 |
| 5 | 175 | 61,018 |
| 6 | 207 | 68,727 |
| 7 | 238 | 79,346 |
| 8 | 280 | 91,564 |
| 9 | 307 | 98,546 |
| 10 | 343 | 109,891 |
| 11 | 381 | 118,473 |
| 12 | 407 | 128,364 |
| 13 | 448 | 140,436 |
| 14 | 481 | 148,291 |
| 15 | 511 | 158,764 |
| 16 | 553 | 170,982 |
| 17 | 581 | 178,109 |
| 18 | 616 | 189,309 |
| 19 | 655 | 198,036 |
| 20 | 681 | 207,927 |
| 21 | 721 | 219,855 |
| 22 | 755 | 227,855 |
| 23 | 784 | 238,182 |
| 24 | 826 | 250,400 |
| 25 | 855 | 257,673 |
| 26 | 889 | 268,727 |
| 27 | 929 | 277,600 |
| 28 | 955 | 287,491 |
| 29 | 994 | 299,273 |
| 30 OR MORE | 1023 | 306,546 |

FIG. 84

NOT USE A-BFT

| Short SSW frame | Packet Type | Addressing | ODOWN | RF Chain ID | Short SSW Feedback | Direction | A-BFT TX =0 | FCS |
|---|---|---|---|---|---|---|---|---|
| Bits: | 2 | 16 | 11 | 2 | 11 | 1 | 1 | 4 |

USE A-BFT

| Short SSW frame | Packet Type | Addressing | SSW Slot ID | FSS Slot ID | Associated | Reserved | RF Chain ID | Sector Select | DMG Antenna Select | Reserved | Direction | A-BFT TX =1 | FCS |
|---|---|---|---|---|---|---|---|---|---|---|---|---|---|
| Bits: | 2 | 16 | 3 | 5 | 1 | 2 | 2 | 6 | 2 | 3 | 1 | 1 | 4 |

FIG. 86

| FSS | aSSDuration [us] | FSS for sSSW |
|---|---|---|
| 1 | 14.9 | 1 |
| 2 | 30.8 | 3 |
| 3 | 46.7 | 4 |
| 4 | 62.6 | 6 |
| 5 | 78.5 | 7 |
| 6 | 94.5 | 9 |
| 7 | 110.4 | 11 |
| 8 | 126.3 | 12 |
| 9 | 142.2 | 14 |
| 10 | 158.1 | 15 |
| 11 | 174.0 | 17 |
| 12 | 189.9 | 19 |
| 13 | 205.8 | 20 |
| 14 | 221.7 | 22 |
| 15 | 237.6 | 23 |
| 16 | 253.5 | 25 |

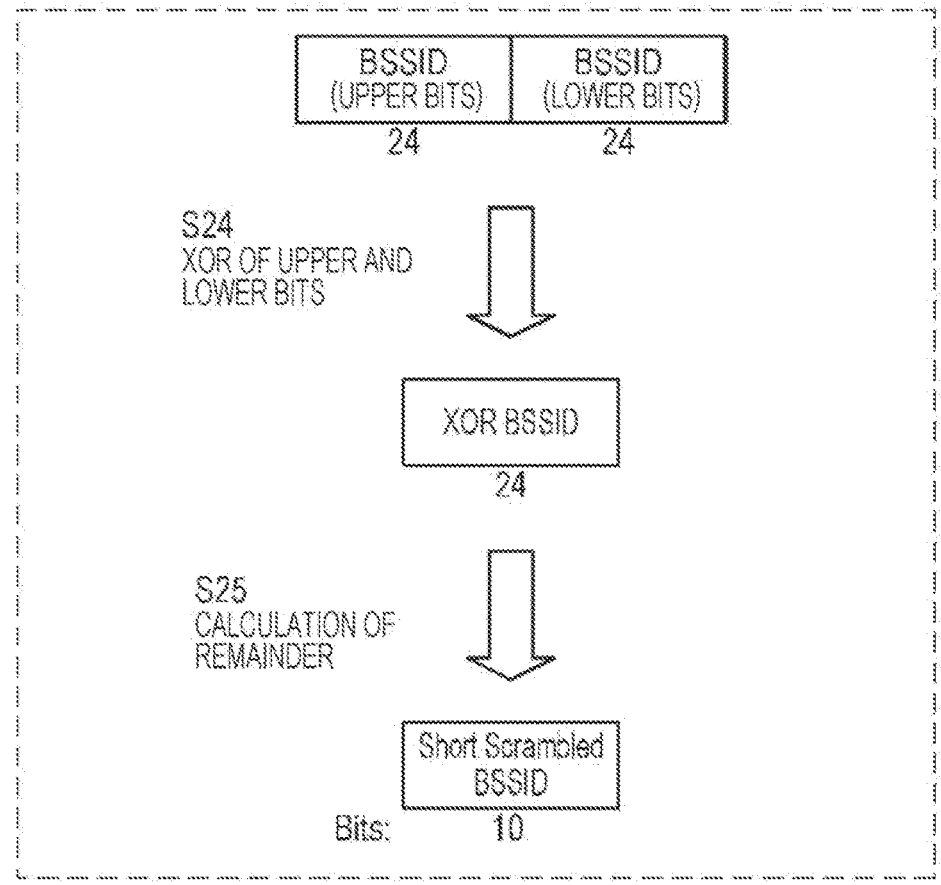

FIG. 90

| Seed | Addressing of AP |
|---:|---:|
| 0 | 239 |
| 1 | 160 |
| 2 | 78 |
| 3 | 60 |
| 4 | 152 |
| 5 | 22 |
| 6 | 232 |
| 7 | 171 |
| 8 | 193 |
| 9 | 44 |
| 10 | 189 |
| 11 | 141 |
| 12 | 153 |
| 13 | 12 |
| 14 | 74 |
| 15 | 58 |

FIG. 102

| Group ID | AID set |
|---|---|
| 0 | RESERVED |
| 1 | 1, 3, 30, 35 |
| 2 | 2, 3, 30 |
| 3 | 10, 11, 12, 13 |
| 4-254 | UNALLOCATED |
| 255 | BROADCAST |

FIG. 104

| Direction | unicast/multicast | sSSW Control | Selected format |
|---|---|---|---|
| 0 (ISS) | 0 (unicast) | – | format 1 |
| 0 (ISS) | 1 (multicast) | – | format 2 |
| 1 (RSS) | – | 0 (DTI) | format 3 |
| 1 (RSS) | – | 1 (A-BFT) | format 4 |

COMMUNICATION APPARATUS AND COMMUNICATION METHOD

BACKGROUND

1. Technical Field

The present disclosure relates to a communication apparatus and a communication method.

2. Description of the Related Art

IEEE 802.11 is one of the standards related to a wireless LAN and includes, for example, the IEEE 802.11ad standard (hereinafter referred to as "11ad standard", see, for example, IEEE 802.11ad™-2012).

In the 11ad standard, a beamforming technique is used. Beamforming is a scheme for changing the directivity of at least one antenna of each of a transmitter and a receiver and setting the directivities of the antennas to optimize communication quality, for example, reception strength, to perform communication.

In the 11ad standard, a procedure called Sector Level Sweep (SLS) is defined to select, from among settings of directivities of a plurality of antennas (hereinafter referred to as "sectors"), an optimum sector. FIG. 1 is a diagram illustrating an overview of the procedure of SLS. SLS is performed between two terminals (hereinafter referred to as "STAs" standing for stations). One of the STAs is called "initiator" and the other is called "responder".

First, the initiator changes sectors and transmits a plurality of Sector Sweep (SSW) frames. This transmission is called "Initiator Sector Sweep (ISS)". In ISS, the responder measures the reception quality of each SSW frame.

Subsequently, the responder changes sectors and transmits a plurality of SSW frames. This transmission is called "Responder Sector Sweep (RSS)". At this time, each SSW frame that is used in RSS is transmitted, with the SSW frame including information for specifying the SSW frame having the highest reception quality in ISS. In RSS, the initiator measures the reception quality of each SSW frame.

Finally, the initiator transmits an SSW Feedback (SSW-FB) frame that includes information for specifying the SSW frame having the highest reception quality in RSS. The responder may transmit SSW Acknowledgement (SSW-ACK) indicating that the responder has received the SSW-FB.

A description has been given above of SLS for performing beamforming training of transmission (Transmitter Sector Sweep, TXSS). Also, SLS may be used to perform beamform training of reception (Receiver Sector Sweep, RXSS). In this case, the STA that transmits SSW frames sequentially transmits the SSW frames in a single sector, whereas the STA that receives the SSW frames receives the SSW frames while switching the sector of a reception antenna for each SSW frame.

FIG. 2 is a diagram illustrating the configuration of an SSW frame. The SSW frame includes seven fields. A Frame Control field includes, for example, information representing the type of frame. A Duration field indicates a time until the current ISS or RSS is completed. RA indicates the MAC address of the STA that is to receive the SSW frame. TA indicates the MAC address of the STA that transmits the SSW frame. The length of the MAC address is 6 octets.

An SSW field includes five subfields. A Direction subfield whose value is 1 indicates that the SSW frame is transmitted by the initiator. A Direction subfield whose value is 0 indicates that the SSW frame is transmitted by the responder.

A CDOWN subfield indicates the value of a down counter indicating the number of remaining SSW frames to be transmitted in ISS or RSS. For example, when the value of the CDOWN subfield is 0, the SSW frame is the last SSW frame to be transmitted in ISS or RSS.

A Sector ID subfield indicates the ID of the sector that is used to transmit the SSW frame. A Directional Multi Gigabit (DMG) Antenna ID is an ID indicating the array antenna used for transmission when the transmitter includes a plurality of array antennas.

An RXSS Length subfield is used to give notice of the number of SSW frames that are necessary to perform RXSS by the STA that is performing transmission.

In the 11ad standard, the SSW frame including the above-described fields and subfields has a length of 26 octets.

As described above, in SLS in the 11ad standard, an SSW frame has a length of 26 octets. In each of ISS and RSS, SSW frames are transmitted the number of which is the same as the number of sectors where beamforming training is performed.

SUMMARY

The effect of beamforming depends on the number of antenna elements (the number of sectors).

However, in SLS according to the related art, each SSW frame has a length of 26 octets, and thus the time until SLS is completed increases as the number of sectors increases.

One non-limiting and exemplary embodiment provides a communication apparatus and a communication method that are capable of shortening an SSW frame and completing SLS in a short time even if the number of sectors increases.

In one general aspect, the techniques disclosed here feature a communication apparatus including a PHY frame generating circuit that generates a PHY frame including either of a short Sector Sweep (Short SSW) frame and a Sector Sweep (SSW) frame; and an array antenna that selects, based on the PHY frame, any sector from among a plurality of sectors and transmits the PHY frame. If, in the PHY frame including the Short SSW frame, a Direction field of the Short SSW frame indicates Initiator Sector Sweep (ISS), the PHY frame generating circuit replaces a Short SSW Feedback field indicating an index of a selected best Short SSW with a Short Scrambled Basic Service Set ID (BSSID) field indicating an abbreviated address generated from an address of a destination communication apparatus.

It should be noted that general or specific embodiments may be implemented as a system, an apparatus, a method, an integrated circuit, a computer program, a recording medium, or any selective combination thereof.

According to an aspect of the present disclosure, a communication apparatus and a communication method that are capable of shortening an SSW frame and completing SLS in a short time even if the number of sectors increases can be provided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 is a diagram illustrating the correspondence (for transmission) between MAC addresses of associated STAs and Addressing (hash values) according to the first embodiment;

FIG. 10 is a diagram illustrating the correspondence (for reception) between MAC addresses of associated STAs and Addressing (hash values) according to the first embodiment;

FIG. 11 is a diagram illustrating the correspondence (for transmission) between a MAC address of a non-AP STA and Addressing (hash value) according to the first embodiment;

FIG. 12 is a diagram illustrating the correspondence (for reception) between a MAC address of a non-AP STA and Addressing (hash value) according to the first embodiment;

FIG. 13 is a diagram illustrating an address table (for transmission) of an AP in the case of applying scrambling according to the first embodiment;

FIG. 14 is a diagram illustrating an address table (for reception) of an AP in the case of applying scrambling according to the first embodiment;

FIG. 15 is a diagram illustrating an address table (for transmission) of an STA in the case of applying scrambling according to the first embodiment;

FIG. 16 is a diagram illustrating an address table (for reception) of an STA in the case of applying scrambling according to the first embodiment;

FIG. 30 is a diagram illustrating the format of an sSSW frame according to the fifth embodiment;

FIG. 34 is a diagram illustrating the correspondence (for reception) between a MAC address of an STA and Addressing (hash values) according to the sixth embodiment;

FIG. 39 is a diagram illustrating an example configuration of a scrambler according to a ninth embodiment;

FIG. 40 is a diagram illustrating another example configuration of a scrambler according to the ninth embodiment;

FIG. 41 is a diagram illustrating an example of calculation using the scrambler according to the ninth embodiment;

FIG. 49 is a diagram illustrating the format of an sSSW frame according to the thirteenth embodiment;

FIG. 60 is a diagram illustrating another example of the Short SSW frame according to the sixteenth embodiment;

FIG. 65 is a diagram illustrating another example configuration of a scrambler according to the nineteenth embodiment;

FIG. 66A is a diagram illustrating an example of combinations of a scrambler seed and a scramble pattern according to the nineteenth embodiment;

FIG. 66B is a diagram illustrating an example of scramble patterns obtained by using a lookup table according to the nineteenth embodiment;

FIG. 67 is a diagram illustrating another example of combinations of a scrambler seed and a scramble pattern according to the nineteenth embodiment;

FIG. 83 is a diagram illustrating an example of the value of Length corresponding to CDOWN according to the twenty-fifth embodiment;

FIG. 84 is a diagram illustrating an example of the format of an sSSW frame according to a modification example of the fourteenth embodiment;

FIG. 86 is a diagram illustrating a maximum number of sSSW frames transmitted in an SSW Slot in accordance with the value of FSS;

FIG. 88C is a diagram illustrating an example of the procedure of calculating the value of the Short Scrambled BSSID field;

FIG. 88D is a diagram illustrating an example of the relationship between seeds and divisors;

FIG. 90 is a diagram illustrating an example of the relationship between seeds and random numbers;

FIG. 102 is a diagram illustrating an example of Group ID according to the modification example of the twenty-seventh embodiment;

FIG. 104 is a diagram illustrating the relationship between frame formats and individual fields according to the modification example of the twenty-eighth embodiment.

DETAILED DESCRIPTION

First Embodiment

Configuration of Communication Apparatus

Figure 3:
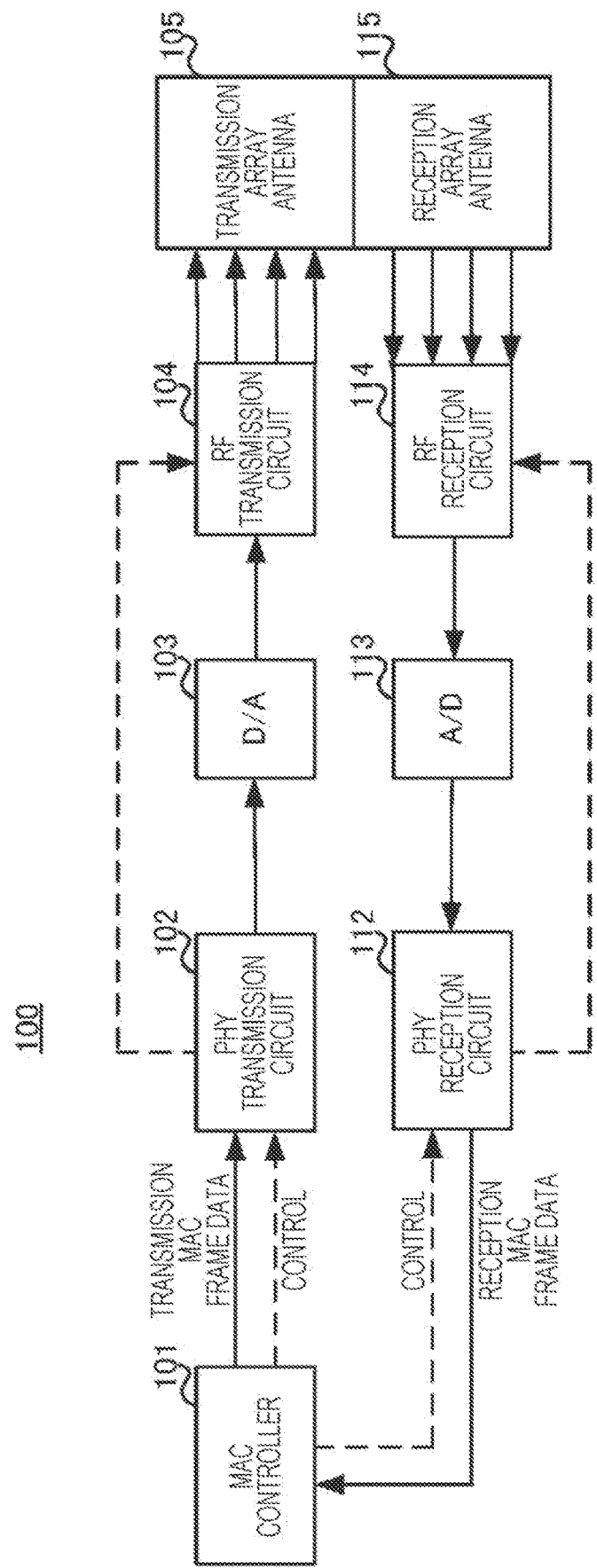
FIG. 3 is a diagram illustrating an example configuration of a communication apparatus according to a first embodiment.

FIG. 3 is a diagram illustrating an example configuration of a communication apparatus 100 according to this embodiment.

The communication apparatus 100 includes a MAC controller 101, a PHY transmission circuit 102, a D/A converter 103, an RF transmission circuit 104, a transmission array antenna 105, a PHY reception circuit 112, an A/D converter 113, an RF reception circuit 114, and a reception array antenna 115.

The MAC controller 101 generates transmission MAC frame data. For example, the MAC controller 101 generates data of SSW frames in ISS of an SLS procedure and outputs the generated data to the PHY transmission circuit 102. In addition, the MAC controller 101 outputs control information to the PHY transmission circuit 102. The control information allows the generated transmission MAC frame to be appropriately coded and modulated and includes header information of a PHY frame and information about transmission timing.

The PHY transmission circuit 102 performs, based on the transmission MAC frame data and control information received from the MAC controller 101, coding processing and modulation processing, thereby generating PHY frame data. The generated PHY frame is converted into an analog signal by the D/A converter 103 and is converted into a radio frequency (RF) signal by the RF transmission circuit 104.

The PHY transmission circuit 102 controls the RF transmission circuit 104. Specifically, the PHY transmission circuit 102 performs, for the RF transmission circuit 104, setting of a center frequency corresponding to a designated channel, control of transmission power, and control of directivity.

The transmission array antenna 105 is an antenna whose directivity is controlled in combination with the RF transmission circuit 104. The transmission array antenna 105 does not necessarily have an array structure, but is called "array antenna" to clearly indicate that the directivity thereof is controlled.

The reception array antenna 115 is an antenna whose directivity is controlled in combination with the RF reception circuit 114. The reception array antenna 115 does not necessarily have an array structure, but is called "array antenna" to clearly indicate that the directivity thereof is controlled.

The RF reception circuit 114 converts a radio signal received by the reception array antenna 115 from an RF signal into a baseband signal. The A/D converter 113 converts the baseband signal from an analog signal into a digital signal.

The PHY reception circuit 112 performs, for example, synchronization, channel estimation, equalization, and demodulation, on the digital baseband signal received thereby, and obtains a reception PHY frame. Furthermore, the PHY reception circuit 112 performs header signal analysis and error-correcting decoding on the reception PHY frame, thereby generating reception MAC frame data.

The reception MAC frame data is input to the MAC controller 101. The MAC controller 101 analyzes the content of the reception MAC frame data, transfers the data to an upper layer (not illustrated), and generates transmission MAC frame data for responding to the reception MAC frame data. For example, when determining that the last SSW frame of ISS of the SLS procedure has been received, the MAC controller 101 generates an SSW frame for RSS including appropriate SSW feedback information and inputs the SSW frame as transmission MAC frame data to the PHY transmission circuit 102.

The PHY reception circuit 112 controls the RF reception circuit 114. Specifically, the PHY reception circuit 112 performs, for the RF reception circuit 114, setting of a center frequency corresponding to a designated channel, control of reception power including Automatic Gain Control (AGC), and control of directivity.

In addition, the MAC controller 101 controls the PHY reception circuit 112. Specifically, the MAC controller 101 performs, for the PHY reception circuit 112, start or stop of reception and start or stop of carrier sensing.

Transmission Operation of Communication Apparatus

A transmission operation of the communication apparatus 100 having the above-described configuration will be described.

Figure 1:
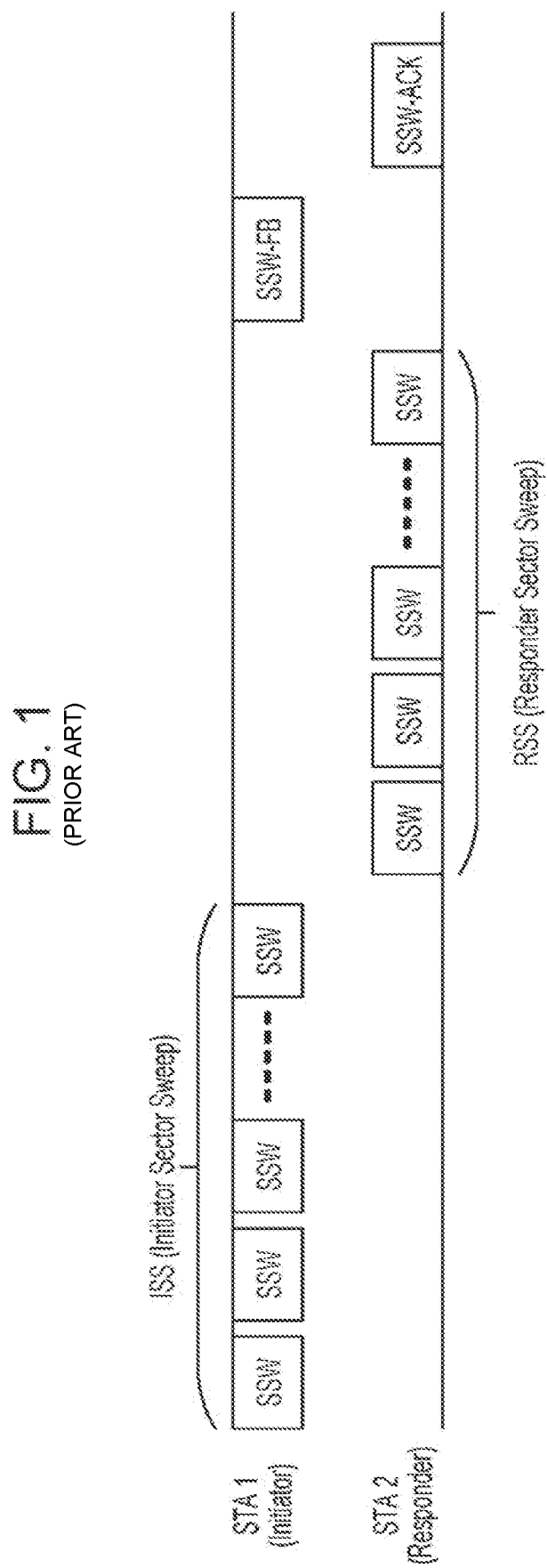
FIG. 1 is a diagram illustrating an overview of the procedure of SLS.
Figure 4:
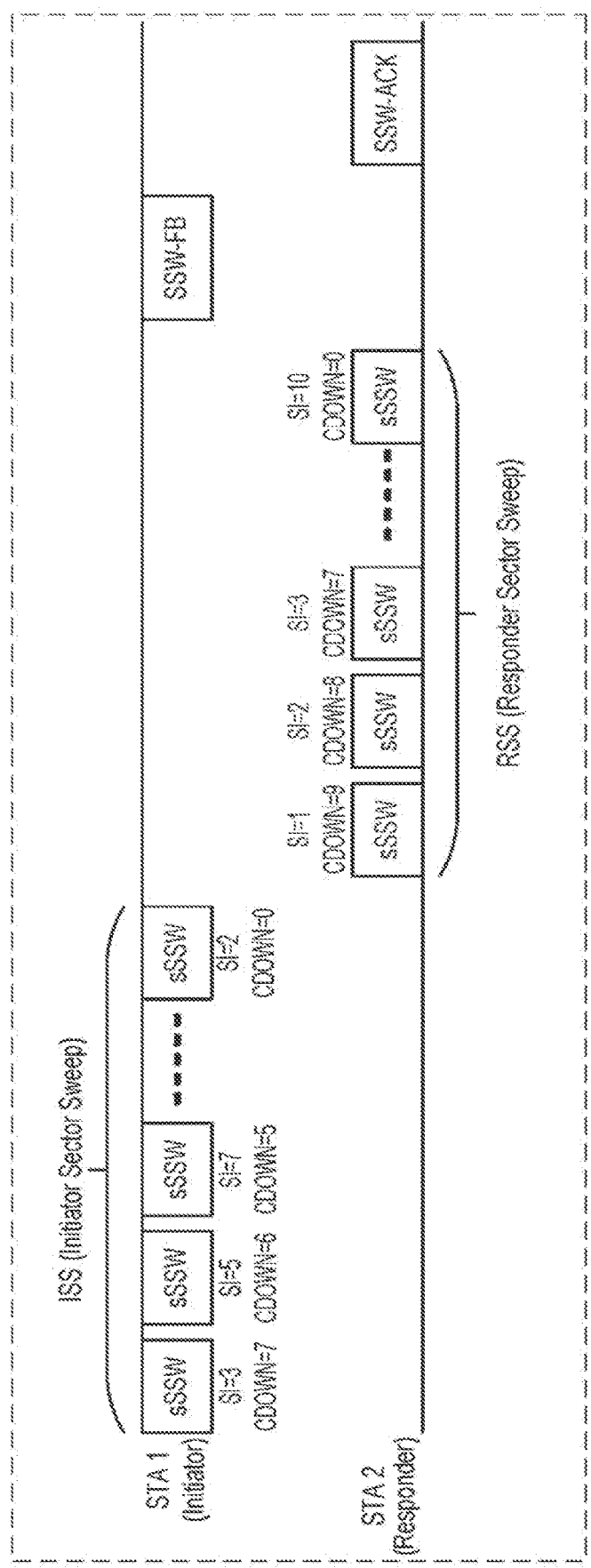
FIG. 4 is a diagram illustrating the procedure of SLS using sSSW frames according to the first embodiment.

FIG. 4 is a diagram illustrating the procedure of SLS using shortened SSW frames (hereinafter referred to as "short Sector Sweep (sSSW) frames"). SLS in this embodiment includes ISS, RSS, SSW-FB, and SSW-ACK and is different from SLS according to the related art (FIG. 1) in that SSW frames are replaced with sSSW frames. The sSSW frame is shorter than the SSW frame, and thus the time required for the entire SLS is shortened.

Figure 5:
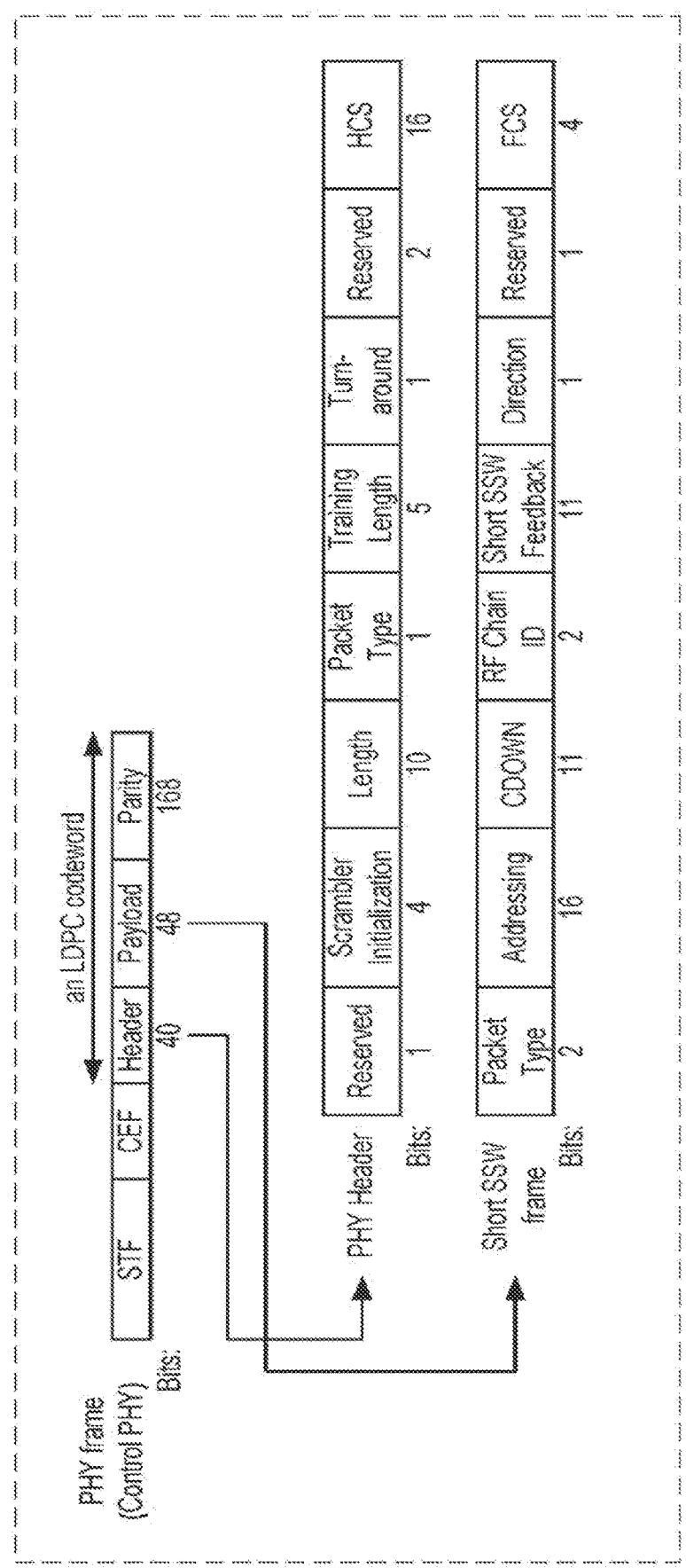
FIG. 5 is a diagram illustrating the configuration of an sSSW frame according to the first embodiment.

FIG. 5 is a diagram illustrating the configuration of an sSSW frame. The SSW frame according to the related art is a MAC frame and is thus transmitted after being formed as a PHY frame by PHY (that is, after coding, modulation, and addition of a preamble and a header have been performed). The sSSW frame is a MAC frame and is a part of a PHY frame, and is thus transmitted after being stored in the payload portion of the PHY frame to form the PHY frame.

The PHY frame includes a Short Training Field (STF), a Channel Estimation Field (CEF), a PHY header (PHY Layer Convergence Protocol Header), Payload, and Parity. Parity is a parity bit generated through LDPC coding. A combination of Payload and Parity may be called Payload or a Payload field.

The PHY header includes eight fields. A value "0" is set to a first reserved bit. A Scrambler Initialization field indicates an initial value of a scrambler for scrambling the fields from the Length field of the PHY header and Payload. The payload length (Length) field indicates the length of data included in Payload by the octet.

A Packet Type field, a Training Length field, and a Turnaround field are not used when the PHY frame is used as sSSW, and thus a predetermined value (for example, 0) is set thereto. A value "0" is set to a second reserved bit. A Frame Check Sequence (FCS) field indicates the value of Cyclic Redundancy Check (CRC) that is used for error detection.

Figure 2:
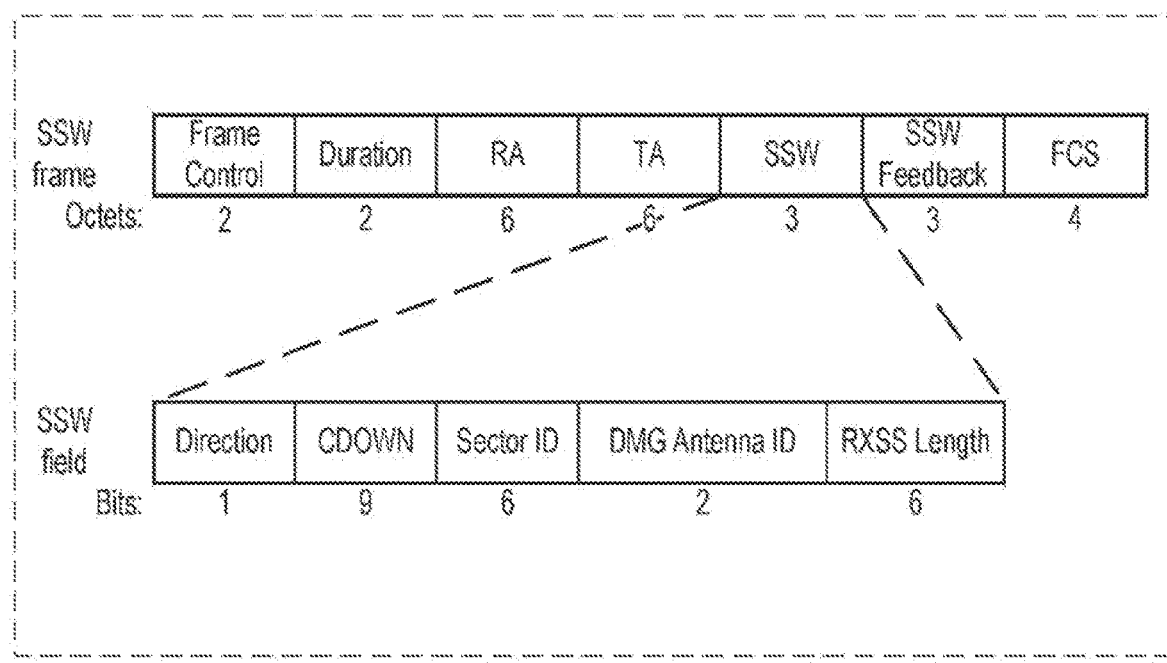
FIG. 2 is a diagram illustrating the configuration of an SSW frame.

The Short SSW frame includes eight fields. A Packet Type field indicates the type of packet. When the value of the Packet Type field is 0, it means that the packet includes a Short SSW frame. When the value of the Packet Type field is not 0, it means that the type of packet is not specified. An Addressing field indicates a hash value that is calculated from two MAC addresses corresponding to RA and TA in the SSW frame (FIG. 2). A CDOWN field indicates the value of a down counter indicating the number of remaining SSW frames to be transmitted in ISS or RSS.

Unlike the CDOWN subfield of the SSW frame (FIG. 2), the size of field is 11 bits. An RF Chain ID indicates, in a case where a transmitter or receiver as a target of beamforming training has a Multi-Input Multi-Output (MIMO) structure, which transmission antenna or reception antenna is to be used for transmission or reception.

A Short SSW Feedback frame indicates the number of the best sSSW that has been selected. For example, in a case where the Short SSW frame is used in RSS, the Short SSW Feedback frame indicates the value of the CDOWN field included in the best sSSW selected in ISS. When the value of a Direction field is 0, it means that the sSSW frame is transmitted from the initiator to the responder. When the value of the Direction field is 1, it means that the sSSW frame is transmitted from the responder to the initiator.

A value "0" is set to a reserved bit (Reserved) field. Reserved bits may be used for another purpose when a function is added in the future. An FCS field indicates a value that is used for error detection. The FCS field of the SSW frame (FIG. 2) has a size of 32 bits (4 octets), whereas the FCS field of the sSSW frame (FIG. 5) has a size of 4 bits. For example, the upper 4 bits of 32-bit CRC are stored in the FCS field of the sSSW frame (FIG. 5).

Figure 6:
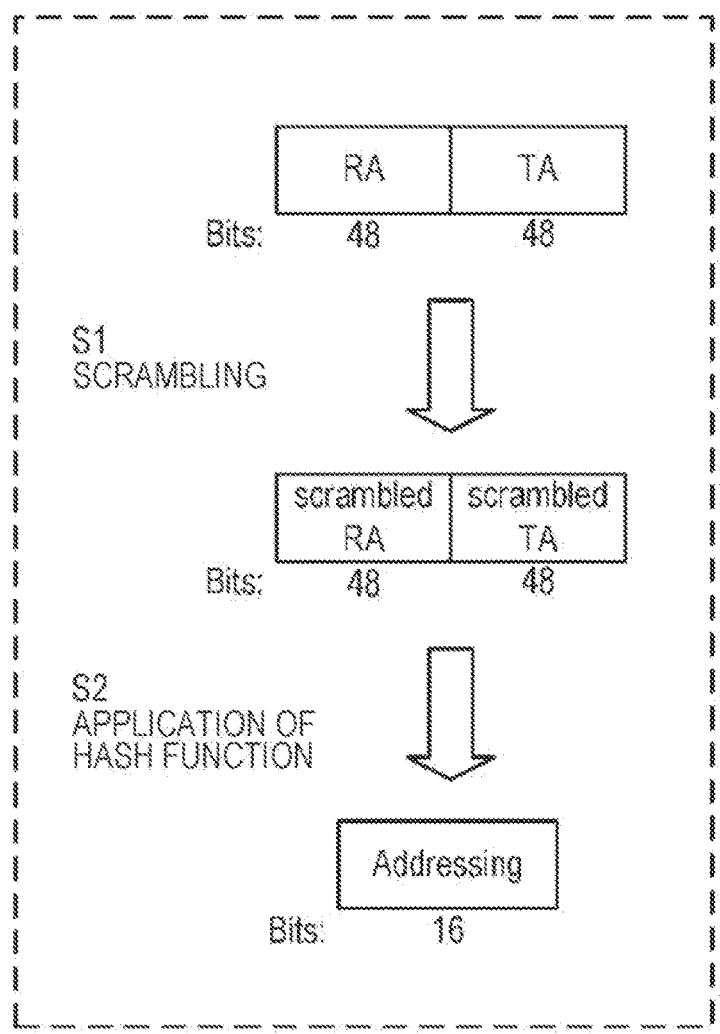
FIG. 6 is a diagram illustrating a procedure of calculating an Addressing field included in the sSSW frame according to the first embodiment.

FIG. 6 is a diagram illustrating a procedure of calculating the Addressing field included in the sSSW frame. First, the MAC controller 101 determines a reception address RA and a transmission address TA. Each address has 48 bits.

In step S1 in FIG. 6, the communication apparatus 100 performs scrambling, in units of bits, on 96-bit data as a combination of RA and TA.

Figure 7:
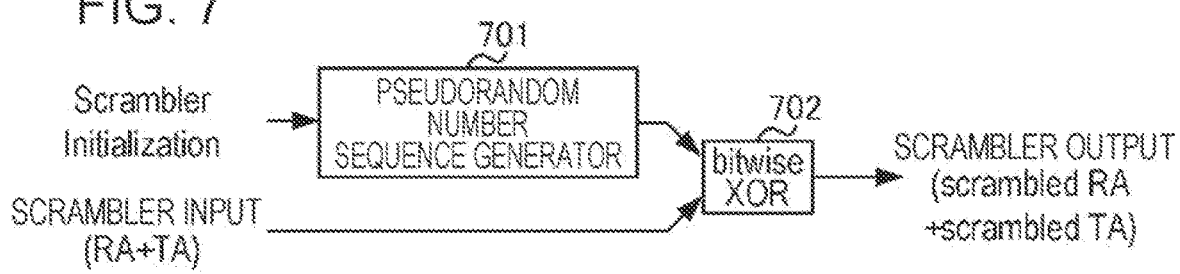
FIG. 7 is a diagram illustrating an example of a scrambling method according to the first embodiment.

FIG. 7 is a diagram illustrating an example of a scrambling method. A scrambled sequence is generated, by a pseudorandom number sequence generator 701, using the value of the Scrambler Initialization field included in the PHY Header illustrated in FIG. 5 as a seed (initial value). As the pseudorandom number sequence generator 701, for example, a circuit using a shift register is available (see, for example, IEEE 802.11ad™-2012). An exclusive OR (XOR) operation circuit 702 performs, for each bit, XOR operation on a generated pseudorandom number sequence and data generated by combining RA and TA as an input of the scrambler, thereby obtaining a scrambled output.

Figure 8:
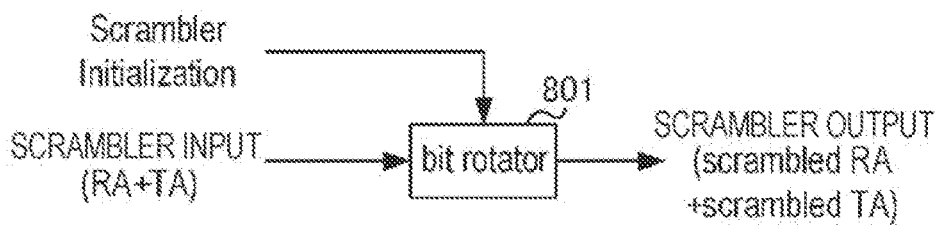
FIG. 8 is a diagram illustrating another example of a scrambling method according to the first embodiment.

FIG. 8 is a diagram illustrating another example of a scrambling method. The purpose of step S1 in FIG. 6 is to change an output of a hash function in step S2, and thus typical processing called scrambling is used. In FIG. 8, circular bit shift (bit rotator) is used instead of a typical scrambler. For example, a bit rotator 801 shifts, to the left, data which is a combination of RA and TA as an input of the scrambler with respect to the value designated by Scrambler Initialization. Overflowed upper bits are stored in lower bits.

In step S2 in FIG. 6, the communication apparatus 100 applies a hash function to the scrambled 96-bit address, thereby converting it into a 16-bit hash value. As a hash function, for example, a Fowler-Nol-Vo (FNV) hash function, a Cyclic Redundancy check (CRC) code, or the like may be used.

In FIG. 6, scrambling is performed in accordance with the value of the Scrambler Initialization field (SI), and thus the resulting hash value varies in accordance with the value of the Scrambler Initialization field (SI) even if the original address is the same. As illustrated in FIG. 4, the communication apparatus 100 transmits sSSW while changing the value of the Scrambler Initialization field (SI) in each sSSW, thereby being able to prevent the occurrence of a hash collision in all the SSW frames in ISS. For example, in a case where there are fifteen possible values of SI, the communication apparatus 100 randomly changes the value of SI in each sSSW, thereby being able to decrease the probability of a hash collision with another address to about $1/15$.

Here, a hash collision means that different addresses result in the same hash value. This may cause the communication apparatus 100 to wrongly recognize an sSSW frame addressed to another STA as an sSSW frame addressed to the own STA and to perform reception processing. If a hash collision occurs, the following situation may arise, for example. When one STA (initiator) transmits ISS, a plurality of STAs (responders) respond by RSS, radio signals of sSSW frames in RSS collide with each other, and the one STA (initiator) is unable to receive any sSSW of RSS.

A transmitter (one STA (initiator or responder)) is able to arbitrarily determine the values of SI. The values of SI may be random, or may be ascending or descending.

The bit rotator 801 in FIG. 8 shifts RA and TA to the left. Alternatively, the bit rotator 801 may shift RA and TA to the right.

In addition, the bit rotator 801 in FIG. 8 shifts RA and TA with respect to the value designated in Scrambler Initialization. Alternatively, the bit rotator 801 may shift RA and TA with respect to a value eight times the value designated in Scrambler Initialization.

Reception Operation of Communication Apparatus

A reception operation of the communication apparatus 100 will be described.

In a case where the communication apparatus 100 is an access point (AP), the communication apparatus 100 has the tables illustrated in FIGS. 9 and 10 (hereinafter referred to as "address tables"), for example. FIGS. 9 and 10 are diagrams illustrating tables showing the correspondence between MAC addresses of associated STAs (STA1 to STA7) and Addressing (hash values) calculated in the procedure illustrated in FIG. 6. FIG. 9 is a table used by the AP to transmit sSSW. FIG. 10 is a table used by AP to receive sSSW.

Here, association means an initial connection between two terminals. As a result of association, the two terminals become able to identify the MAC address of each other. In a case where an AP and a non-AP STA (not an access point) perform typical association, the STA is able to perform association for one AP at a certain time point.

When the communication apparatus 100 receives an sSSW frame, the communication apparatus 100 searches the table in FIG. 10 for the hash value indicated in the Addressing field and obtains actual values of RA and TA. For example, when the value of the Addressing field is h15, the communication apparatus 100 (AP1) estimates that the received sSSW is transmitted from STA5 and is addressed to AP1. On the other hand, for example, when the value of the Addressing field is h20, which is not included in the table in FIG. 10, the communication apparatus 100 (AP1) determines that the received sSSW is not addressed to AP1 and discards the received sSSW.

In a case where the communication apparatus 100 is a non-AP STA and is associated with an AP, the communication apparatus 100 uses the tables illustrated in FIGS. 11 and 12, for example. In this case, the communication apparatus 100 may hold the MAC address of the associated AP and Addressing (hash value) for transmission and reception therefor. The address table for a non-AP STA is equivalent to a corresponding one of rows of the address table for an AP. Since there is only one row, the communication apparatus 100 only needs to hold corresponding information and does not necessarily need to have the information in the form of table.

FIGS. 9 to 12 illustrate an example in which scrambling is not applied in step S1 in FIG. 6 for simplicity. In the case of applying scrambling in step S1 in FIG. 6, address tables for an AP are illustrated in FIGS. 13 and 14. In the case of applying scrambling in step S1 in FIG. 6, address tables for an STA are illustrated in FIGS. 15 and 16.

In the case of applying scrambling in step S1 in FIG. 6, the hash value stored in the Addressing field varies according to the value of SI, and thus the communication apparatus 100 has different tables corresponding to the values of SI. FIGS. 13 to 16 illustrate tables in which columns corresponding to the values of SI have been added.

When AP1 receives an sSSW frame in which, for example, the value of SI is 6 and the Addressing value is h361, AP1 searches the address table for AP1 (for reception) in FIG. 14 for the Addressing values in the column of an SI value of 6 (h361 to h367), thereby detecting AP1-STA1 corresponding to h361.

When STA1 receives an sSSW frame in which, for example, the value of SI is 14 and the Addressing value is h162, STA1 refers to the Addressing value in the column of an SI value of 14 in the address table for STA1 (for reception) in FIG. 16, thereby detecting h241. However, detected h241 is different from h162, which is the received Addressing value, and thus STA1 determines that the received sSSW frame is not addressed to STA1 and discards the received sSSW frame.

In this way, the communication apparatus 100 performs scrambling in accordance with the value of the Scrambler Initialization field (SI). Thus, if a hash collision occurs in any sSSW in ISS or RSS, the hash collision can be prevented by changing the value of SI, and accordingly the communication apparatus 100 is able to prevent a collision in all sSSW in ISS or RSS.

In addition, since the communication apparatus 100 performs scrambling in accordance with the value of the Scrambler Initialization field (SI), the communication apparatus that has received sSSW does not need to search the overall address table, and may search or refer to part of the table in accordance with the value of SI. Accordingly, the configuration of the communication apparatus can be simplified and the power consumption of the communication apparatus can be reduced.

In addition, since the communication apparatus 100 performs scrambling in accordance with the value of the Scrambler Initialization field (SI) at the time of transmission and searches or refers to part of the table in accordance with the value of SI at the time of reception, the probability a hash collision can be decreased. Accordingly, even if the overall address table includes an Addressing value of collision, the communication apparatus 100 is able to narrow down the target of search in accordance with the value of SI, and the Addressing value of collision can be eliminated from the target of search.

Second Embodiment

Figure 17:
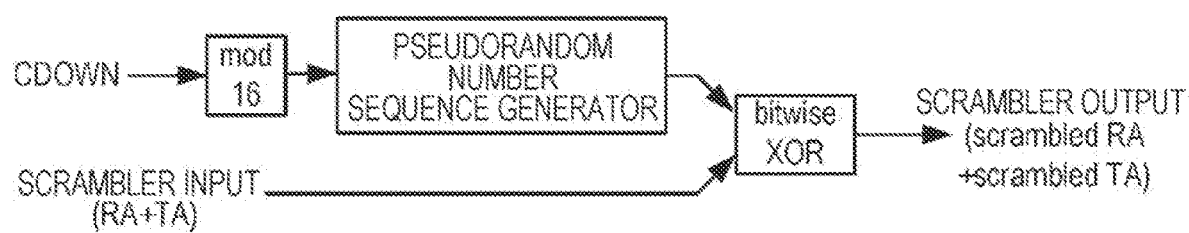
FIG. 17 is a diagram illustrating an example of a scrambling method according to a second embodiment.
Figure 18:
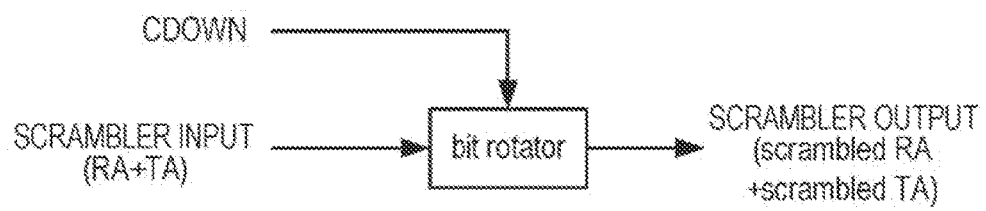
FIG. 18 is a diagram illustrating another example of a scrambling method according to the second embodiment.

In this embodiment, a description will be given of a configuration different from that of the scrambler illustrated in FIGS. 7 and 8 of the first embodiment. FIGS. 17 and 18 are diagrams illustrating another configuration of the scrambler. That is, in transmission processing, scrambling is performed in accordance with the value of the CDOWN field illustrated in FIG. 5 instead of the value of the Scrambler Initialization field (SI).

FIG. 17 is a diagram illustrating a configuration of using lower bits of the CDOWN field as a value of a seed of a pseudorandom number sequence generator. In FIG. 17, "mod 16" is processing of calculating a remainder of division by 16, and the lower 4 bits of the CDOWN field are obtained. If there is a value not allowable as a value of a seed of the pseudorandom number sequence generator, the rule of mod 16 may replace the unallowable value with another value. For example, if a value "0" is not allowable, the rule of mod 16 replaces "0" with another value, such as "7". Alternatively, if there is an unallowable value, the scrambler does not perform scrambling in step S1 in FIG. 6.

In reception processing, the communication apparatus 100 reconstructs the Addressing value into original address values (RA, TA) by using address tables similar to those illustrated in FIGS. 13 to 16. Note that the address tables have columns corresponding to the value of lower bits of CDOWN instead of the columns corresponding to the value of SI.

In FIG. 17, mod 32 or mod 64 may be used instead of mod 16 to increase the number of bits to be input to the pseudorandom number sequence generator, or mod 8 or mod 4 may be used to decrease the number of bits.

If the number of bits is increased, the probability of an address collision can be decreased, but the size of the address tables illustrated in FIGS. 13 to 16 increases. However, the communication apparatus 100 is able to select a column in an address table in accordance with the value of lower bits of the CDOWN field in reception processing, as described above, and thus the number of candidates for an Addressing value to be searched for does not increase. That is, as a result of increasing the number of bits to be input to the pseudorandom number sequence generator, the probability of an address collision can be decreased without increasing the amount of processing and the power consumption of the communication apparatus 100.

If the number of bits is decreased, the size of the address tables illustrated in FIGS. 13 to 16 can be reduced. In this case, the probability of an address collision increases. However, in a case where the number of sectors of an AP and an STA is small, the probability of an address collision can be sufficiently decreased even if the number of bits to be input to the pseudorandom number sequence generator is reduced. Thus, the AP may increase or decrease the number of bits to be input to the pseudorandom number sequence generator in accordance with the number of sectors of the AP and an associated STA.

In this way, the communication apparatus 100 performs scrambling in accordance with the value of lower bits of the CDOWN field. Thus, if a hash collision occurs in any sSSW in ISS or RSS, the hash collision can be prevented by changing the value of lower bits of the CDOWN field, and thus a collision in all sSSW in ISS or RSS can be prevented.

In addition, since the communication apparatus 100 performs scrambling in accordance with the value of lower bits of the CDOWN field, the communication apparatus that has received sSSW does not need to search the overall address table and may search or refer to part of the table in accordance with the value of lower bits of the CDOWN field. Accordingly, the configuration of the communication apparatus can be simplified and the power consumption of the communication apparatus can be reduced.

In addition, since the communication apparatus 100 performs scrambling in accordance with the value of lower bits of the CDOWN field at the time of transmission and searches or refers to part of the table in accordance with the value of lower bits of the CDOWN at the time of reception, the probability of a hash collision can be decreased. Accordingly, even if the overall address table includes an Addressing value of collision, the communication apparatus 100 is able to narrow down the target of search in accordance with the value of lower bits of the CDOWN field, and the Addressing value of collision can be eliminated from the target of search.

In addition, an AP increases or decreases the number of bits to be input to the pseudorandom number sequence generator in accordance with the number of sectors of the AP and an associated STA, and thus the probability of an address collision can be decreased and the size of the address table used for search can be re duce d.

Third Embodiment

Transmission Operation of Communication Apparatus

Figure 19:
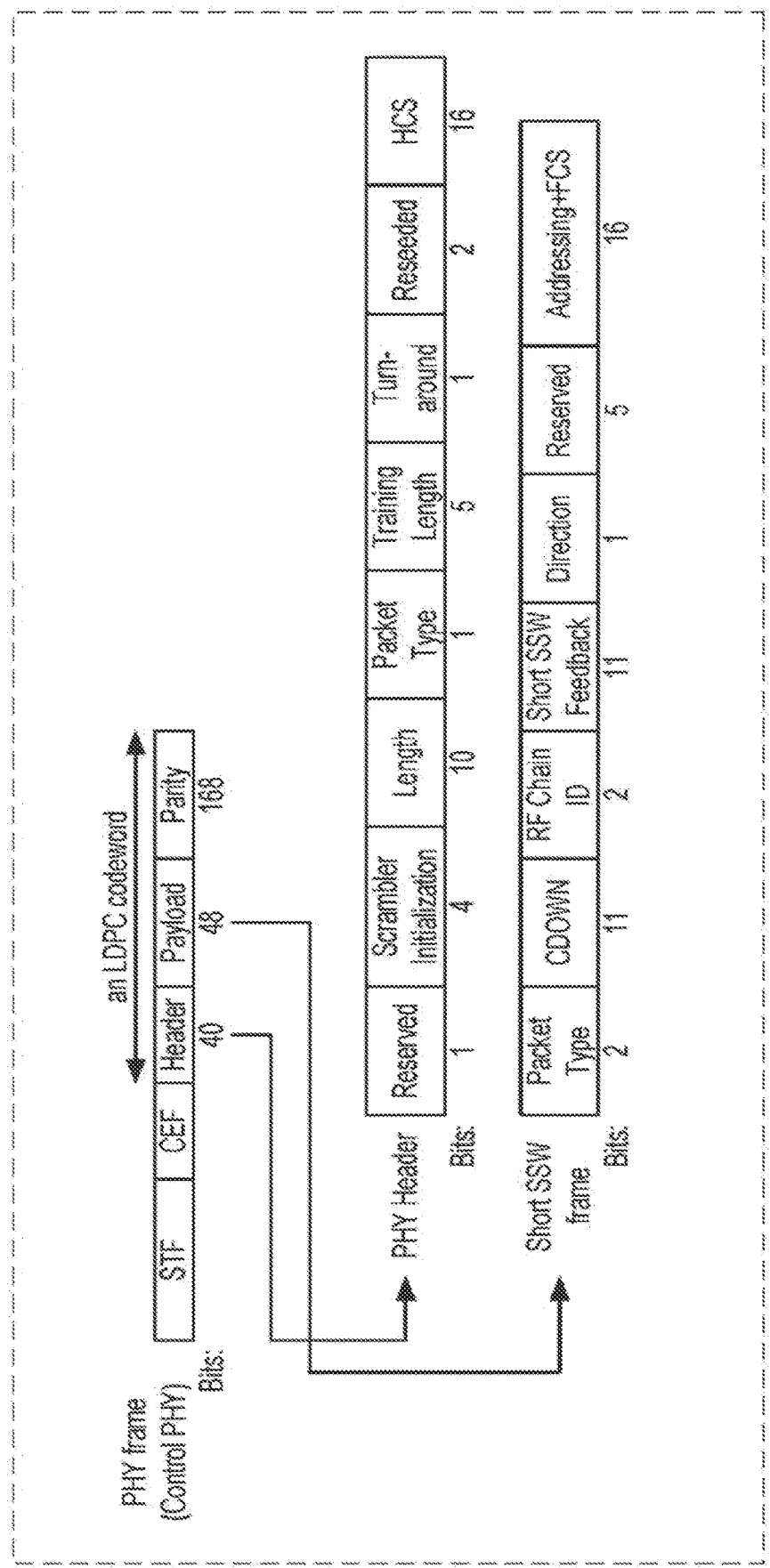
FIG. 19 is a diagram illustrating the configuration of an sSSW frame according to a third embodiment.

FIG. 19 illustrates the configuration of an sSSW frame according to a third embodiment. Compared with the sSSW frame in FIG. 5, the sSSW frame in FIG. 19 does not include an Addressing field and an FCS field but includes an Addressing+FCS field. In addition, the Reserved field has 5 bits, which is larger by 4 bits than that in FIG. 5.

Hereinafter, a description will be given of a case where a communication apparatus (AP) transmits sSSW frames and a communication apparatus (STA) receives the sSSW frames. The same applies to a case where the communication apparatus (STA) transmits sSSW frames and the communication apparatus (AP) receives the sSSW frames and a case where the communication apparatus (STA) transmits sSSW frames and a communication apparatus (STA) receives the sSSW frames.

Figure 20:
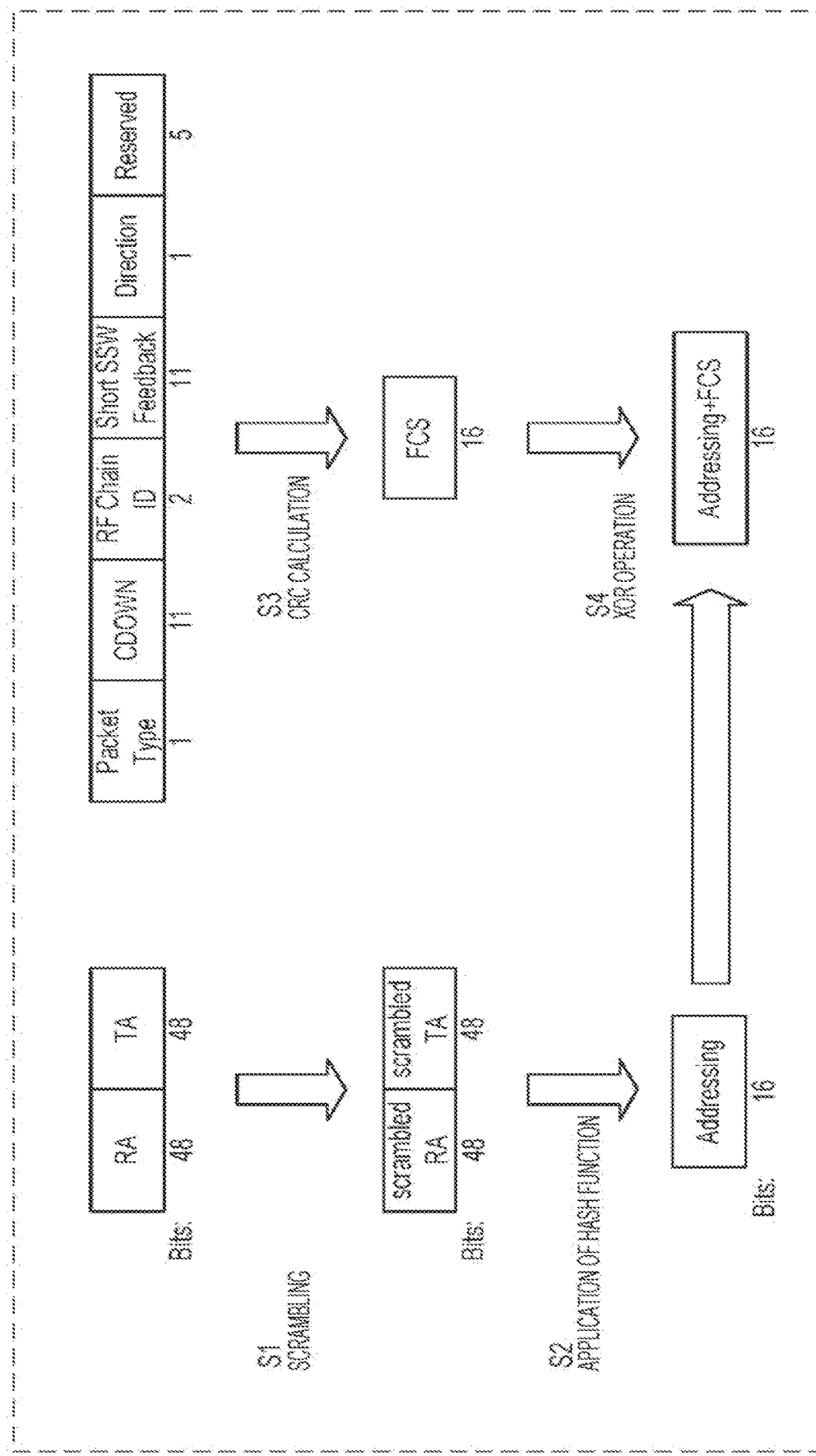
FIG. 20 is a diagram illustrating a method for calculating the value of an Addressing+FCS field at the time of transmission according to the third embodiment.

FIG. 20 is a diagram illustrating a method for calculating the value of the Addressing+FCS field at the time of transmission. As in the first or second embodiment, the communication apparatus (AP) first performs scrambling on RA and TA (step S1), and then applies a hash function to calculate a hash value of addressing (step S2).

Subsequently, the communication apparatus (AP) calculates 16-bit CRC for the entire portion except the Addressing+FCS field in the sSSW frame. The calculated CRC is called Frame Check Sequence (FCS) (step S3).

Subsequently, the communication apparatus (AP) performs XOR operation between the calculated Addressing value and FCS value (step S4). The communication apparatus (AP) regards the value obtained through the XOR operation as the Addressing+FCS field and transmits it.

Reception Operation of Communication Apparatus

Figure 21:
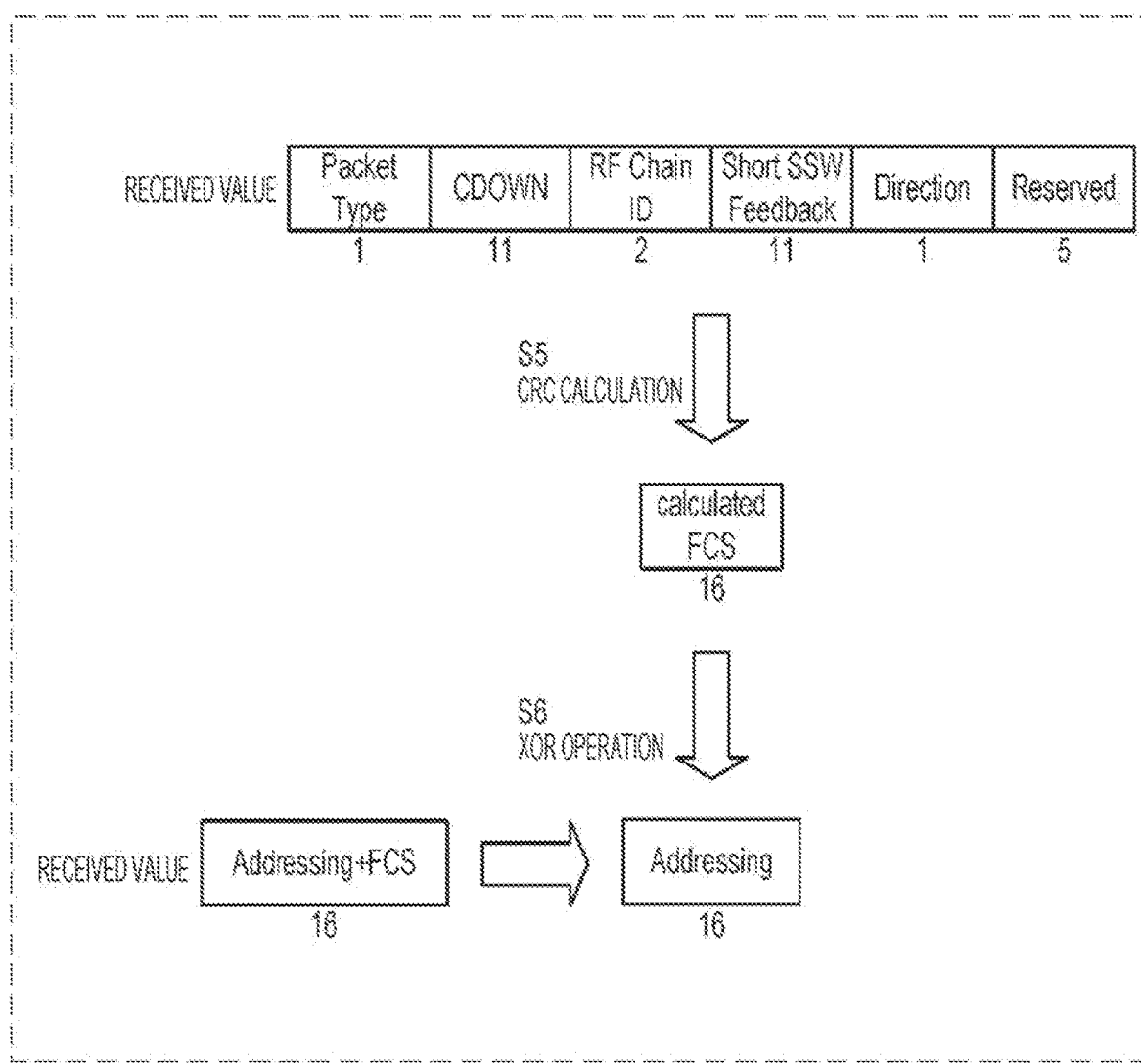
FIG. 21 is a diagram illustrating processing of receiving the value of the Addressing+FCS field according to the third embodiment.

FIG. 21 is a diagram illustrating processing of receiving the value of the Addressing+FCS field.

First, the communication apparatus (STA) that has received the sSSW frame calculates 16-bit CRC from the entire portion except the Addressing+FCS field in the received sSSW frame (step S5). The calculated CRC is called a calculated FCS.

The communication apparatus (STA) that has received the sSSW frame performs XOR operation on the value of the calculated FCS and the value of the received Addressing+FCS field, thereby obtaining an Addressing value (step S6).

If the received sSSW frame does not include a bit error, the Addressing value obtained in step S6 is equal to the transmitted Addressing value (in other words, a correct Addressing value). The communication apparatus (STA) that has received the sSSW frame determines whether the sSSW frame is addressed to the communication apparatus (STA) by using the obtained Addressing value and any of FIGS. 13 to 16, as in the first and second embodiments.

Next, a description will be given of a case where a received sSSW frame includes a bit error. It is difficult for the communication apparatus (STA) that has received the sSSW frame to know in advance whether the sSSW frame includes a bit error. Thus, the communication apparatus (STA) checks the Addressing value by using the address tables in FIGS. 13 to 16, as described above.

Here, if a bit error is included in the portion except the Addressing+FCS field in the received sSSW frame, the FCS value calculated in step S5 is different from the FCS value calculated in step S3 by the communication apparatus (AP) as a transmitter.

Thus, the Addressing value obtained in step S6 is different from the Addressing value calculated in step S2 by the communication apparatus (AP) as a transmitter. In other words, the Addressing value obtained in step S6 is an incorrect Addressing value.

Here, the Addressing field has 16 bits and has one of 65536 values. Thus, the probability that an incorrect Addressing value is included in the address tables in FIGS. 13 to 16 is low. That is, if the Addressing value obtained in step S6 is not found in the address tables, the communication apparatus (STA) that has received the sSSW frame determines that the received sSSW frame is not addressed to the communication apparatus (STA) or includes a bit error, and discards the received sSSW frame.

If an incorrect Addressing value is included in the address tables by chance, reception processing (for example, measurement of reception quality and determination of whether to perform feedback) is performed on the sSSW frame by using erroneous data. That is, the same thing occurs as in the case of not detecting an error in CRC.

However, in the third embodiment, the undetected error probability is significantly lower than in the sSSW frame according to IEEE 802.11-1610416r01 Short SSW Format for 11ay. This will be described in detail below.

In the sSSW frame according to IEEE 802.11-16/0416r01 Short SSW Format for 11ay, 4 bits are assigned to the FCS field. When 4-bit CRC is used, the undetected error probability is about $1/16$ with respect to the number of error frames.

On the other hand, in the communication apparatus according to the third embodiment, 16 bits are assigned to the Addressing+FCS field. In an AP, for example, when there are 256 associated STAs, the probability that an incorrect Addressing value is included in the address table by chance is 256/65536, that is, $1/256$. In other words, the undetected error probability can be decreased to $1/16$, compared with the method according to IEEE 802.11-16/0416r01 Short SSW Format for 11ay.

In addition, if a non-AP associated with an AP receives an sSSW frame, the number of Addressing values to be checked is one and thus the undetected error probability is $1/65536$. That is, an error detection ability equivalent to that in the case of a 16-bit FCS field (low undetected error probability) can be obtained.

In the third embodiment, the communication apparatus 100 performs XOR operation on the calculated FCS value and the calculated Addressing value before transmission. Thus, the frame length can be reduced compared with the SSW frame according to the related art, and a high error detection ability can be obtained.

In the third embodiment, the communication apparatus 100 performs XOR operation on the calculated FCS value and the calculated Addressing value before transmission. Thus, the number of bits required for the FCS field can be reduced, and more reserved bits can be obtained. The reserved bits can be used to expand the functions in the future, and thus various functions can be implemented by using sSSW frames.

In addition, in accordance with the reduced bits required for the FCS field, the length of the sSSW frame may be further reduced. Accordingly, the time required for SLS can be shortened, radio resources can be effectively used (more data can be transmitted), the power consumption can be reduced, and high-speed tracking of beamforming can be realized in a mobile environment.

Fourth Embodiment

Figure 22:
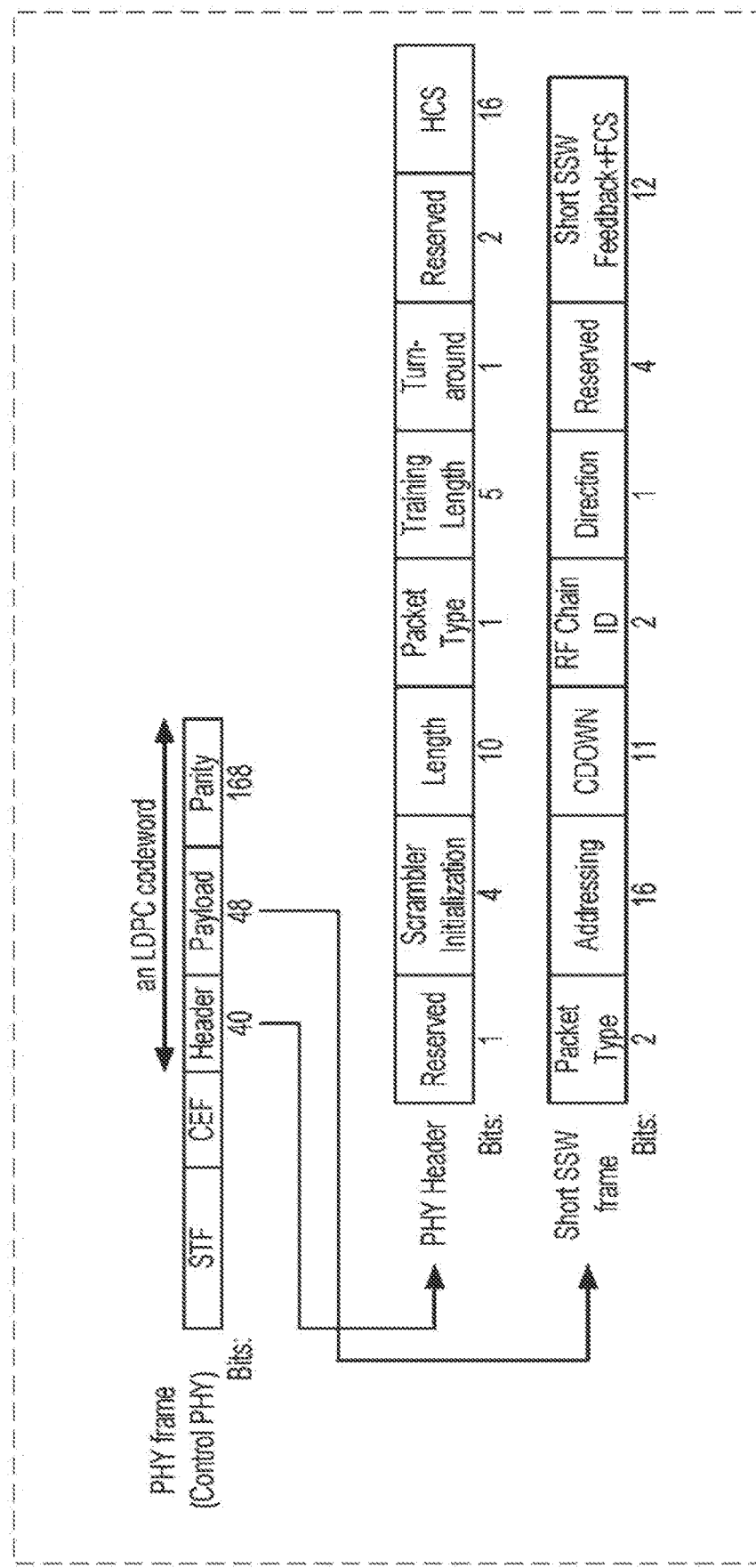
FIG. 22 is a diagram illustrating the configuration of an sSSW frame according to a fourth embodiment.

FIG. 22 is a diagram illustrating the configuration of an sSSW frame according to a fourth embodiment. Compared with the sSSW frame in FIG. 5, the sSSW frame in FIG. 22 does not include a Short SSW Feedback field and an FCS field but includes a 12-bit Short SSW Feedback+FCS field. The Reserved field has 4 bits, which is larger by 3 bits than that in FIG. 5.

Transmission Operation of Communication Apparatus

Figure 23:
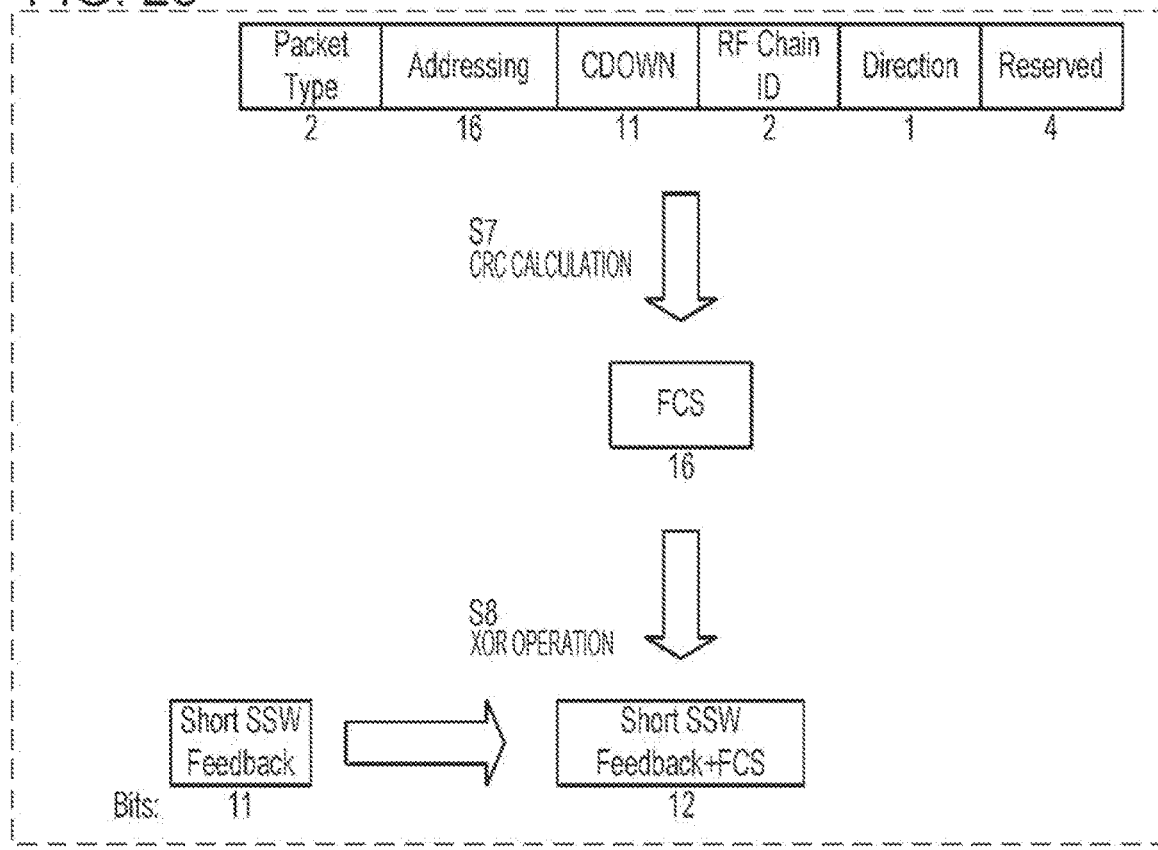
FIG. 23 is a diagram illustrating a method for calculating the value of a Short SSW Feedback+FCS field at the time of transmission according to the fourth embodiment.

FIG. 23 is a diagram illustrating a method for calculating the value of the Short SSW Feedback+FCS field at the time of transmission. First, a communication apparatus (AP) calculates 12-bit CRC for the entire portion except the Short SSW Feedback+FCS field of the sSSW frame. The calculated CRC is called Frame check sequence (FCS) (step S7).

Subsequently, the communication apparatus (AP) combines, through XOR operation, the calculated FCS value and the value of the Short SSW Feedback (step S8). The resulting value is regarded as the Short SSW Feedback+FCS field and transmits it.

Reception Operation of Communication Apparatus

Figure 24:
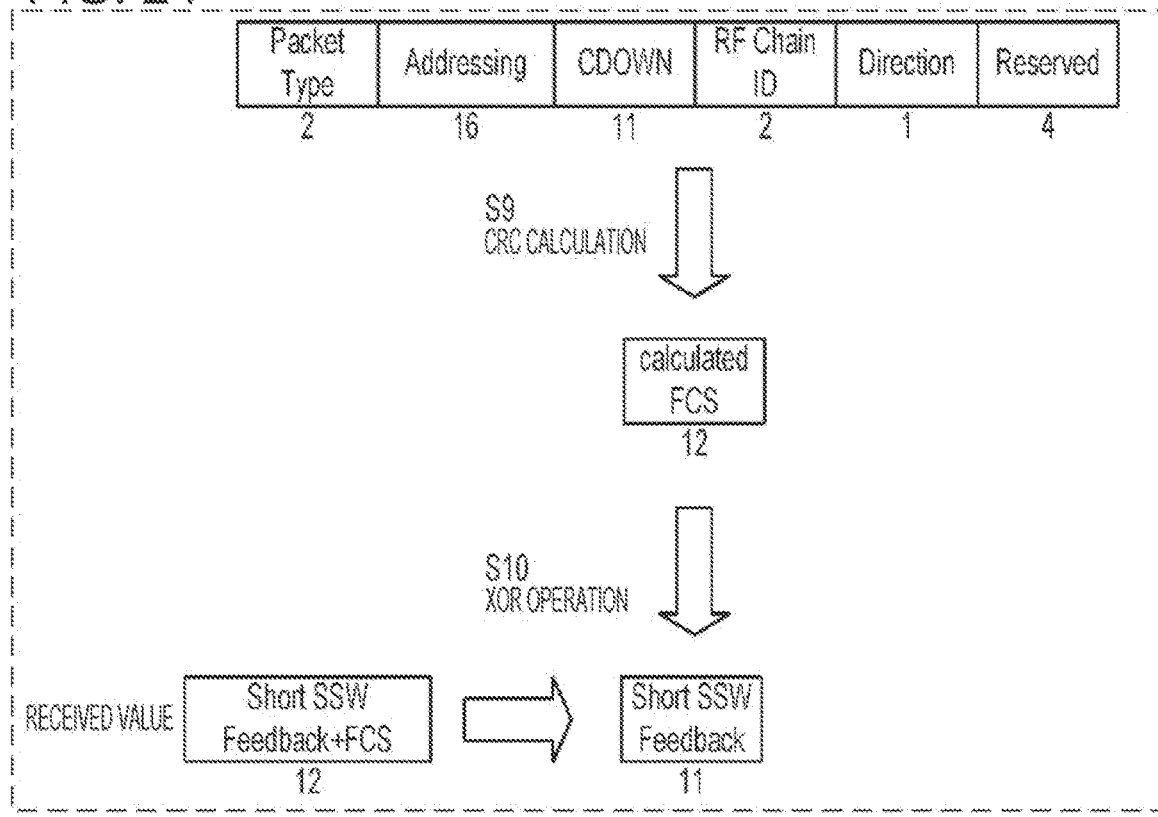
FIG. 24 is a diagram illustrating processing of receiving the value of the Short SSW Feedback+FCS field according to the fourth embodiment.

FIG. 24 is a diagram illustrating processing of receiving the value of the Short SSW Feedback+FCS field.

First, a communication apparatus (STA) that has received the sSSW frame calculates 12-bit CRC from the entire portion except the Short SSW Feedback+FCS field of the received sSSW frame (step S9). The calculated CRC is called a calculated FCS.

The communication apparatus (STA) that has received the sSSW frame performs XOR operation on the calculated FCS value and the received value of the Short SSW Feedback+FCS field, thereby obtaining a value of Short SSW Feedback (step S10).

If the received sSSW frame does not include a bit error, the value of Short SSW Feedback+FCS obtained in step S10 is equal to the transmitted Addressing value (in other words, a correct Addressing value). The communication apparatus (STA) that has received the sSSW frame determines whether the sSSW frame is addressed to the communication apparatus (STA) by using the obtained Addressing value and any of FIGS. 13 to 16, as in the first and second embodiments.

Next, a description will be given of a case where a received sSSW frame includes a bit error (including a case where the Short SSW Feedback+FCS field includes a bit error). It is difficult for the communication apparatus (STA) that has received the sSSW frame to know in advance whether the sSSW frame includes a bit error. However, since an sSSW frame including the same value of Short SSW Feedback is repeatedly transmitted during RSS, the communication apparatus (STA) is able to obtain a correct value of Short SSW Feedback, for example, based on the majority decision logic. Here, in the majority decision logic, the value of Short SSW Feedback that is obtained most may be adopted. Alternatively, in the bit expression of the value of Short SSW Feedback, the value of 0 or 1 that appears most frequently in units of bits may be adopted.

Another Method for Calculating Value of Short SSW Feedback+FCS Field

Figure 25:
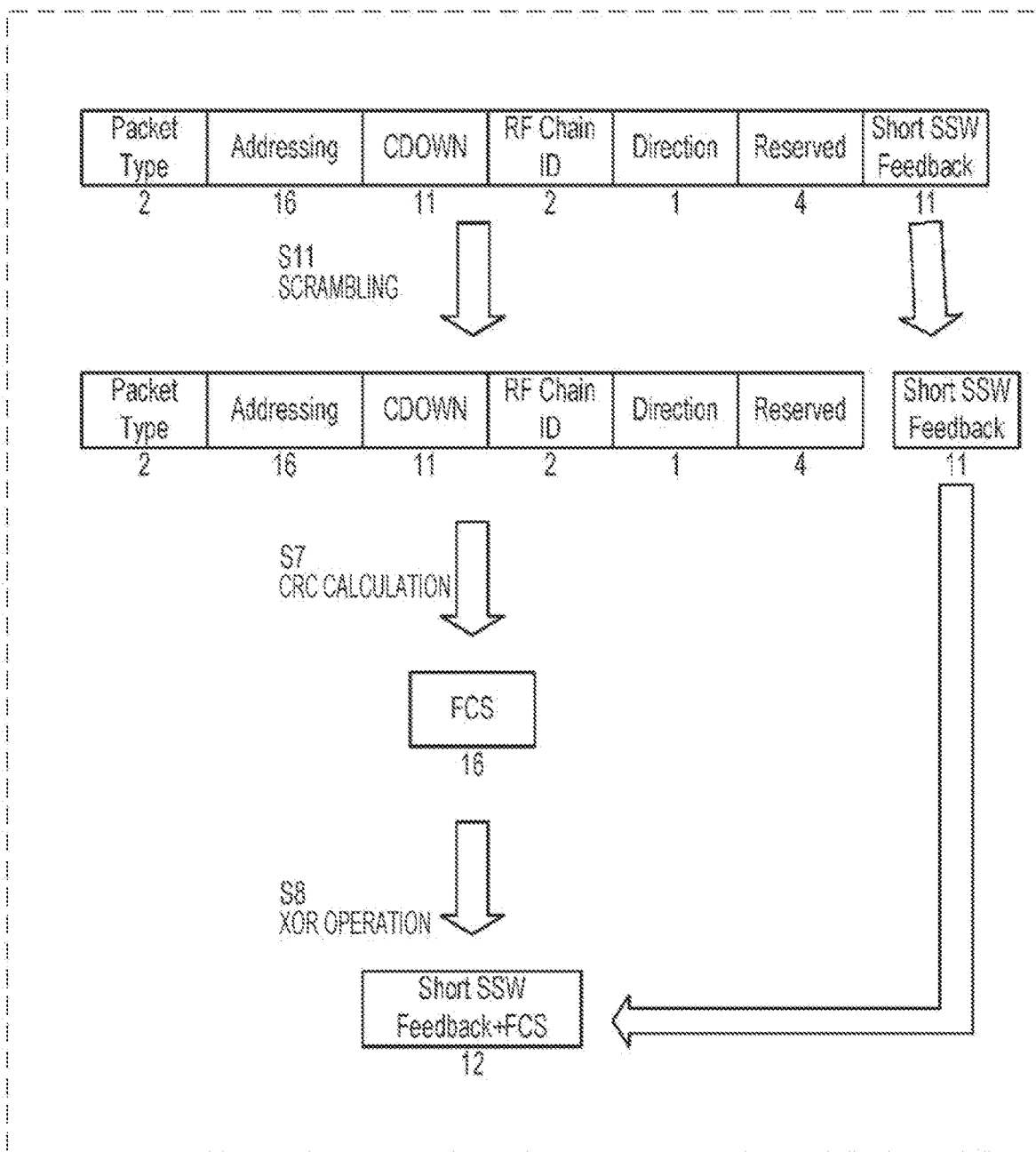
FIG. 25 is a diagram illustrating another method for calculating the value of the Short SSW Feedback+FCS field at the time of transmission according to the fourth embodiment.
Figure 26:
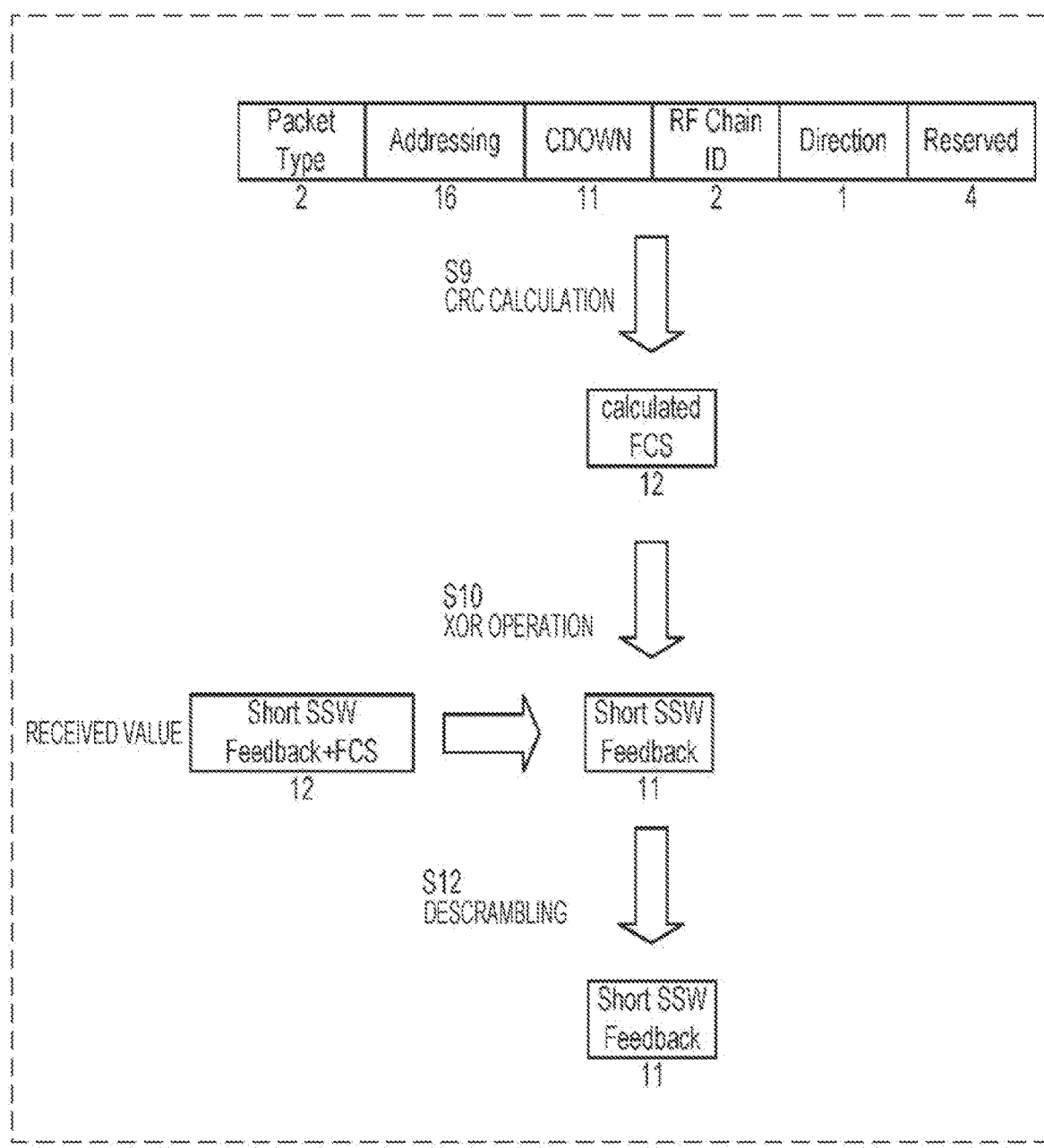
FIG. 26 is a diagram illustrating another processing of receiving the value of the Short SSW Feedback+FCS field according to the fourth embodiment.

FIG. 25 is a diagram illustrating another method for calculating the value of the Short SSW Feedback+FCS field at the time of transmission. FIG. 26 is a diagram illustrating another processing of receiving the value of the Short SSW Feedback+FCS field.

In step S7 in FIG. 25, a communication apparatus (AP) adds the value of Short SSW Feedback to the end of the frame and performs scrambling before calculating CRC. As a scrambling method, a method defined in the 11ad standard is used as a method for scrambling the payload of PHY. Note that the value of Short SSW Feedback added to the end of the frame is regarded as part of the payload (step S11).

Subsequently, the communication apparatus (AP) performs CRC calculation on the portion except the value of the scrambled Short SSW Feedback, as in step S7 in FIG. 23. Subsequently, the communication apparatus (AP) performs XOR operation by using FCS and the value of the scrambled Short SSW Feedback, as in step S8 in FIG. 23.

A communication apparatus (STA) as a receiver descrambles a value calculated through CRC calculation in step S9 and XOR operation in step S10 in FIG. 26, thereby obtaining the value of Short SSW Feedback (step S12).

The scrambling in step S11 in FIG. 25 can be performed by using a scrambling initial value that is different in each sSSW in the SLS procedure, for example. Accordingly, the number of types of the value of Short SSW Feedback can be increased and the probability of receiving a wrong value of Short SSW Feedback can be decreased. Thus, the communication apparatus is able to increase the probability of obtaining a correct value of Short SSW Feedback, for example, based on the majority decision logic.

Another Method for Calculating Value of Short SSW Feedback+FCS Field

Figure 27:
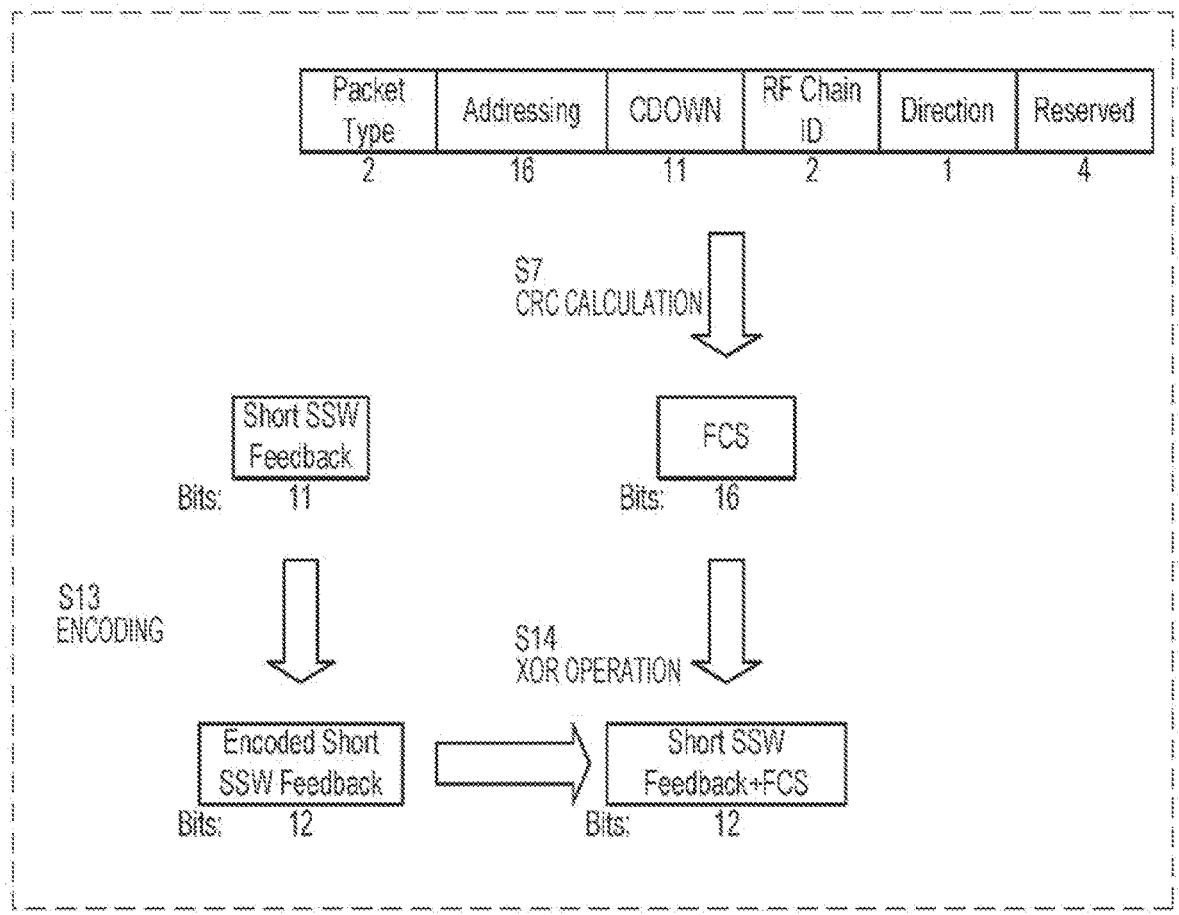
FIG. 27 is a diagram illustrating another method for calculating the value of the Short SSW Feedback+FCS field at the time of transmission according to the fourth embodiment.

FIG. 27 is a diagram illustrating another method for calculating the value of the Short SSW Feedback+FCS field at the time of transmission.

In FIG. 27, a communication apparatus (AP) encodes the value of Short SSW Feedback (step S13) before performing XOR operation in step S8 in FIG. 23 (step S14 in FIG. 27). The encoding is performed by, for example, multiplying the value of Short SSW Feedback by a predetermined prime number and obtaining a remainder (i.e., lower 12 bits). For example, the prime number is determined to be 599. In this case, the encoding in step S13 is expressed by the following expression.

Encoded Short *SSW* Feedback=(Short *SSW* Feedback×599)mod $2^{12}$

Since the prime number is used, a single value of Encoded Short SSW Feedback is determined for a single value of Short SSW Feedback.

As a result of performing encoding, the communication apparatus (AP) is more likely to be able to detect a bit error that has occurred in the Short SSW Feedback+FCS field. An example will be described below.

The Short SSW Feedback field is assigned with 11 bits. However, 0 to 2047 are not necessarily set, and a maximum value of the Short SSW Feedback field is determined by the number of sSSW frames transmitted in ISS (the number of sectors). Thus, if encoding is not applied (FIG. 23) and if upper bits of FCS include a bit error, the communication apparatus (STA) is able to determine that there is clearly a bit error if the value of Short SSW Feedback obtained at the time of reception exceeds the maximum value determined by the number of sSSW frames. Here, a bit error can be found when a bit error occurs in any bit of the entire sSSW frame and mismatch occurs in upper bits of FCS, as well as when a bit error occurs in the Short SSW Feedback+FCS field.

If encoding is not applied (FIG. 23) and if there is a bit error in lower bits of FCS, it is difficult for the communication apparatus (STA) to detect a bit error because the value of Short SSW Feedback obtained at the time of reception does not exceed the maximum value determined by the number of sSSW frames.

On the other hand, if encoding is performed (FIG. 27), the encoded value of Short SSW Feedback has a nearly uniform distribution regardless of the value of Short SSW Feedback. Thus, whether the value of Short SSW Feedback exceeds the maximum value if a bit error occurs in the sSSW frame does not depend on the position where a bit error has occurred. The communication apparatus (STA) is able to detect a bit error by using the maximum value of Short SSW Feedback at a constant probability even in a situation where an error is likely to occur at a specific bit due to the configuration of LDPC coding performed when generating a PHY frame and the relationship between the data pattern of the sSSW frame and CRC.

A value coprime to $2^{12}$ (i.e., an arbitrary odd number) may be used instead of a prime number. Also in this case, a single value of Encoded Short SSW Feedback is determined for a single value of Short SSW Feedback.

As an encoding method, CRC, parity bit addition, or the like may be used.

In the fourth embodiment, the undetected error probability is significantly lower than in the sSSW frame according to IEEE 802.11-16/0416r01 Short SSW Format for 11ay. This will be described in detail below.

In the sSSW frame according to IEEE 802.11-16/0416r01 Short SSW Format for 11ay, 4 bits are assigned to the FCS field. In the case of using 4-bit CRC, the undetected error probability is about $\frac{1}{16}$ with respect to the number of error frames.

On the other hand, in the communication apparatus according to the fourth embodiment, 12 bits are assigned to the Short SSW Feedback+FCS field. In ISS, the value of Short SSW Feedback is 0, and thus the same error detection ability as in the case of adding 12-bit CRC is obtained. Thus, the undetected error probability is about $\frac{1}{4096}$ with respect to the number of error frames.

In RSS, the undetected error probability depends on a possible maximum value of Short SSW Feedback. For example, in a case where the maximum value of Short SSW Feedback is up to about 100 to 200, which is assumed in typical use, the undetected error probability is about $\frac{1}{2000}$ with respect to the number of error frames.

For example, when the maximum value of Short SSW Feedback is 2047, the undetected error probability is $\frac{1}{2}$ with respect to the number of error frames. However, the communication apparatus (STA) is able to decrease the probability in accordance with the number of sSSW frames that have been received. For example, if the communication apparatus (STA) have received four frames, the undetected error probability is $\frac{1}{16}$ (fourth power of $\frac{1}{2}$) by using the majority decision logic. As described above, in many cases, the communication apparatus according to this embodiment is able to decrease the undetected error probability compared with that in the sSSW frame according to IEEE 802.11-16/0416r01 Short SSW Format for 11ay.

In the fourth embodiment, the communication apparatus performs XOR operation on the calculated FCS value and the value of Short SSW Feedback before transmission, and is thus able to reduce the frame length compared with the SSW frame according to the related art and to obtain a high error detection ability.

In addition, in the fourth embodiment, the communication apparatus performs XOR operation on the calculated FCS value and the calculated value of Short SSW Feedback before transmission, and is thus able to reduce the number of bits required for the FCS field and to acquire more reserved bits. The reserved bits can be used to expand functions in the future, and thus various functions can be implemented by using sSSW frames.

In addition, in accordance with the reduced bits required for the FCS field, the length of the sSSW frame may be further reduced. Accordingly, the time required for SLS can be shortened, radio resources can be effectively used (more data can be transmitted), the power consumption can be reduced, and high-speed tracking of beamforming can be realized in a mobile environment.

Fifth Embodiment

Mutual Operation Between Two Communication Apparatuses

Figure 28:
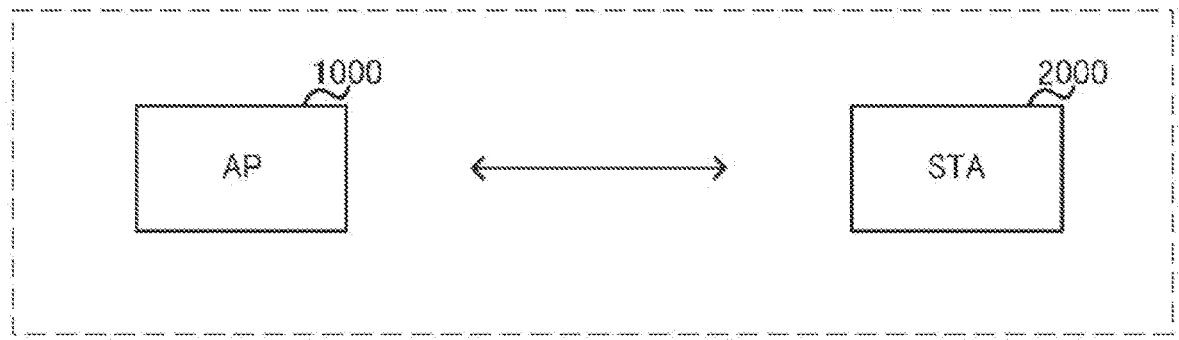
FIG. 28 is a diagram illustrating a mutual operation in the case of using a plurality of communication apparatuses according to a fifth embodiment.

FIG. 28 is a diagram illustrating a mutual operation in a case where a plurality of communication apparatuses are used in a fifth embodiment. A communication apparatus 1000 is an access point (AP), and a communication apparatus 2000 is a non-AP STA (not an access point). At the starting point of the procedure and during the procedure, (i.e., before S103 in FIG. 29), the two communication apparatuses are not associated with each other.

Figure 29:
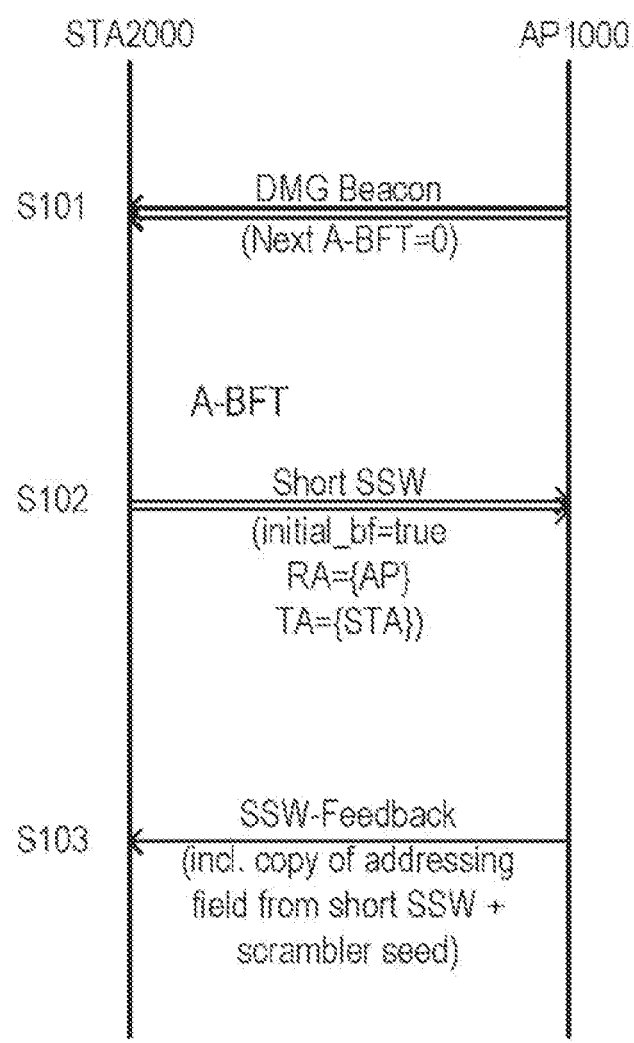
FIG. 29 is a diagram illustrating a procedure in which an AP and an STA perform SLS according to the fifth embodiment.

FIG. 29 is a diagram illustrating a procedure in which the AP 1000 and the STA 2000 perform SLS. First, the AP 1000 transmits a DMG Beacon frame. At this time, the Next A-BFT field in the DMG Beacon frame is set to 0. That is, A-BFT is scheduled after the DMG Beacon frame, and thus the STA may transmit SSW frames related to RSS by using A-BFT (step S101).

The frame transmitted by the AP 1000 in step S101 is a DMG Beacon frame, and thus the destination thereof is not specified. That is, the frame is broadcast information. Thus, in step S101, it is difficult for the AP 1000 to know in advance which STA will respond.

In response to the DMG Beacon frame, the STA 2000 transmits sSSW frames related to RSS by using the time slot of A-BFT (step S102). FIG. 30 is a diagram illustrating the format of the sSSW frame. In FIG. 30, the sSSW frame includes an Initial BF field. In the case of transmitting RSS by using the slot of A-BFT in response to the DMG Beacon frame, the STA 2000 performs transmission by setting the Initial BF field to 1.

That is, in the sSSW frame, the Initial BF field is set to 1 (true) in the case of performing SLS between communication apparatuses in which connection has not been established. The case where connection has not been established is, for example, a case where association has not been performed. Another example of the case where connection has not been established is a case where transmission and reception of a PHY packet has never been performed between the communication apparatuses. In the Addressing field, a hash value calculated based on RA, TA, and Scramble Initialization is set as described in the first embodiment. Here, the STA 2000 has already received the DMG Beacon frame and is thus able to set RA (TA is its address and is thus can be set) (step S102).

In step S102, the AP 1000 receives sSSW frames. The AP 1000 has not been associated with the STA 2000 and thus does not have the corresponding Addressing value in an address table. However, the received sSSW frame has the Initial BF field, and thus the AP 1000 determines that the AP 1000 needs to respond.

After receiving an sSSW frame for which a response is required and receiving an sSSW frame in which the CDOWN field is 0 (or after an estimated reception timing), the AP 1000 transmits an SSW-Feedback frame to the STA 2000. At this time point, the AP 1000 does not know the MAC address of the STA 2000.

Thus, the AP 1000 sets, in the RA field of the SSW-Feedback frame, the Addressing value received in step S102 and a seed value used for scrambling (for example, Scrambler Initialization described in the first embodiment), and transmits the SSW-Feedback frame.

Figure 31:
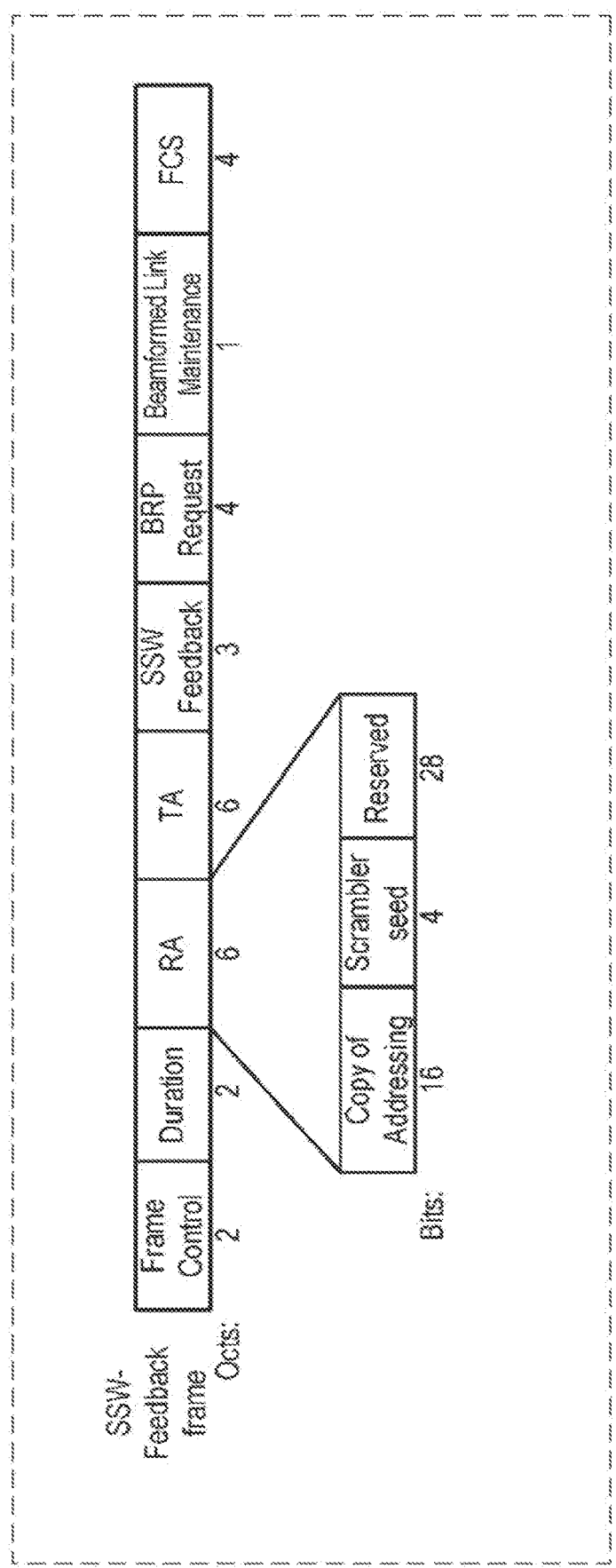
FIG. 31 is a diagram illustrating the format of an SSW-Feedback frame according to the fifth embodiment.

FIG. 31 is a diagram illustrating the format of the SSW-Feedback frame. The SSW-Feedback frame in FIG. 31 has the same field configuration as that of the SSW-Feedback frame defined by the 11ad standard, that is, includes a Frame Control field, a Duration field, an RA field, a TA field, an SSW Feedback field, a BRP Request field, a Beamformed Link Maintenance field, and an FCS field. The RA field includes three subfields unlike in the 11ad standard: a Copy of Addressing field, a Scrambler seed field, and a Reserved field.

In the sSSW frames transmitted in step S102, the seed of scrambling is changed in each sSSW frame. Thus, the AP 1000 gives notice about the seed used in the sSSW frame indicated by the SSW Feedback field of the SSW-Feedback frame and the corresponding Addressing value (step S103). That is, the AP 1000 stores the Addressing value in the Copy of Addressing subfield of the SSW-Feedback frame illustrated in FIG. 31 and stores the seed value in the Scrambler seed subfield.

In a case where a CDOWN value is used as the seed of scrambling of addressing as in the second embodiment, embedding the seed in the RA field of the SSW-Feedback frame and transmitting it can be omitted, and the AP 1000 only needs to transmit an Addressing value. This is because the CDOWN value of a selected sSSW frame is indicated in the SSW Feedback field of the SSW-Feedback frame. Also in this case, as an Addressing value, the value of the received sSSW frame (i.e., the Addressing value scrambled by the corresponding CDOWN value) is put in the RA field and transmitted.

In step S102, an sSSW frame is transmitted with the Initial BF field being set to 1 (true). Thus, there is a possibility that an access point other than the AP 1000 may respond to the STA 2000 in step S103. This can be prevented by using the following first to third methods.

First Method

Each AP transmits an SSW-Feedback frame in response to receipt of an sSSW frame in which the Initial BF field is set to 1 in the slot period of A-BFT set by the AP.

Second Method

Figure 32:
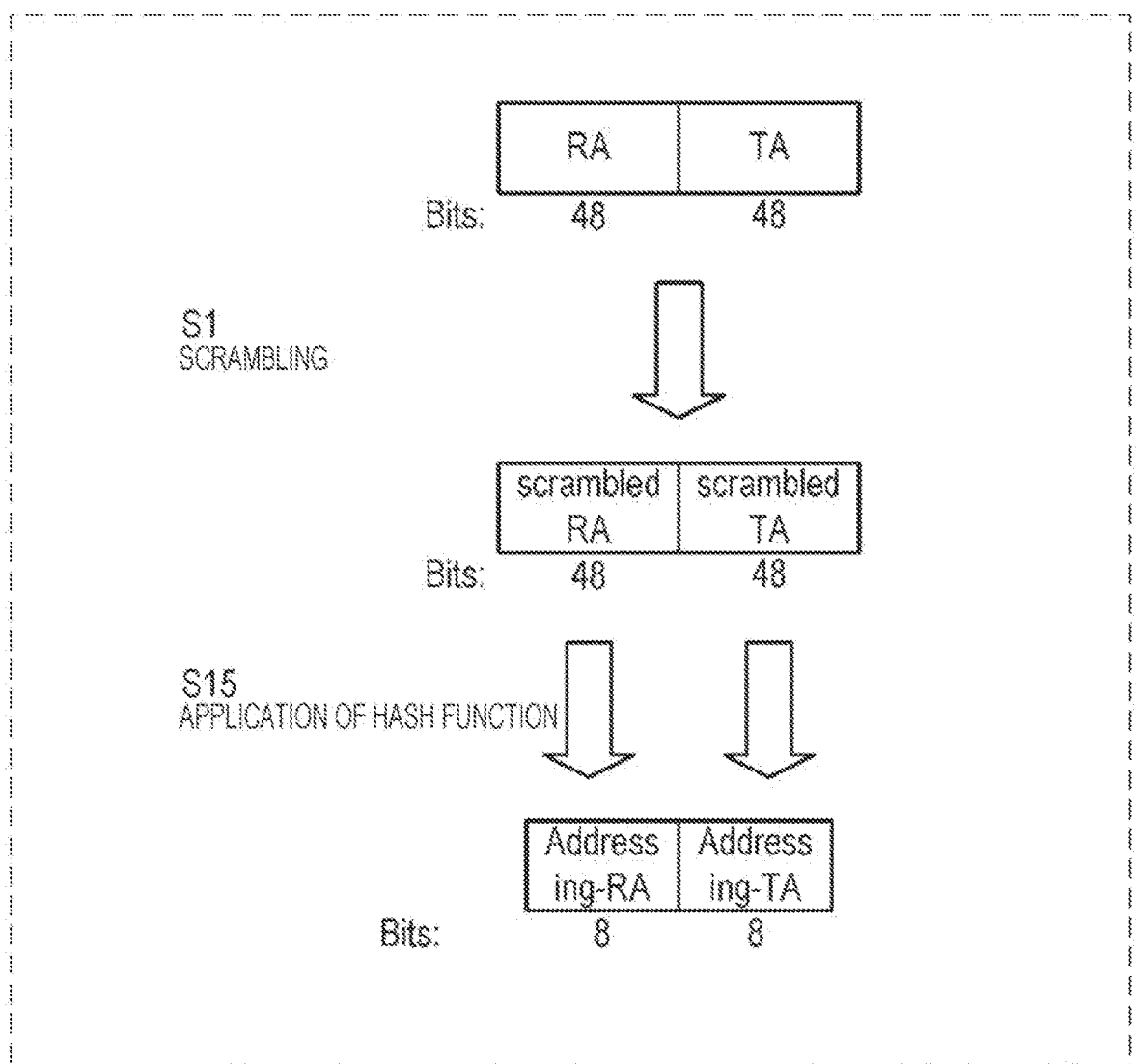
FIG. 32 is a diagram illustrating another calculation procedure of an Addressing field included in the sSSW frame according to the fifth embodiment.

In step S102, the STA 2000 separately applies a hash function to RA and TA, as illustrated in FIG. 32. Accordingly, each AP that has received an sSSW frame examines Addressing-RA to determine whether the sSSW frames is addressed to the AP. FIG. 32 is a diagram illustrating another calculation procedure of the Addressing field included in the sSSW frame.

Third Method

In response to receipt of an sSSW frame in the slot period of A-BFT set by the AP, each AP transmits an SSW-Feedback frame as a response by using the SSW-Feedback frame format in FIG. 31 regardless of the received Addressing value. In this method, an effect similar to that in the first method can be obtained and it is not necessary to use the Initial BF field. Thus, the same format of the sSSW frame as that in FIG. 5 can be used.

According to the fifth embodiment, an sSSW frame is transmitted by adding an Initial BF bit in accordance with DMG Beacon. Thus, even if the communication apparatus as a destination does not know the address of a source, SLS can be performed by using the sSSW frame, the frame length can be reduced, and the time required for SLS can be shortened.

According to the fifth embodiment, in response to receipt of a plurality of sSSW frames to which an Initial BF bit has been added, one of the sSSW frames is selected, and an SSW-Feedback frame is transmitted with the Addressing field included in the selected sSSW frame being included in the RA field of the SSW-Feedback frame. Thus, even if the communication apparatus as a destination does not know the address of a source, SLS can be performed by using the sSSW frame, the frame length can be reduced, and the time required for SLS can be shortened.

Sixth Embodiment

Mutual Operation Between Two Communication Apparatuses

Figure 33:
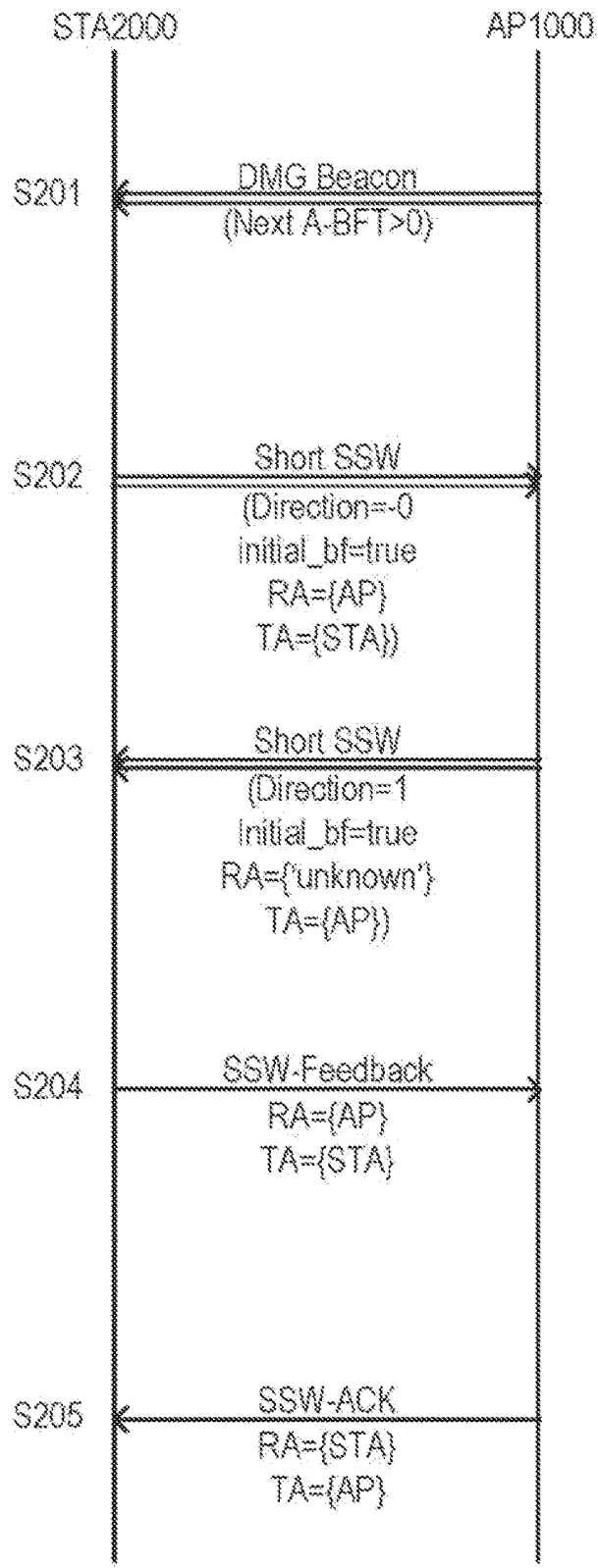
FIG. 33 is a diagram illustrating a procedure in which an AP and an STA perform SLS according to a sixth embodiment.

FIG. 33 is a diagram illustrating a procedure in which the AP 1000 and the STA 2000 perform SLS. FIG. 33 illustrates, unlike FIG. 29, a case where the STA 2000 receives a DMG Beacon frame in which the Next A-BFT field has a value that is not 0. Thus, the STA 2000 does not perform RSS using the slot of A-BFT, and thus the STA 2000 serves as an initiator and starts an SLS procedure by using DTI.

First, the AP 1000 transmits a DMG Beacon frame. In the DMG Beacon frame, the Next A-BFT field is set to a value other than 0. That is, A-BFT is not scheduled after the DMG Beacon frame, and thus the STA does not transmit SSW frames related to RSS by using A-BFT (step S201).

Subsequently, the STA 2000 starts SLS with the STA 2000 being an initiator in DTI. First, the STA 2000 transmits sSSW frames related to ISS (step S202).

In step S202, the STA 2000 has not established a connection with the AP 1000 (i.e., the MAC address of the STA 2000 is unknown in the AP 1000), and thus transmits sSSW frames by setting the Initial BF field to 1 (true). At this time, the STA 2000 sets the Direction field to 0 indicating that the frame is transmitted from the initiator to the responder. In addition, the STA 2000 sets the MAC address of the AP 1000 obtained from the DMG Beacon frame to RA, sets the MAC address of the STA 2000 to TA, and performs scrambling and application of a hash function as in the first embodiment, thereby calculating the value of the Addressing field.

In response to the sSSW frames that have been received, the AP 1000 transmits sSSW frames related to RSS (step S203).

In step S203, the AP 1000 sets a predetermined value indicating "unknown" to RA, sets the MAC address of the AP 1000 to TA, and performs scrambling and application of a hash function, thereby calculating the value of the Addressing field. In addition, the value of the Direction field is set to 1, which represents transmission from the responder to the initiator. In addition, the Initial BF field is set to 1 to represent SLS between communication apparatuses in which a connection has not been established.

The address representing "unknown" used as RA may be, for example, 00-00-00-00-00-00-00. The address representing "unknown" used as RA may be, for example, FF-FF-FF-FF-FF-FF.

In the sSSW frame in step S203, the value of the Initial BF field may be 0 (false). Since the address representing "unknown" is set to RA, the address need not be indicated in the Initial BF field. If the Direction field is set to 0 and if the Initial BF field is set to 1, it can be determined that the sSSW frame is an sSSW frame that is not a response to DMG Beacon. If the Direction field is set to 1 and if the Initial BF field is set to 1, it may be determined that the sSSW frame is an sSSW frame that is a response to DMG Beacon.

When the STA 2000 receives an sSSW frame transmitted in step S203, the STA 2000 determines whether the sSSW frame is addressed to the STA 2000. At this time, the STA 2000 is able to make a determination by having a table of Addressing values when RA is unknown as illustrated in FIG. 34, instead of the table illustrated in FIG. 16. That is, for example, if the value of SI of the received sSSW frame is 8 and if the received Addressing value is h581, the STA 2000 is able to determine that the Addressing value is an Addressing value in which RA is unknown and TA is AP1.

The STA 2000, which has transmitted the sSSW frame in which the Initial BF field is 1 in step S202, expects to receive an sSSW frame in which RA is unknown from the AP 1000 (AP1 in the address table). FIG. 34 is a diagram illustrating the correspondence between the MAC address of STA and Addressing values (hash values). Thus, instead of using the table illustrated in FIG. 34, an Addressing value may be calculated from the value of SI and the values of RA and TA, in which RA is set to unknown and TA is set to AP1 (the address of the AP 1000) every time an sSSW frame is received, and the calculated Addressing value may be compared with the received Addressing value.

To have the table illustrated in FIG. 34, it is necessary to create the table by calculating an Addressing value after receiving the address of the AP 1000 in step S201. The created table is used only for initial connection (while the address is unknown viewed from the AP 1000). To omit such calculation, in the case of transmitting an sSSW frame in response to the sSSW frame in which the value of Initial BF is set to 1 (i.e., the sSSW frame transmitted in step S202, for example) in step S203, the value of the scramble seed may be a predetermined value (for example, 1).

In the case of transmitting an sSSW frame in response to the sSSW frame in which the value of Initial BF is set to 1 (i.e., the sSSW frame transmitted in step S202, for example) in step S203, a value set to specific bits (for example, lower 4 bits) of the Short SSW Feedback field of the sSSW frame in which the value of Initial BF is set to 1 may be used as the value of the scramble seed.

After receiving the sSSW frame having an Addressing value in which RA is unknown and TA is AP1, the STA 2000 transmits an SSW-Feedback frame (step S204).

Since the STA 2000 knows the MAC address of the AP 1000, the STA 2000 sets the address of the AP 1000 to RA, sets the address of the STA 2000 to TA, and transmits the SSW-Feedback frame.

The AP 1000 receives the SSW-Feedback frame and then transmits an SSW-ACK frame. Accordingly, the SLS procedure ends (step S205).

In the SSW-Feedback frame, the address of the STA 2000 is stored as TA. Thus, the AP 1000 is able to know the address of the STA 2000. Thus, the AP 1000 sets the address of the STA 2000 to RA and the address of the AP 1000 to TA, and then transmits the SSW-ACK frame.

The AP 1000 calculates an Addressing value from the actual values of RA and TA received in step S204, and compares the calculated Addressing value with the Addressing value received in step S202. If the Addressing values match, the AP 1000 may transmit the SSW-ACK frame.

In step S202, the sSSW frame is transmitted with the Initial BF field being set to 1. Thus, in step S203, there is a possibility that an access point or STA other than the AP 1000 may respond to the STA 2000. This can be prevented by using the following first to fourth methods.

First Method

In step S202, the STA 2000 transmits an sSSW frame in which the lower 11 bits of the MAC address of the AP 1000 are set in the SSW-Feedback field. The AP that has received the sSSW frame responds in step S203 if the lower 11 bits of the MAC address of the AP matches the value set in the SSW-Feedback field.

Second Method

In step S202, the STA 2000 separately applies a hash function to RA and TA, as illustrated in FIG. 32. Accordingly, each AP that has received the sSSW frame is able to determine whether the sSSW frame is addressed to the AP by examining Addressing-RA.

Third Method

In step S202, the STA 2000 sets the MAC address of the AP 1000 to both RA and TA, performs scrambling and calculation of a hash function to calculate an Addressing value, and transmits an sSSW frame. The AP 1000 receives the sSSW frame, sets the MAC address of the AP 1000 to both RA and TA, and performs comparison with an Addressing value calculated through scrambling and calculation of a hash function. If the Addressing values match, the AP 1000 determines that the sSSW frame is addressed to the AP 1000 and responds in step S203.

Fourth Method

In step S202, the STA 2000 sets target type information, indicating which of AP, PCP, and STA is the address, to any 2 bits of the SSW-Feedback field of the sSSW frame. In the case of transmitting an sSSW frame to the AP 1000, the STA 2000 sets the target type information to a value representing the AP. Accordingly, none but the AP respond, and thus a situation can be prevented from occurring where an unintended STA responds.

In the following embodiments, a similar effect can be obtained even if an access point (AP) is replaced with a personal basic service set control point (PCP). The PCP is an STA that controls peer-to-peer communication in the 11ad standard.

The first to fourth methods may be used alone or in combination with one another.

According to the sixth embodiment, an STA that is not associated transmits an sSSW frame by adding an Initial BF bit. Thus, even if the communication apparatus as a destination does not know the address of a source, SLS can be performed by using the sSSW frame, the frame length can be reduced, and the time required for SLS can be shortened.

According to the sixth embodiment, when an AP receives a plurality of sSSW frames in which the Direction field is set to 0 and an Initial BF bit is added, the AP selects one of the sSSW frames and performs RSS by using an sSSW frame including an Addressing value in which RA is set to the bit string representing an unknown address. Thus, even if the communication apparatus as a destination does not know the address of a source, SLS can be performed by using the sSSW frame, the frame length can be reduced, and the time required for SLS can be shortened.

Seventh Embodiment

Mutual Operation Between Two Communication Apparatuses

Figure 35:
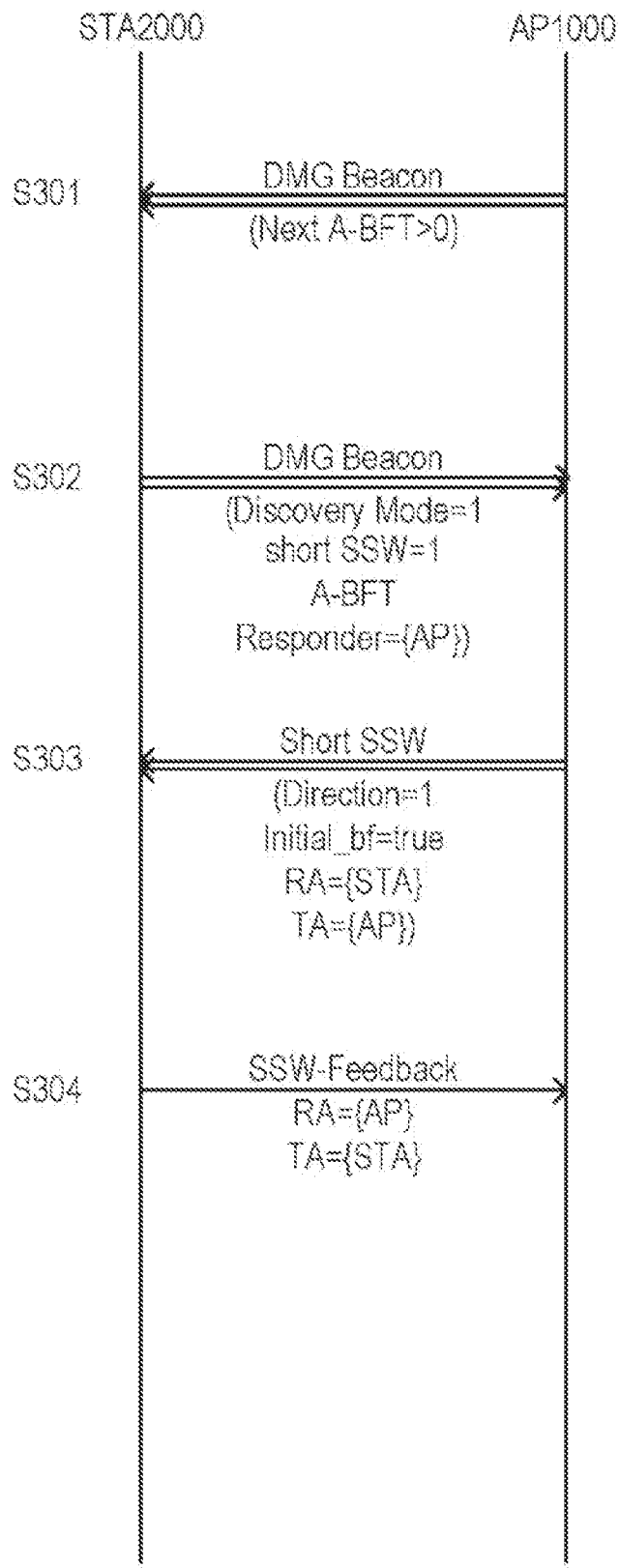
FIG. 35 is a diagram illustrating a procedure in which an AP and an STA perform SLS according to a seventh embodiment.

FIG. 35 is a diagram illustrating another procedure in which the AP 1000 and the STA 2000 perform SLS. FIG. 35 illustrates a case where, as in FIG. 33, the STA 2000 receives a DMG Beacon frame in which the Next A-BFT field has a value that is not 0. With reference to FIG. 35, a description will be given of another method (different from the method in FIG. 33) in which the STA 2000 starts SLS.

First, the AP 1000 transmits a DMG Beacon frame. At this time, the Next A-BFT field in the DMG Beacon frame is set to a value other than 0. That is, A-BFT is not scheduled after the DMG Beacon frame, and thus the STA does not transmit SSW frames related to RSS by using A-BFT (step S301).

The STA 2000 transmits a DMG Beacon frame (step S302).

In step S302, the STA 2000 sets the Discovery Mode field to 1, thereby clearly indicating that the STA that does not belong to the BSS is transmitting the DMG Beacon frame. In addition, the STA 2000 sets the MAC address of the AP 1000 received in step S301 to A-BFT Responder. In addition, the DMG Beacon includes a field indicating that the STA 2000 supports Short SSW. For example, the field may be included in reserved bits of the Beacon Interval Control field or in an optional portion of Beacon Body.

The AP 1000 that has received the DMG Beacon transmits sSSW frames related to RSS (step S303).

In step S303, the sSSW frames related to RSS are transmitted. Since the DMG Beacon transmitted in step S302 includes the MAC address of the STA 2000, the AP 1000 sets the address of the STA 2000 to RA, sets the address of the AP 1000 to TA, and calculates an Addressing value by performing scrambling and applying a hash function as in the first embodiment. Since the connection between the AP 1000 and the STA 2000 has not been established, the Initial BF field is set to 1 (true).

RA, that is, the MAC address of the STA 2000, is known in the AP 1000, and thus the Initial BF field may be set to 0 (false).

The STA 2000 that has received the sSSW frames as RSS transmits SSW-Feedback (step S304).

Since the STA 2000 knows the MAC address of the AP 1000 in step S301, and thus the STA 2000 sets the MAC address of the AP 1000 to RA and the MAC address of the STA 2000 to TA and transmits SSW-Feedback in step S304.

According to the seventh embodiment, an STA that is not associated sets the Discovery Mode field to 1, sets the A-BFT Responder field to the MAC address of an AP, sets the field for supporting the sSSW frame to 1, and transmits the sSSW frame. Thus, even if the communication apparatus as a destination does not know the address of a source, SLS can be performed by using the sSSW frame, the frame length can be reduced, and the time required for SLS can be shortened.

Eighth Embodiment

In an eighth embodiment, a description will be given of another configuration of an sSSW frame.

Figure 36:
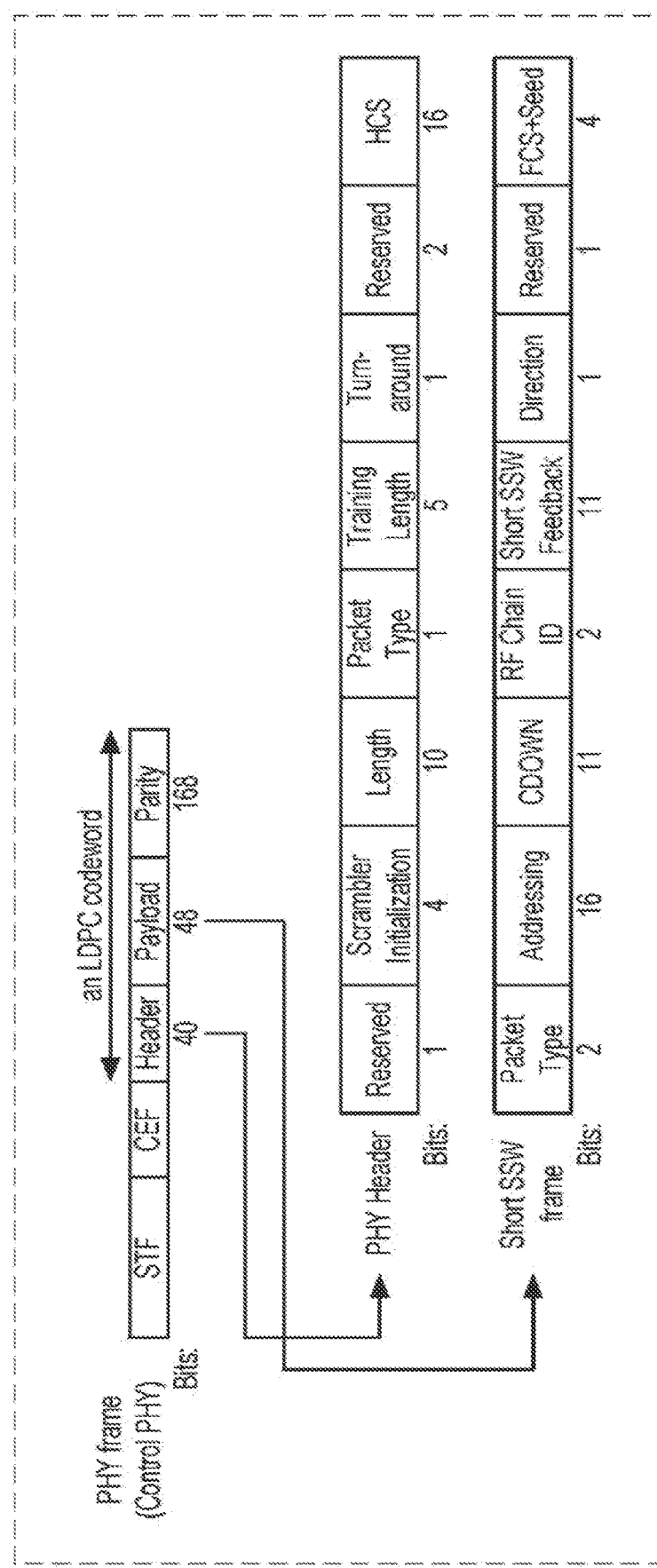
FIG. 36 is a diagram illustrating the configuration of an sSSW frame according to an eighth embodiment.

FIG. 36 illustrates the configuration of an sSSW frame according to the eighth embodiment. Compared with the sSSW frame in FIG. 5, the sSSW frame in FIG. 36 does not include an FCS field but includes an FCS+Seed field. In the first embodiment, the communication apparatus 100 uses the value of the Scrambler Initialization (SI) field of the PHY header as a seed of scrambling for calculating the Addressing field (FIG. 6). In contrast, the communication apparatus 100 according to the eighth embodiment uses an arbitrary value as a seed of scrambling. The arbitrary value used for scrambling is added as an FCS+Seed field to the sSSW frame. Thus, a communication apparatus (STA) that has received the sSSW frame is able to obtain RA and TA.

Transmission Operation of Communication Apparatus

Figure 37:
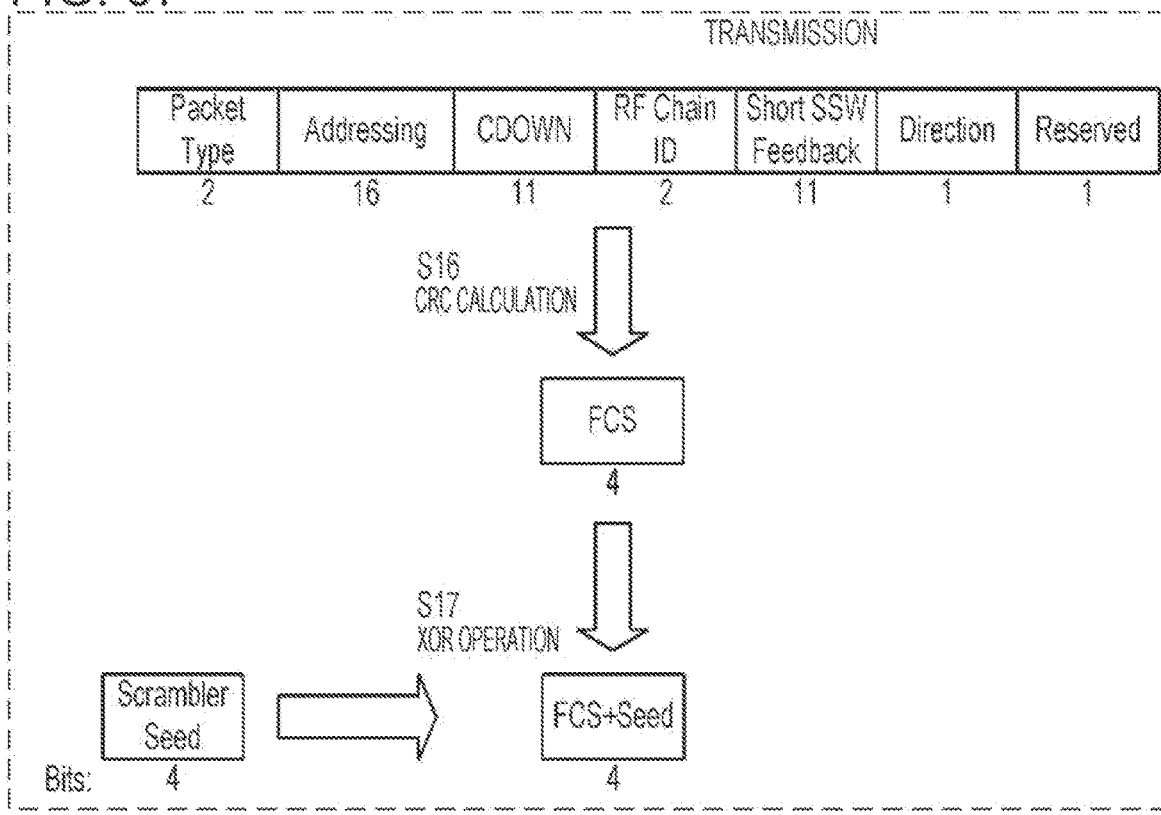
FIG. 37 is a diagram illustrating a method for calculating the value of an FCS+Seed field at the time of transmission according to the eighth embodiment.

FIG. 37 is a diagram illustrating a method for calculating the value of the FCS+Seed field at the time of transmission.

As in the first or second embodiment, a communication apparatus (AP) scrambles RA and TA (step S1), applies a hash function, and calculates a hash value of addressing (step S2).

In step S1, the value of the SI field of the PHY header is used as a seed of scrambling in the first embodiment, and the CDOWN value of the sSSW frame is used as a seed of scrambling in the second embodiment. In contrast, in this embodiment, an arbitrary value is used as a seed of scrambling.

Subsequently, the communication apparatus (AP) calculates 4-bit CRC for the entire portion except the FCS+Seed field in the sSSW frame. The calculated CRC is called Frame check sequence (FCS) (step S16).

Subsequently, the communication apparatus (AP) performs XOR operation between the arbitrary value of the seed of scrambling (scrambler seed) used for calculating addressing and the FCS value (step S17). The communication apparatus (AP) sets the value obtained through the XOR operation in the FCS+Seed field and transmits it.

Reception Operation of Communication Apparatus

Figure 38:
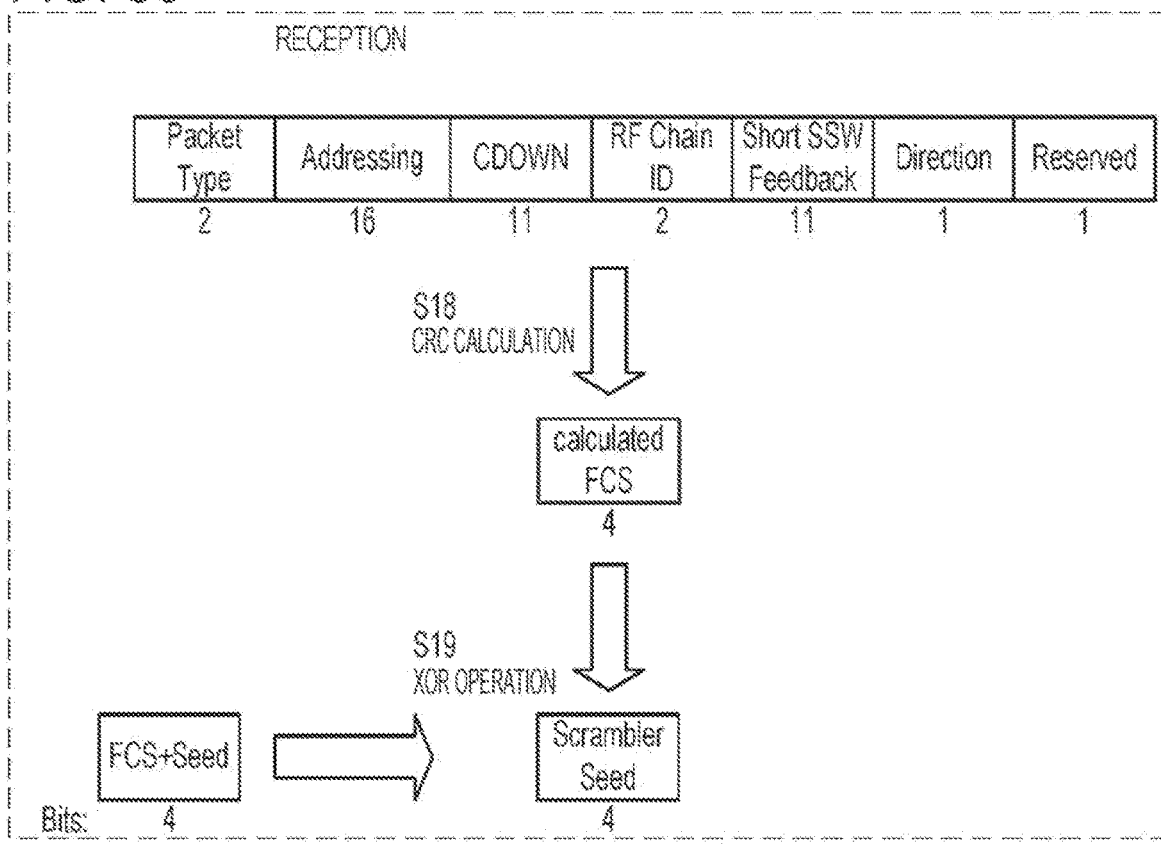
FIG. 38 is a diagram illustrating processing of receiving the value of the FCS+Seed field according to the eighth embodiment.

FIG. 38 is a diagram illustrating processing of receiving the value of the Addressing+FCS field.

First, a communication apparatus (STA) that has received the sSSW frame calculates 4-bit CRC from the entire portion except the FCS+Seed field in the received sSSW frame (step S18). The calculated CRC is called "calculated FCS".

The communication apparatus (STA) that has received the sSSW frame performs XOR operation on the value of the calculated FCS and the received value of the FCS+Seed field and obtains a value of a scrambler seed (step S19).

The communication apparatus (STA) that has received the sSSW frame determines whether the sSSW frame is addressed to the STA by using the received Addressing value and the value of the scrambler seed obtained in step S19 and by using, as in the third embodiment, the obtained Addressing value and any of the address tables illustrated in FIGS. 13 to 16. As described above, in the case of using any of the address tables illustrated in FIGS. 13 to 16, the communication apparatus (STA) that has received the sSSW frame refers to the column corresponding to the value of the scrambler seed.

If the sSSW frame includes a bit error and if an incorrect scrambler seed is obtained in step S19, the column in the address table that is referred to does not include the same value as the received Addressing value. Thus, the received sSSW frame can be determined to be a frame not addressed to the communication apparatus (STA) or a frame including a bit error, and accordingly the communication apparatus (STA) that has received the sSSW frame discards the received sSSW frame.

That is, in FIG. 37, the communication apparatus 100 performs XOR operation on an arbitrarily selected value of the scrambler seed and transmits the sSSW frame. Thus, as in the first embodiment, the search range of an address table can be narrowed down and the probability of a hash collision can be decreased.

The communication apparatus 100 selects a value of the scrambler seed that varies in each sSSW frame, and is thus able to prevent a hash collision in all sSSW frames in ISS.

The communication apparatus 100 may select the same value of the scrambler seed in all sSSW frames in ISS or may select a value of the scrambler seed that varies in each SLS. This method is effective in a case where SLS fails if a hash collision occurs in any one of sSSW frames in ISS. Accordingly, it is possible to increase the probability of succeeding in the SLS procedure without causing a hash collision in SLS.

In the eighth embodiment, the communication apparatus 100 performs XOR operation on a calculated FCS value and an arbitrarily selected value of the scrambler seed. Thus, the search range of an address table can be narrowed down and the probability of a hash collision can be decreased.

Ninth Embodiment

In this embodiment, a description will be given of a configuration different from that of the scrambler illustrated in FIGS. 7 and 8 according to the first embodiment. FIGS. 39 and 40 are diagrams illustrating another configuration of the scrambler. That is, in the operation for performing scrambling, addition of an integer is used instead of XOR operation and bit shift.

A scrambler 3900 illustrated in FIG. 39 includes a splitter 3901, adders 3902a to 3902L, and a combiner 3903.

The splitter 3901 splits a scrambler input in units of octets (8 bits). If the scrambler input is 96 bits, the splitter 3901 outputs first to twelfth octets.

The adder 3902a adds the first octet and a scrambler seed. The adder 3902a may calculate a remainder of division by 256 (mod 256) so that the value obtained through addition has 8 bits.

The adders 3902b to 3902L perform addition and remainder on the second to twelfth octets, respectively, like the adder 3902a. In FIG. 39, the scrambler 3900 includes twelve adders, but the number of adders may be increased or decreased in accordance with the number of bits of a scrambler input.

The combiner 3903 combines pieces of data output from the twelve adders 3902a to 3902L, thereby generating a 96-bit scrambler output data.

In FIG. 39, the scrambler seed may be Scrambler Initialization described in another embodiment. In FIG. 39, the scrambler seed may be the CDOWN value described in another embodiment.

FIG. 41 is a diagram illustrating an example of a result of calculation using the scrambler illustrated in FIG. 39. A first pair of RA and TA (first address) is 2B-A7-D2-7E-4D-08-4B-B7-23-B2-AA-02 in hexadecimal form. The CRC for the first pair of RA and TA (first CRC) is 8465 in hexadecimal form. A second pair of RA and TA (second address) is 72-76-B7-68-E0-A7-94-DC-36-CA-7F-D9 in hexadecimal form. The CRC for the second pair of RA and TA (second CRC) is 8465 in hexadecimal form. The first CRC and the second CRC have the same value. That is, if scrambling illustrated in FIG. 39 is not performed, the first address and the second address cause a hash collision. In the row where the seed is 0 in FIG. 41, the addresses and CRC in a case where scrambling is not performed are shown.

In the rows where the seed is 1 to F in FIG. 41, a result of applying the scrambler in FIG. 39 by changing the seed value from 1 to F (hexadecimal form) is shown. For example, in a case where the scrambler is applied with the seed value being 1, the value of the first address is changed to 2C-A8-D3-7F-4E-09-4C-B8-24-B3-AB-03. That is, the seed value "1" is added to the first octet "2B" of the first address to obtain "2C", and also "1" is added to the second octet "A7" to obtain "A8". The same applies to the other octets. In addition, the CRC for the address after the scrambler has been applied is 4F39.

Likewise, in a case where the scrambler is applied to the second address with the seed value being 1, the value of the second address is 73-77-B8-69-E1-A8-95-DD-37-CB-80-DA. The CRC is C446. In this way, with the scrambling in FIG. 39 being applied to the two addresses having a hash collision (having the same CRC), different CRC values can be obtained for the two addresses, and accordingly a hash collision can be prevented.

The communication apparatus 100 may transmit the first CRC value in FIG. 41 while changing the seed value in each sSSW frame in the ISS period in FIG. 4. The first CRC value and the second CRC value in FIG. 41 conflict with each other when the seed value is "0" and do not conflict with each other when the seed value is "1" to "F (15 in decimal form)". In this way, the communication apparatus 100 is able to decrease the probability of a hash collision by using the scrambler in FIG. 39.

In addition, in the ISS period in FIG. 4, the communication apparatus 100 receives a plurality of sSSW frames in which the Addressing field stores the first CRC in FIG. 41, and compares the received Addressing value with the address table (for example, FIG. 13) held by the communication apparatus 100, as in the first embodiment. Here, if the first address in FIG. 41 is included in the address table, the communication apparatus 100 determines that the Addressing value of the received sSSW frame corresponds to the first address. If the address table includes the second address in FIG. 41 and if the communication apparatus 100 receives an sSSW frame having an Addressing value whose seed corresponds to "0", the communication apparatus 100 determines that the Addressing value corresponds to the second address.

In addition, in FIG. 41, an address conflict occurs when the seed value is "0". Thus, if the communication apparatus 100 receives an sSSW frame having the seed value "0", the communication apparatus 100 may wrongly determine that the seed value corresponds to the second address, although the seed value actually corresponds to the first address. In addition, it is difficult for the communication apparatus 100 to know the seed value that causes an address conflict.

Thus, the communication apparatus 100 receives sSSW frames having at least two different seed values, performs comparison with the address table in accordance with each seed value, and responds if a result of the comparison is "match".

That is, if the communication apparatus 100 receives sSSW frames corresponding to a plurality of different seed values, the communication apparatus 100 may determine that an addressing comparison result is correct and may respond (for example, RSS for ISS or SSW-Feedback to RSS). Accordingly, the communication apparatus 100 is able to decrease the probability of wrong responding due to an address conflict.

The communication apparatus 100 is able to decrease the probability of conflict between a plurality of seeds by using the scrambler in FIG. 39, and responds when receiving sSSW frames corresponding to a plurality of different seed values. Accordingly, the probability of wrong responding due to an address conflict can be decreased.

FIG. 40 is a diagram illustrating another configuration of the scrambler. A scrambler 4000 illustrated in FIG. 40 includes the splitter 3901, the adders 3902a to 3902L, the combiner 3903, and a multiplier 3904. The same elements as those in FIG. 39 are denoted by the same reference numerals, and the description thereof is not given.

The multiplier 3904 multiplies a scrambler seed by a constant "13". The multiplier 3904 may use another predetermined constant instead of "13".

The scrambler 4000 multiplies the scrambler seed by the constant, thereby being able to change the bit pattern of the output of the adders 3902a to 3902L. Accordingly, a scrambling effect can be enhanced.

A description will be given of a reason the constant "13" is multiplied by the multiplier 3904. To change the bit pattern of the output of the adders 3902a to 3902L, it is desirable that a sequence of 0 and a sequence of 1 be shorter when the product of the scrambler seed and the constant is expressed in binary form. For example, the constant "13" is "1101" in binary form. That is, "1101" is formed of two sequences of value "1" (11 and 1) and 0 interposed therebetween. In such a value, a sequence of value "0" and a sequence of value "1" are short compared to, for example, 15 ("1111" in binary form, including four sequential "1") or 1 ("0001" in binary form, including three sequential "0").

In a case where the scrambler seed is "4", if the constant to be multiplied is "13", the product is "52" ("00110100" in binary form), and If the constant to be multiplied is "12", the product is "48" ("00110000" in binary form). In this way, in the constant "13" to be multiplied, there are two sequential "0" at maximum, whereas in the constant "12", there are four sequential "0" at maximum. In other words, the constant "13" includes a shorter sequence of "0" than the constant "12".

In a case where the product has the above-described feature, a carry may occur or may not occur as a result of addition in accordance with the value of octet data (X, which is another input to the adders 3902a to 3902L. Whether or not a carry occurs has an influence on the output result of hash (S2 in FIG. 6), and thus the probability of avoiding a hash collision increases. In other words, the communication apparatus 100 is able to enhance the scrambling effect by causing a carry in a result of addition of the value of octet data (X).

As the constant, "11" or "17" may be used.

The scrambler 4000 uses a prime number as a value to be multiplied by the scrambler seed. Thus, the bit pattern of the output of the adders 3902a to 3902L can be changed more significantly compared to the case of multiplying a number other than a prime number, and thus the scrambling effect can further be enhanced.

As described above, the communication apparatus 100 performs scrambling by adding a value based on the scrambler seed in units of octets. Accordingly, if a hash collision occurs in any sSSW frame in ISS or RSS, the communication apparatus 100 is able to avoid a hash collision by changing the scrambler seed. Thus, the communication apparatus 100 is able to avoid the occurrence of a collision in all sSSW frames in ISS or RSS.

In addition, the communication apparatus 100 performs scrambling by adding an integer in units of octets, and is thus able to significantly change the CRC value as a scrambler output and to avoid the occurrence of a collision in all sSSW frames in ISS or RSS.

Tenth Embodiment

First Configuration
Transmission Operation of Communication Apparatus

Figure 42:
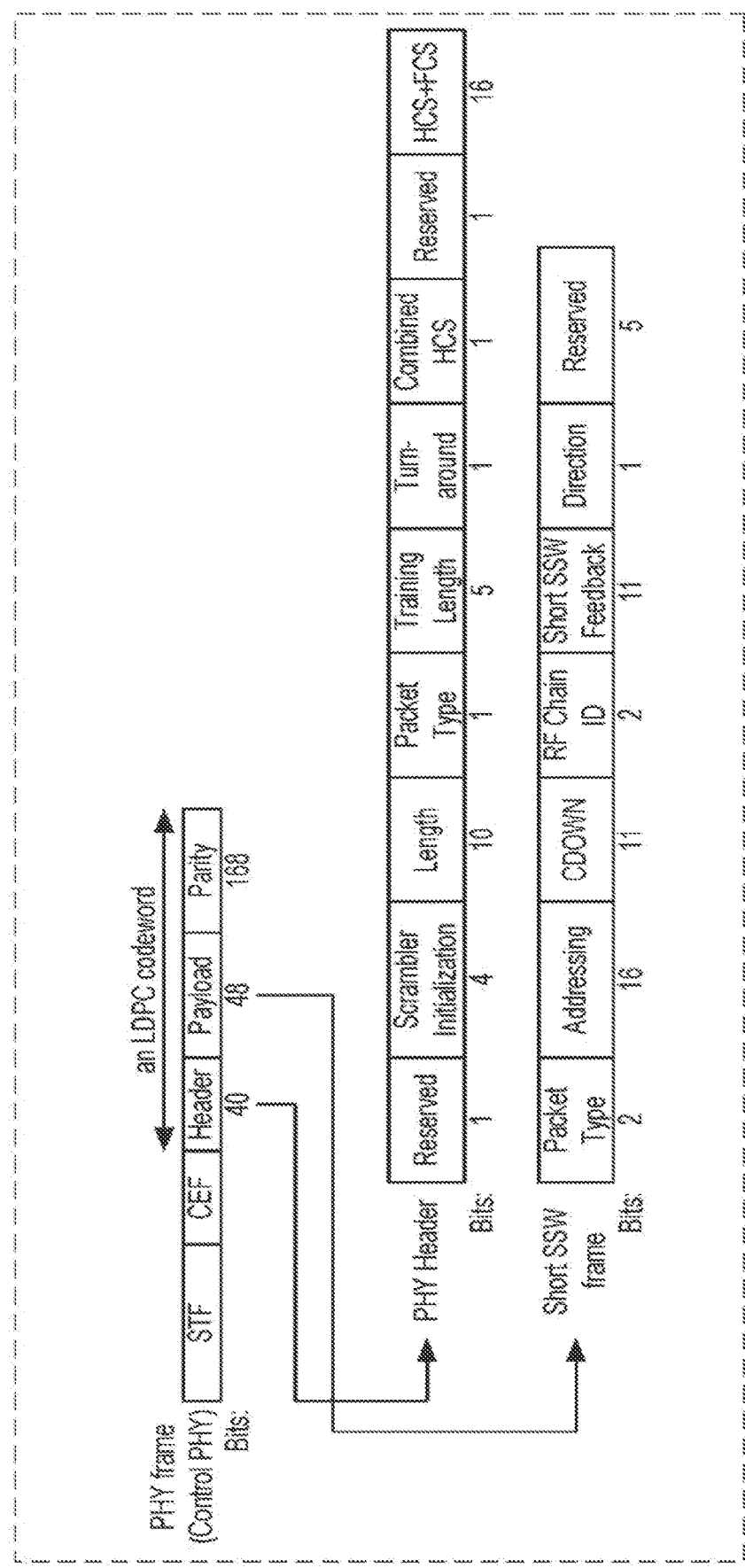
FIG. 42 is a diagram illustrating a first example configuration of a PHY frame according to a tenth embodiment.

FIG. 42 illustrates a first configuration of a PHY frame. In the PHY frame in FIG. 42, the PHY header does not include an HCS field but includes a Combined HCS field and an HCS+FCS field, compared with the PHY header in FIG. 5. In addition, in the PHY frame in FIG. 42, the sSSW frame does not include an FCS field compared with the sSSW frame in FIG. 5. The Reserved field has 5 bits, which is larger by 4 bits than that in FIG. 5.

Hereinafter, a description will be given of a case where a communication apparatus (AP) transmits sSSW frames and a communication apparatus (STA) receives the sSSW frames. The same applies to a case where the communication apparatus (STA) transmits sSSW frames and the communication apparatus (AP) receives the sSSW frames and a case where the communication apparatus (STA) transmits sSSW frames and a communication apparatus (STA) receives the sSSW frames.

Figure 43:
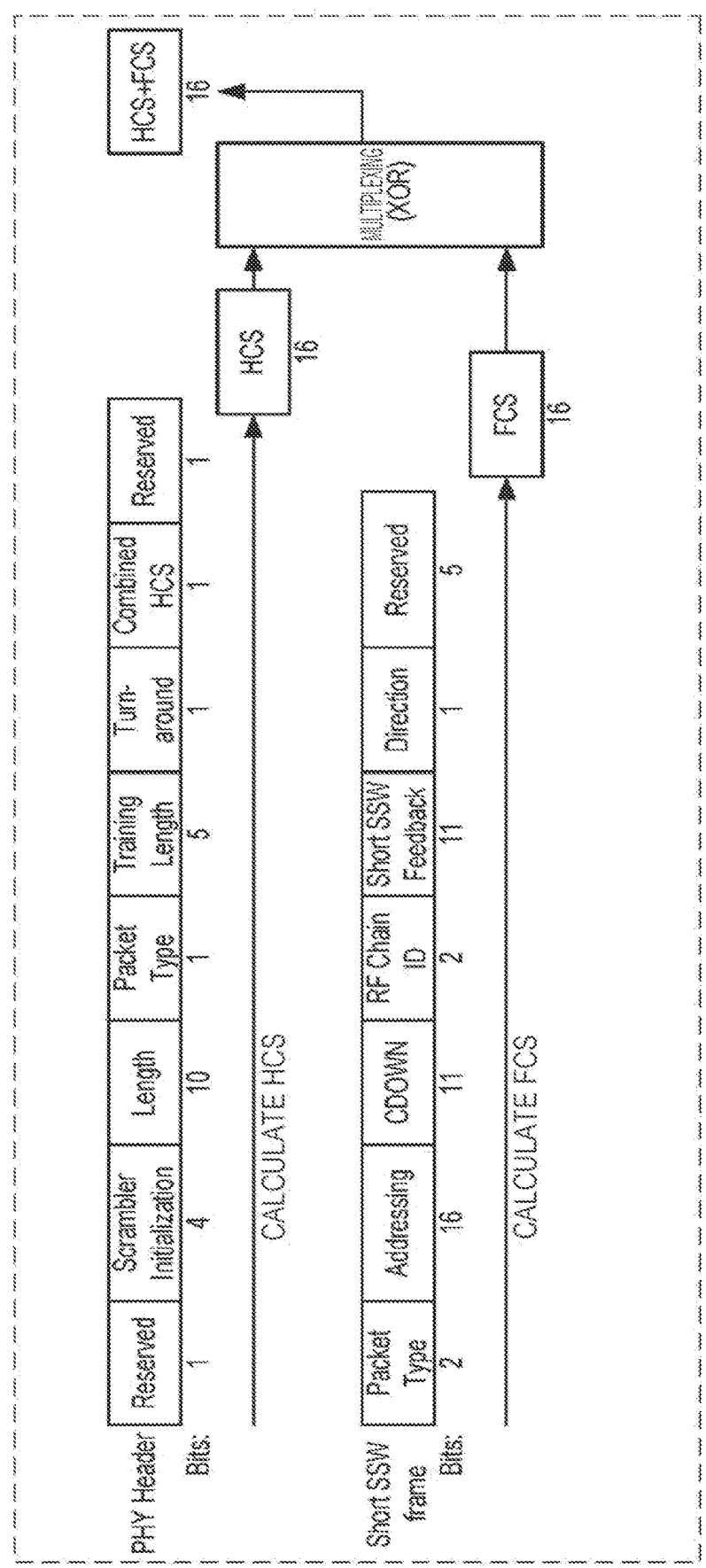
FIG. 43 is a diagram illustrating a method for calculating the value of an HCS+FCS field according to the tenth embodiment.

FIG. 43 is a diagram illustrating a method for calculating the value of the HCS+FCS field at the time of transmission. First, as in the first or second embodiment, the communication apparatus (AP) generates a portion except the HCS+FCS field of the PHY header and a Short SSW frame. At this time, the communication apparatus (AP) sets the Combined HCS field to 1.

Subsequently, the communication apparatus (AP) calculates 16-bit CRC for the entire portion except the HCS+FCS field in the PHY header in FIG. 43. The calculated CRC is called Header Check Sequence (HCS).

Subsequently, the communication apparatus (AP) calculates 16-bit CRC for the entire sSSW frame in FIG. 43. The calculated CRC is called Frame Check Sequence (FCS).

Subsequently, the communication apparatus (AP) performs XOR operation between the calculated HCS value and FCS value. The communication apparatus (AP) regards the value obtained through the XOR operation as the value of the HCS+FCS field in FIG. 43 and transmits it.

Reception Operation of Communication Apparatus

With reference to FIG. 43, a description will be given of a case where processing of receiving the value of the HCS+FCS field is performed similarly to transmission processing.

First, the communication apparatus (STA) that has received an sSSW frame calculates 16-bit CRC from all the portions except the HCS+FCS field in the received PHY header. The calculated CRC is called "calculated HCS".

Subsequently, the communication apparatus (STA) that has received the sSSW frame calculates 16-bit CRC from the entire sSSW frame that has been received. The calculated CRC is called "calculated FCS".

Subsequently, the communication apparatus (STA) that has received the sSSW frame calculates XOR of the calculated HCS and the calculated FCS if the value of the received Combined HCS bit is set to 1. The calculated value is called "calculated HCS+FCS".

If the value of the received HCS+FCS field matches the value of calculated HCS+FCS, the communication apparatus (STA) that has received the sSSW frame determines that neither the PHY header nor the sSSW frame includes a bit error and continues the processing of receiving sSSW frames.

If the value of the received HCS+FCS field does not match the value of calculated HCS+FCS, the communication apparatus (STA) that has received the sSSW frame determines that either or both of the PHY header and the sSSW frame includes a bit error and discards the received PHY frame.

If the value of the received Combined HCS bit is set to 0, the communication apparatus (STA) that has received the sSSW frame does not calculate calculated FCS. As in the 11ad standard according to the related art, the communication apparatus (STA) that has received the sSSW frame compares the calculated HCS with the received HCS.

In the frame configuration in FIG. 42, the communication apparatus (AP) includes the value of HCS+FCS in the PHY header when the value of Combined HCS is set to 1. When the value of Combined HCS is set to 0, the communication apparatus (AP) may include the value of HCS, not the value of HCS+FCS, in accordance with the 11ad standard according to the related art. That is, the communication apparatus (AP) may set the value of Combined HCS to 1 and include the value of HCS+FCS in the PHY header if the PHY frame includes an sSSW frame, and may set the value of Combined HCS to 0 and include the value of HCS in the PHY header if the PHY frame does not include an sSSW frame.

The communication apparatus (AP) may include the value of HCS+FCS in the PHY header if the value of the Length field is less than 14 and may include the value of HCS in the PHY header if the value of the Length field is 14 or more, instead of including the Combined HCS field in the PHY header. In FIG. 42, the Length field is 10, and thus the communication apparatus (AP) includes the value of HCS+FCS in the PHY header.

In the 11ad standard, it is defined that the value of Length is 14 or more in Control PHY. Thus, the communication apparatus (AP) may include the value of HCS in the PHY header in accordance with the 11ad standard if the value of Length is 14 or more, and may include the value of HCS+FCS different from the 11ad standard in the PHY header if the value of Length is less than 14. Accordingly, the communication apparatus (AP) is able to omit the Combined HCS field and is thus able to add 1 bit to the Reserved bit.

If a terminal compatible with the 11ad standard according to the related art (11ad terminal) receives the PHY frame in FIG. 42 in which the value of Combined HCS is set to 1, the terminal calculates a value of HCS in accordance with the 11ad standard. However, the value of the HCS+FCS field and the value of HCS are compared with each other, which do not match. Thus, the 11ad terminal determines that the sSSW frame is a packet having an HCS error and discards it. In this way, the PHY frame in FIG. 42 in which the value of Combined HCS is set to 1 is discarded from the 11ad terminal and thus does not have a negative influence on the 11ad terminal.

Second Configuration

Figure 44:
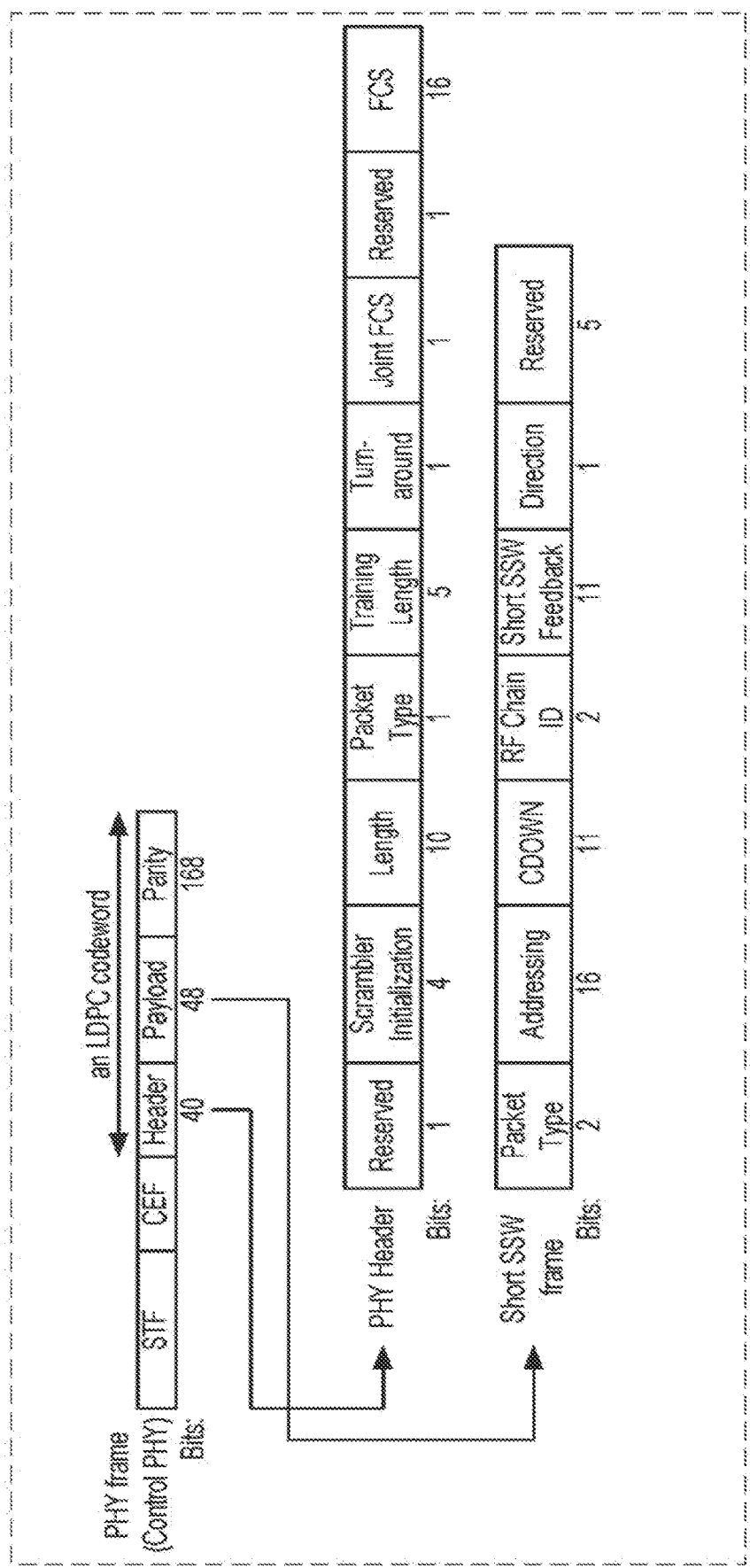
FIG. 44 is a diagram illustrating a second example configuration of the PHY frame according to the tenth embodiment.

FIG. 44 is a diagram illustrating a second configuration of a PHY frame. The PHY header in FIG. 44 includes, unlike the PHY header in FIG. 42, a Joint FCS field and an FCS field. The sSSW frame in FIG. 44 is similar to the sSSW frame in FIG. 42.

Transmission Operation of Communication Apparatus

Figure 45:
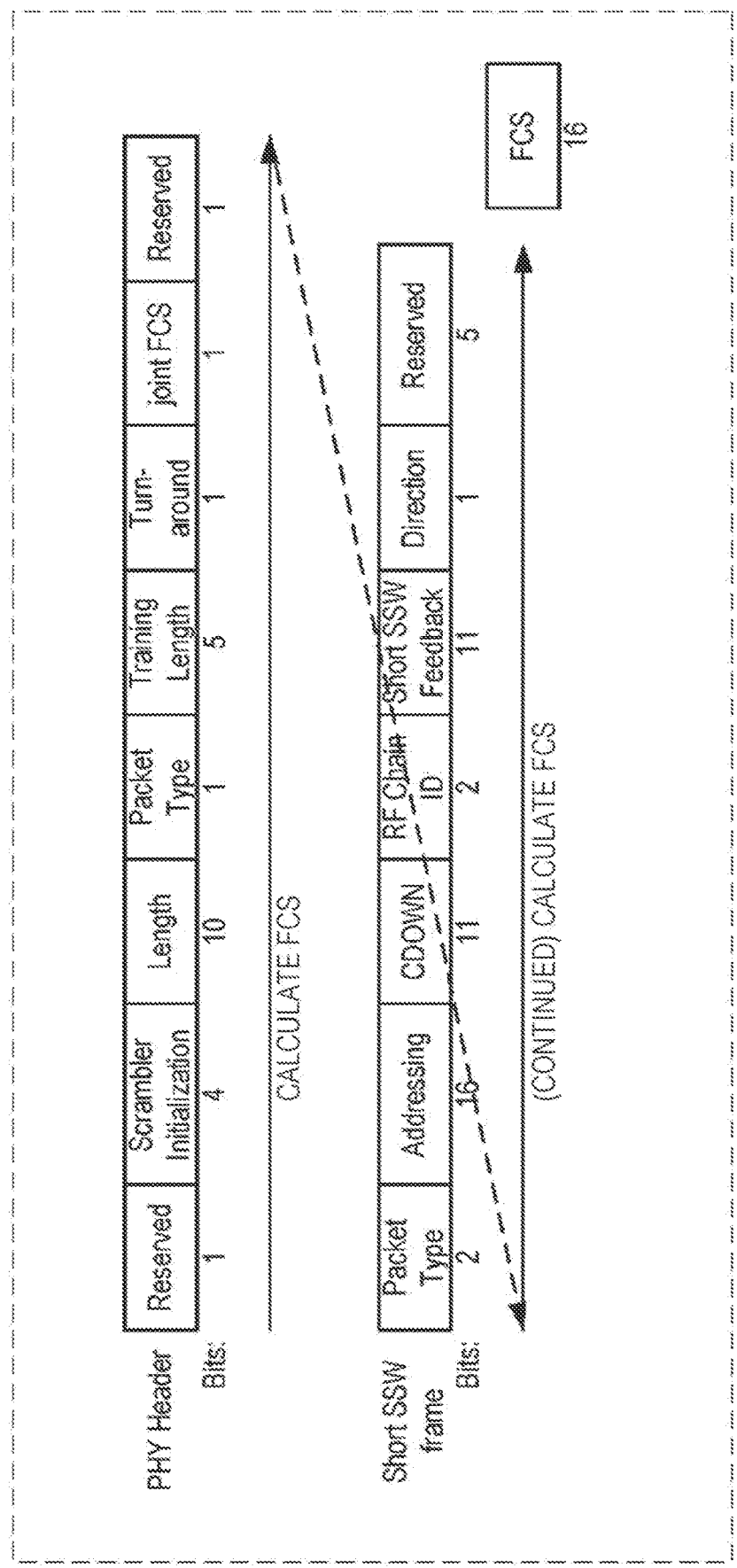
FIG. 45 is a diagram illustrating a method for calculating the value of the HCS+FCS field according to the tenth embodiment.

FIG. 45 is a diagram illustrating a method for calculating the value of the FCS field at the time of transmission. First, as in the first or second embodiment, the communication apparatus (AP) generates a portion except the HCS+FCS field of the PHY header and a Short SSW frame. At this time, the communication apparatus (AP) sets the Joint FCS field to 1.

Subsequently, the communication apparatus (AP) calculates 16-bit CRC for a data sequence obtained by combining a portion except the FCS field of the PHY header in FIG. 45 and the entire sSSW frame in FIG. 45. The communication apparatus (AP) transmits the PHY frame that includes the calculated CRC in the FCS field of the PHY header.

Reception Operation of Communication Apparatus

The communication apparatus (STA) that has received an sSSW frame calculates, if the value of the received Joint FCS bit is set to 1, 16-bit CRC for a data sequence obtained by combining the portion except the FCS field of the received PHY header and the entire sSSW frame that has been received. The communication apparatus (STA) compares the calculated CRC value with the value of the received FCS field, thereby determining whether a bit error is included in either or both of the PHY header and the sSSW frame.

If the value of the received Joint FCS bit is set to 0, the communication apparatus (STA) that has received the sSSW frame calculates 16-bit CRC for the portion except the FCS field of the received PHY header. This is similar to the HCS processing according to the 11ad standard.

The communication apparatus (AP) may include the value of FCS in the PHY header if the value of the Length field is less than 14 and may include the value of HCS in the PHY header if the value of the Length field is 14 or more, instead of including the Joint FCS field in the PHY header. In FIG.

44, the Length field is 10, and thus the communication apparatus (AP) includes the value of FCS in the PHY header.

In the 11ad standard, it is defined that the value of Length is 14 or more in Control PHY. Thus, the communication apparatus (AP) may include the value of HCS in the PHY header in accordance with the 11ad standard if the value of Length is 14 or more, and may include the value of FCS different from the 11ad standard in the PHY header if the value of Length is less than 14. Accordingly, the communication apparatus (AP) is able to omit the Joint FCS field and is thus able to add 1 bit to the Reserved bit.

In the first configuration of the tenth embodiment, the communication apparatus 100 includes the Combined HCS field in the PHY header, and performs XOR operation on the calculated HCS value and the calculated FCS value before transmission if the value of the Combined HCS field is set to 1. Thus, the frame length can be reduced and a high error detection ability can be obtained, compared with the SSW frame according to the related art.

In the first configuration of the tenth embodiment, the communication apparatus 100 performs XOR operation on the calculated HCS value and the calculated FCS value before transmission if the value of the Length field is less than 14. Thus, the frame length can be reduced and a high error detection ability can be obtained, compared with the SSW frame according to the related art.

In the second configuration of the tenth embodiment, the communication apparatus 100 includes the Joint FCS field in the PHY header, and if the value of the Joint FCS field is set to 1, the communication apparatus 100 calculates, before transmission, 16-bit CRC for a data sequence obtained by combining the portion except the FCS field of the PHY header and the entire sSSW frame that has been received. Thus, the frame length can be reduced and a high error detection ability can be obtained, compared with the SSW frame according to the related art.

In the second configuration of the tenth embodiment, if the value of the Length field is less than 14, the communication apparatus 100 calculates, before transmission, 16-bit CRC for a data sequence obtained by combining the portion except the FCS field of the PHY header and the entire sSSW frame that has been received. Thus, the frame length can be reduced and a high error detection ability can be obtained, compared with the SSW frame according to the related art.

The communication apparatus 100 may further reduce the length of the sSSW frame by decreasing the number of bits required for the FCS field. Accordingly, the communication apparatus 100 is able to shorten the time required for SLS, effectively use radio resources (transmit more data), reduce power consumption, and realize high-speed tracking of beamforming in a mobile environment.

Eleventh Embodiment

Figure 46:
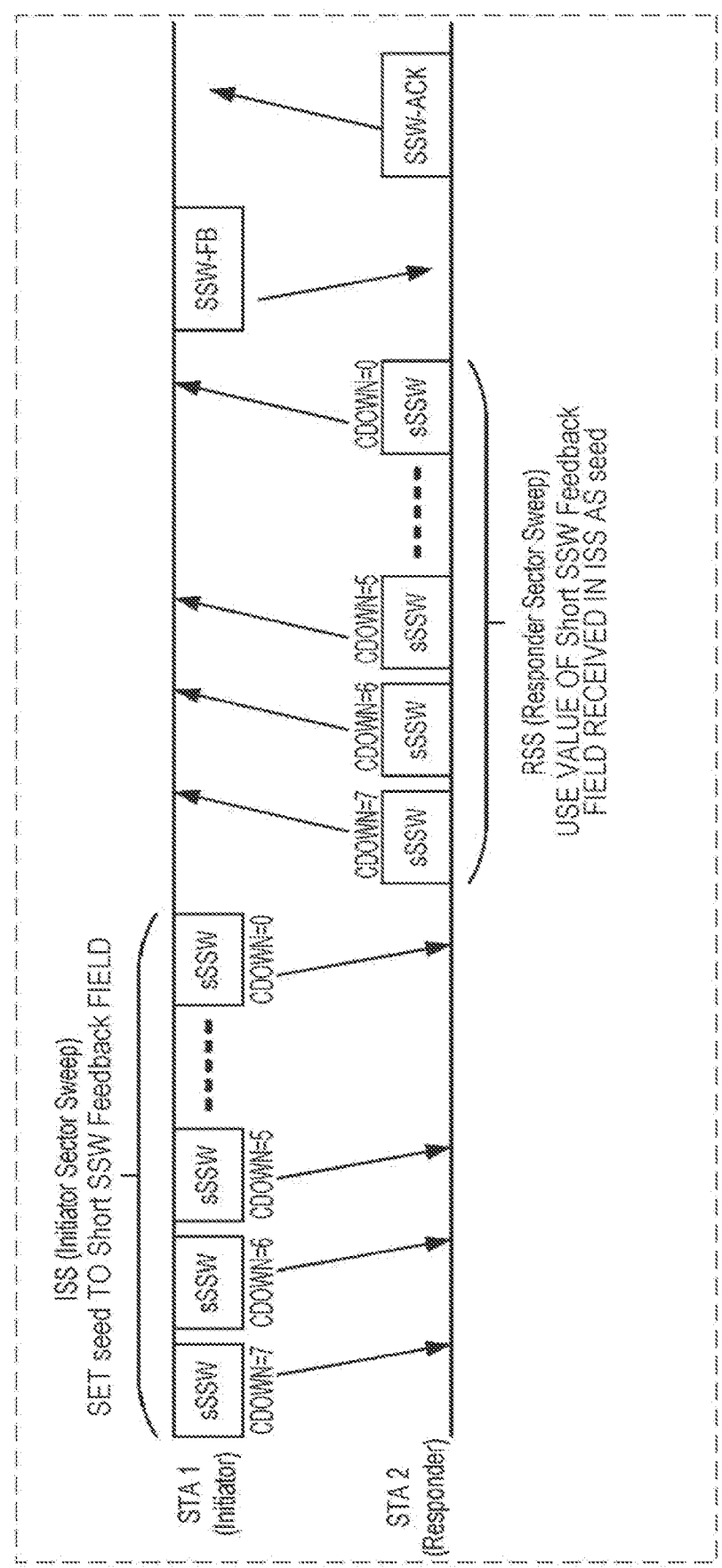
FIG. 46 is a diagram illustrating a seed notification method according to an eleventh embodiment.

In this embodiment, a notification method is used which is different from the seed notification method used in the scrambler illustrated in FIGS. 7 and 8 according to the first embodiment. FIG. 46 is a diagram illustrating a seed notification method. That is, in transmission processing of ISS, a communication apparatus (initiator) sets an arbitrary seed value in the Short SSW Feedback field illustrated in FIG. 5 instead of performing scrambling in accordance with the value of the Scrambler Initialization field (SI), and performs scrambling of addresses illustrated in FIGS. 7 and 8 in accordance with the set value.

In RSS, a communication apparatus (responder) performs scrambling of addresses illustrated in FIGS. 7 and 8 by using, as a seed, the value included in the Short SSW Feedback field of the sSSW frame received in ISS.

If an addressing conflict occurs during ISS or RSS, a plurality of terminals transmit RSS or SSW-FB and a packet collision occurs. Accordingly, it may be impossible to normally complete SLS.

If the communication apparatus serving as an initiator starts SLS and is not able to normally complete SLS, the communication apparatus may perform SLS again by changing the seed value set to the Short SSW Feedback field. By changing the seed value, an addressing conflict in the same terminal can be avoided, and the probability of normally completing SLS can be increased.

In the eleventh embodiment, unlike in the first embodiment, the value of SI is not used as a seed, which is effective when the same seed is used in all sSSW frames in ISS. In addition, the seed value used in RSS is designated by an initiator by using the Short SSW Feedback field. Thus, a situation can be prevented from occurring where the same seed as that when SLS is not normally completed is used by a responder, and the probability of normally completing SLS can be increased.

Twelfth Embodiment

In this embodiment, a seed value that is different from the seed used in the scrambler illustrated in FIGS. 7 and 8 according to the first embodiment is used.

Figure 47:
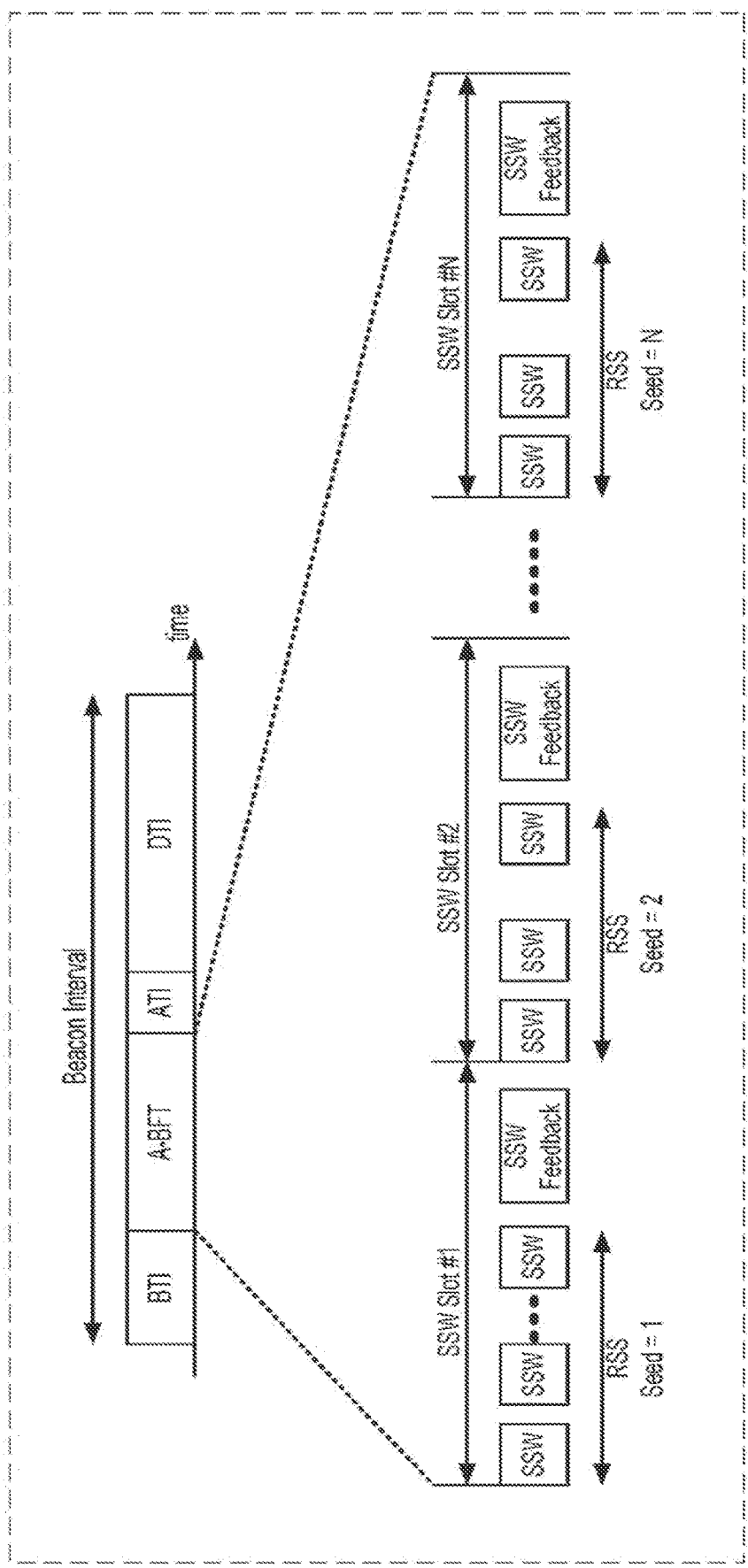
FIG. 47 is a diagram illustrating a seed notification method according to a twelfth embodiment.

FIG. 47 is a diagram illustrating a seed notification method. In the 11ad standard, a frame transmission timing is specified so as to adapt to scheduling by AP. The scheduling is performed within a period of time called "Beacon Interval". The Beacon Interval includes Beacon Transmission Interval (BTI), Association Beamforming Training (A-BFT), Announcement Transmission Interval (ATI), and Data Transfer Interval (DTI).

BTI is a period of time over which the AP transmits DMG Beacon. A-BFT is a period of time over which the STA that has received DMG Beacon is able to transmit a frame for beamforming training to the AP. That is, with use of BTI and A-BFT, SLS can be performed in which the AP serves as an initiator and the STA serves as a responder. ATI is used to transmit a frame including control information, such as an announcement frame, and may also be used for another application. DTI is used to transfer data. As in the sixth embodiment, beamforming training can be performed in the DTI period.

In FIG. 47, A-BFT is constituted by a plurality of SSW Slots. There may be a plurality of STAs that respond to DMG Beacon, and thus each STA is able to avoid a transmission collision with another STA by randomly selecting an SSW Slot in accordance with a certain rule. Each SSW Slot includes RSS and transmission of SSW Feedback. RSS includes transmission of a plurality of SSW frames in the 11ad standard. In this embodiment, sSSW frames may be used instead of SSW frames.

The communication apparatus (STA as a responder) performs scrambling of addresses illustrated in FIGS. 7 and 8 by using the number of the SSW Slot as a seed instead of the value of Scrambler Initialization, unlike in the first embodiment.

When an addressing collision occurs, SSW Feedback frames are transmitted from a plurality of APs, and a collision of SSW Feedback frames occurs in the STA. As a result, there is a possibility that the STA is unable to normally complete SLS. If it is impossible to normally complete SLS, the communication apparatus (STA as a responder) may perform RSS again by changing the SSW Slot to be used. The AP receives an sSSW frame in which the seed value has been changed due to the change of the SSW Slot. Accordingly, the STA is able to avoid an addressing conflict caused by the same AP and to increase the probability of normally completing SLS.

Thirteenth Embodiment

Mutual Operation Between Two Communication Apparatuses

Figure 48:
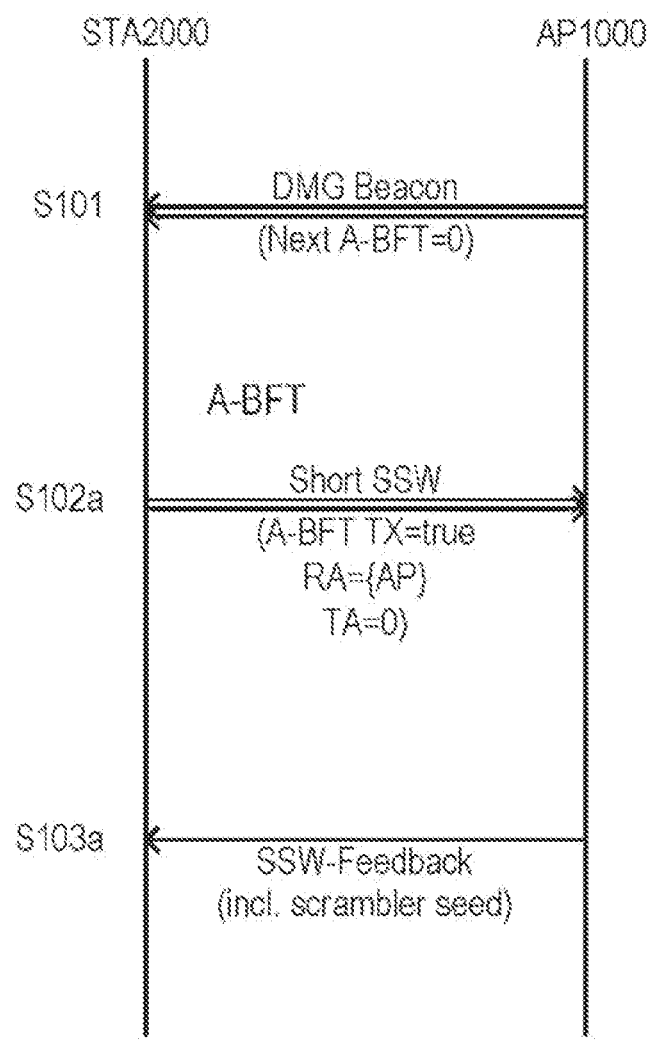
FIG. 48 is a diagram illustrating a procedure in which an AP and an STA perform SLS according to a thirteenth embodiment.

FIG. 48 is a diagram illustrating another procedure in which the AP 1000 and the STA 2000 perform SLS. FIG. 48 illustrates, like FIG. 29, a case where the STA 2000 receives a DMG Beacon frame in which the value of the Next A-BFT field is 0. A description will be given of another method (different from that in FIG. 29) in which the STA 2000 starts SLS, with reference to FIG. 48.

First, the AP 1000 transmits a DMG Beacon frame. At this time, the Next A-BFT field in the DMG Beacon frame is set to 0. That is, A-BFT is scheduled after the DMG Beacon frame, which indicates that the STA may transmit SSW frames related to RSS by using A-BFT (step S101).

The frame transmitted by the AP 1000 in step S101 is a DMG Beacon frame and thus the destination thereof is not specified. That is, the DMG Beacon frame is broadcast information. Thus, in step S101, it is difficult for the AP 1000 to know in advance which STA will respond.

In response to the DMG Beacon frame, the STA 2000 transmits sSSW frames related to RSS by using the time slot of A-BFT (step S102a). FIG. 49 is a diagram illustrating the format of the sSSW frame. In FIG. 49, the sSSW frame includes an A-BFT TX field. When transmitting RSS by using the slot of A-BFT to respond to the DMG Beacon frame, the STA 2000 sets the A-BFT TX field of the sSSW frame to 1 and transmits the sSSW frame.

As in the first embodiment, the STA 2000 sets, in the Addressing field of the sSSW frame, a hash value calculated based on RA, TA, and Scramble Initialization. Here, the STA 2000 sets a predetermined value (for example, 0) to TA and, since the DMG Beacon frame has already been received, sets the address of the AP to RA (step S102a).

The reason the STA 2000 sets a predetermined value (for example, 0) to TA in step S102a will be described. If the STA 2000 sets an original TA (i.e., the MAC address of the STA 2000), it is difficult for the AP 1000 that has received the sSSW frame including the calculated Addressing value to check the value of RA because the AP 1000 does not know the value of TA. In other words, it is possible for the AP 1000 to check the pair of RA and TA by using the Addressing value converted to a hash value, but it is difficult to check either of RA and TA.

The AP 1000 calculates in advance an Addressing value when the value of TA is set to 0 and the value of RA is set to the own MAC address. In step S102a, the AP 1000 receives an sSSW frame. The received sSSW frame includes the A-BFT TX field. Thus, the AP 1000 compares the Addressing value with the foregoing Addressing value calculated in advance. If both values match, the AP 1000 determines that it is necessary to respond.

After receiving an sSSW frame for which a response is required and receiving an sSSW frame in which the CDOWN field is 0 (or after an estimated reception timing), the AP 1000 transmits an SSW-Feedback frame to the STA 2000 (step S103a). At this time point, the AP 1000 does not know the MAC address of the STA 2000.

Thus, the AP 1000 includes the seed value used for scrambling in the RA field of the SSW-Feedback frame (for example, Scrambler Initialization according to the first embodiment) and transmits the SSW-Feedback frame.

Figure 50:
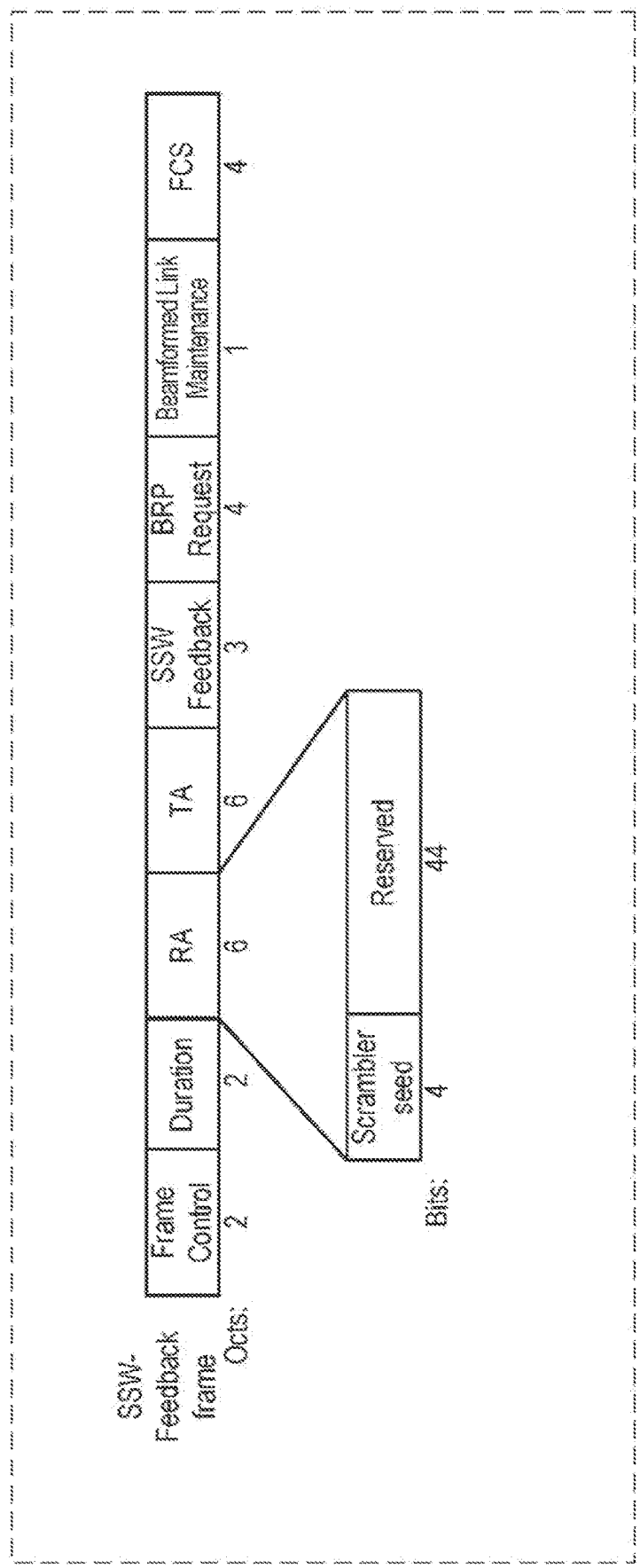
FIG. 50 is a diagram illustrating the format of an SSW-Feedback frame according to the thirteenth embodiment.

FIG. 50 is a diagram illustrating the format of the SSW-Feedback frame. The SSW-Feedback frame in FIG. 50 has the same field configuration as that of the SSW-Feedback frame defined in the 11ad standard. That is, the SSW-Feedback frame includes a Frame Control field, a Duration field, an RA field, a TA field, an SSW Feedback field, a BRP Request field, a Beamformed Link Maintenance field, and an FCS field. Note that the RA field includes two subfields unlike in the 11ad standard. That is, the RA field includes a Scrambler seed field and a Reserved field.

In the sSSW frames transmitted in step S102a, the seed of scrambling is changed in each sSSW frame or every time RSS is executed. Thus, the AP 1000 adds information representing the sSSW frame in the SSW Feedback field of the SSW-Feedback frame, so as to give notice about the seed value used in the sSSW frame corresponding to the Scrambler seed field of the SSW-Feedback frame (step S103a).

In step S103a, the STA 2000 receives the SSW-Feedback frame. If the combination of the seed included in the Scrambler seed field and the CDOWN value indicated by the value included in the SSW Feedback field (information representing the sSSW frame) is equal to the combination of the values transmitted in step S102a (the seed value used in the Addressing field and the value of the CDOWN field), the STA 2000 determines that the received SSW-Feedback frame has arrived a correct destination and determines that SLS has been normally completed.

A description will be given of, for example, a case where the combination of the seed value and CDOWN of the sSSW frame transmitted by the STA 2000 has the values shown in RSS of STA2 in FIG. 4.

In the SSW-Feedback frame transmitted by the AP 1000, if the seed value indicated by the Scrambler seed field is 3 and if the CDOWN value indicated by the SSW Feedback field is 7, the combination of the values matches one of the sSSW frames transmitted by the STA 2000 (SI=3, CDOWN=7), and thus the STA 2000 determines that the SSW-Feedback frame is addressed to the STA 2000.

In the SSW-Feedback frame transmitted by the AP 1000, if the seed value indicated by the Scrambler seed field is 6 and if the CDOWN value indicated by the SSW Feedback field is 8, the combination of the values does not match any of the sSSW frames transmitted by the STA 2000, and thus the STA 2000 determines that the SSW-Feedback frame is not addressed to the STA 2000.

Figure 51:
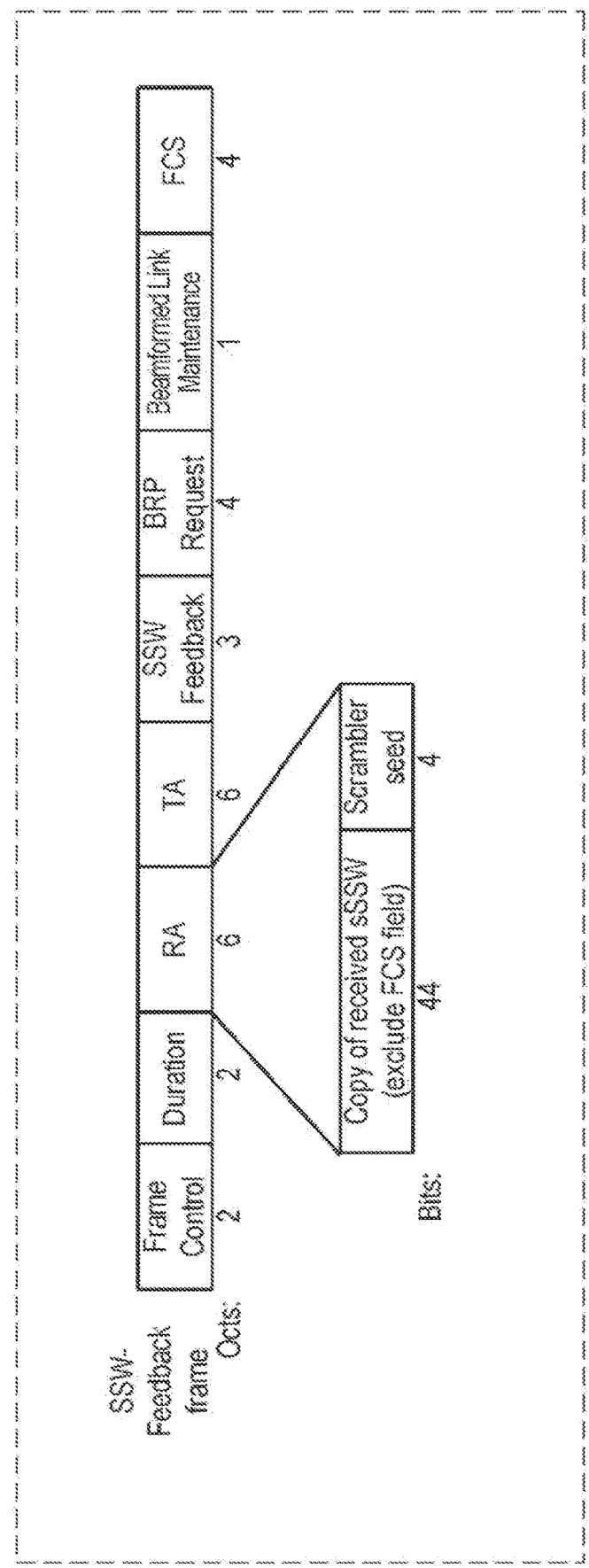
FIG. 51 is a diagram illustrating another format of the SSW-Feedback frame according to the thirteenth embodiment.

FIG. 51 is a diagram illustrating another format of the SSW-Feedback frame. The RA field includes two subfields, that is, a Copy of received sSSW field and a Reserved field.

The Copy of received sSSW field includes the values of all fields, except the FCS field, of the sSSW frame indicated by the SSW Feedback field.

In step S103a, the STA 2000 receives the SSW-Feedback frame. The STA 2000 determines whether the value included in the Copy of received sSSW field matches the value of one of the sSSW frames transmitted in step S102a. If the values match, the STA 2000 determines that the received SSW-Feedback frame is addressed to a correct destination (addressed to the STA 2000) and determines that SLS has been normally completed.

In addition, the STA 2000 may check the seed as in the case of the format in FIG. 50. However, an effect similar to that of check of the seed can be obtained by checking the Addressing field included in the Copy of received sSSW field, and thus the STA 2000 does not need to check the seed.

In FIG. 51, the Copy of received sSSW field includes all fields except FCS of the sSSW field, but does not necessarily include all fields. For example, it is clear that a value indicating an sSSW frame is set in the Packet Type field, and thus the Copy of received sSSW field does not need to include the Packet Type field.

On the other hand, in a case where the Copy of received sSSW field includes the Short SSW Feedback field and an RF Chain ID, the STA 2000 is able to determine, at a higher probability, whether the SSW-Feedback frame is addressed to the STA 2000.

Alternatively, the RA field of the SSW-Feedback frame does not include the Copy of received sSSW field but may include the FCS value of the sSSW frame indicated by the value included in the SSW Feedback field. By checking the FCS value, the STA 2000 is able to determine whether the SSW-Feedback frame is addressed to the STA 2000, as in the case of checking the Copy of received sSSW field.

In step S102a, unlike in the first, second, and thirteenth embodiments, the STA 2000 may calculate an Addressing value by using an arbitrary seed separately from the SI, CDOWN value, and SSW Slot number. At this time, the AP 1000 needs to compare the received Addressing value with an address table by considering all possible seed values. However, the RA value is the MAC address of the AP 1000 and the TA value is a predetermined value (for example, 0). Thus, there is one combination of addresses, and the Addressing value can be easily searched for. For example, if there are sixteen possible seed values, the AP 1000 may search for sixteen Addressing values.

According to the thirteenth embodiment, the STA that is not associated transmits an sSSW frame including an Addressing value calculated by setting TA to a specified value. Thus, even if the communication apparatus as a destination does not know the address of a source, SLS can be performed by using the sSSW frame, the frame length can be reduced, and the time required for SLS can be shortened.

According to the thirteenth embodiment, when the AP receives sSSW frames transmitted from an STA that is not associated, the AP selects one of the sSSW frames, includes the seed value used for calculating the addressing field included in the selected sSSW frame in the RA field of an SSW-Feedback frame, and transmits the SSW-Feedback frame. Thus, even if the communication apparatus as a destination does not know the address of a source, SLS can be performed by using the sSSW frame, the frame length can be reduced, and the time required for SLS can be shortened.

According to the thirteenth embodiment, when the AP receives sSSW frames transmitted from an STA that is not associated, the AP selects one of the sSSW frames, includes the value of the selected sSSW frame in the RA field of an SSW-Feedback frame, and transmits the SSW-Feedback frame. Thus, even if the communication apparatus as a destination does not know the address of a source, SLS can be performed by using the sSSW frame, the frame length can be reduced, and the time required for SLS can be shortened.

According to the thirteenth embodiment, when the AP receives sSSW frames transmitted from an STA that is not associated, the AP selects one of the sSSW frames, includes the FCS value of the selected sSSW frame in the RA field of an SSW-Feedback frame, and transmits the SSW-Feedback frame. Thus, even if the communication apparatus as a destination does not know the address of a source, SLS can be performed by using the sSSW frame, the frame length can be reduced, and the time required for SLS can be shortened.

Fourteenth Embodiment

Mutual Operation Between Two Communication Apparatuses

Figure 52:
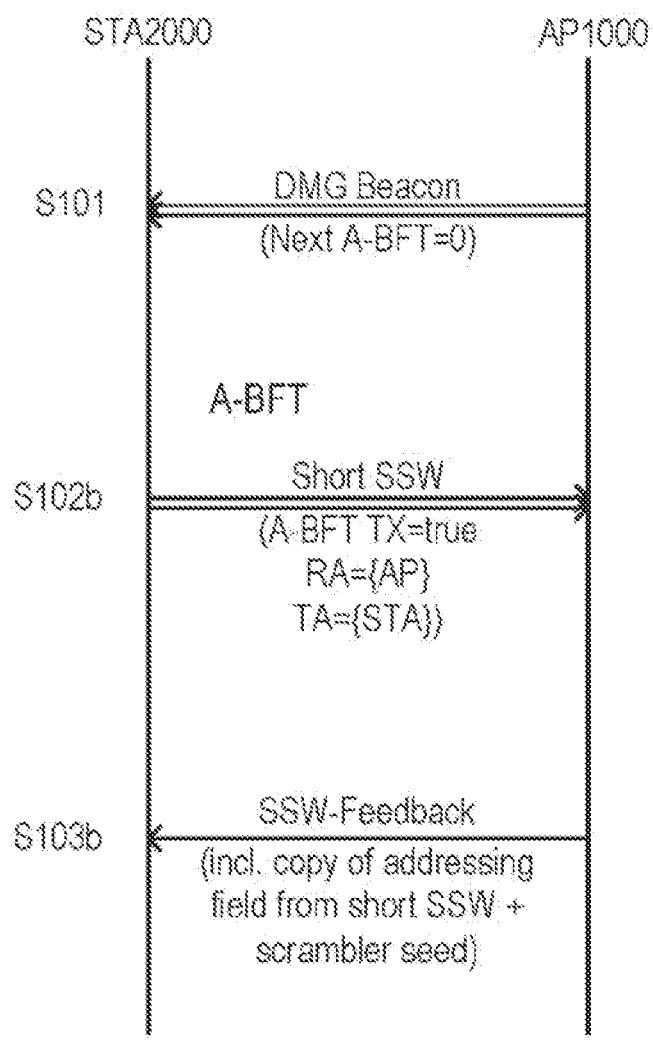
FIG. 52 is a diagram illustrating a procedure in which an AP and an STA perform SLS according to a fourteenth embodiment.

FIG. 52 is a diagram illustrating another procedure in which the AP 1000 and the STA 2000 perform SLS. FIG. 52 illustrates, like FIG. 29, a case where the STA 2000 receives a DMG Beacon frame in which the value of the Next A-BFT field is 0. A description will be given of another method (different from that in FIG. 29) in which the STA 2000 starts SLS, with reference to FIG. 52.

First, the AP 1000 transmits a DMG Beacon frame. At this time, the Next A-BFT field in the DMG Beacon frame is set to 0. That is, A-BFT is scheduled after the DMG Beacon frame, which indicates that the STA 2000 may transmit SSW frames related to RSS by using A-BFT (step S101).

The frame transmitted by the AP 1000 in step S101 is a DMG Beacon frame and thus the destination thereof is not specified. That is, the DMG Beacon frame is broadcast information. Thus, it is difficult for the AP 1000 to know in advance which STA will respond in step S102b.

Figure 53:
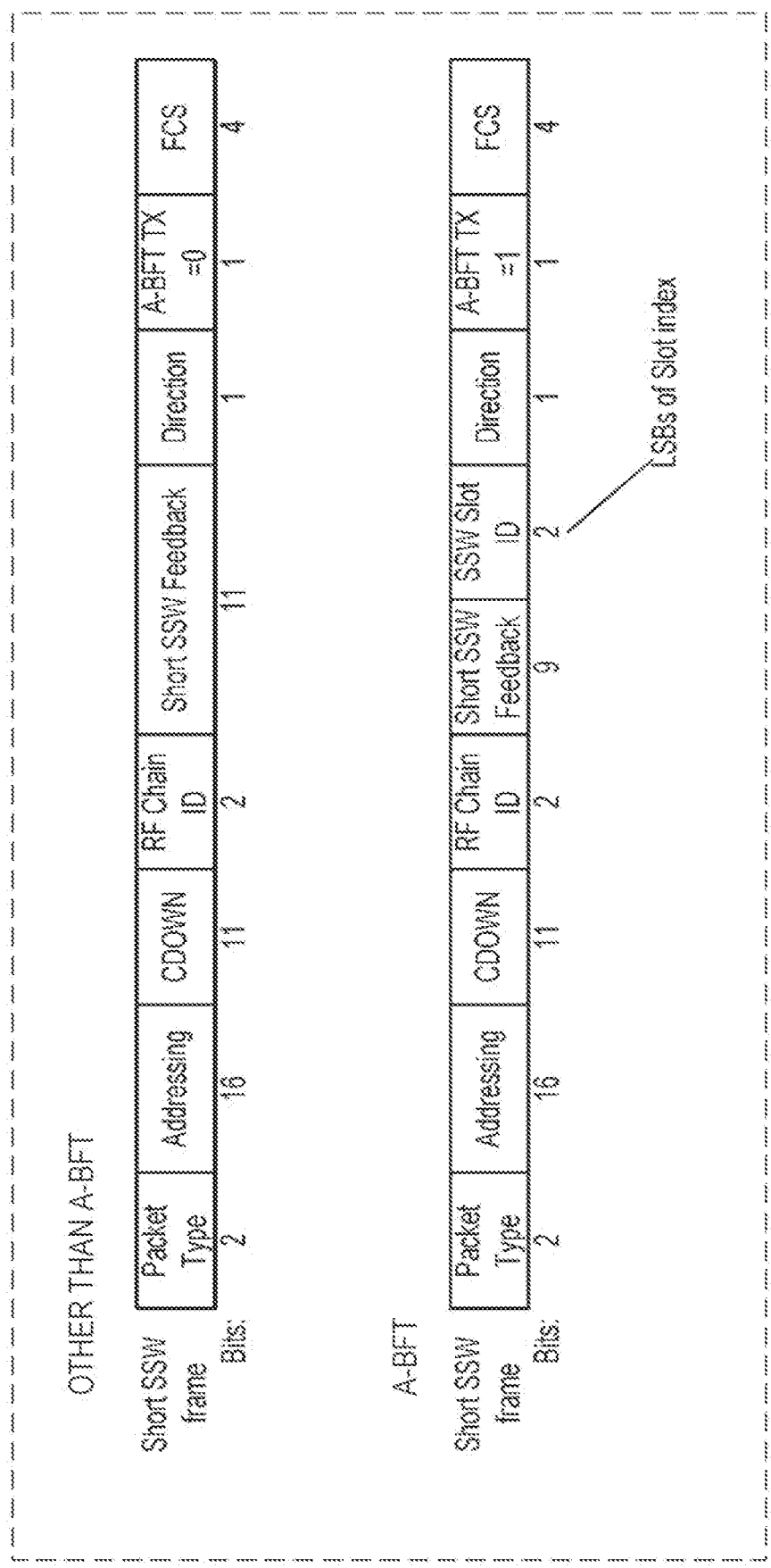
FIG. 53 is a diagram illustrating the format of an sSSW frame according to the fourteenth embodiment.

In response to the DMG Beacon frame, the STA 2000 transmits sSSW frames related to RSS by using the time slot of A-BFT (step S102b). FIG. 53 is a diagram illustrating the format of the sSSW frame. In FIG. 53, the sSSW frame includes an A-BFT TX field. When transmitting RSS by using the slot of A-BFT to respond to the DMG Beacon frame, the STA 2000 sets the A-BFT TX field to 1 and transmits the sSSW frame.

In the case of transmitting an sSSW frame without using the slot of A-BFT (for example, in the case of transmitting an sSSW frame in DTI), the STA 2000 sets the A-BFT TX field to 0 and transmits the sSSW frame.

In the case of setting the A-BFT TX field to 1 and transmitting the sSSW frame, the STA 2000 reduces the bits of the Short SSW Feedback to 9 bits and includes a 2-bit SSW Slot ID field.

An SSW Slot number (see FIG. 47) may be included in the SSW Slot ID field. If the SSW Slot number is 3 bits or more, the lower 2 bits of the SSW Slot number may be included in the SSW Slot ID field.

In step S102b, the AP 1000 receives an sSSW frame. The AP 1000 is not associated with the STA 2000 and does not have the corresponding Addressing value in an address table. However, in the received sSSW frame, the value of the A-BFT TX field is set to 1 and thus the AP 1000 determines that the AP 1000 needs to respond.

After that, the AP 1000 receives an sSSW frame for which a response is required, and after receiving an sSSW frame in which the CDOWN field is 0 (or after an estimated reception timing), the AP 1000 transmits an SSW-Feedback frame to the STA 2000.

At this time point, the AP 1000 does not know the MAC address of the STA 2000. However, as in the fifth embodiment, the AP 1000 includes information about the selected sSSW frame in the Copy of Addressing field and the Scrambler seed field by using the format of the SSW-Feedback frame illustrated in FIG. 31 and transmits the SSW-Feedback frame, thereby being able to specify the STA as a destination of the SSW-Feedback frame and to complete the procedure of SLS (step S103b).

A description will be given of a case where an AP or STA other than the AP 1000 receives an sSSW frame in step S102b. The sSSW frame transmitted in step S102b is intended to be received by the AP 1000. Thus, it is desired that an AP or STA other than the AP 1000 does not respond by using an SSW-Feedback frame in step S103b.

If the terminal that has received the sSSW frame is neither an AP nor PCP, the terminal that has received the sSSW frame does not need to respond by using an SSW-Feedback frame because the A-BFT TX field of the sSSW frame is set to 1.

If the terminal that has received the sSSW frame is either an AP or PCP, the terminal that has received the sSSW frame responds by using an SSW-Feedback frame if it is scheduled in the current A-BFT because the A-BFT TX field of the sSSW frame is set to 1.

The sSSW frame in FIG. 53 includes the value of the SSW Slot ID field. Thus, the terminal that has received the sSSW frame responds by using an SSW-Feedback frame if the number of SSW Slot that is currently scheduled matches the value of the received SSW Slot ID field. It is rare that the values of SSW Slot IDs of the AP 1000 and another AP match. Thus, it is possible to decrease the probability of receiving an unintended response from an AP other than the AP 1000.

Figure 54:
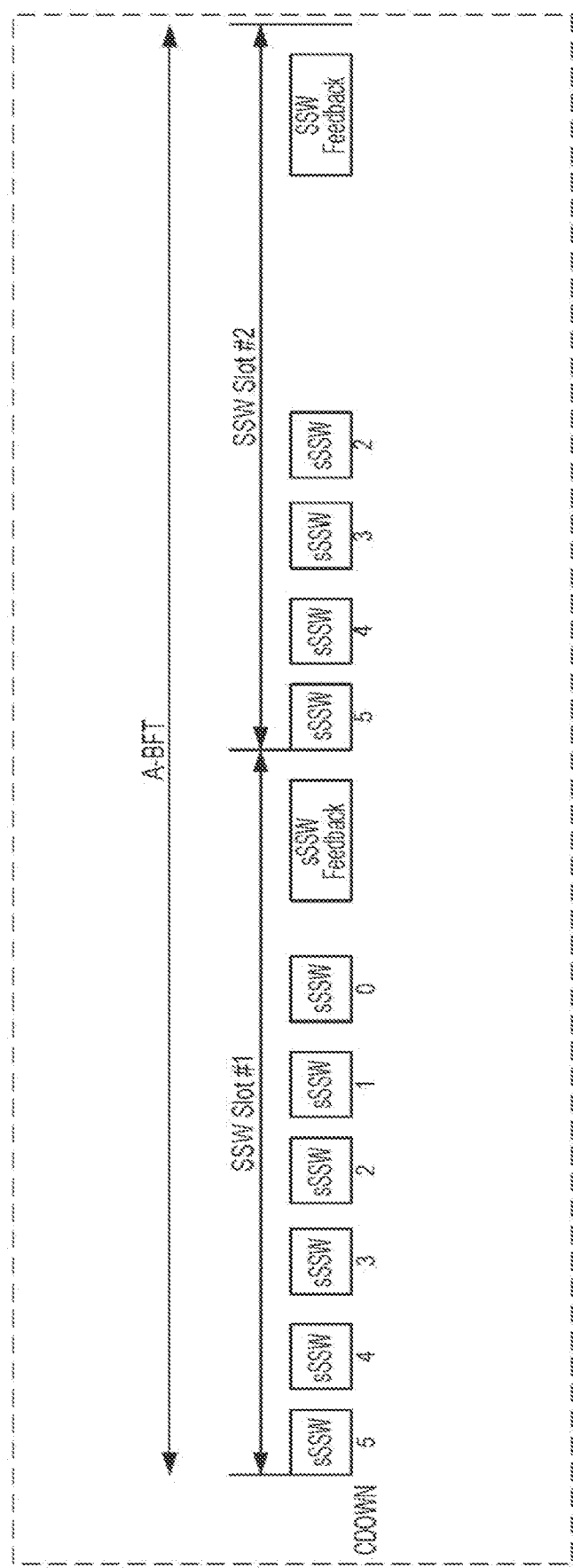
FIG. 54 is a diagram illustrating a method for setting the value of CDOWN in A-BFT according to the fourteenth embodiment.

FIG. 54 is a diagram illustrating another method for setting a CDOWN value in A-BFT.

In the 11ad standard, it is defined to set a CDOWN value so that the CDOWN value decreases by 1 every time an SSW frame is transmitted and that the CDOWN value of the SSW frame that is transmitted last is 0.

In FIG. 54, unlike in the 11ad standard, a predetermined CDOWN value is used in accordance with a transmission timing in the SSW Slot. For example, in a case where up to six sSSW frames can be transmitted in SSW Slot #1, the CDOWN value of the top sSSW frame in the SSW Slot is set to 5 (1 is subtracted from a maximum of 6), is decreased by 1 for each sSSW frame, and is changed to 0.

Accordingly, in a case where an STA transmits a maximum number of sSSW frames, the CDOWN value of the sSSW frame that is transmitted last in the SSW Slot is 0. In a case where the STA transmits a smaller number of sSSW frames, the CDOWN value of the sSSW frame that is transmitted last in the SSW Slot is 1 or more. For example, in SSW Slot #2 in FIG. 54, four sSSW frames are transmitted. In this case, the CDOWN value changes from 5 to 2. In this case, an SSW-Feedback frame is transmitted at a certain timing in the SSW Slot regardless of the total number of sSSW frames that are transmitted. That is, in SSW Slot #1 and SSW Slot #2, the CDOWN values 5 to 2 and the SSW-Feedback frame are transmitted at the same timing in each slot.

By using a predetermined CDOWN value in accordance with the transmission timing of an sSSW frame in the SSW Slot, the AP 1000 is able to predict the CDOWN value of the sSSW frame received at a certain timing. If a received sSSW frame has a CDOWN value that is different from a CDOWN value predicted from the reception timing, the AP 1000 determines that the received sSSW frame is addressed to another AP and does not respond by using an SSW-Feedback frame.

In the fourteenth embodiment, the sSSW frame includes the A-BFT TX field and the SSW Slot ID field. Thus, the possibility of responding using an SSW-Feedback frame from an unintended terminal can be decreased, and a collision of SSW-Feedback frames can be prevented.

In the fourteenth embodiment, a predetermined CDOWN value is used in accordance with the transmission timing of an sSSW frame in the SSW slot. Thus, the possibility of responding using an SSW-frame frame from an unintended terminal can be decreased, and a collision of SSW-Feedback frames can be prevented.

Fifteenth Embodiment

Mutual Operation Between Two Communication Apparatuses

Figure 55:
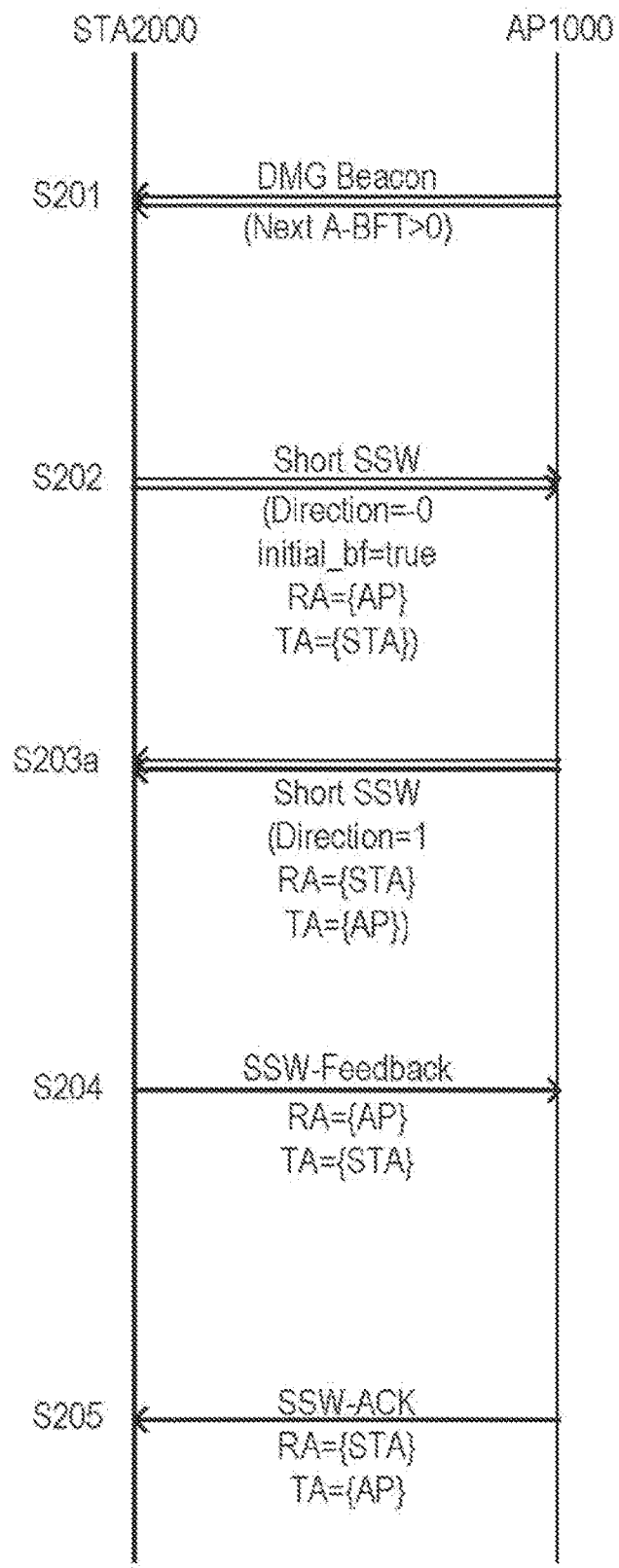
FIG. 55 is a diagram illustrating a procedure in which an AP and an STA perform SLS according to a fifteenth embodiment.

FIG. 55 is a diagram illustrating another procedure in which the AP 1000 and the STA 2000 perform SLS. FIG. 55 illustrates, like FIG. 33 (sixth embodiment), a procedure in which the STA 2000 receives a DMG Beacon frame in which the Next A-BFT field has a value that is not 0. Thus, the STA 2000 does not perform RSS using a slot of A-BFT, and thus starts an SLS procedure by using DTI while serving as an initiator. The description of the same part as that in the sixth embodiment will not be given.

In FIG. 55, unlike in FIG. 33, RA of addressing the sSSW frame in step S203a is not unknown, and a correct Addressing value is used. At the time point of step S203a, the AP 1000 does not know the MAC address of the STA 2000, but is able to calculate the Addressing value to be used in step S203a by using the following expressions. For simplicity, a description will first be given of a case where scrambling is not performed.

The MAC addresses of the AP and the STA are expressed by expressions (1) and (2), which are polynomial expressions including 0 and 1 as coefficients.

$$AP(X) = A_0 X^{47} + A_1 X^{46} + \ldots + A_{46} X + A_{47} \tag{1}$$

$$STA(X) = B_0 X^{47} + B_1 X^{46} + \ldots + B_{46} X + B_{47} \tag{2}$$

In a case where AP(X) is RA and STA(X) is TA, an address before scrambling and hash calculation (the value before step S1 in FIG. 6) is expressed by expression (3).

$$ISS(X) = AP(X) X^{48} + STA(X) \tag{3}$$

CRC of ISS(X) is expressed by expression (4).

$$CRC_{ISS}(X) = \text{not } ((ISS(X) + I(X)) X^{16} \bmod G(X)) \tag{4}$$

Here, "not" represents an operation of 0-1 inversion of a value. I(X) is an initial value of CRC calculation and is defined by expression (5).

$$I(X) = X^{95} + X^{94} + \ldots + X^{80} \tag{5}$$

G(X) is a generator polynomial of CRC and is defined by expressions (6) and (7).

$$G(X) = X^{16} + X^{12} + X^5 + 1 \tag{6}$$

$$\begin{aligned} CRC_{ISS}(X) &= \text{not } (ISS(X) + I(X)) X^{16} \bmod G(X)) \\ &= \text{not } (STA(X) X^{16} \bmod G(X) + (AP(X) X^{48} + \\ &\quad I(X)) \bmod G(X)) \end{aligned} \tag{7}$$

The AP knows AP(X) and is thus able to calculate expression (8).

$$STA(X) X^{16} \bmod G(X) = \text{not } CRC_{ISS}(X) + \text{not } (AP(X) X^{48} + I(X)) \bmod G(X)) \tag{8}$$

The first term of the right side is obtained through 0-1 inversion of the Addressing value received in step S202 in FIG. 55. The second term of the right side is equal to the Addressing value that is calculated by setting RA to AP(X) and TA to 0. The AP 1000 is able to calculate the second term of the right side in advance. For simplicity of expression (8), the value calculated in expression (8) is represented by S(X) as in expression (9).

$$S(X) = STA(X) X^{16} \bmod G(X) \tag{9}$$

In a case where AP(X) is TA and STA(X) is RA, an address before scrambling and hash calculation (the value before step S1 in FIG. 6) is expressed by expression (10).

$$RSS(X)=STA(X)X^{48}+AP(X) \qquad (10)$$

CRC of RSS(X) is calculated by using expression (11).

$$\begin{aligned} CRC_{RSS}(X) = &\; \text{not } (STA(X)X^{48} + AP(X) + \\ &\; I(X))X^{16} \bmod G(X)) \\ = &\; \text{not } (S(X)X^{48} \bmod G(X)) + \text{not}((AP(X) + \\ &\; I(X))X^{16} \bmod G(X)) \end{aligned} \qquad (11)$$

The first term of the right side can be calculated by using S(X) calculated from the Addressing value received in step S202. The second term of the right side, which is CRC of AP(X), can be calculated by the AP 1000 in advance.

In the above-described manner, the AP 1000 is able to calculate CRC of RSS(X) in step S203a, and is thus able to set the calculated value as an Addressing value and transmit an sSSW frame.

Next, a description will be given of a case where address scrambling is performed. When the scrambling method in FIG. 39 or 40 is assumed, the values before input of hash calculation (S2 in FIG. 6) are expressed by expressions (12) and (13). Here, AP'(X) is a value obtained by scrambling AP(X), and STA'(X) is a value obtained by scrambling STA(X).

$$ISS'(X)=AP'(X)X^{48}+STA'(X) \qquad (12)$$

$$RSS'(X)=STA'(X)X^{48}+AP'(X) \qquad (13)$$

Thus, in the calculation of expressions (4) to (11), AP(X) may be replaced with AP'(X) and STA(X) may be replaced with STA'(X). That is, the value of $CRC_{RSS}(X)$ after scrambling can be calculated by replacing AP(X) with AP'(X) and replacing $CRC_{ISS}(X)$ with a scrambled value in expressions (8) and (11).

According to the fifteenth embodiment, the communication apparatus 100 is able to calculate an Addressing value to be transmitted in RSS by using the Addressing value of the received sSSW frame and the MAC address of the communication apparatus 100. Thus, even if the address of an initiator is unknown, SLS can be performed by using sSSW frames.

Sixteenth Embodiment

Mutual Operation Between Two Communication Apparatuses

Figure 56:
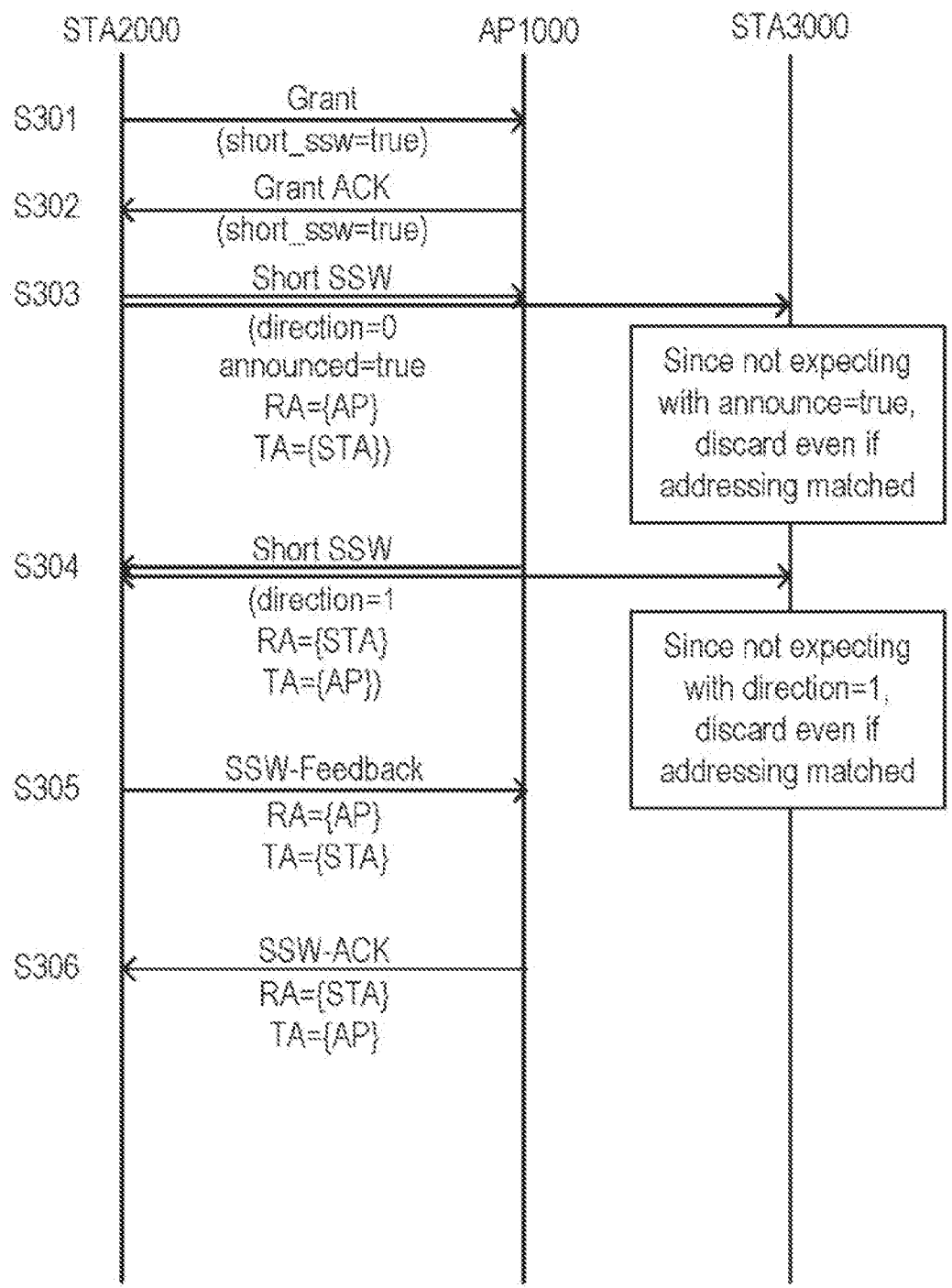
FIG. 56 is a diagram illustrating a procedure in which an AP and an STA perform SLS according to a sixteenth embodiment.

FIG. 56 is a diagram illustrating another procedure in which the AP 1000 and the STA 2000 perform SLS. A description will be given of a procedure of performing SLS under the following state. The AP 1000 and the STA 2000 complete association before step S301, that is, the AP 1000 and the STA 2000 know the MAC address of each other. In addition, there is an STA 3000 near the AP 1000, and the signals transmitted by the AP 1000 and the STA 2000 may be received by the STA 3000. The STA 3000 is not associated with the AP 1000.

In the 11ad standard, SLS is started upon transmission of SSW by an initiator (for example, the STA 2000). On the other hand, in FIG. 56, for example, the initiator transmits a Grant frame (described below) in which the Short SSW bit is set to 1 (true) to a responder (for example, the AP 1000) before transmitting Short SSW (ISS) in FIG. 4 (step S301). By transmitting the Grant frame in which the Short SSW bit is set to 1 (true), the initiator requests the responder to permit start of SLS using Short SSW frames.

The AP 1000 that has received the Grant frame in which the Short SSW bit is set to 1 (true) transmits a Grant ACK frame in which the Short SSW bit is set to 1 (true) to the STA 2000, thereby permitting transmission of Short SSW frames (step S302).

The STA 2000 that has received the Grant ACK frame in which the Short SSW bit is set to 1 (true) starts transmitting Short SSW frames. The AP 1000 and the STA 2000 know the MAC address of each other. Thus, as in the first embodiment, the STA 2000 sets RA to the MAC address of the AP 1000 and TA to the MAC address of the STA 2000, calculates an Addressing value by using hash, sets the calculated Addressing value in the Addressing field of the Short SSW frame, and transmits the Short SSW frame (step S303).

In the Short SSW frame transmitted in step S303, the Announced field may be set to 1, indicating that communication using a Grant frame and a Grant ACK frame has been completed before transmission of the Short SSW frame. When the AP 1000 receives the Short SSW frame in which the Announced field is set to 1 in step S303, the AP 1000 checks the value of the Addressing field of the Short SSW frame and determines whether the received frame is the Short SSW frame transmitted from the STA with which communication using a Grant frame and a Grant ACK frame has been performed.

Although described below, the FCS field of the Grant frame is calculated including the values of RA and TA and thus can be used to specify RA and TA. With the communication using the Grant frame and the Grant ACK frame being performed between the STA 2000 and the AP 1000, the AP 1000 determines that the source of the received Short SSW frame is the STA 2000 and the destination is the AP 1000.

A description will be given of a case where a terminal different from the AP 1000 (STA 3000) receives a Short SSW frame in step S303. Since the Announced field is set to 1, the STA 3000 checks the value of the Addressing field of the Short SSW frame and determines whether the received frame is a Short SSW frame transmitted from the STA with which communication using a Grant frame and a Grant ACK frame has been performed. The communication using a Grant frame and a Grant ACK frame has not been performed between the STA 2000 and the STA 3000, and thus the STA 3000 determines that the destination of the received Short SSW frame is not the STA 3000 and discards the received Short SSW frame.

The AP 1000 transmits Short SSW frames as RSS processing. The RSS processing is similar to that in FIG. 4 according to the first embodiment, and thus the detailed description thereof is not given (step S304).

A description will be given of a case where a terminal different from the STA 2000 (STA 3000) receives a Short SSW frame in step S304. Since step S304 is included in RSS, the Direction field of the Short SSW frame is set to 1. The STA 3000 is not an initiator and thus does not expect to receive a Short SSW frame in which the Direction field is set to 1. Thus, the STA 3000 discards the received Short SSW frame.

In step S304, the AP 1000 may transmit a Short SSW frame in which the Announced field (described below) is set to 1. When the STA 3000 receives the Short SSW frame in which the Announced field is set to 1, the STA 3000 checks the value of the Addressing field of the Short SSW frame and determines whether the frame is a Short SSW frame transmitted from the STA with which communication using a Grant frame and a Grant ACK frame has been performed. The communication using a Grant frame and a Grant ACK frame has not been performed between the STA 2000 and the STA 3000, the STA 3000 determines that the destination of the received Short SSW frame is not the STA 3000 and discards the received Short SSW frame.

Even if the Addressing values conflict with each other between the STA 3000 and the AP 1000, the Announced field is set to 1 and the STA 2000 checks the Addressing value of the STA with which communication using a Grant frame and a Grant ACK frame has been performed. Accordingly, it is possible to decrease the possibility that a Short SSW frame related to RSS is transmitted from the unintended STA 3000 due to a conflict between Addressing values.

In addition, when receiving a Short SSW frame, the AP 1000 and the STA 3000 compare the received Addressing value with the Addressing value that is calculated by regarding, as TA, the STA with which communication using a Grant frame and a Grant ACK frame has been performed. Thus, it is possible to decrease the possibility of an addressing conflict with unintended RA and TA.

Figure 57:
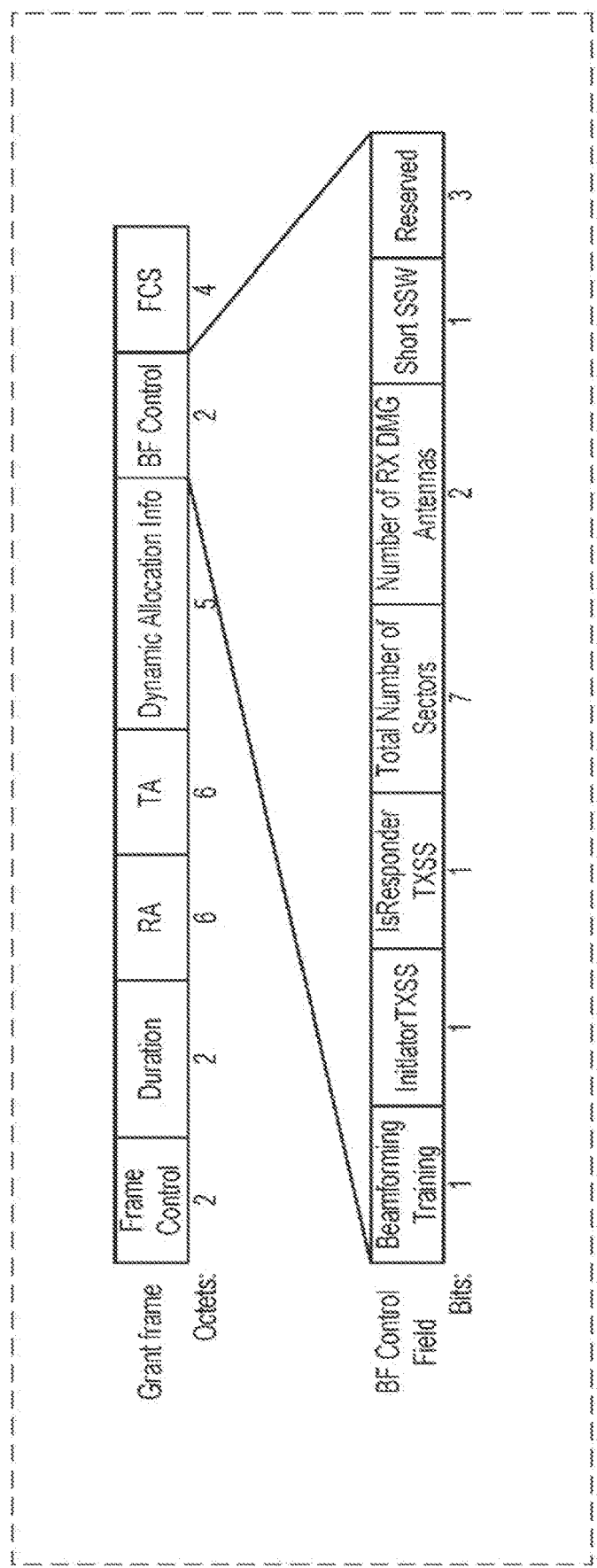
FIG. 57 is a diagram illustrating an example of a Grant frame according to the sixteenth embodiment.

FIG. 57 illustrates an example of the Grant frame used in step S301. The STA 2000 may transmit a Grant frame in which the BF Control field includes a Short SSW field.

Figure 58:
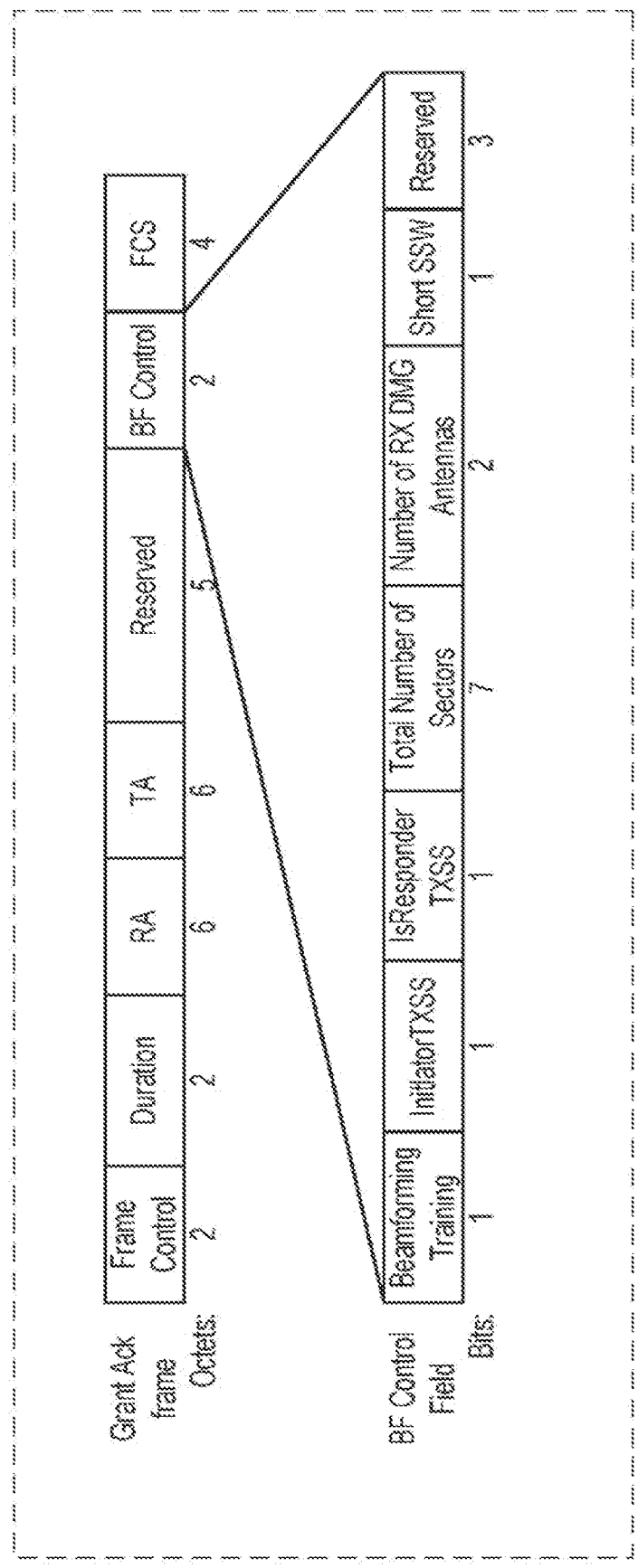
FIG. 58 is a diagram illustrating an example of a Grant ACK frame according to the sixteenth embodiment.

FIG. 58 illustrates an example of the Grant ACK frame used in step S302. The AP 1000 may transmit a Grant ACK frame in which the BF Control field includes a Short SSW field.

Figure 59:
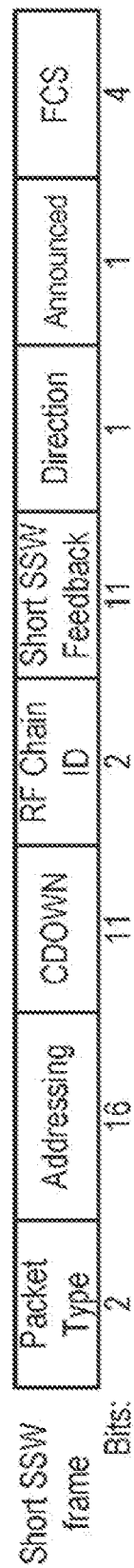
FIG. 59 is a diagram illustrating an example of a Short SSW frame according to the sixteenth embodiment.

FIG. 59 illustrates an example of the Short SSW frame used in step S303. The STA 2000 may transmit a Short SSW frame that includes an Announced field.

FIG. 60 illustrates another example of the Short SSW frame used in step S303 different from the example in FIG. 59. The STA 2000 may transmit a Short SSW frame that includes an Announced field. In addition, the STA 2000 may include, as the value of the Addressing field, the value of the FCS field of the Grant frame transmitted in step S301. The FCS field of the Grant frame is calculated by including the values of RA and TA, and thus can be used to specify RA and TA and can be used as a substitute of a hash value of addressing.

In FIG. 60, if the number of bits of the FCS of Grant frame (substitute of the Addressing field) is smaller than the number of bits of the FCS field of the Grant frame in FIG. 57, an upper bit of the FCS field of the Grant frame may be used. A change in bit is more likely to appear in an upper bit than in a lower bit and thus the upper bit is suitable for use as a hash, and the probability of an addressing conflict can be decreased.

In FIG. 56, a description has been given of a case where the STA 3000 is not associated with the AP 1000. Hereinafter, a description will be given of a case where the STA 3000 is associated with the AP 1000.

In step S301, the STA 2000 sets the MAC address of the destination (AP 1000) in the RA field of the Grant frame and transmits the Grant frame. In the RA field of the Grant frame, unlike in the Short SSW frame, the entire MAC address, not a hash value is set. Thus, a situation can be prevented from occurring where the STA 3000 wrongly recognizes that the destination is the STA 3000.

As a result, in step S303, when the STA 3000 receives a Short SSW frame in which the Announced field is set to 1 in a state where communication using a Grant frame in which the Short SSW bit is set to 1 has not been performed, the STA 3000 determines that the received Short SSW frame is not addressed to the STA 3000 and is able to discard the received Short SSW frame.

In FIG. 56, a description has been given of a case where the STA 3000 is near the AP 1000, but another AP (AP 1500 that is not illustrated) may be near the STA 2000 or the AP 1000. In this case, when the AP 1500 receives a Short SSW frame in step S303 like the STA 3000, the AP 1500 is able to check the value of the Announced field and the Addressing value and to determine that the Short SSW frame is not addressed to the AP 1500.

In a case where the communication apparatus 100 uses the Short SSW frame in FIG. 60, the communication apparatus 100 does not change the Addressing value by using the value of SI as in the first embodiment and thus uses a single Addressing value during RSS and ISS. If SLS fails due to a conflict of Addressing values, the communication apparatus 100 may change the value of part of the Grant frame, for example, add a dummy sector to increase the value of Total Number of Sectors by 1, and may perform the procedure again from step S301. In addition, for example, the communication apparatus 100 may change the value of Allocation Duration (not illustrated) included in the Dynamic Allocation Information field. Since the value of part of the Grant frame has been changed, the value of FCS is changed, and thus the communication apparatus 100 is able to decrease the probability of an addressing conflict.

In the sixteenth embodiment, the communication apparatus 100 transmits an sSSW frame in which the Announced field is set. Thus, the probability of responding from an unintended terminal using a Short SSW frame can be decreased and a collision of Short SSW frames can be prevented.

Seventeenth Embodiment

Mutual Operation Between Two Communication Apparatuses

Figure 61:
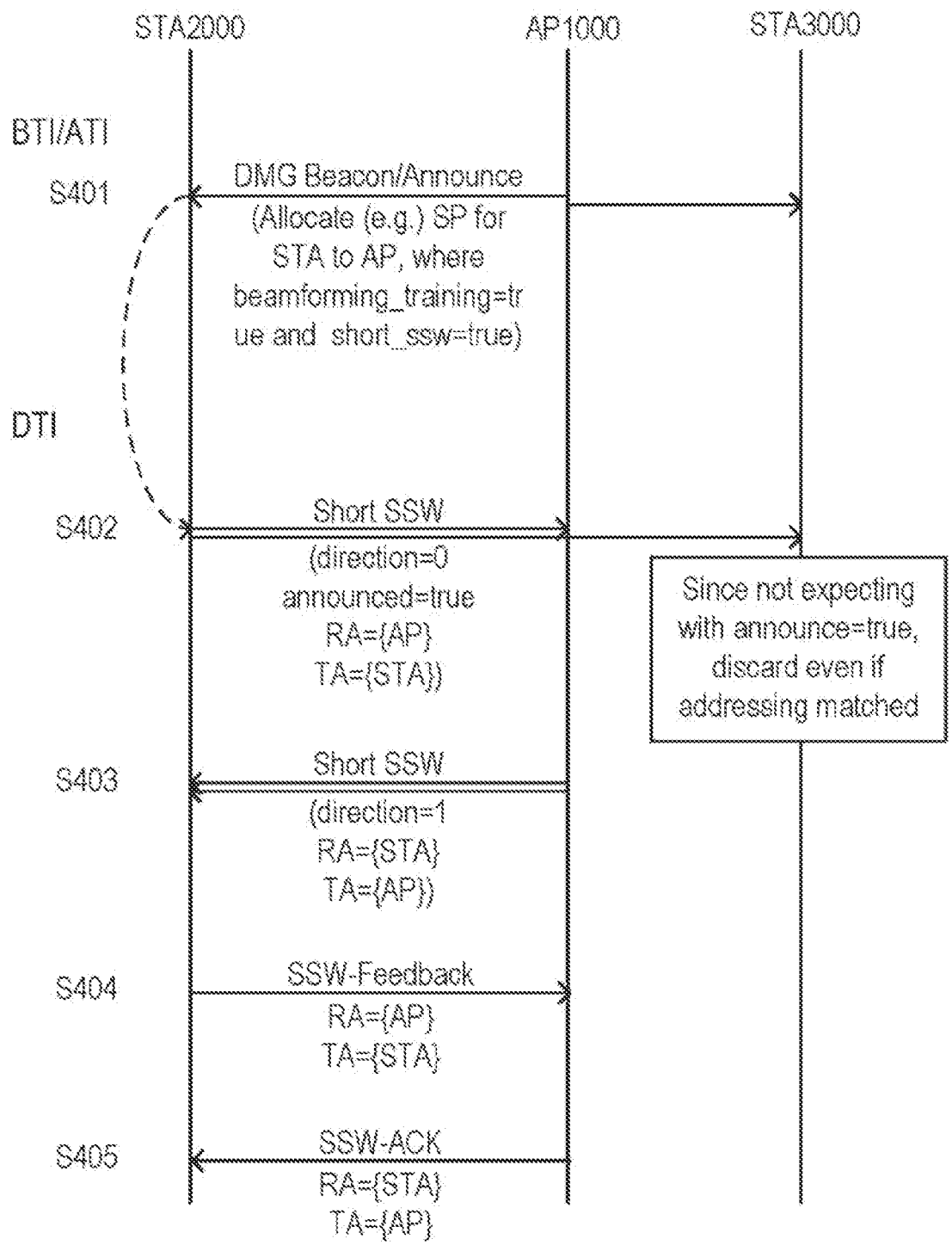
FIG. 61 is a diagram illustrating a procedure in which an AP and an STA perform SLS in DTI according to a seventeenth embodiment.

FIG. 61 is a diagram illustrating another procedure in which the AP 1000 and the STA 2000 perform SLS in DTI. A description will be given of a procedure of performing SLS in DTI in the following state. The AP 1000 and the STA 2000 have been associated with each other. That is, the AP 1000 and the STA 2000 know the MAC address of each other. In addition, the STA 3000 is near the AP 1000, and thus the signals transmitted from the AP 1000 and the STA 2000 may be received by the STA 3000. The STA 3000 is associated with the AP 1000.

Prior to SLS, the AP 1000 performs time scheduling in which the STA 2000 performs SLS (step S401).

In step S401, for example, the AP 1000 performs allocation (scheduling) of a Service Period (SP) that can be used by the STA 2000 in the DTI period, by using a DMG Beacon frame (described below).

Figure 62:
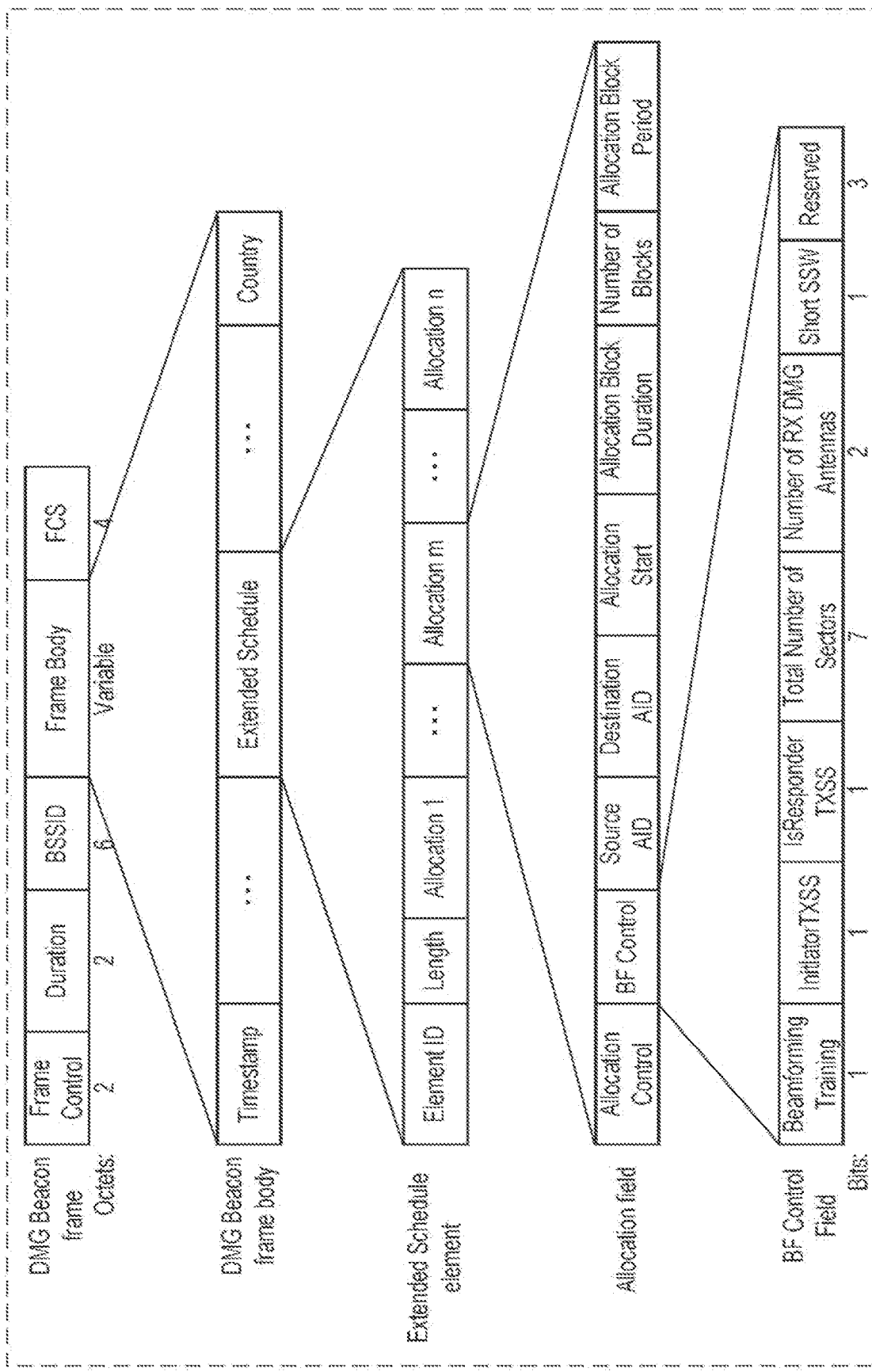
FIG. 62 is a diagram illustrating an example of a DMG Beacon frame according to the seventeenth embodiment.

FIG. 62 illustrates an example of the DMG Beacon frame transmitted by the AP 1000 in step S401. The DMG Beacon frame includes a Frame Body field. The Frame Body field may include an Extended Schedule element. The Extended Schedule element may include one or more Allocation fields. The Allocation field includes scheduling information of the SP. In addition, the Allocation field includes a BF Control field.

In step S401, the AP 1000 may give notice of a Short SSW field by using an Announce frame instead of DMG Beacon. The Announce frame may include, in its inside, an Extended Schedule element. Thus, the AP 1000 may transmit the Announce frame that includes the Extended Schedule element illustrated in FIG. 62 in step S401. Hereinafter, a description will be given of a case where the AP 1000 transmits DMG Beacon in step S401. The same applies to the case of transmitting the Announce frame.

When transmitting DMG Beacon in step S401, the AP 1000 sets the Beamforming Training field of the BF Control field to 1, thereby giving notice about performing beamforming training (for example, SLS) in the scheduled SP. In addition, the AP 1000 sets the Short SSW field of the BF Control field to 1, thereby giving notice about using Short SSW frames in the scheduled SP.

In the 11ad standard, the Short SSW field is not included in the BF Control field. In this embodiment, as illustrated in FIG. 62, 1 bit among 4 reserved bits included in the BF Control field in the 11ad standard is used as a Short SSW field.

The STA 2000 transmits a Short SSW frame to start ISS by using the scheduled SP, that is, at the scheduled time (step S402).

A notice about using a Short SSW frame has already been given by DMG Beacon in step S401. Thus, in step S402, the STA 2000 sets the Announced field to 1 by using the format of the Short SSW frame in FIG. 59 and transmits the Short SSW frame. In addition, the STA 2000 may calculate an Addressing value by using the value of the BSSID field of the DMG Beacon frame in FIG. 62 as the MAC address of the AP.

A description will be given of a case where a terminal different from the AP 1000 (STA 3000) receives the Short SSW frame in step S402. Since the Announced field is set to 1, the STA 3000 checks the value of the Addressing field of the Short SSW frame and determines whether the Short SSW frame is a Short SSW frame transmitted from the STA having a transmission right in the schedule indicated in the Allocation field (note that the value of the Short SSW field is 1). The transmission from the STA 2000 to the STA 3000 is not scheduled in the Allocation field (note that the value of the Short SSW field is 1). Thus, the STA 3000 determines that the received Short SSW frame is not addressed to the STA 3000 and discards the received Short SSW frame.

A description has been given of a case where the STA 3000 is associated with the AP 1000 in FIG. 61. Hereinafter, a description will be given of a case where the STA 3000 is not associated with the AP 1000 but is associated with another AP (AP 1500 that is not illustrated).

In step S401, the STA 3000 receives a DMG Beacon frame or an Announce frame from the AP 1500 instead of receiving a DMG Beacon frame or an Announce frame from the AP 1000. The timing of transmission of the DMG Beacon frame or the Announce frame from the AP 1500 is not limited to the same time as step S401, and includes scheduling information different from scheduling information about transmission by the AP 1000.

The STA 3000 performs reception processing on the basis of the scheduling information received from the AP 1500. If the STA 3000 receives notice about using a Short SSW frame from the AP 1500 and if the STA 2000 transmits a Short SSW frame in step S402 at the same timing, the STA 3000 checks addressing. Thus, the STA 3000 is able to decrease the probability of an addressing conflict with another STA.

In FIG. 61, a description has been given of a case where the STA 3000 is near the AP 1000. Hereinafter, a description will be given of a case where another AP (AP 1500 that is not illustrated) is near the STA 2000 or the AP 1000.

When the AP 1500 receives, like the STA 3000, a Short SSW frame in step S402, the AP 1500 is able to check the value of the Announced field and the Addressing value and to determine that the received Short SSW frame is not addressed to the AP 1500.

In this embodiment, a description has been given of a case where an Announced field is added to the Short SSW frame. Alternatively, notice about using Short SSW using a Grant frame (disclosed in the sixteenth embodiment), DMG Beacon, or an Announce frame (disclosed in the seventeenth embodiment) before transmission of a Short SSW frame may be defined to be necessary, and the Announced field in the Short SSW frame may be omitted. In this case, a terminal that receives the Short SSW frame performs processing similar to that performed when the Announced field is set to 1.

In the seventeenth embodiment, the communication apparatus 100 sets an Announced field in the sSSW frame and transmits the sSSW frame. Accordingly, the probability of responding using a Short SSW frame from an unintended terminal can be decreased, and a collision of Short SSW frames can be prevented.

Eighteenth Embodiment

Mutual Operation Between Two Communication Apparatuses

Figure 63:
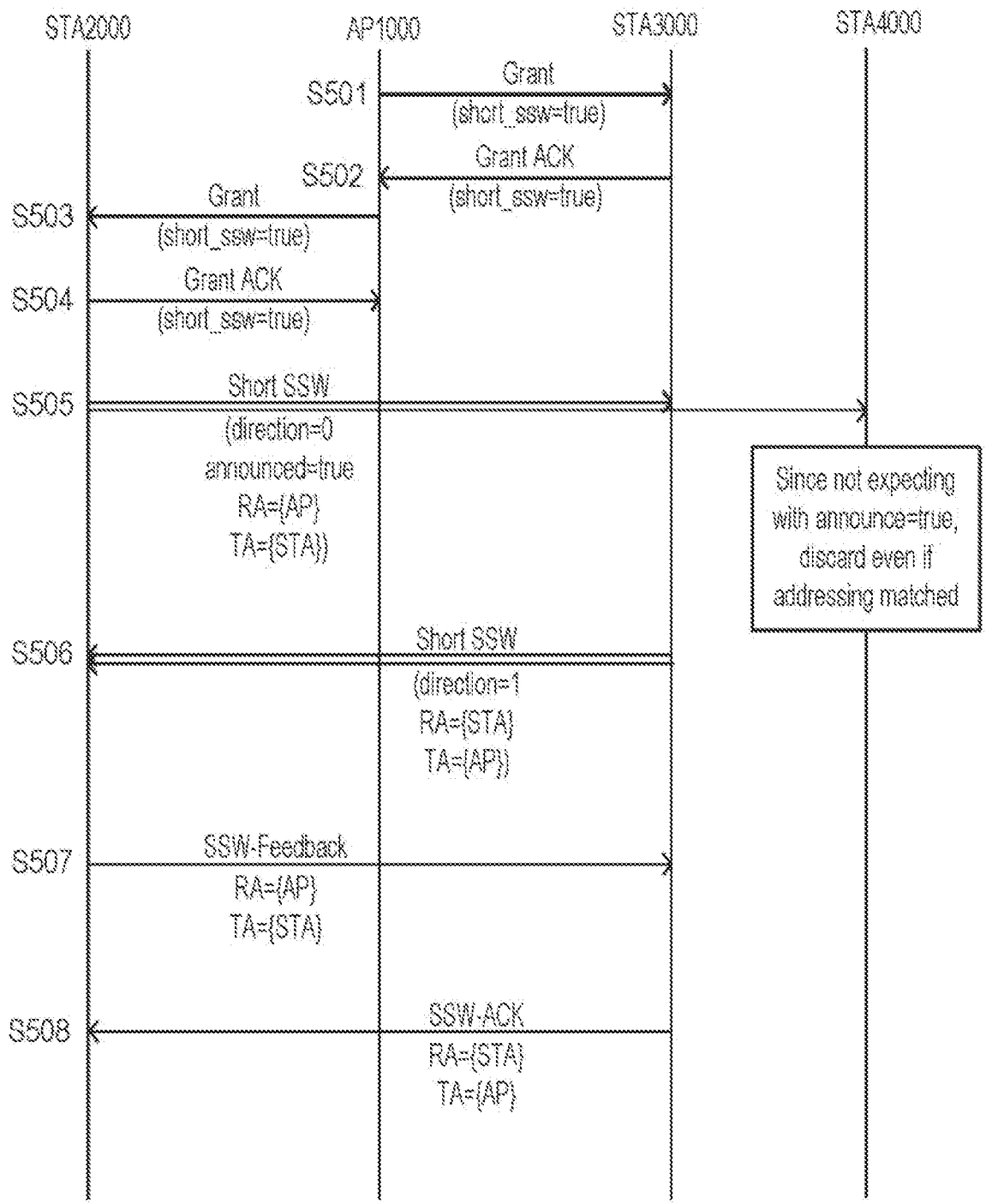
FIG. 63 is a diagram illustrating a procedure in which an AP and STAs perform SLS according to an eighteenth embodiment.

FIG. 63 is a diagram illustrating a procedure in which two STAs (STA 2000 and STA 3000) perform SLS. Hereinafter, a description will be given of a procedure of performing SLS in the following state. As in FIG. 56, a Grant frame, a Grant ACK frame, and a Short SSW frame including an Announced field are used. The STA 2000 is an initiator. The difference from FIG. 56 is that the STA 3000 serves as a responder instead of the AP 1000. Each of the STA 2000 and the STA 3000 has been associated with the AP 1000. That is, the AP 1000 knows the MAC addresses of the STA 2000 and STA 3000, and the STA 2000 and the STA 3000 know the MAC address of the AP 1000.

After each of the STA 2000 and the STA 3000 has been associated with the AP 1000, the AP 1000 is able to broadcast information about the STA 2000 and the STA 3000 (including the MAC addresses). That is, the STA 2000 and the STA 3000 know the MAC address of each other. To broadcast the information about the STAs, an Information Response frame defined in the 11ad standard may be used, for example.

An STA 4000 may be present near the AP 1000, and the signals transmitted by the AP 1000, the STA 2000, and the STA 3000 may be received by the STA 4000. The STA 4000 is associated with the AP 1000.

Before transmission of Short SSW, the AP 1000 transmits a Grant frame in which the Short SSW bit is set to 1 (true) to the STA 3000. The Grant frame may include information that designates the STA 2000 as a source and the STA 3000 as a destination. For example, a Source AID field and a Destination AID field (not illustrated) of a Dynamic Allocation Info field may be used (step S501).

The STA 3000 receives the Grant frame in which the Short SSW bit is set to 1 (true) and then transmits a Grant ACK frame in which the Short SSW bit is set to 1 (true) to the AP 1000, thereby permitting transmission of Short SSW from the STA 3000 (step S502).

The AP 1000 transmits a Grant frame in which the Short SSW bit is set to 1 (true) to the STA 2000 as in the case of STA 3000. The AP 1000 may include, in the Grant frame, information that designates the STA 2000 as a source and the STA 3000 as a destination (step S503).

After receiving the Grant frame in which the Short SSW bit is set to 1 (true), the STA 2000 transmits a Grant ACK frame in which the Short SSW bit is set to 1 (true) to the AP 1000, thereby permitting transmission of Short SSW from the STA 2000 (step S504).

In FIG. 63, the AP 1000 transmits a Grant frame to the STA 3000 (step S501) and then transmits a Grant frame to the STA 2000 (step S503). In other words, the AP 1000 first transmits a Grant frame to the STA 3000 serving as a responder (step S501). The AP 1000 receives a Grant ACK frame in step S502. If the STA 3000 permits SLS using Short SSW, the AP 1000 transmits a Grant frame to the STA 2000 serving as an initiator (step S503). Thus, if the STA 3000 does not permit start of SLS using Short SSW, the STA 2000 does not receive a Grant frame and does not start SLS. Accordingly, a situation can be prevented from occurring where the STA 2000 transmits an unnecessary Short SSW frame to interfere with another STA and the STA 2000 wastefully consumes power.

The AP 1000 may invert the order of transmission of a Grant frame to the STA 3000 (step S501) and transmission of a Grant frame to the STA 2000 (step S503).

The STA 2000 starts transmitting Short SSW frames. Since the STA 2000 and the STA 3000 know the MAC address of each other, the STA 2000 sets RA to the MAC address of the AP 1000, sets TA to the MAC address of the STA 2000, calculates an Addressing value by using hash, sets the calculated value to the Addressing field of the Short SSW frame, and transmits the Short SSW frame (step S505) as in the first embodiment.

The STA 2000 may set, in the Short SSW frame transmitted in step S505, the Announced field to 1 indicating that communication using a Grant frame and a Grant ACK frame has been performed before transmission of the Short SSW frame.

When the STA 3000 receives the Short SSW frame in which the Announced field is set to 1 in step S505, the STA 3000 checks the value of the Addressing field of the Short SSW frame and determines whether the Short SSW frame is a Short SSW frame transmitted from the STA that has performed communication using a Grant frame and a Grant ACK frame via the AP.

The communication using a Grant frame and a Grant ACK frame via the AP has been performed between the STA 2000 and the STA 3000. Thus, the STA 3000 determines that the source of the received Short SSW frame is the STA 2000 and the destination is the STA 3000.

A description will be given of a case where a terminal different from the STA 3000 (STA 4000) receives Short SSW in step S505. Since the Announced field of the received Short SSW frame is set to 1, the STA 4000 checks the value of the Addressing field of the Short SSW frame and determines whether the Short SSW frame is a Short SSW frame transmitted from the STA with which communication using a Grant frame and a Grant ACK frame has been performed.

The communication using a Grant frame and a Grant ACK frame, including communication via the AP, has not been performed between the STA 2000 and the STA 4000. Thus, the STA 4000 determines that the destination of the received Short SSW frame is not the STA 4000 and discards the received Short SSW frame.

In addition, when receiving Short SSW, the AP 1000 and the STA 4000 compare the received Addressing value with an Addressing value that is calculated by regarding an STA with which communication using a Grant frame and a Grant ACK frame has been performed as TA. Thus, it is possible to decrease the probability of an addressing conflict with unintended RA and TA.

The STA 3000 transmits Short SSW frames as RSS processing. The RSS processing is similar to that in step S304 in FIG. 56 according to the sixteenth embodiment, and thus the detailed description thereof is not given (step S506).

In step S506, the STA 3000 may transmit a Short SSW frame in which the Announced field is set to 1. When the STA 4000 receives the Short SSW frame in which the Announced field is set to 1, the STA 4000 checks the value of the Addressing field of the Short SSW frame and determines whether the Short SSW frame is a Short SSW frame transmitted from the STA with which communication using a Grant frame and a Grant ACK frame has been performed.

The communication using a Grant frame and a Grant ACK frame has not been performed between the STA 3000 and the STA 4000. Thus, the STA 4000 determines that the destination of the received Short SSW frame is not the STA 4000 and discards the received Short SSW frame.

Even if the Addressing values conflict with each other between the STA 4000 and the STA 3000, the Announced field is set to 1 and the STA 3000 checks the Addressing value of the STA with which communication using a Grant frame and a Grant ACK frame has been performed. Accordingly, it is possible to decrease the possibility that a Short SSW frame related to RSS is transmitted from the unintended STA 4000 due to a conflict between Addressing values.

In FIG. 63, a description has been given of a case where the STA 4000 is associated with the AP 1000. Hereinafter, a description will be given of a case where the STA 4000 is not associated with the AP 1000.

In step S501, the AP 1000 sets the MAC address of the destination (STA 3000) in the RA field of the Grant frame and transmits the Grant frame. In the RA field of the Grant frame, unlike in the Short SSW frame, the entire MAC address, not a hash value is set. Thus, a situation can be prevented from occurring where the STA 4000 wrongly recognizes that the destination is the STA 4000.

As a result, in step S505, when the STA 4000 receives a Short SSW frame in which the Announced field is set to 1 in a state where communication using a Grant frame in which the Short SSW bit is set to 1 has not been performed, the STA 4000 determines that the received Short SSW frame is not addressed to the STA 4000 and is able to discard the received Short SSW frame.

In FIG. 61, a description has been given of a case where the STA 4000 is near the AP 1000, but another AP (AP 1500 that is not illustrated) may be near the STA 2000, the AP 1000, or the STA 3000. In this case, when the AP 1500 receives a Short SSW frame in step S505 like the STA 3000, the AP 1500 is able to check the value of the Announced field and the Addressing value and to determine that the Short SSW frame is not addressed to the AP 1500.

In the eighteenth embodiment, the communication apparatus 100 transmits an sSSW frame in which the Announced field is set. Thus, the probability of responding from an unintended terminal using a Short SSW frame can be decreased and a collision of Short SSW frames can be prevented.

Nineteenth Embodiment

Figure 64:
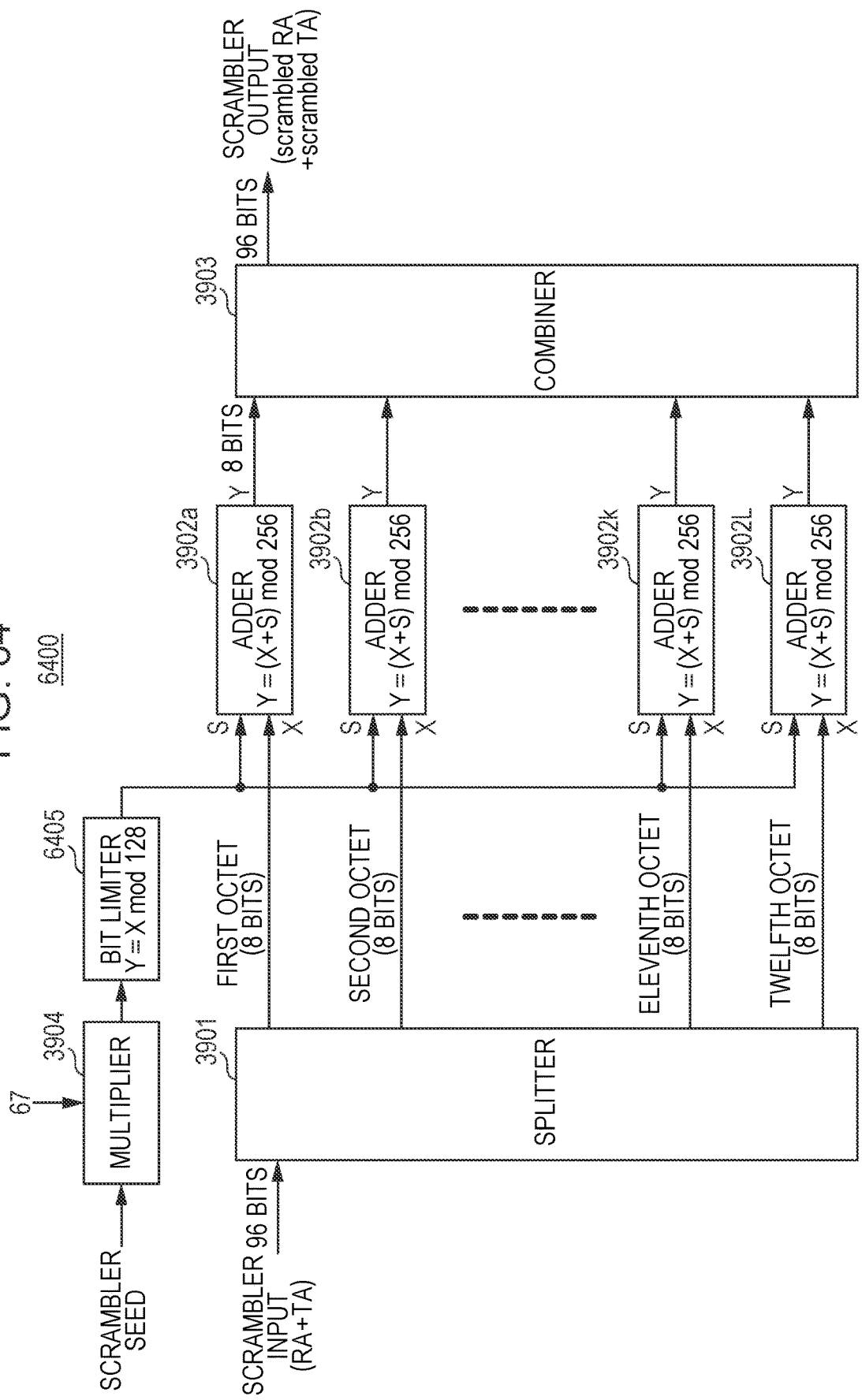
FIG. 64 is a diagram illustrating another example configuration of a scrambler according to a nineteenth embodiment.

In this embodiment, a description will be given of a configuration different from that of the scrambler illustrated in FIGS. 7 and 8 according to the first embodiment. FIG. 64 is a diagram illustrating another configuration of the scrambler. That is, in the operation for performing scrambling, addition of an integer is used instead of XOR operation and bit shift.

A scrambler 6400 illustrated in FIG. 64 includes the splitter 3901, the adders 3902a to 3902L, and the combiner 3903. In FIG. 64, the same elements as those in FIG. 39 are denoted by the same reference numerals and the description thereof is not given.

The scrambler 6400 includes a bit limiter 6405, unlike the scrambler 4000 in FIG. 40.

The bit limiter 6405 performs a modulo operation on an output of the multiplier 3904 to obtain a bit width that is smaller than octet data output from the splitter 3901 by 1 bit (7 bits). The modulo operation may be performed by discarding an upper bit of input data. The reason for limiting bits will be described below.

FIG. 66A is a diagram illustrating an example of combinations of a scrambler seed and a scramble pattern. FIG. 66A illustrates an example of values output from the bit limiter 6405 of the scrambler 6400 in FIG. 64. Here, the constant input to the multiplier 3904 is 67, which is 0x43 in hexadecimal form (see FIG. 64). In the table in FIG. 66A, "Seed" is a value in hexadecimal form of the scrambler seed to be input to the multiplier 3904. "Scramble Pattern (hex)" is a value in hexadecimal form output from the bit limiter 6405 when the foregoing scrambler seed is input.

As illustrated in FIG. 66A, the scrambler 6400 is able to change the value of the scramble pattern (output of the bit limiter 6405) by changing the value of the scrambler seed. Accordingly, the value of the scrambler output can be changed, and the communication apparatus 100 is able to decrease the probability of an address conflict.

In FIGS. 64 and 66A, the constant that is input to the multiplier 3904 is 67 ("43" in hexadecimal form, "01000011" in binary form), but another value (for example, "5a" in hexadecimal form, "01011010" in binary form) may be used. At the time of selecting a constant, it is desired that, as illustrated in FIG. 66A, the same scramble pattern be not generated with respect to a plurality of scrambler seeds. In addition, it is desired to avoid a constant at which a value including an unbalanced number of 0 or 1 in binary form (for example, the number of 0 or 1 is 6 or more: "111 0111" or "1000000") appears, such as 0x77 or 0x40, among the scramble patterns generated for a plurality of scrambler seeds. The foregoing values 43 and 5a (both are hexadecimal numbers) are examples of a value satisfying such a feature. Accordingly, the communication apparatus 100 is able to decrease the probability of an address conflict.

In this way, the scrambler 6400 in FIG. 64 is able to obtain a 7-bit scramble pattern illustrated in FIG. 66A in accordance with a scrambler seed by using the multiplier 3904 and the bit limiter 6405. The scrambler 6400 may obtain a scramble pattern by using a lookup table instead of using the multiplier 3904. The scramble pattern may be a pseudorandom number (for example, a value obtained by using an M sequence) or may be a value determined by a certain standard in advance.

FIG. 66B is a diagram illustrating an example of scramble patterns obtained by using a lookup table. In FIG. 66B, the value of a scrambler seed is 0 to 12 (C in hexadecimal form). When the value of the seed is 1 to 12, there is no duplication of the scramble pattern. In each scramble pattern, 4 bits among 7 bits are 1. In addition, the number of bits that are 1 is 2 or less.

As a result of determining a scramble pattern in the above-described manner, a carry occurs irregularly in addition performed by the adders 3902a to 3902L, and an effect of scrambling can be enhanced.

Next, a description will be given of a reason for limiting the bit width output from the bit limiter 6405 to 7 bits.

First, the operation of the scrambler 4000 in FIG. 40 will be described in more detail. As described above in the ninth embodiment, the reason the scrambler 4000 is able to decrease the probability of an address conflict is that the adders 3902a to 3902L perform addition of an integer to cause a carry in each bit, thereby changing the pattern of the scrambler output.

For example, when a value "0xCC" and a value "0x43" are added, a carry occurs in the seventh bit. That is, the eighth bit is influenced by the carry and the value is changed. Note that LSB is the first bit and MSB is the eighth bit. On the other hand, when a value "0x55" and a value "0x43" are added, a carry occurs in the first bit. That is, the second bit is influenced by the carry and the value is changed.

Thus, the bit influenced by a carry is different between a case where the scrambler input includes a value "0xCC" and a case where the scrambler input includes a value "0x55", for example. Thus, when the individual values of the scrambler outputs are converted to CRC values, the CRC values are largely different from each other. That is, a carry enhances an effect of scrambling.

However, the carry that occurs in addition of the eighth bit (MSB of octet data) of the adders 3902a to 3902L is discarded by mod 256 (remainder by 256) processing included in the adders 3902a to 3902L. In other words, there is no ninth bit that is to be influenced by the carry. Thus, in accordance with whether the value of the eighth bit of the scramble pattern output from the multiplier 3904 is 0 or 1, the value of the scrambler output can be changed, but there is no influence on the probability of an address conflict. For example, the value of the scrambler output is different between a case where the constant input to the multiplier 3904 is 0x43 and a case where the constant is 0xC3, but the probability of an address conflict is equivalent in both cases.

On the basis of the foregoing consideration, in the scrambler 6400, the output of a scramble pattern is limited to 7 bits, which is smaller than octet data by 1 bit, by using the bit limiter 6405. Accordingly, the probability of an address conflict can be decreased to a probability equivalent to that in the scrambler 4000. Furthermore, since the number of bits of the scramble pattern is small, the circuit scale of the adders 3902a to 3902L can be reduced.

Since the output of a scramble pattern is limited to 7 bits, which is smaller than octet data by 1 bit, by using the bit limiter 6405, the processing of the adders 3902a to 3902L of the scrambler 6400 can reduce the amount of operation when software processing is performed by using a general-purpose CPU or DSP. The following expression is an example of expression (14), which corresponds to the processing of the adders 3902a to 3902L.

$$A\text{out}=((A\text{in} \ \& \ 0x7F7F7F7F7F7F7F7F7F7F7F7F)+ \\ 0x434343434343434343434343) \ \text{xor} \ (A\text{in} \ \& \\ 0x808080808080808080808080) \quad (14)$$

In expression (14), Ain is a 96-bit value and corresponds to a scrambler input (RA+TA). Aout is a 96-bit value and corresponds to a scrambler output (scrambled RA+scrambled TA).

In expression (14), a hexadecimal value 0x7F7F7F7F7F7F7F7F7F7F7F7F is a mask value for obtaining a value in which MSB is rewritten to 0 in each of the first octet to the twelfth octet. 0x434343434343434343434343 is a 96-bit value generated by repeating a scramble pattern (0 is added to MSB to obtain 8 bits) twelve times. The logical conjunction (AND) of Ain and mask 0x7F7F7F7F7F7F7F7F7F7F7F7F is calculated and then a 96-bit scramble pattern is added, so that a carry does not propagate between octets.

In expression (14), a hexadecimal value 0x808080808080808080808080 is a mask value for obtaining a value in which the bits other than MSB are replaced with 0 in each of the first octet to the twelfth octet.

In expression (14), a scramble pattern (0x434343434343434343434343) is different in accordance with a scrambler seed. In a case where a scramble pattern when a seed is a value "seed" is represented by S (seed), the scramble pattern may be calculated in the following manner.

$$S(0)=0 \quad (15)$$

$$S(1)=0x434343434343434343434343 \quad (16)$$

$$S(\text{seed}+1)=(S(\text{seed})+S(1)) \,\&\, 0x7F7F7F7F7F7F7F7F7F7F7F7F \quad (17)$$

Expression (17) is a recurrence relation. Since the output of a scramble pattern is limited to 7 bits, which is smaller than octet data by 1 bit, by using the bit limiter 6405, a scramble pattern can be calculated with a recurrence relation of a small calculation amount by using the mask value 0x7F7F7F7F7F7F7F7F7F7F7F7F. This is useful when it is necessary to calculate an Addressing value for each scrambler seed (SI), as in the case of calculating the values of the table in FIG. 13, because a scramble pattern can be calculated with a small calculation amount.

Expression (14) may be calculated by dividing data into pieces of data of an appropriate number of bits in accordance with the function of a general-purpose CPU or DSP. For example, in the case of using a CPU capable of performing 32-bit operation, Ain may be divided into three pieces of 32-bit data: Ain[95:64], Ain[63:32], and Ain[31:0], and calculation may be performed in accordance with the following expressions, for example.

$$A\text{out}[31:0]=((A\text{in}[31:0] \,\&\, 0x7F7F7F7F)+ 0x43434343) \text{ xor } (A\text{in}[31:0] \,\&\, 0x80808080) \quad (18)$$

$$A\text{out}[63:32]=A\text{in}[63:32] \,\&\, 0x7F7F7F7F)+ 0x43434343) \text{ xor } (A\text{in}[63:32] \,\&\, 0x80808080) \quad (19)$$

$$A\text{out}[95:64]=A\text{in}[95:64] \,\&\, 0x7F7F7F7F)+ 0x43434343) \text{ xor } (A\text{in}[95:64] \,\&\, 0x80808080) \quad (20)$$

FIG. 65 is a diagram illustrating another configuration of the scrambler. A scrambler 6500 illustrated in FIG. 65 includes a splitter 6501, adders 6502a to 6502f, a combiner 6503, a multiplier 6504, and a bit limiter 6505.

The splitter 3901 in FIG. 64 splits a scrambler input in units of octets (8 bits). In contrast, the splitter 6501 in FIG. 65 splits a scrambler input in units of 16 bits (in units of 16-bit words).

The adders 3902a to 3902L in FIG. 64 perform addition in units of octets (8 bits) and calculate a remainder by 256. In contrast, the adders 6502a to 6502f in FIG. 65 perform addition in units of 16 bits and calculate a remainder by $2^{16}$ (16th power of 2, i.e., 65536).

The combiner 3903 in FIG. 64 combines twelve pieces of octet data to generate 96-bit data. In contrast, the combiner 6503 in FIG. 65 combines six pieces of 16-bit word data to generate 96-bit data.

The multiplier 3904 in FIG. 64 multiplies a scrambler seed by a constant of up to 7 bits. In contrast, the multiplier 6504 in FIG. 65 multiplies a scrambler seed by a constant of up to 15 bits.

The bit limiter 6405 in FIG. 64 limits output data to 7 bits. In contrast, the bit limiter 6505 in FIG. 65 limits output data to 15 bits. That is, each of the bit limiter 6405 and the bit limiter 6505 limits bits to reduce the size of data output from the splitter 3901 or the splitter 6501 by 1 bit. Alternatively, the bit limiter 6505 may perform a modulo operation using $2^{15}$ (15th power of 2, i.e., 32768) to limit bits to 15 bits.

In the scrambler 6400, a scrambler input is splitted into twelve pieces of octet data, and thus there are twelve portions in which a carry is discarded in addition. In contrast, in the scrambler 6500, a scrambler input is splitted into six pieces of 16-bit word data, and thus there are six portions in which a carry is discarded in addition. Thus, the scrambler 6500 is able to further decrease the probability of an address conflict.

FIG. 67 is a diagram illustrating another example of combinations of a scrambler seed and a scramble pattern. FIG. 67 illustrates an example of values output from the bit limiter 6505 of the scrambler in FIG. 65. Here, a description will be given of an example in which the constant input to the multiplier 6504 is 22421 (0x5795 in hexadecimal form). The scrambler 6500 is able to change the value of the scramble pattern (output of the bit limiter 6505) by changing the value of the scrambler seed illustrated in FIG. 67. That is, the communication apparatus 100 is able to change the value of a scrambler output and is thus able to decrease the probability of an address conflict.

In FIGS. 65 and 67, the constant that is input to the multiplier 6504 is 5795 in hexadecimal form ("0101011110010101" in binary form), but another value (for example, "5A5A" in hexadecimal form, "0001000100010001" in binary form) may be used. At the time of selecting a constant, it is desired that, as illustrated in FIG. 67, the same scramble pattern be not generated with respect to a plurality of scrambler seeds. In addition, it is desired to avoid a constant at which a value including an unbalanced number of 0 or 1 in binary form (for example, the number of 0 or 1 is 12 or more: "111111011100111" or "100000000000000") appears, such as 0x7EE7 or 0x4000, among the scramble patterns generated for a plurality of scrambler seeds. The foregoing values 5795 and 5A5A (both are hexadecimal numbers) are examples of a value satisfying such a feature. Accordingly, the communication apparatus 100 is able to decrease the probability of an address conflict.

As in the description with reference to FIG. 65, a lookup table that outputs a 15-bit scramble pattern corresponding to a scrambler seed may be used instead of the multiplier 6504 and the bit limiter 6505. With the scramble pattern output from the lookup table being 15 bits, the same effect as in the case of using the bit limiter 6505 (decrease the probability of an address conflict and reduce the amount of calculation) can be obtained.

The calculation by the adders 6502a to 6502f may be performed by software, like the adders 3902a to 3902L. Expression (21) is an example of a calculation expression.

$$A\text{out}=((A\text{in} \,\&\, 0x7FFF7FFF7FFF7FFF7FFF7FFF)+ 0x579557955795579557955795) \text{ xor } (A\text{in} \,\&\, 0x800080008000800080008000) \quad (21)$$

In expression (21), a hexadecimal value 0x7FFF7FFF7FFF7FFF7FFF7FFF is a mask value for obtaining a value in which MSB is rewritten to 0 in each of the first word to the sixth word. 0x579557955795579557955795 is a 96-bit value generated by repeating a scramble pattern (0 is added to MSB to obtain 16 bits) six times. A hexadecimal value 0x800080008000800080008000 is a mask value for obtaining a value in which the bits other than MSB are rewritten to 0 in each of the first word to the sixth word.

As described above, the communication apparatus 100 performs scrambling by using addition of an integer in units of octets, and is thus able to significantly change the CRC value of a scrambler output and to avoid the occurrence of collision in all sSSW frames in ISS or RSS.

In addition, the communication apparatus 100 performs scrambling by using addition of an integer in units of 16-bit words, and is thus able to significantly change the CRC value of a scrambler output and to avoid the occurrence of collision in all sSSW frames in ISS or RSS.

The communication apparatus 100 may perform scrambling by adding an integer after dividing a scrambler input value in units of an arbitrary number of bits (for example, in units of multiple of 8 bits), as well as in units of octets (8 bits) or in units of 16-bit words.

The communication apparatus 100 specifies the number of bits output from the bit limiter to the number of bits that is smaller by 1 bit than a division size of a scrambler input value, but may limit the number of bits to the number of bits smaller by 2 bits or more. The highest performance of avoiding an address conflict can be obtained when the number of bits is smaller by 1 bit. However, if a sufficiently high performance of avoiding an address conflict is obtained even if the number of bits is limited to the number smaller by 2 bits or more, the number of bits may be limited to the number smaller by 2 bits and the amount of calculation may be reduced.

Twentieth Embodiment

Mutual Operation Between Two Communication Apparatuses

Figure 68:
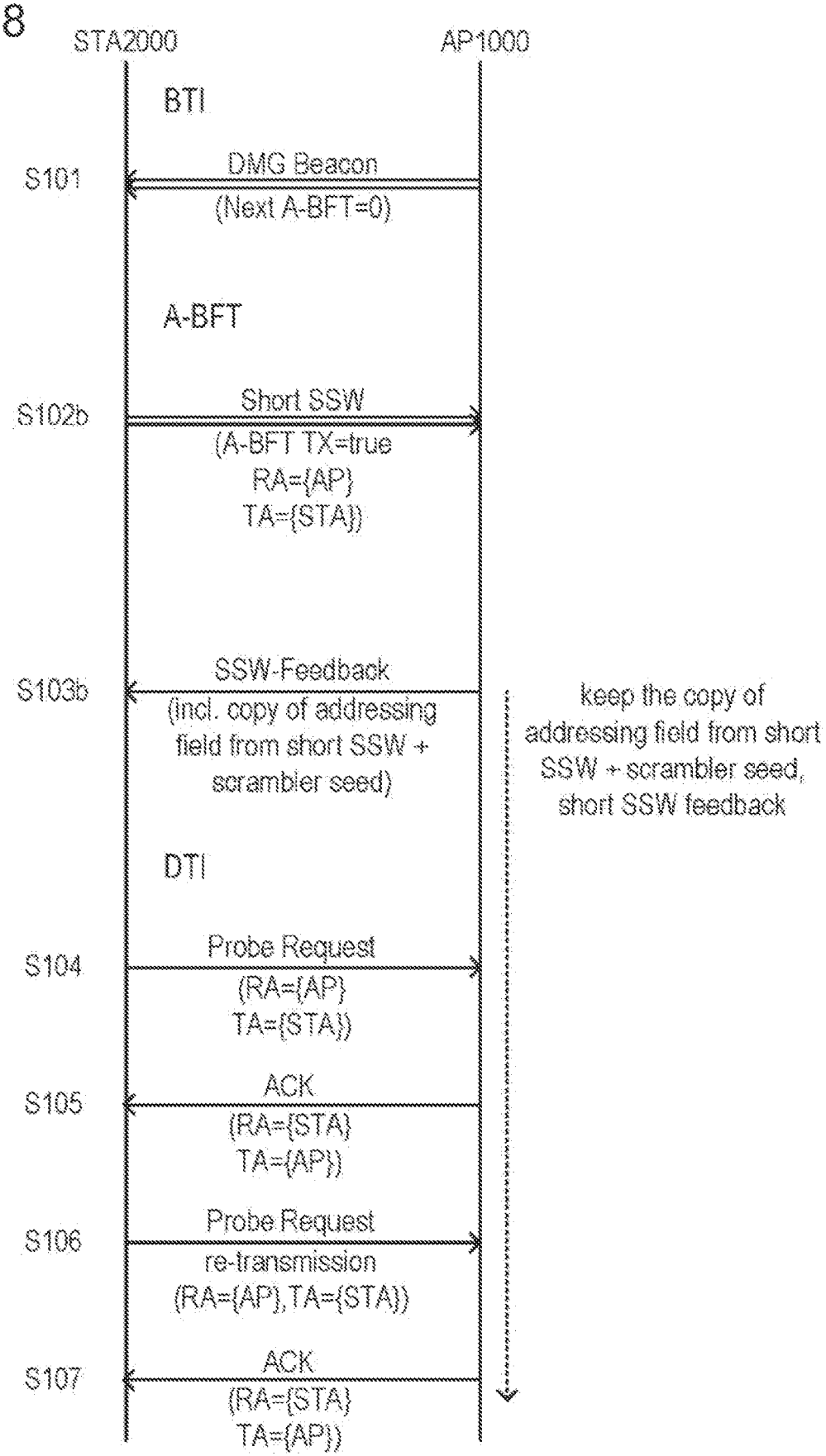
FIG. 68 is a diagram illustrating an example of a procedure in which an AP and an STA perform SLS according to a twentieth embodiment.

FIG. 68 is a diagram illustrating a procedure in which the AP 1000 and the STA 2000 perform an initial connection using SLS. FIG. 68 illustrates, like FIGS. 29 and 52, a case where the STA 2000 receives a DMG Beacon frame in which the value of the Next A-BFT field is 0.

In FIG. 68, step S101, step S102*b*, and step S103*b* are the same as those in FIG. 52, and thus the description thereof is not given. The AP 1000 combines and holds the values of the Copy of Addressing field and the Scrambler seed field transmitted in step S103*b* and the value of the Short SSW Feedback received in step S102*b*.

FIG. 68 illustrates an example of using a procedure including step S101, step S102*b*, and step S103*b* that are the same as in FIG. 52. Alternatively, a procedure including step S101, step S102, and step S103 that are the same as in FIG. 29 may be used.

After the procedure of SLS is completed in step S104, the STA 2000 sets a transmission antenna sector on the basis of information about the best sector received from the AP 1000 in step S103*b* and transmits a Probe Request frame in a DTI period, for example. In the RA and TA fields of the Probe Request frame, actual MAC addresses are included, not a hash value (addressing).

When receiving the Probe Request frame, the AP 1000 knows that RA (reception address) is the MAC address of the AP 1000. On the other hand, the MAC address included in the TA field is unknown. Thus, the AP 1000 calculates an Addressing value by using the values of RA and TA included in the Probe Request frame and the value of the scrambler seed held in step S103*b*.

In step S105, the AP 1000 compares the calculated Addressing value with the value of the Copy of Addressing field held in step S103*b*, and if the values match, determines that the STA is an STA for which SLS has already been performed. Thus, the AP 1000 transmits an ACK frame to the address indicated by TA included in the Probe Request frame (the MAC address of the STA 2000) by setting the transmission antenna sector based on the value of the Short SSW Feedback held in combination with the value of the Copy of Addressing field in step S102*b*.

In step S105, if the Addressing value does not match the value of the Copy of Addressing field, the AP 1000 may transmit ACK by using an omnidirectional or quasi-omnidirectional antenna.

In a case where the AP 1000 has antenna reciprocity (a configuration in which a transmission antenna sector and a corresponding reception antenna sector have the same directivity), if the Addressing value does not match the held value of the Copy of Addressing field in step S105, the AP 1000 may transmit an ACK frame by using an antenna sector number that is the same as the setting of the reception antenna when the Probe Request frame is received.

If the Addressing value does not match the held value of the Copy of Addressing field in step S105, the AP 1000 may randomly select one of the held values of Short SSW Feedback, set a transmission antenna sector based on the value, and transmit an ACK frame. If the AP 1000 has only one value of Short SSW Feedback, the AP 1000 may set a transmission antenna sector on the basis of the one value of Short SSW Feedback without checking addressing and transmit an ACK frame.

If the STA 2000 is not able to receive the ACK frame from the AP 1000 in step S105, the STA 2000 may transmit a Probe Request frame again in step S106.

In step S107, the AP 1000 transmits an ACK frame as in step S105 in response to receipt of the Probe Request frame that is transmitted again. At this time, the AP 1000 may transmit the ACK frame by using a value different from a candidate value of Short SSW-Feedback used in step S105. In addition, the AP 1000 may calculate an Addressing value from the values of RA and TA received in step S104 and may compare the calculated value with the stored value of the Copy of Addressing field in a period of time from step S104 to step S107. By using the period of time from step S104 to step S107, it becomes easy to compare the value with all values of the Copy of Addressing field.

The AP 1000 may transmit an ACK frame by randomly selecting one of the values of Short SSW Feedback held in step S105, and may transmit an ACK frame by appropriately selecting a value of Short SSW Feedback on the basis of comparison of addressing in step S107.

Figure 69:
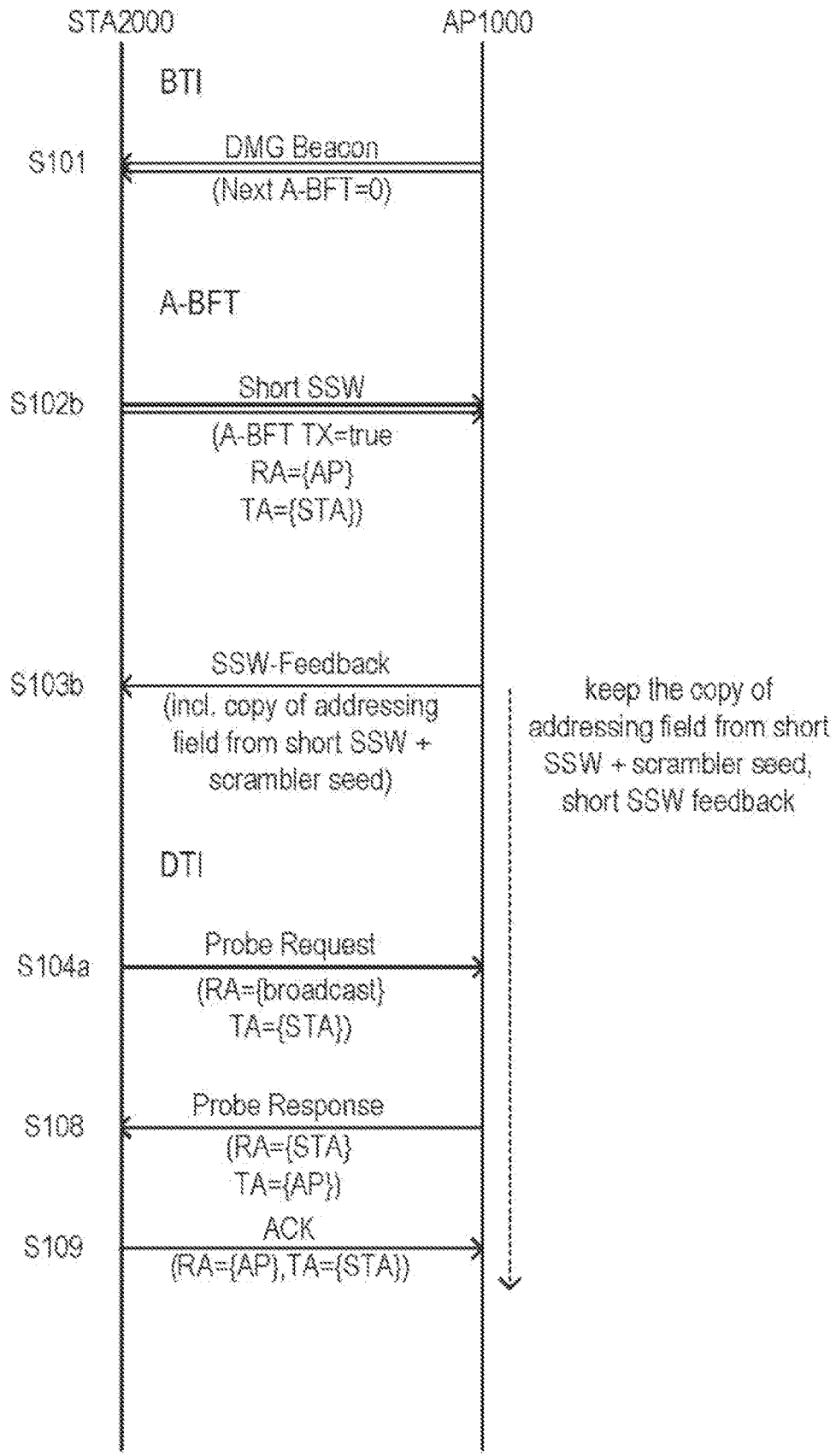
FIG. 69 is a diagram illustrating another example of a procedure in which an AP and an STA perform SLS according to the twentieth embodiment.

FIG. 69 is a diagram illustrating another example of a procedure in which the AP 1000 and the STA 2000 perform an initial connection using SLS. In FIG. 69, step S101, step S102*b*, and step S103*b* are the same as those in FIG. 52, and thus the description thereof is not given.

In step S104*a*, the STA 2000 sets RA (reception address) of the Probe Request frame to a broadcast address (all bits are 1), unlike in step S104 in FIG. 68.

When receiving the Probe Request frame, the AP 1000 calculates an Addressing value by using TA included in the Probe Request frame and using the MAC address of the AP 1000 as a substitute of RA. As in step S104 in FIG. 68, the AP 1000 compares the calculated Addressing value with the held value of the Copy of Addressing field, and determines a transmission antenna sector to be used in a response frame.

In step S108, the AP 1000 transmits a Probe Response frame to the STA 2000 by using the determined transmission antenna sector.

In step S109, the STA 2000 transmits an ACK frame.

In step S104a in FIG. 69, unlike in FIG. 68, the AP 1000 does not need to transmit ACK to the Probe Request frame because RA of the Probe Request frame is a broadcast address. Thus, the AP 1000 is able to have a time to calculate and compare Addressing values in a period of time from step S104a to step S108.

As described above, when the AP 1000 receives a Short SSW frame including an unknown Addressing value in the A-BFT period, the AP 1000 holds the value of Copy of Addressing, the value of scrambler seed, and the value of Short SSW Feedback. Furthermore, when the AP 1000 receives a frame from an unknown address after SLS finishes, the AP 1000 compares Addressing values calculated from the unknown address and the held value of the scrambler seed. Furthermore, if the Addressing values compared with each other match, the AP 1000 transmits a response frame. Thus, even in the case of an STA that is not associated, SLS using Short SSW frames can be performed, and the time required for SLS can be shortened.

In step S104a, the STA 2000 transmits the Probe Request frame. Alternatively, another MAC frame (for example, Association Request) may be transmitted.

In step S108, the AP 1000 transmits the Probe Response frame. Alternatively, another MAC frame (for example, Association Response) may be received.

The AP 1000 may discard the information held from step S103b after a beacon interval (BI) ends. Accordingly, the number of candidate Addressing values to be compared by the AP 1000 can be reduced, and a delay in response (ACK and Probe Response) can be reduced.

The AP 1000 may discard the information held from step S103b to step S107 every time A-BFT starts.

Figure 70:
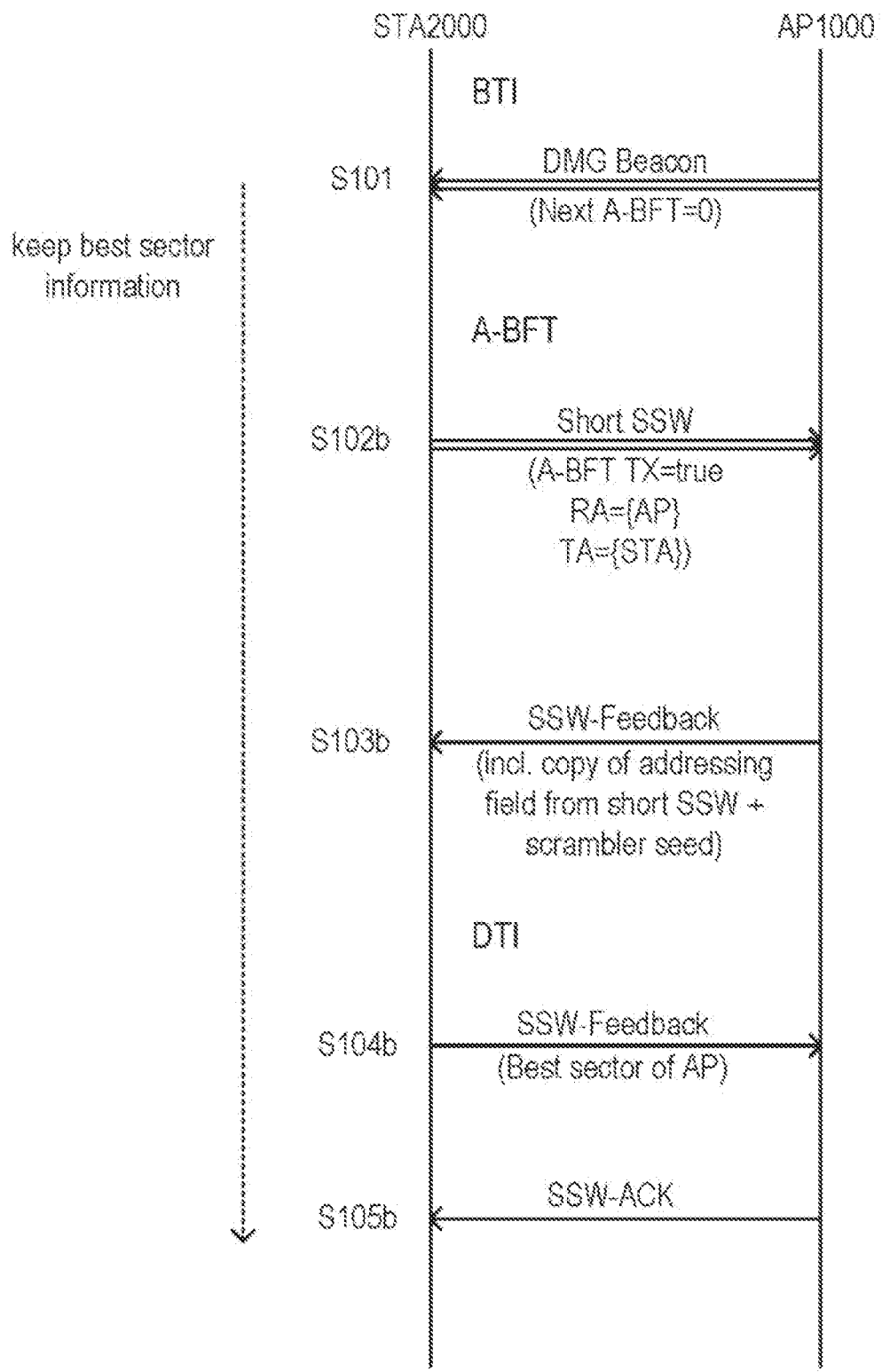
FIG. 70 is a diagram illustrating another example of a procedure in which an AP and an STA perform SLS according to the twentieth embodiment.

FIG. 70 is a diagram illustrating another example of a procedure in which the AP 1000 and the STA 2000 perform an initial connection using SLS.

In FIG. 70, step S101, step S102b, and step S103b are the same as those in FIG. 52, and thus the description thereof is not given. The STA 2000 holds information about the best sector selected in step S101 (i.e., ISS) in combination with the MAC address of the AP 1000. On the other hand, in FIG. 70, the AP 1000 does not hold the value of Copy of Addressing and so forth in step S103b, unlike in FIG. 68.

In step S104b, the STA 2000 transmits an SSW-Feedback frame to the AP 1000 after the procedure of SLS including steps S101 to S103b ends, for example, in a DTI period. At this time, the STA 2000 transmits the SSW-Feedback frame that includes the information about the best sector held from step S101.

In step S105b, the AP 1000 is able to obtain, from the content of the SSW-Feedback frame, the MAC address of the STA 2000 and information about the transmission antenna sector to be used for transmission to the STA 2000. The AP 1000 transmits an SSW-ACK frame by using the information obtained in step S104b.

In this way, when the STA 2000 performs RSS by using Short SSW in the A-BFT period, the STA 2000 holds information about the best sector of the AP 1000 and transmits an SSW-Feedback frame not accompanied by ISS and RSS after SLS ends. Thus, even in the case of an STA that is not associated, SLS using Short SSW frames can be performed, and the time required for SLS can be shortened.

Figure 71:
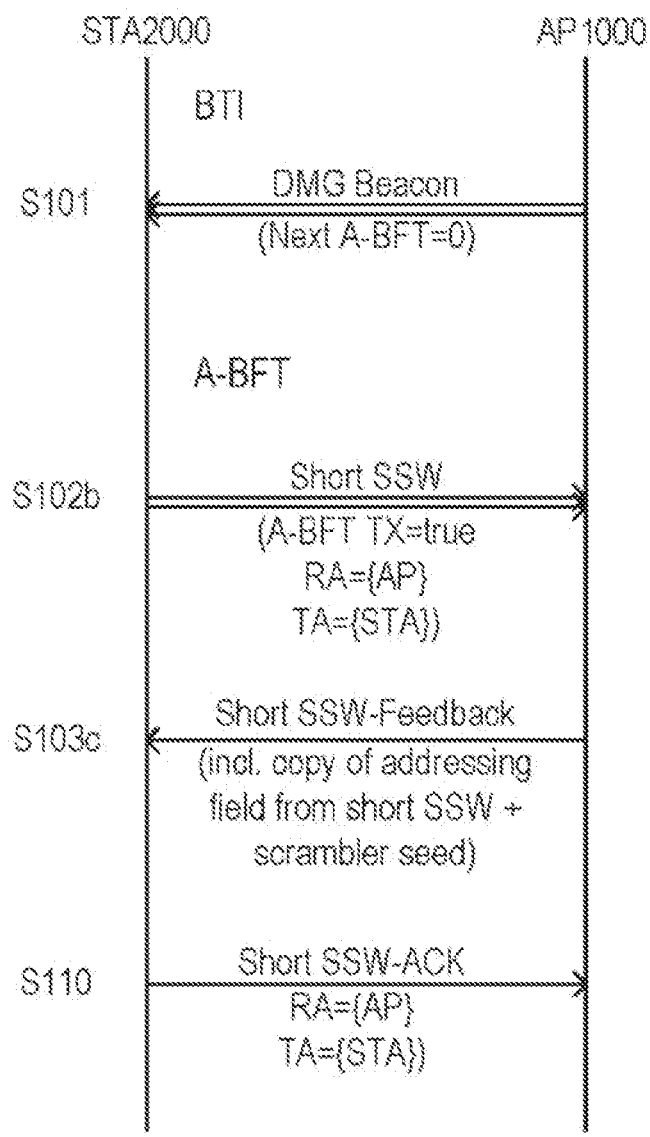
FIG. 71 is a diagram illustrating another example of a procedure in which an AP and an STA perform SLS according to the twentieth embodiment.

FIG. 71 is a diagram illustrating another example of a procedure in which the AP 1000 and the STA 2000 perform an initial connection using SLS. In FIG. 71, step S101 and step S102b are the same as those in FIG. 52, and thus the description thereof is not given.

After receiving a Short SSW frame in step S102b, the AP 1000 transmits a response frame in step S103c, as in FIG. 52. In FIG. 52, the SSW-Feedback frame in FIG. 31 is used as a response frame, for example. In FIG. 71, unlike in FIG. 52, an SSW-Feedback frame having a shorter length (called "Short SSW-Feedback frame" or "sSSW-Feedback frame") is used.

After receiving the Short SSW-Feedback frame in step S103c, the STA 2000 transmits a Short SSW-ACK (sSSW-ACK) frame in step S110. If the STA 2000 receives an SSW-Feedback frame or an SSW-Feedback frame that is not short in A-BFT, the STA 2000 does not transmit an SSW-ACK frame. The Short SSW-ACK frame includes information about the MAC address of the STA 2000. By receiving the Short SSW-ACK frame, the AP 1000 is able to know the MAC address of the STA 2000 and to know the combination of the MAC address of the STA 2000 and information about the best sector to be used to transmit a frame to the STA 2000 (received in step S102b).

Figure 72:
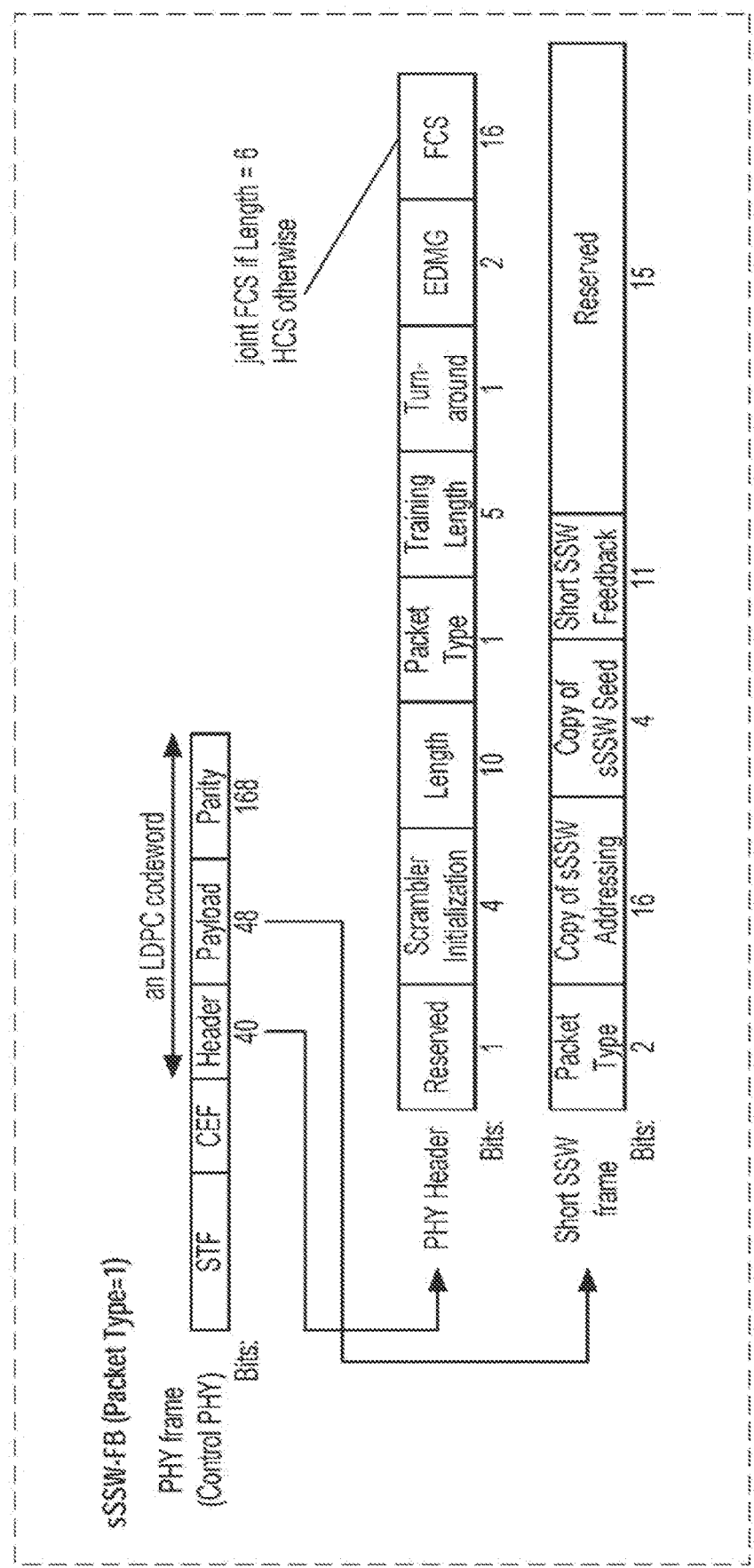
FIG. 72 is a diagram illustrating an example of the format of an sSSW-Feedback frame according to the twentieth embodiment.

FIG. 72 illustrates the format of the sSSW-Feedback frame. As in the Short SSW frame in FIG. 44, Length is set to 6 and the frame is transmitted in MCSO. The PHY Header portion of the sSSW-Feedback frame is the same as the PHY Header portion in FIG. 44. However, as described above in the tenth embodiment, if Length is less than 14, FCS is used instead of HCS, and the joint FCS field is omitted.

The Payload portion of the sSSW-Feedback frame in FIG. 72 includes a Packet Type field, a Copy of sSSW Addressing field, a Copy of sSSW Seed field, and a Short SSW Feedback field. The other bits are reserved.

The value of the Packet Type field of the sSSW-Feedback frame is 1. Thus, if a received packet is modulated by MCSO and if Length is 6, the receiver refers to the first two bits of Payload, determines that the frame is an sSSW frame if the value is 0, and determines that the frame is an sSSW-Feedback frame if the value is 1.

The Copy of sSSW Addressing field and the Copy of sSSW Seed field of the sSSW-Feedback frame are the same as the Copy of Addressing field and the Scrambler seed field of the SSW-Feedback frame in FIG. 31.

The Short SSW Feedback field of the sSSW-Feedback frame includes a CDOWN value corresponding to the best sector selected in RSS (step S102b).

Figure 73:
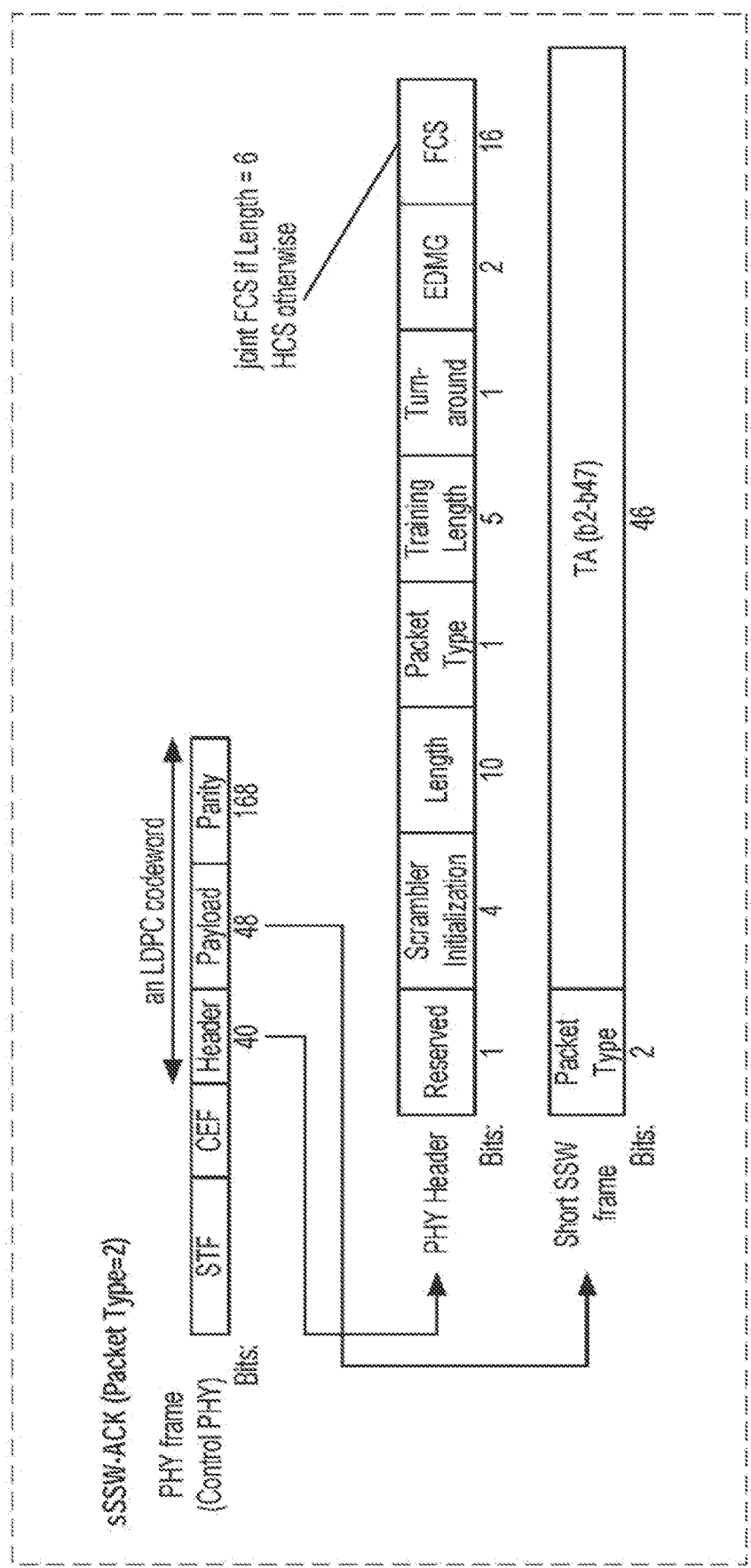
FIG. 73 is a diagram illustrating an example of the format of an sSSW-ACK frame according to the twentieth embodiment.

FIG. 73 illustrates the format of the sSSW-ACK frame. As in the Short SSW frame in FIG. 44, Length is set to 6 and the frame is transmitted in MCSO. The PHY Header portion of the sSSW-ACK frame is the same as the PHY Header portion in FIG. 72.

The Payload portion of the sSSW-ACK frame in FIG. 73 includes a Packet Type field and a TA field. In the Packet Type field, a value "2" is set.

The TA field includes the upper 46 bits of a source address (i.e., the MAC address of the STA 2000). The AP 1000 is able to know the upper 46 bits of the MAC address of the STA 2000, that is, the portion except the lower 2 bits, by receiving the sSSW-ACK frame.

A description will be given of a method for notifying the AP 1000 of the lower 2 bits of the MAC address of the STA 2000.

Figure 74:
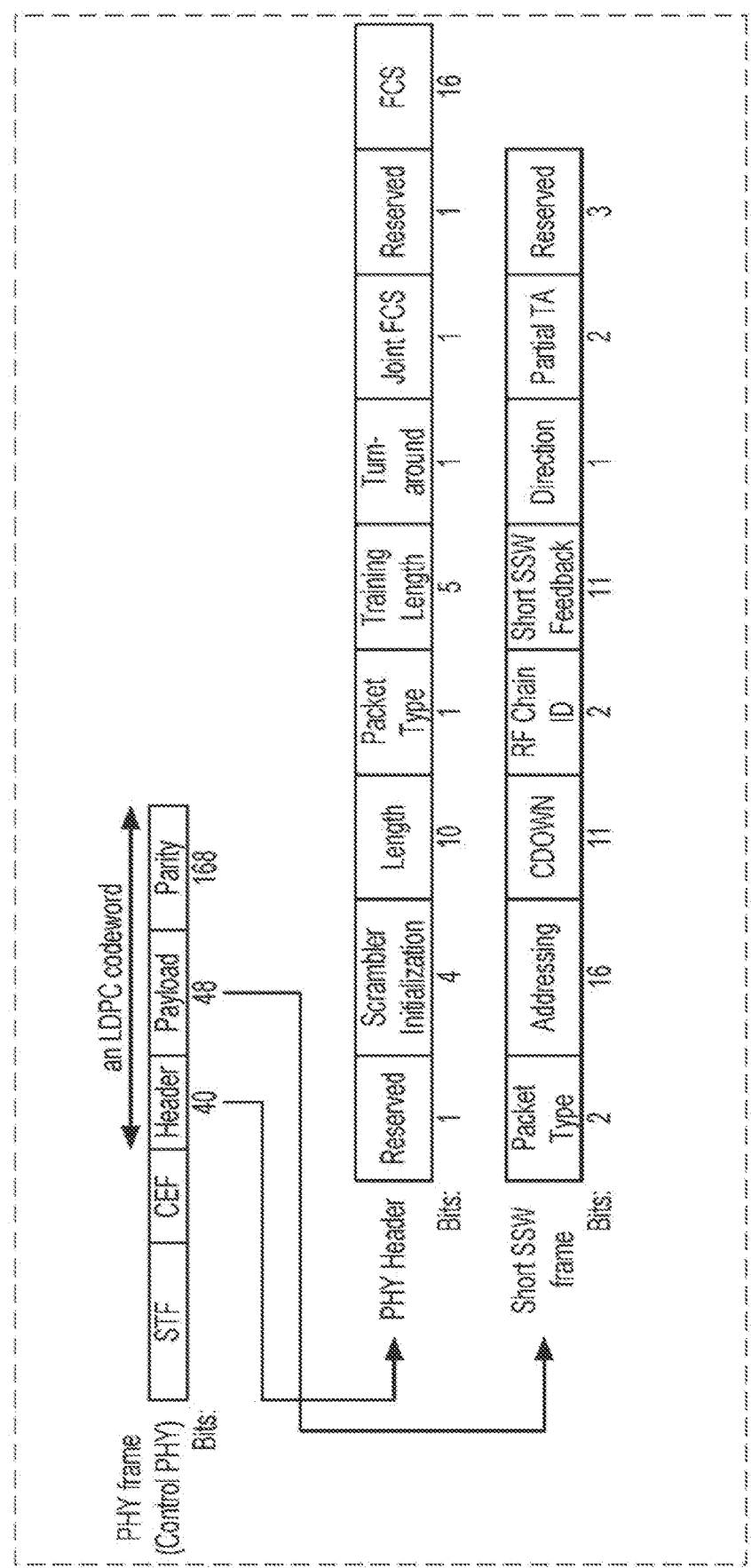
FIG. 74 is a diagram illustrating an example of a PHY frame according to the twentieth embodiment.

The STA 2000 uses the PHY frame in FIG. 74 instead of the PHY frame in FIG. 44 in step S102b. The PHY frame in FIG. 74 includes a 2-bit Partial TA field, unlike the PHY frame in FIG. 44. The Partial TA field includes the lower 2 bits of the source address (i.e., the MAC address of the STA 2000).

That is, the AP 1000 is able to know the lower 2 bits of the MAC address of the STA 2000 by receiving the PHY frame in FIG. 74 in step S102b, and is also able to know the upper 46 bits of the MAC address of the STA 2000 by receiving the sSSW-ACK frame in FIG. 73 in step S110. As a result, the AP 1000 is able to know all the 48 bits of the MAC address of the STA 2000.

Figure 75A:
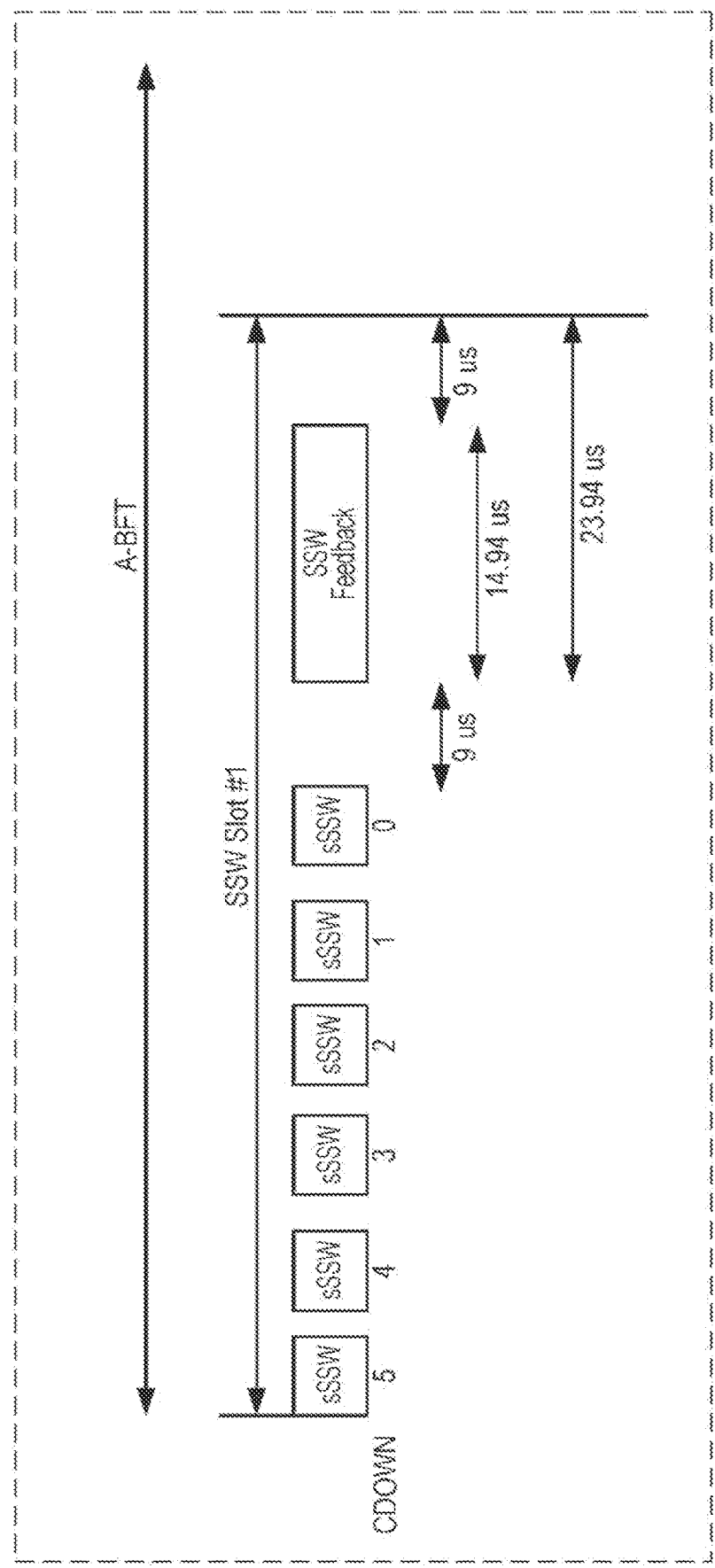
FIG. 75A is a diagram illustrating an example of timing in the case of performing SLS by using Short SSW frames in A-BFT according to the twentieth embodiment.
Figure 75B:
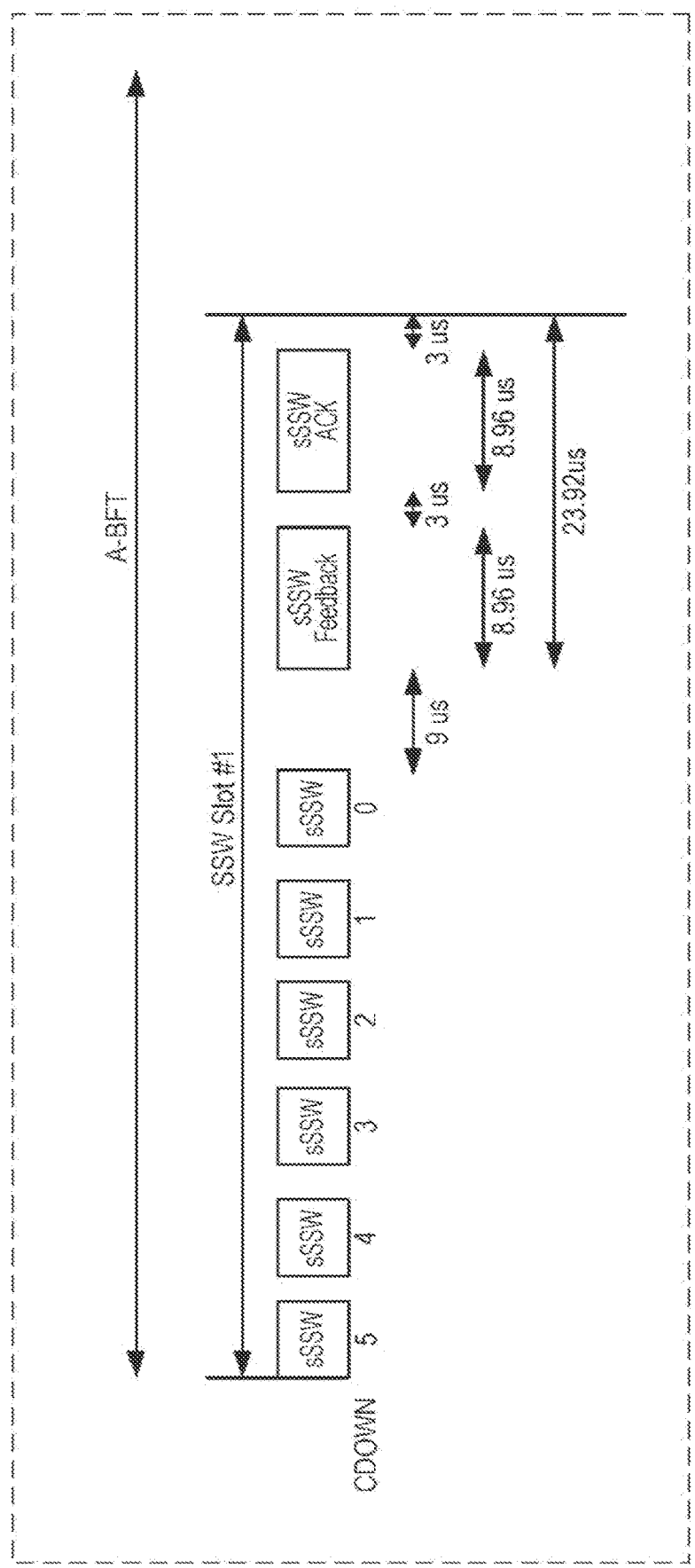
FIG. 75B is a diagram illustrating another example of timing in the case of performing SLS by using Short SSW frames in A-BFT according to the twentieth embodiment.

FIG. 75A is a diagram illustrating an example of the timing to perform SLS by using Short SSW frames in A-BFT and illustrates the case of using an SSW Feedback frame (for example, the procedure in FIG. 52). FIG. 75B is a diagram illustrating another example of the timing to perform SLS by using Short SSW frames in A-BFT and illustrates the case of using a Short SSW-Feedback frame and a Short SSW-ACK frame (for example, the procedure in FIG. 71).

In FIG. 75A, transmission of an SSW Feedback frame is started about 23.94 μs before the end of the SSW Slot. In FIG. 75B, transmission of a Short SSW Feedback frame is started about 23.92 μs before the end of the SSW Slot. That is, the number of Short SSW frames transmitted in a single SSW Slot is equivalent in FIGS. 75A and 75B, and also the number of sectors for training is equivalent.

In this way, the STA 2000 transmits the lower 2 bits of TA by using Short SSW in the A-BFT period and transmits a Short SSW-ACK frame in the A-BFT. Thus, even in the case of an STA that is not associated, SLS using Short SSW frames can be performed and the time required for SLS can be shortened.

Twenty-First Embodiment

In a twenty-first embodiment, a description will be given of another procedure in which the STA 2000 and the STA 3000 perform SLS illustrated in FIG. 63 according to the eighteenth embodiment. A description of the same part as that in the eighteenth embodiment will not be given.

In FIG. 63, the STA 3000 may calculate, before step S501, an Addressing value while regarding the STA 3000 as RA and the STA 2000 as TA and may hold the Addressing value in the addressing table (For example, FIG. 12). For example, if an announce frame (not illustrated) transmitted from the AP 1000 is received by the STA 3000 before step S501 and if the announce frame includes information about the MAC address of the STA 2000, the STA 3000 calculates an Addressing value while regarding the STA 3000 as RA and the STA 2000 as TA.

When the STA 3000 receives a Grant frame in step S501, the STA 3000 may calculate an Addressing value while regarding the STA 3000 as RA and the STA 2000 as TA and may hold the Addressing value in the addressing table (for example, FIG. 12). For example, when the STA 3000 receives an announce frame (not illustrated) transmitted from the AP 1000 before step S501, if the announce frame includes information about the MAC address of the STA 2000, the STA 3000 holds the information about the MAC address of the STA 2000 but does not calculate an Addressing value. The STA 3000 calculates an Addressing value upon receiving a Grant frame, and thus does not need to hold many Addressing values and is able to decrease the probability of an address conflict.

When the STA 3000 receives an announce frame (not illustrated) transmitted from the AP 1000 before step S501, the STA 3000 may calculate an Addressing value that is based on a combination of the AP 1000 and the STA 3000 (i.e., including a case where the AP 1000 is TA and the STA 3000 is RA and a case where the AP 1000 is RA and the STA 3000 is TA) and may not calculate an Addressing value that is based on a combination of the STA 3000 and the STA 2000. At this time, Short SSW can be received from the AP, and Short SSW can be received from an STA other than the AP when a Grant frame is received. Accordingly, the STA 3000 is able to decrease the probability of wrongly determining Short SSW transmitted from an unintended STA (i.e., an STA other than the AP 1000 and STA 2000) to be addressed to the STA 3000.

The STA 3000 in FIG. 63 may discard the calculated Addressing value (for example, delete the corresponding address from FIG. 12) after a certain period of time elapses from when a Grant frame is received. For example, the STA 3000 may discard the Addressing value after a Beacon Interval (BI) period ends. Accordingly, the STA 3000 does not need to hold many Addressing values and is able to decrease the probability of wrongly determining Short SSW transmitted from an unintended STA to be addressed to the STA 3000.

Twenty-Second Embodiment

In a twenty-second embodiment, a description will be given of another procedure in which the AP 1000 and the STA 2000 perform SLS illustrated in FIG. 56 according to the sixteenth embodiment. A description of the same part as that in the sixteenth embodiment will not be given. In FIG. 56, the STA 3000 is near the AP 1000, and the signals transmitted by the AP 1000 and the STA 2000 may be received by the STA 3000. In the sixteenth embodiment, the STA 3000 is not associated with the AP 1000. However, in the twenty-second embodiment, the STA 3000 is associated with the AP 1000.

In FIG. 56, the STA 3000 may calculate, before step S301, an Addressing value while regarding the STA 3000 as RA and the STA 2000 as TA and may hold the Addressing value in the addressing table (For example, FIG. 12). For example, if an announce frame (not illustrated) transmitted from the AP 1000 is received by the STA 3000 before step S301 and if the announce frame includes information about the MAC address of the STA 2000, the STA 3000 calculates an Addressing value while regarding the STA 3000 as RA and the STA 2000 as TA.

When the STA 3000 receives an announce frame (not illustrated) transmitted from the AP 1000 before step S301, if the announce frame includes information about the MAC address of the STA 2000, the STA 3000 may hold the information about the MAC address of the STA 2000 without calculating an Addressing value. The STA 3000 calculates an Addressing value upon receiving a Grant frame, and thus does not need to hold many Addressing values and is able to decrease the probability of an address conflict.

In FIG. 56, unlike in FIG. 63, the STA 3000 does not receive a Grant frame for performing SLS with the STA 2000 from the AP 1000 and thus does not need to calculate an Addressing value that is based on a combination of the STA 3000 and the STA 2000. Accordingly, when the STA 3000 receives an sSSW frame from the STA 2000 in step S303 in FIG. 56, the STA 3000 determines that the addresses do not match. Thus, the STA 3000 is able to decrease the probability of wrongly determining that Short SSW transmitted from an unintended STA (i.e., an STA other than the AP 1000) is addressed to the STA 3000.

When the STA 3000 receives an announce frame (not illustrated) transmitted from the AP 1000 before step S301, the STA 3000 may calculate an Addressing value that is based on a combination of the AP 1000 and the STA 3000 (i.e., including a case where the AP 1000 is TA and the STA 3000 is RA and a case where the AP 1000 is RA and the STA 3000 is TA) and may not calculate an Addressing value that is based on a combination of the STA 3000 and the STA 2000. At this time, Short SSW can be received from the AP, and Short SSW can be received from an STA other than the AP when a Grant frame is received. Accordingly, the STA 3000 is able to decrease the probability of wrongly determining Short SSW transmitted from an unintended STA (i.e., an STA other than the AP 1000 and STA 2000) to be addressed to the STA 3000.

Twenty-Third Embodiment

Figure 76:
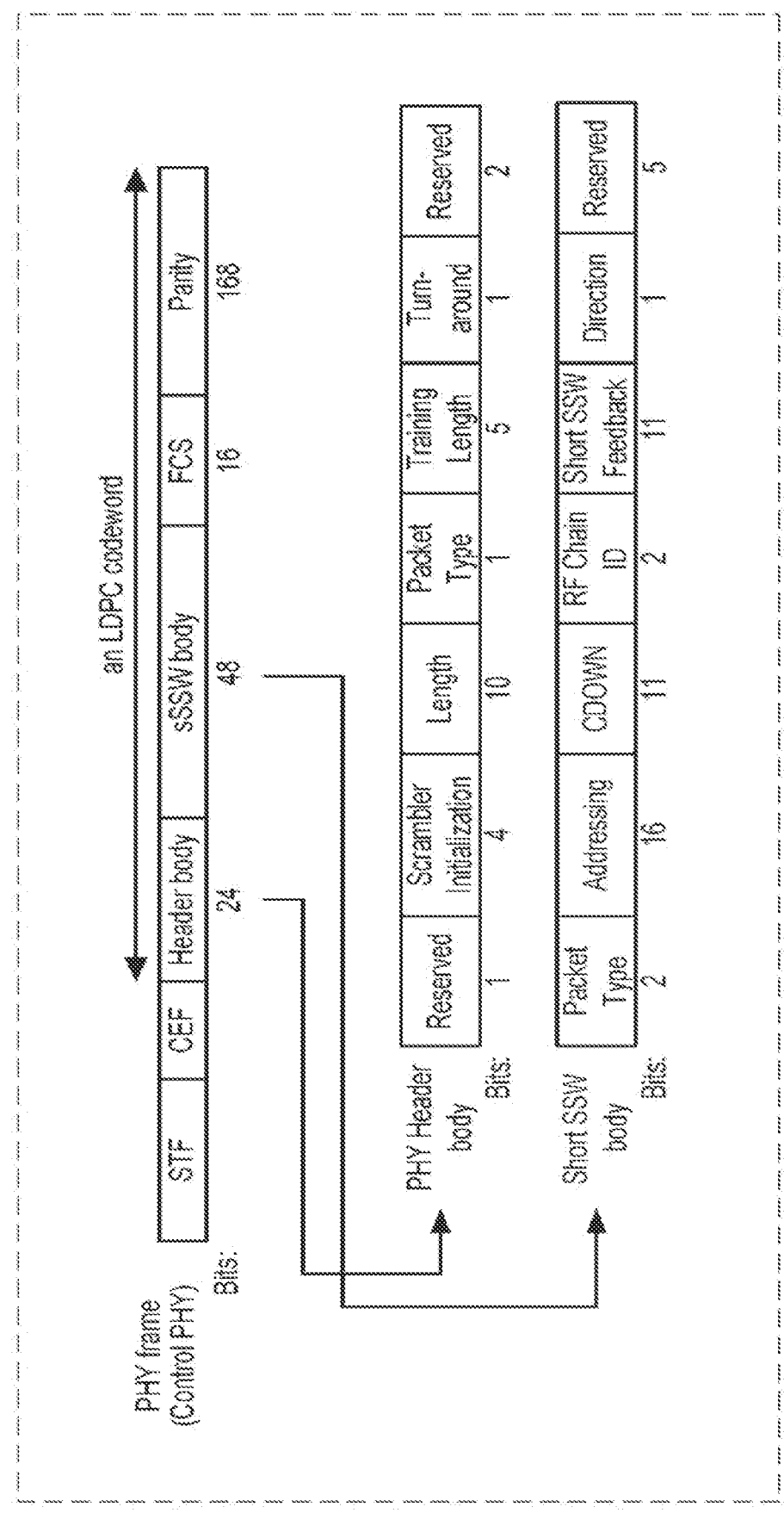
FIG. 76 is a diagram illustrating an example of the configuration of a PHY frame according to a twenty-third embodiment.

Example of Configuration of PHY Frame
Transmission Operation of Communication Apparatus FIG. 76 illustrates an example of the configuration of a PHY frame. In the PHY frame in FIG. 76, the PHY Header body field does not include an HCS field compared with the PHY header in FIG. 5. The PHY header not including HCS is referred to as a PHY Header body field or a Header body field. That is, the Header body field in FIG. 76 is equivalent to a PHY header of the 11ad standard from which the HCS field has been removed. That is, in the PHY Header body field, the portion to the Reserved field has the same configuration as the PHY Header field and thus the receiver operates in the same way.

In the PHY frame in FIG. 76, the sSSW body field does not include an FCS field compared with the sSSW frame in FIG. 5. The sSSW frame not including FCS is referred to as a Short SSW body field or an sSSW body field. The sSSW body field has 48 bits, which is larger by 4 bits than that in FIG. 5. That is, the sSSW body field in FIG. 76 has a format in which the FCS field in the sSSW frame in FIG. 5 is replaced with a Reserved field.

The PHY frame in FIG. 76 includes an FCS field compared with the PHY frame in FIG. 5. That is, in FIG. 76, the PHY Header body field and the Short SSW body field do not include an FCS field, but the PHY frame includes the FCS field.

Hereinafter, a description will be given of a case where a communication apparatus (AP) transmits the PHY frame in FIG. 76 and a communication apparatus (STA) receives the PHY frame in FIG. 76. The same applies to a case where the communication apparatus (STA) transmits the PHY frame in FIG. 76 and the communication apparatus (AP) receives the PHY frame in FIG. 76 and a case where the communication apparatus (STA) transmits the PHY frame in FIG. 76 and a communication apparatus (STA) receives the PHY frame in FIG. 76.

The communication apparatus (AP) sets the value of the Length field of the Header body field to 6. This indicates that the sSSW body field has 6 octets (48 bits). That is, the communication apparatus (STA) checks the Header body field in the preceding stage and is thus able to determine which of the sSSW body field and the sSSW frame is located in the subsequent stage.

The communication apparatus (AP) may set the value of Length to a value less than 14 and transmit the PHY frame, thereby indicating that the PHY frame includes an sSSW body field. In the 11ad standard, the value of Length is defined to be 14 or more. Thus, Length smaller than 14 indicates a frame format different from that of the 11ad standard.

The communication apparatus (AP) may transmit the PHY frame in which the value of the Reserved bit at the end of the Header body field is set to 3 (11 in binary form), so as to indicate that the PHY frame includes an sSSW body field.

The communication apparatus (AP) may transmit the PHY frame in which the value of the Reserved bit at the end of the Header body field is set to 3 (11 in binary form), the value of the Packet Type field is set to 1, and the value of the Training Length field is set to 0, so as to indicate that the PHY frame includes an sSSW body field.

In this way, the communication apparatus (AP) sets the value of the Reserved bit to a value other than 0, thereby indicating that the PHY frame includes a field different from that of the 11ad standard (for example, an sSSW body field). When the Training Length field is set to 0, a terminal according to the 11ad standard according to the related art does not refer to the value of the Packet Type field, and thus the communication apparatus (AP) may include, in the PHY frame, a field corresponding to the value of the Packet Type field. Accordingly, a plurality of fields (sSSW body field and so forth) not included in the 11ad standard can be newly added without giving an influence on a terminal according to the 11ad standard.

The communication apparatus (AP) calculates 16-bit CRC. The CRC is calculated by, as in FIG. 45, coupling the Header body field and the sSSW body field into a single data sequence and regarding the data sequence as input data. The communication apparatus (AP) sets the calculated CRC value as the value of the FCS field of the PHY frame in FIG. 76 and transmits the PHY frame.

Reception Operation of Communication Apparatus

The communication apparatus (STA) that has received the PHY frame refers to the Length field of the received PHY header or PHY Header body field. If the value of the Length field is 6, the communication apparatus (STA) determines that the received PHY frame includes an sSSW body field. In this case, the communication apparatus (STA) calculates a CRC value from the values of the received Header body field and sSSW body field and compares the CRC value with the received FCS value. If both the values match, the communication apparatus (STA) determines that there are no bit errors and continues the reception processing of the sSSW body field. If both the values do not match, the communication apparatus (STA) determines that there is a bit error and discards the data of the received sSSW body field.

The communication apparatus (STA) that has received the PHY frame refers to the Length field of the received PHY header or PHY Header body frame. If the value of the Length field is not 6, the communication apparatus (STA) determines that the received frame does not include an sSSW body field. In this case, the communication apparatus (STA) continues the processing of receiving a PHY frame in accordance with the 11ad standard.

The communication apparatus (STA) may determine whether the received PHY frame includes an sSSW body field by determining whether the value of Length is less than 14. The communication apparatus (STA) may determine whether the received PHY frame includes an sSSW body field by determining whether the value of the Reserved bit at the end of the Header body is 3 (11 in binary form).

The communication apparatus (STA) may determine whether the received PHY frame includes an sSSW body field by determining whether the value of the Reserved bit at the end of the Header body is 3 (11 in binary form), whether the value of the Packet Type field is 1, and whether the value of the Training Length field is 0.

Next, a description will be given of a case where the communication apparatus (STA) receives the PHY frame in FIG. 76 when the communication apparatus (STA) is not compatible with the processing of receiving an sSSW body field (for example, when the communication apparatus (STA) is compatible with the 11ad standard and is incompatible with the 11ay standard).

The communication apparatus (STA) calculates CRC (HCS in the 11ad standard) from the received Header body field. If the received frame is a PHY frame of the 11ad standard, the communication apparatus (STA) compares the calculated CRC with the first 16 bits of the sSSW body field located at the position of the HCS field.

In the PHY frame in FIG. 76, the first 16 bits of the sSSW body field is different from HCS, which is the CRC calculated from the Header body field, and thus the comparison result is "mismatch". Thus, the communication apparatus (STA) determines that the PHY header includes a bit error and discards the received PHY frame.

In this way, in the frame format in FIG. 76, the PHY header (Header body field) not including CRC is followed by the sSSW body field, and the sSSW body field is followed by FCS. Thus, the Reserved bits of the sSSW body field can be increased, and it becomes easy to add a function to the sSSW body field. For example, the Reserved bits in FIG. 76 may include the A-BFT TX field in FIG. 53.

In addition, for example, the Reserved bits and the Addressing field in FIG. 76 may be combined to form a 21-bit field, which may be used as an Addressing field. Accordingly, a large number of bits can be used as an Addressing value, and thus the probability of an address conflict can be decreased.

Another Example of Configuration of PHY Frame

Figure 77:
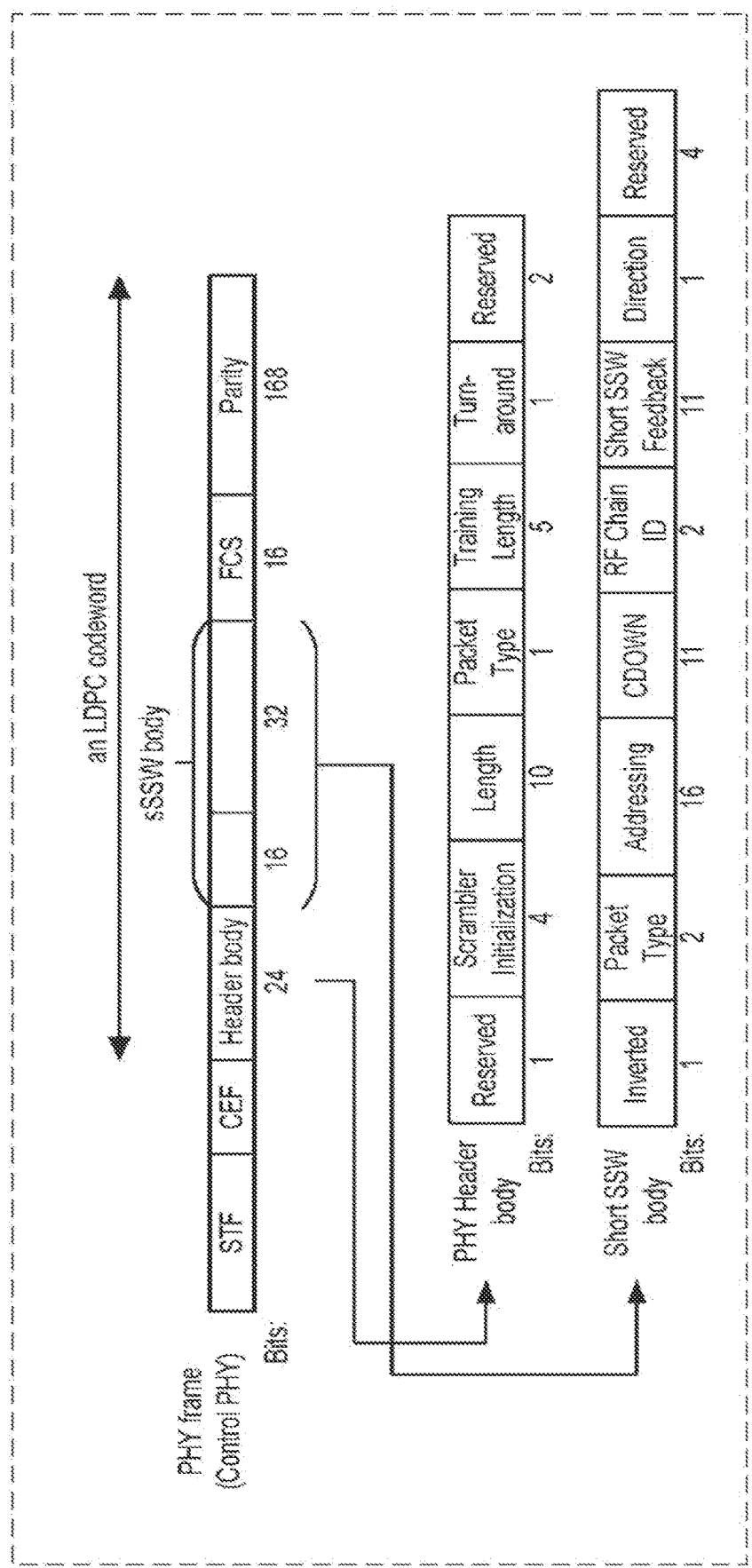
FIG. 77 is a diagram illustrating another example of the configuration of the PHY frame according to the twenty-third embodiment.

FIG. 77 is a diagram illustrating another example of the configuration of a PHY frame. The sSSW body field in FIG. 77 includes, unlike the sSSW body field in FIG. 76, an Inverted field at the top of the sSSW body field. The PHY Header body field and the FCS field in FIG. 77 are the same as those of the PHY frame in FIG. 76.

Transmission Operation of Communication Apparatus

Figure 78:
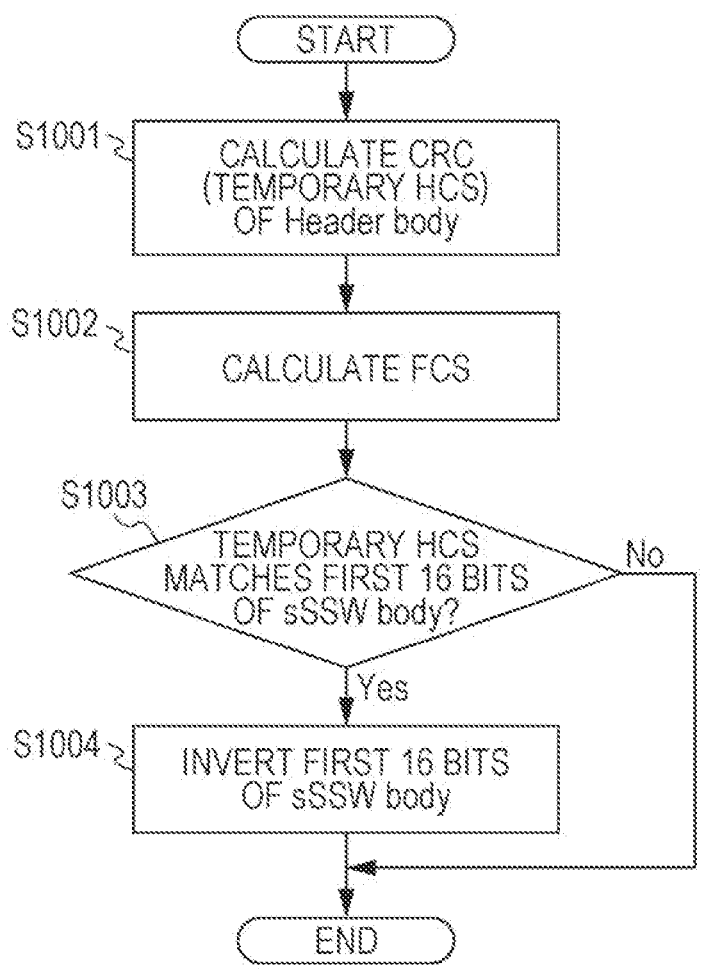
FIG. 78 is a flowchart illustrating an example of the procedure of calculating the values of individual fields of the PHY frame according to the twenty-third embodiment.

FIG. 78 is a flowchart illustrating an example of a procedure of calculating the value of each field of the PHY frame in FIG. 76 at the time of transmission. First, as in the first or twelfth embodiment, the communication apparatus (AP) generates a Header body field and an sSSW body field. At this time, the communication apparatus (AP) sets the Inverted field to 0.

In step S1001, the communication apparatus (AP) calculates a CRC value from the Header body field in FIG. 77. The calculated CRC value is referred to as temporary HCS. The temporary HCS is calculated in accordance with the HCS calculation method defined by the 11ad standard, but is not included in the PHY frame unlike in the 11ad standard.

In step S1002, the communication apparatus (AP) calculates FCS from the Header body field and the sSSW body field in FIG. 77. FCS may be calculated in accordance with the HCS calculation method defined by the 11ad standard. Here, calculation of FCS includes calculation of temporary HCS, and thus the amount of processing for calculating the temporary HCS can be decreased in step S1001.

In step S1003, the communication apparatus (AP) compares the value of the temporary HCS with the first 16 bits of the sSSW body field. If the values match, the communication apparatus (AP) performs step S1004. If the values do not match, the processing ends.

In step S1004, the communication apparatus (AP) inverts the value of 16 bits at the top of the sSSW body field. That is, the communication apparatus (AP) interchanges 0 and 1 when the value of 16 bits at the top of the sSSW body field is expressed in binary form.

After the processing in FIG. 78 ends, the communication apparatus (AP) performs bit scrambling, LDPC coding, modulation, and so forth, and transmits the PHY frame.

In step S1004, the communication apparatus (AP) may invert data whose number of bits is not 16, instead of inverting the value of 16 bits at the top of the sSSW body field. At this time, the data portion to be inverted includes an Inverted field. For example, the communication apparatus (AP) may invert the value of the first 3 bits. At this time, the Inverted field and the Packet Type field are inverted, and the Addressing field is not inverted. Accordingly, the receiver is able to perform processing of the Addressing field before performing processing of resetting inversion.

Reception Operation of Communication Apparatus

The communication apparatus (STA) that has received the PHY frame refers to the Length field of the received PHY header or PHY Header body. If the value is 6, the communication apparatus (STA) determines that the received PHY frame includes an sSSW body field.

Subsequently, the communication apparatus (STA) refers to the Inverted field. If the value is 1, the communication apparatus (STA) inverts the value of 16 bits at the top of the received sSSW body field.

Subsequently, the communication apparatus (STA) calculates a CRC value from the values of the received Header body field and sSSW body field and compares the CRC value with the value of the received FCS field. If the values match, the communication apparatus (STA) determines that there is no bit errors and continues the processing of receiving an sSSW body field. If the values do not match, the communication apparatus (STA) determines that there is a bit error and discards the data of the received sSSW body field.

The communication apparatus (AP) sets the value of the Inverted field to 0, and thus the value of the Inverted field is 1 when the first 16 bits of the sSSW body field are inverted in step S1004. Thus, the communication apparatus (STA) is able to determine whether bit inversion is performed in the received sSSW body field.

Next, a description will be given of a case where the communication apparatus (STA) receives the PHY frame in FIG. 77 when the communication apparatus (STA) is incompatible with the processing of receiving the sSSW body field (for example, when the communication apparatus (STA) is compatible with the 11ad standard and is incompatible with the 11ay standard).

The communication apparatus (STA) calculates CRC (HCS in the 11ad standard) from the received Header body field and compares it with the first 16 bits of the sSSW body field. In the sSSW body field, the first 16 bits of the sSSW body field are different from HCS, and thus both do not match. Thus, the communication apparatus (STA) determines that there is a bit error in the PHY header and discards the received PHY frame.

In the frame format in FIG. 76, there is a possibility that HCS calculated by the communication apparatus (STA) and the first 16 bits of the sSSW body field have the same value. On the other hand, in the frame format in FIG. 77, the communication apparatus (AP) performs steps S1003 and S1004 in FIG. 78, thereby decreasing the possibility that HCS calculated by the communication apparatus (STA) and the first 16 bits of the sSSW body field have the same value.

Accordingly, it is possible to decrease the probability that the communication apparatus (STA) performs a wrong operation.

Figure 79:
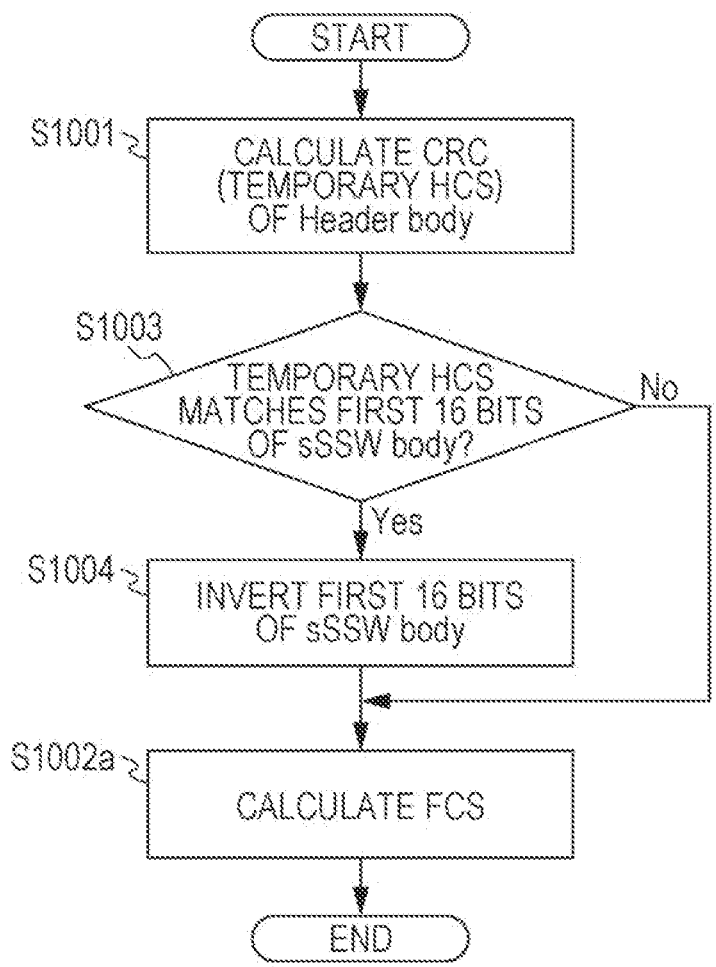
FIG. 79 is a flowchart illustrating another example of the procedure of calculating the values of individual fields of the PHY frame according to the twenty-third embodiment.

In FIG. 78, the communication apparatus (AP) performs step S1002 (calculation of FCS) before step S1003. Alternatively, as in FIG. 79, calculation of FCS (step S1002*a*) may be performed after step S1004. FIG. 79 is a flowchart illustrating another example of the procedure of calculating the value of each field of the PHY frame in FIG. 76. In this case, in step S1002*a*, the communication apparatus (AP) calculates FCS for the bit-inverted sSSW body. In addition, the communication apparatus (STA) calculates FCS for the received Header body field and sSSW body field and then inverts the first 16 bits of the sSSW body field in accordance with the value of the Inverted field.

In FIG. 76 in the twenty-third embodiment, when the value of the Length field is set to less than 14, the communication apparatus 100 transmits a PHY frame that includes the PHY header (PHY Header body field) that does not include HCS, the sSSW frame (sSSW body field) that does not include FCS, and FCS calculated from the PHY Header body field and the sSSW body field. Thus, the frame length can be reduced compared with the SSW frame according to the related art, and a high error detection ability can be obtained.

In FIG. 76 in the twenty-third embodiment, when the communication apparatus 100 transmits a PHY frame that includes the PHY header that does not include HCS, the sSSW frame that does not include FCS, and FCS calculated from the PHY header and the sSSW frame, the communication apparatus 100 sets the value of the Reserved field at the end of the PHY header body to 3 (11 in binary form). Accordingly, distinction from the SSW frame according to the related art can be achieved, the frame length can be reduced, and a high error detection ability can be obtained.

In FIG. 77 in the twenty-third embodiment, when the communication apparatus 100 transmits a PHY frame that includes the PHY header (PHY Header body field) that does not include HCS, the sSSW frame (sSSW body field) that does not include FCS, and FCS calculated from the PHY Header body field and the sSSW body field, the communication apparatus 100 sets the first bit of the sSSW frame to 0. If HCS calculated from the PHY header and the first 16 bits of the sSSW frame match, the communication apparatus 100 transmits the sSSW frame by inverting the value of the first 16 bits of the sSSW frame. Thus, the frame length can be reduced compared with the SSW frame according to the related art, and a high error detection ability can be obtained.

In FIG. 77 in the twenty-third embodiment, the communication apparatus 100 sets the value of the Reserved field at the end of the PHY header to 3 (11 in binary form), thereby being able to achieve distinction from the SSW frame according to the related art. In addition, with the Inverted field being set at the first 1 bit of the sSSW frame, the value of the first 16 bits of the sSSW frame is inverted if HCS calculated from the PHY header matches the first 16 bits of the sSSW frame. Thus, the frame length can be reduced compared with the SSW frame according to the related art, and a high error detection ability can be obtained.

Twenty-Fourth Embodiment

Transmission Operation of Communication Apparatus

Figure 80:
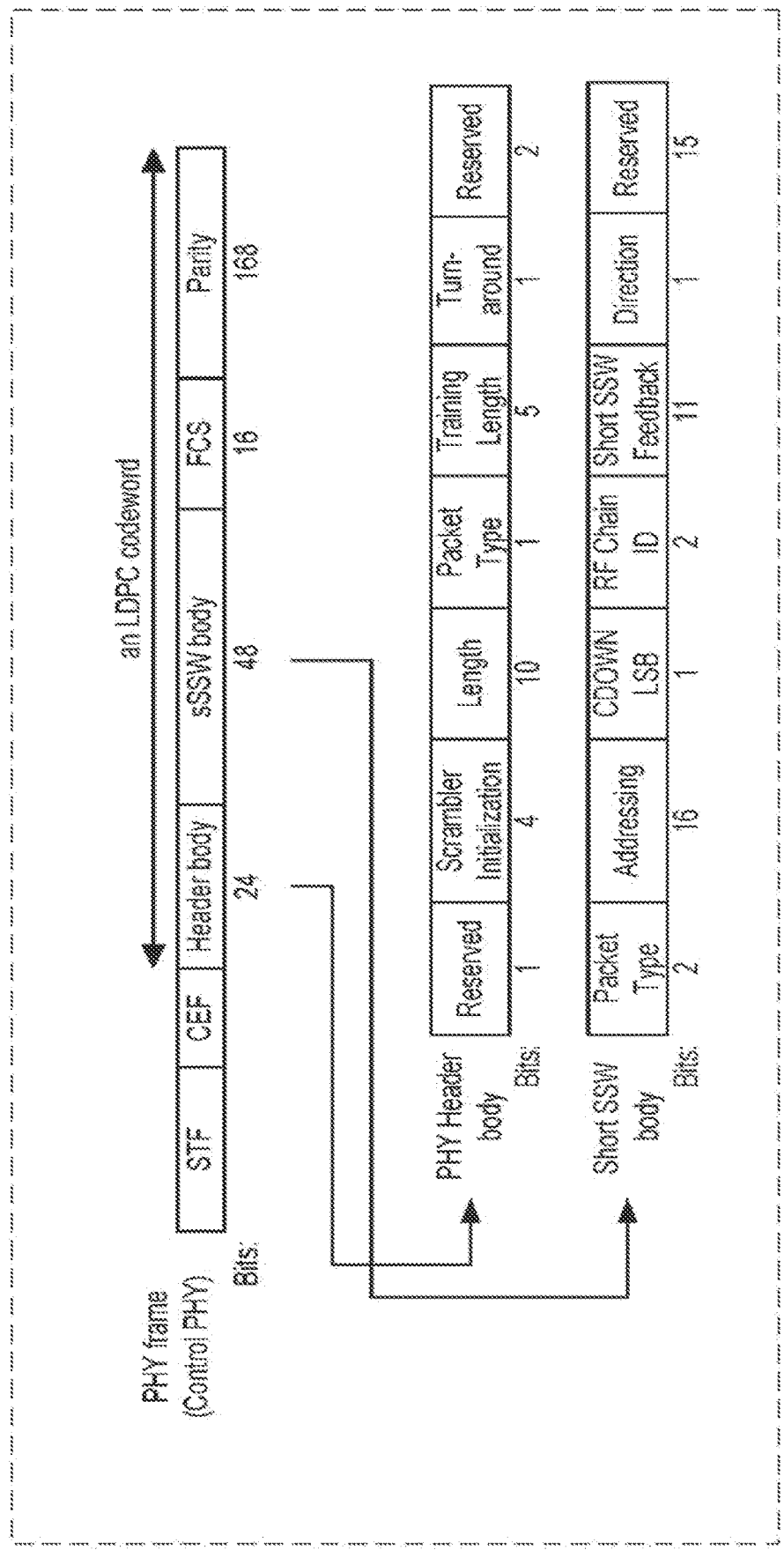
FIG. 80 is a diagram illustrating an example of the configuration of a PHY frame according to a twenty-fourth embodiment.

FIG. 80 is a diagram illustrating the configuration of an example of a PHY frame. In the PHY frame in FIG. 80, the sSSW body field includes a CDOWN LSB field instead of a CDOWN field compared with the sSSW body field in FIG. 76. The Reserved field has 15 bits, which is larger by 10 bits than that in FIG. 76. The PHY Header body field in FIG. 80 is similar to the PHY Header body field in FIG. 76.

Hereinafter, a description will be given of a case where a communication apparatus (AP) transmits the PHY frame in FIG. 80 and a communication apparatus (STA) receives the PHY frame in FIG. 80. The same applies to a case where the communication apparatus (STA) transmits the PHY frame in FIG. 80 and the communication apparatus (AP) receives the PHY frame in FIG. 80 and a case where the communication apparatus (STA) transmits the PHY frame in FIG. 80 and a communication apparatus (STA) receives the PHY frame in FIG. 80.

The communication apparatus (AP) sets the value of the Reserved bits at the end of the Header body field (PHY Header body field) to 3 (11 in binary form), sets the value of the Packet Type field to 1, and sets the value of the Training Length field to 0. In addition, the communication apparatus (AP) sets the value of the Length field of the Header body field to the upper 10 bits of the CDOWN value. In addition, the communication apparatus (AP) sets the value of CDOWN LSB of the sSSW body field to the value of LSB of the CDOWN value.

That is, in the format in FIG. 76, the communication apparatus (AP) includes an 11-bit CDOWN value in the sSSW body field. In contrast, in FIG. 80, the upper 10 bits of the 11-bit CDOWN value are included in the Length field of the Header body field, and the 1 bit as LSB is included in the sSSW body field. That is, the communication apparatus (AP) includes, in the sSSW body field, the residual 1 bit that is not included in the Length field among the bits of CDOWN.

Figure 81:
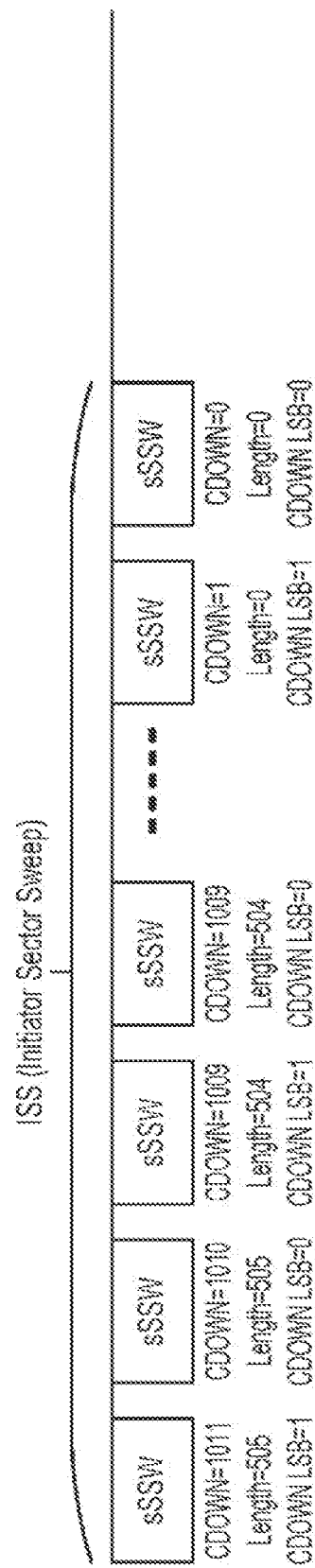
FIG. 81 is a diagram illustrating an example of a procedure in which a communication apparatus (AP) performs ISS by transmitting the PHY frame illustrated in FIG. 80 according to the twenty-fourth embodiment.

FIG. 81 illustrates an example of a procedure in which the communication apparatus (AP) performs ISS by transmitting the PHY frame (hereinafter referred to as an sSSW packet) illustrated in FIG. 80. In FIG. 81, the number of sSSW packets to be transmitted is 1012.

The communication apparatus (AP) first transmits an sSSW packet in which CDOWN is 1011. The format in FIG. 80 is used and thus the entire value of CDOWN is not included in the sSSW packet. The communication apparatus (AP) sets the value of the Length field of the Header body field to 505 (the upper 10 bits of the CDOWN value), sets the value of the CDOWN LSB field of the sSSW body field to 1, and transmits the sSSW packet.

The communication apparatus (AP) transmits 1012 sSSW packets while decreasing the CDOWN value by 1.

The CDOWN value of the sSSW packet that is transmitted last is 0. However, the format in FIG. 80 is used and thus the entire CDOWN value is not included in the sSSW body field. Thus, the communication apparatus (AP) sets the value of the Length field to 0 (the upper 10 bits of the CDOWN value) and the value of the CDOWN LSB field to 0 and transmits the sSSW frame.

Reception Operation of Communication Apparatus

The communication apparatus (STA) that has received the PHY frame refers to the value of the Reserved bits at the end of the Header body field and the value of the Packet Type field. If the value of the Reserved bits is 3 (11 in binary form) and if the value of the Packet Type field is 1, the communication apparatus (STA) determines that the received frame is an sSSW packet (a PHY frame including an sSSW body field). In this case, the communication apparatus (STA) calculates a CRC value from the values of the received Header body field and sSSW body field and compares the calculated value with the value of the received FCS field. If the values match, the communication apparatus (STA) determines that there is no bit error and continues the processing of receiving an sSSW body field. If the values do not match, the communication apparatus (STA) determines that there is a bit error and discards the data of the received sSSW body field.

The communication apparatus (STA) combines the value of the Length field of the PHY frame including the received sSSW body field and the value of the CDOWN LSB field of the sSSW body field to obtain a CDOWN value. Accordingly, the communication apparatus (STA) performs the processing of the received sSSW body field.

Next, a description will be given of a case where the communication apparatus (STA) receives the PHY frame in FIG. 80 when the communication apparatus (STA) is incompatible with the processing of receiving an sSSW body field (for example, when the communication apparatus (STA) is compatible with the 11ad standard and is incompatible with the 11ay standard).

The communication apparatus (STA) calculates CRC (HCS in the 11ad standard) from the received Header body field and compares the calculated CRC with the first 16 bits of the sSSW body field, which corresponds to the position of HCS in the 11ad standard. In the sSSW body field, the first 16 bits of the sSSW body are different from HCS and thus both do not match. Thus, the communication apparatus (STA) determines that the PHY header includes a bit error and discards the received PHY frame.

In the format in FIG. 80, the value of the Length field is not related to an actual packet length. However, the first 16 bits of the sSSW body field do not match HCS and the PHY frame is discarded. Thus, a wrong operation of the communication apparatus (STA) can be prevented.

As described above, in the frame format in FIG. 80, an sSSW body frame is placed after the header that does not include CRC (HCS) and a value corresponding to the CDOWN value is included in the Length field of the PHY header. Accordingly, the number of Reserved bits in the sSSW body field can be increased, and it becomes easy to add a function to the sSSW body field. For example, the Reserved bits in FIG. 80 may include the A-BFT TX field in FIG. 53.

In the frame format in FIG. 80, a value corresponding to the CDOWN value is included in the Length field of the PHY header. Alternatively, another value may be included therein. For example, a value corresponding to the value of the Short SSW Feedback field may be included.

In the frame format in FIG. 80, a value corresponding to the CDOWN value is included in the Length field of the PHY header. Alternatively, a value corresponding to the CDOWN value or another value may be included in a field other than the Length field of the PHY header, except a field used to decode the sSSW body field (Reserved and Scrambler Initialization at the top of the PHY header) and a field used to indicate that the PHY frame includes an sSSW body field (for example, the Reserved bits at the end of the Header body and the Packet Type field) are eliminated.

For example, in the frame format in FIG. 80, a value corresponding to the CDOWN value may be included in the Training Length field of the PHY Header body field.

In the frame format in FIG. 80, the procedure illustrated in FIG. 78 or 79 may be applied, as in the frame format in FIG. 77. Accordingly, the probability that HCS calculated by a receiver matches the first 16 bits of sSSW body can be decreased, and the probability of wrong operation of the receiver can be decreased.

In the twenty-fourth embodiment, the communication apparatus 100 sets the value of the Reserved field at the end of the PHY header to 3 (11 in binary form), so that distinction from the SSW frame according to the related art can be achieved. In addition, the sSSW body field is included just after the header not including CRC, and a value corresponding to the CDOWN value is included in the Length field of the PHY header. Thus, the frame length can be reduced compared with the SSW frame according to the related art, and a high error detection ability can be obtained.

Twenty-Fifth Embodiment

Figure 82:
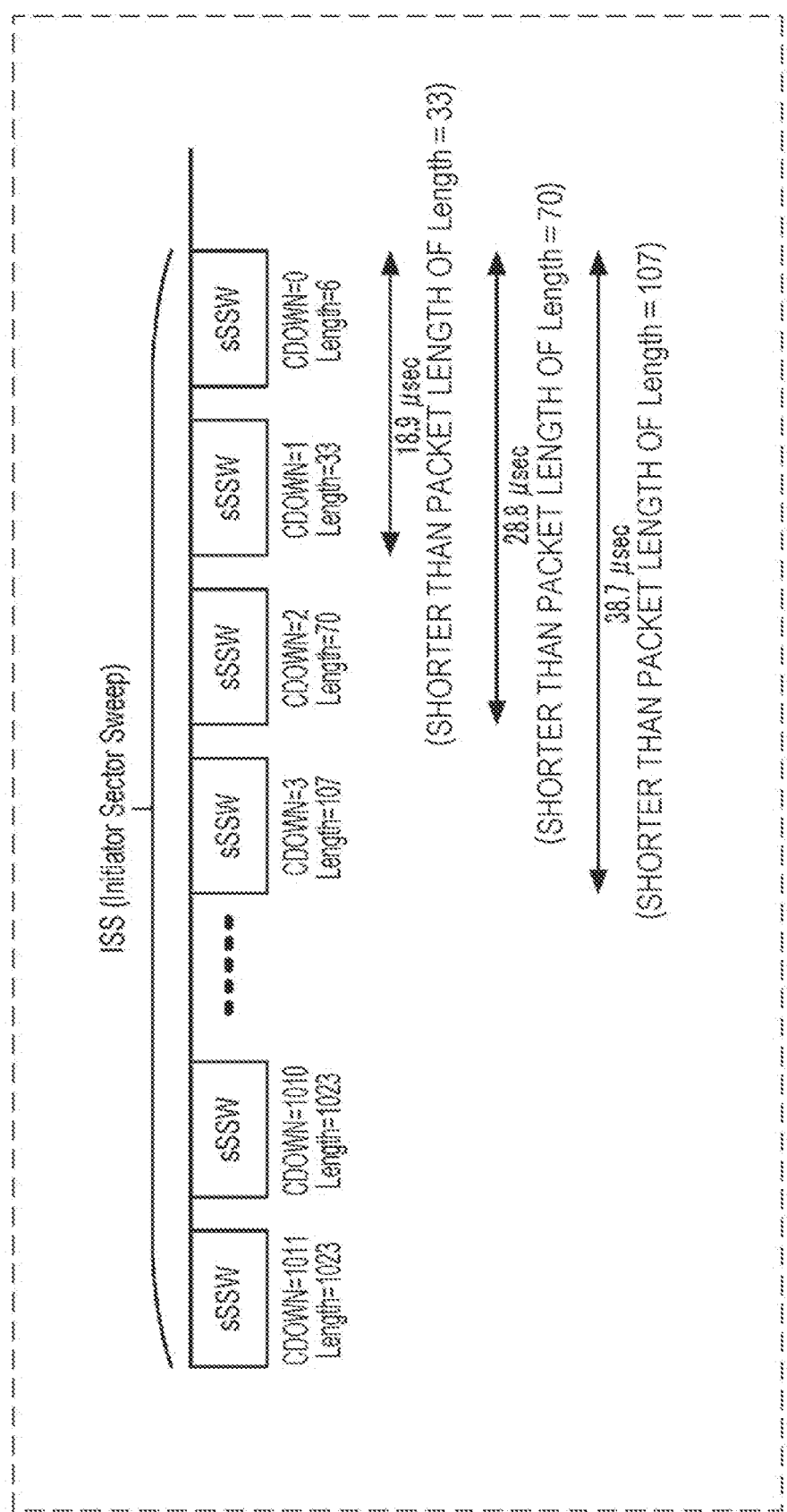
FIG. 82 is a diagram illustrating an example of the procedure of SLS in a communication apparatus according to a twenty-fifth embodiment.

FIG. 82 illustrates an example of the procedure of SLS in FIG. 4 performed in the communication apparatus 100. In a twenty-fifth embodiment, the communication apparatus 100 may be either an initiator or a responder. FIG. 82 illustrates an example of a case where the communication apparatus 100 is an initiator.

The sSSW frames in FIG. 82 may have the configuration illustrated in FIG. 5, 19, 22, 36, or the like. That is, the PHY header has HCS as indicated in the 11ad standard.

In the sSSW frame in FIG. 5, the value of Length is 6. In contrast, the communication apparatus 100 sets a value of Length corresponding to CDOWN to the sSSW frame in FIG. 82. FIG. 83 illustrates an example of values of Length corresponding to CDOWN. In FIG. 83, the column "TXTIME" shows the lengths of the MCSO packet corresponding to the values of Length and is called "TXTIME calculated from Length". FIG. 83 is shared by the initiator and the responder in advance.

That is, the communication apparatus 100 determines the value of Length of the sSSW frame so that TXTIME calculated from Length is longer than the period of time from the top of the corresponding sSSW frame to the end of the sSSW frame in which the CDOWN value is 0.

For example, the period of time from the top of the sSSW frame having a CDOWN value of 3 to the end of the sSSW frame having a CDOWN value of 0 is about 38.7 μsec. Thus, the communication apparatus 100 sets the value of Length to 107 so that TXTIME calculated from Length exceeds 38.7 μsec and is closest to 38.7 μsec.

In a case where the CDOWN value is 30 or more, there is no value of Length that satisfies the above-described condition, and thus the communication apparatus 100 sets the value of Length to 1023, which is a possible maximum value.

The communication apparatus 100 may set the value of the Reserved bits at the end of the PHY header of the sSSW frame to 11 (binary number) and set the value of the Packet Type field to 1, so as to indicate that the frame to be transmitted is an sSSW frame corresponding to FIGS. 82 and 83.

Next, a description will be given of a case where the communication apparatus (STA) receives the PHY frame in FIG. 82 when the communication apparatus (STA) is incompatible with the processing of receiving the sSSW frame corresponding to FIGS. 82 and 83 (for example, when the communication apparatus is compatible with the 11ad standard and is incompatible with the 11ay standard).

The communication apparatus (STA) calculates TXTIME from the value of Length of the received PHY frame (i.e., sSSW frame). For example, when the value of Length is 107, a calculated TXTIME is 38.9 μsec. In FIG. 83, the relationship between Length and TXTIME is a value calculated based on the 11ad standard, and the communication apparatus (STA) is able to calculate TXTIME from the value of Length. On the other hand, the value Length corresponding to the CDOWN value is not defined in the 11ad standard.

Thus, the communication apparatus (STA) that is compatible with the 11ad standard and is incompatible with the 11ay standard does not know the CDOWN value corresponding to the value of Length.

Thus, the communication apparatus (STA) that is compatible with the 11ad standard and is incompatible with the 11ay standard performs reception processing in accordance with the value of Length and does not perform transmission during TXTIME (38.9 μsec) from the top of the received PHY frame. In other words, the communication apparatus 100 does not receive interference caused by transmission of a packet by the communication apparatus (STA) until ISS is completed.

In FIG. 82, the communication apparatus 100 determines the value of Length corresponding to a CDOWN value in accordance with FIG. 83. Alternatively, the value of Length may be calculated in accordance with the following expression (22).

$$\text{Length}=\text{Floor}(\text{CDOWN}*34.25)+6 \qquad (22)$$

In expression (22), the value "6" is an added value that makes Length 6 (i.e., the minimum Length of the 11ad standard) when CDOWN is 0. The coefficient "34.25" is a coefficient that is determined so that the value of TXTIME calculated from the value of Length calculated in expression (22) becomes longer than the time from the top of the corresponding sSSW frame to the end of the sSSW frame having a CDOWN value "0". As a value satisfying the above-described condition, 34.33 may be used, for example. However, the value of Length calculated by using 34.25 has a smaller error than the value of Length in FIG. 83, and a fractional portion (0.25) can be expressed with a small number of bits in binary form, and thus the amount of calculation for calculating Length can be decreased.

In expression (22), a value such as 34 may be used instead of the coefficient 34.25. In this case, a value of Length smaller than those illustrated in FIG. 83 is calculated in some CDOWN values, but the amount of calculation can be reduced.

In FIG. 82, the communication apparatus 100 determines the value of Length corresponding to a CDOWN value in accordance with the table in FIG. 83. Alternatively, the value of Length may be determined in accordance with an upper bit of the CDOWN value as expressed by expression (23).

$$\text{Length}=\text{Floor}(\text{CDOWN}/2)+6 \qquad (23)$$

In the case of using expression (23), when the communication apparatus (STA) that is incompatible with the 11ad standard receives an sSSW frame, the communication apparatus (STA) suspends transmission in accordance with the value of Length. The period of time over which transmission is suspended is shorter than in the case of using FIG. 83. However, the communication apparatus (STA) suspends transmission for a certain period of time in accordance with the CDOWN value, and thus the communication apparatus 100 is able to decrease interference caused by packet transmission by the communication apparatus (STA).

In the case of using expression (23), with use of the same format as the Short SSW body in FIG. 80, the number of bits of the CDOWN LSB field can be reduced, and more Reserved bits can be obtained.

In the twenty-fifth embodiment, the communication apparatus 100 includes a value corresponding to the CDOWN value in the Length field of the PHY header, and is thus able to decrease the probability of receiving interference from another communication apparatus and to increase the probability of succeeding in SLS.

The STA 3000 in FIG. 56 may discard a calculated Addressing value (for example, delete a corresponding address from FIG. 12) after a certain period of time elapses from when a Grant frame is received. For example, the STA 3000 may discard the Addressing value when the Beacon Interval (BI) period ends. Accordingly, the STA 3000 does not need to hold many Addressing values and is able to decrease the probability of wrongly determining that Short SSW received from an unintended STA is addressed to the STA 3000.

Modification Example of Fourteenth Embodiment

FIG. 84 is a diagram illustrating the format of an sSSW frame different from that in FIG. 53 according to the fourteenth embodiment. In FIG. 84, the sSSW frame includes an A-BFT TX field. When the STA 2000 transmits RSS by using a slot of A-BFT in response to a DMG Beacon frame, the STA 2000 sets the A-BFT TX field to 1.

When the STA 2000 transmits an sSSW frame without using the slot of A-BFT (for example, in the case of transmitting an sSSW frame in DTI), the STA 2000 sets the A-BFT TX field to 0.

An sSSW frame that is transmitted in which A-BFT TX field is set to 1 (using A-BFT) includes, instead of a 11-bit CDOWN field in the sSSW frame not using A-BFT, a 3-bit SSW Slot ID field, a 5-bit FSS Slot ID field, and a 1-bit Associated field. The other 2 bits are reserved.

The SSW Slot ID field may include an SSW Slot number (see FIG. 47). The FSS Slot ID field may include an FSS Slot number, which will be described below. The Associated field is set to 1 when the STA 2000 is associated with the AP 1000 (i.e., the destination of the sSSW frame) and is set to 0 when the STA 2000 is not associated with the AP 1000.

When the Associated field is set to 0, the AP 1000 does not know the STA 2000, and thus the AP 1000 does not check the Addressing field of the received sSSW frame.

Figure 85A:
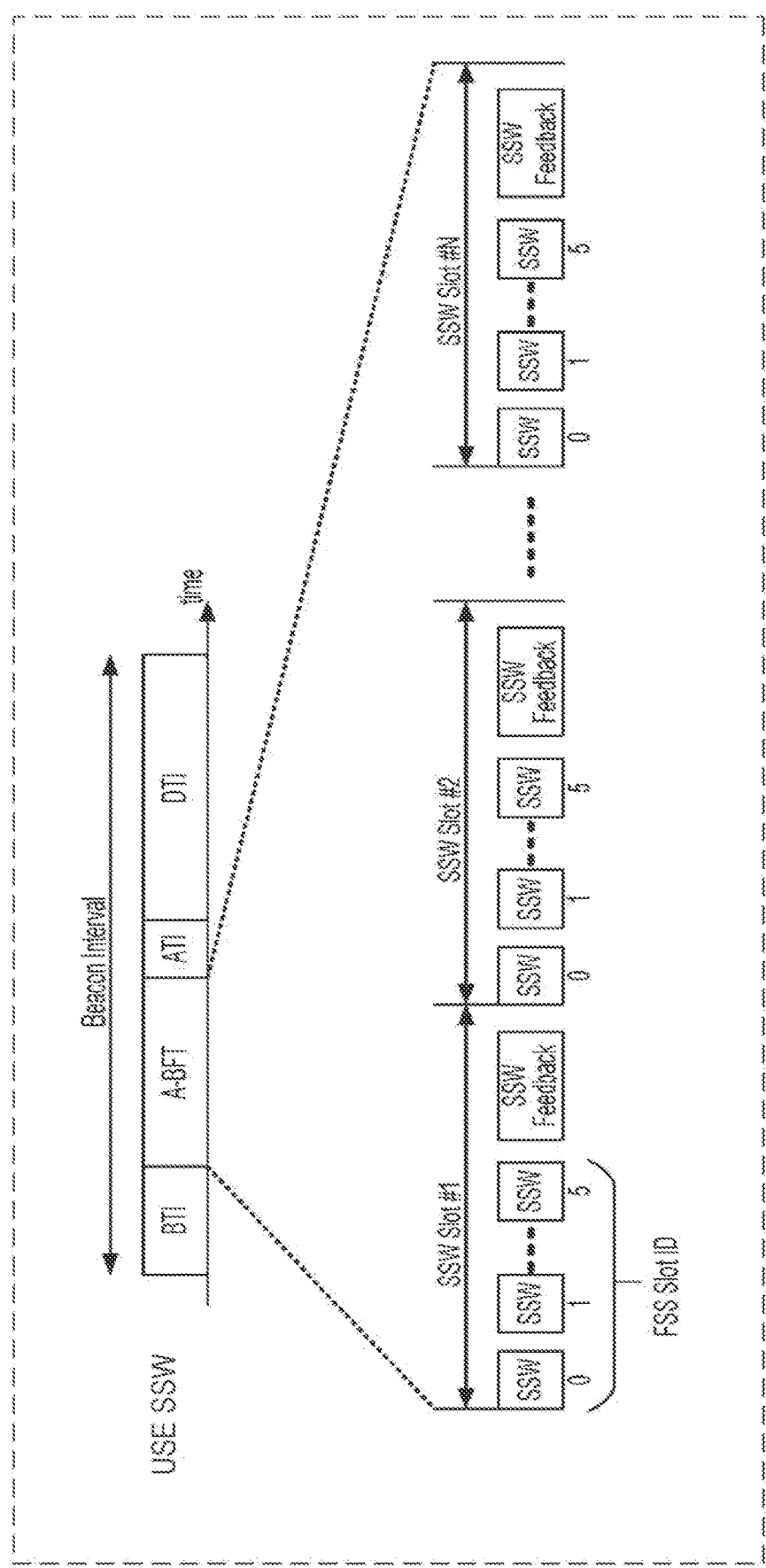
FIG. 85A is a diagram illustrating an example of a method for determining an FSS Slot number (FSS Slot ID) in A-BFT.
Figure 85B:
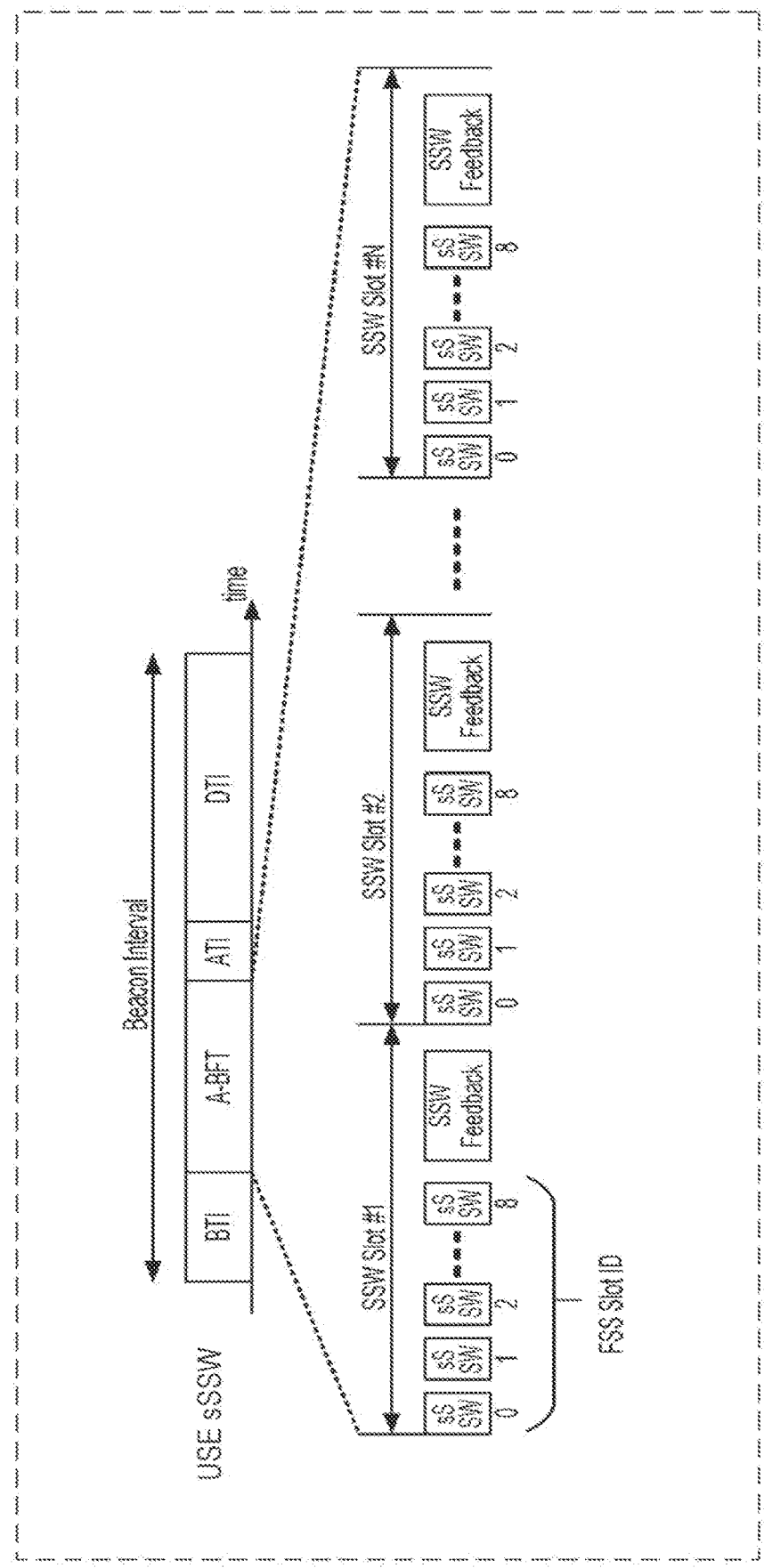
FIG. 85B is a diagram illustrating an example of a method for determining an FSS Slot number (FSS Slot ID) in A-BFT.

FIGS. 85A and 85B are diagrams illustrating a method for determining an FSS Slot number (FSS Slot ID) in A-BFT. In FIGS. 85A and 85B, a description of the same part as that in FIG. 47 is not given.

FIG. 85A is a diagram illustrating a method for transmitting SSW frames according to the related art in A-BFT. The number of SSW frames that can be transmitted in each SSW Slot (FSS) is predetermined. For example, the AP 1000 may include FSS information in a beacon frame and transmit frames.

FSS Slot numbers represent a transmission order of SSW frames in the SSW Slot. In FIG. 85A, FSS Slot numbers are determined in ascending order in accordance with the transmission order of the SSW frames. Alternatively, FSS Slot numbers may be determined in descending order in accordance with the transmission order of SSW frames, like CDOWN.

FIG. 85B is a diagram illustrating a method for transmitting sSSW frames in A-BFT. The sSSW frame has a shorter packet length than the SSW frame according to the related art, and thus the STA 2000 may transmit more packets in each SSW Slot.

FIG. 86 is a diagram illustrating the maximum number of sSSW frames transmitted by the STA 2000 in one SSW Slot in accordance with the value of FSS reported by the AP 1000. In FIG. 86, FSS represents the value of FSS reported by the AP 1000. In addition, aSSDuration represents the length (microseconds) of the SSW Slot calculated for the value of FSS. FSS for sSSW is the maximum number of sSSW frames transmitted by the STA 2000 in one SSW Slot in accordance with the value of FSS. In other words, the total time of the sSSW frames the number of which is represented by FSS for sSSW and transmission of SSW-Feedback does not exceed aSSDuration.

The communication apparatus 100 determines the maximum number of sSSW frames corresponding to the value of FSS in accordance with the table in FIG. 86. Alternatively, the maximum number may be determined in accordance with expression (24).

Maximum number of sSSW frames=Floor((aSSDuration+1)/(8.946+1))    (24)

In expression (24), the constant "8.946" is the length of the sSSW frame (microseconds).

The communication apparatus 100 may use expression (25) instead of expression (24).

Maximum number of sSSW frames=Floor(*FSS*×51/32)    (25)

In expression (25), the constant "51/32" is a constant that is adjusted so that the value calculated by using expression (25) is equal to the value in FIG. 86 when the value of FSS is 1 to 16. The constant "51/32" is a constant that is adjusted so that the denominator is the power of 2 and that division is substantially unnecessary.

In FIG. 85B, as in FIG. 85A, FSS Slot numbers are determined based on a transmission order of sSSW frames in an SSW Slot. In FIG. 85B, FSS Slot numbers are determined in ascending order in accordance with the transmission order of the SSW frames. Alternatively, FSS Slot numbers may be determined in descending order in accordance with the transmission order of SSW frames, like CDOWN.

In addition, the sSSW frame using A-BFT (when transmitted with the A-BFT TX field being set to 1) may include, instead of the Short SSW Feedback field in the sSSW frame not using A-BFT, a 6-bit Sector Select field, a 2-bit DMG Antenna Select field, and a 3-bit Reserved field.

The Sector Select field indicates the sector number corresponding to the beacon frame of the best reception quality among the beacon frames received by the STA 2000 in BTI (see FIGS. 85A and 85B).

The DMG Antenna Select field indicates the DMG Antenna number corresponding to the beacon frame of the best reception quality among the beacon frames received by the STA 2000 in BTI (see FIGS. 85A and 85B).

In step S102*b* in FIG. 52, the STA 2000 transmits the sSSW frame in FIG. 84. The AP 1000 receives the sSSW frame and determines whether the value of the SSW Slot ID field and the value of the FSS Slot ID field included in the sSSW frame respectively match the SSW Slot number and the FSS Slot number that are currently scheduled. If the values do not match, the AP 1000 determines that the received sSSW frame is not addressed to the AP 1000 and discards the received sSSW frame.

The AP 1000 may determine the currently scheduled SSW Slot number and FSS Slot number by using a clock, a counter, a timer, or the like.

The sSSW frames in FIGS. 85A and 85B include the value of the SSW Slot ID field and the value of the FSS Slot ID field. Thus, the terminal that has received the sSSW frame responds by using an SSW-Feedback frame if the currently scheduled SSW Slot number matches the value of the received SSW Slot ID field and if the currently scheduled FSS Slot number matches the value of the received FSS Slot ID field.

Accordingly, between the AP 1000 and another AP, the possibility that both the value of the SSW Slot ID and the value of the FSS Slot ID match is low, and thus the probability of unintended responding from the AP other than the AP 1000 can be decreased.

Twenty-Sixth Embodiment

Transmission Operation of Communication Apparatus

Figure 87:
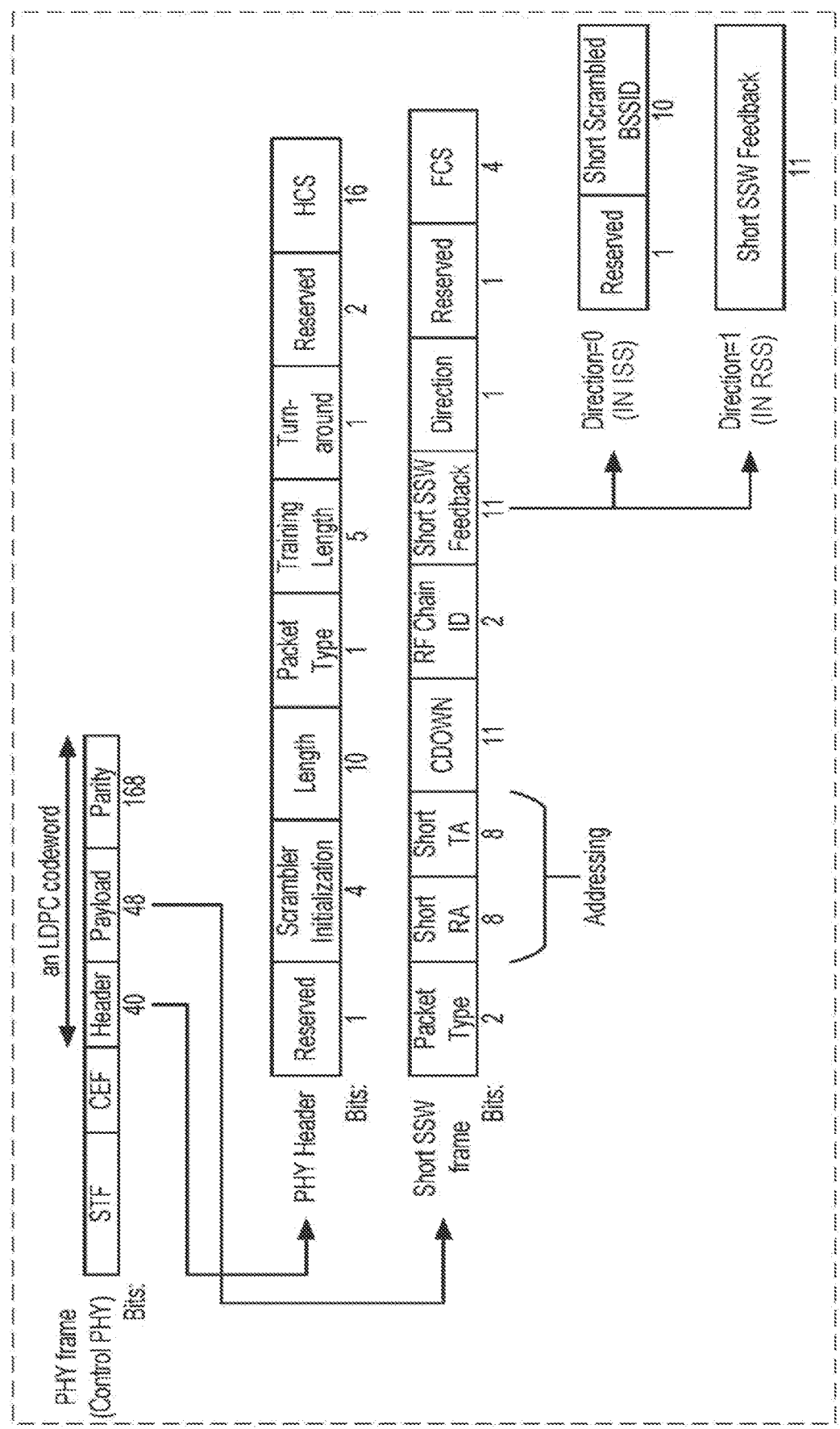
FIG. 87 is a diagram illustrating an example of the configuration of an sSSW frame according to a twenty-sixth embodiment.

FIG. 87 illustrates the configuration of an sSSW frame according to a twenty-sixth embodiment. In the sSSW frame in FIG. 87, compared with the sSSW frame in FIG. 5, the Addressing field includes an 8-bit Short RA field and an 8-bit Short TA field. In addition, the Short SSW Feedback field is replaced with a 1-bit Reserved field and a 10-bit Short Scrambled BSSID field in the case of ISS (i.e., when the value of the Direction field is 0).

Hereinafter, a description will be given of a case where a communication apparatus (AP) transmits sSSW frames and a communication apparatus (STA) receives the sSSW frames. The same applies to a case where the communication apparatus (STA) transmits sSSW frames and the communication apparatus (AP) receives the sSSW frames and a case where the communication apparatus (STA) transmits sSSW frames and a communication apparatus (STA) receives the sSSW frames.

In the sSSW frame in FIG. 87, the communication apparatus (AP) may use, as a value of the Short RA field and a value of the Short TA field, Addressing values for RA and TA (Addressing-RA and Addressing-TA) calculated by applying scrambling and CRC to RA and TA, as in FIG. 32.

In the sSSW frame in FIG. 87, the communication apparatus (AP) may use, as a value of the Short TA field, an Association ID (AID) of the communication apparatus (AP). Also, the communication apparatus (AP) may use, as a value of the Short RA field, an AID of the communication apparatus (STA). Here, the AID is an 8-bit ID that is uniquely determined for each STA by the communication apparatus (AP) when the STA is associated. The AID of the AP is 0. A value other than 0 may be used as the AID of the AP. For example, 8-bit CRC of the MAC address of the AP may be used. In addition, CRC may be calculated after applying scrambling as in FIG. 32, and CRC may be used instead of the AID.

In one Basic Service Set (BSS, a group whose association is managed by a single AP), an AID is given to each STA without duplication, and thus an addressing conflict does not occur between STAs belonging to a single BSS. However, if there are a plurality of BSSs and if a second STA belonging to a second BSS receives an sSSW frame that is addressed to a first communication apparatus (STA) and transmitted by a communication apparatus (AP) belonging to a first BSS, there is a possibility that the first communication apparatus (STA) and the second STA have the same AID. At this time, an addressing conflict occurs, and the second STA transmits unintended RSS or unintended SSW-Feedback.

To detect the occurrence of an addressing conflict, the communication apparatus (AP) belonging to the first BSS replaces, in the case of ISS (i.e., when the value of the Direction field is 0), the Short SSW Feedback field with a 1-bit Reserved field and a 10-bit Short Scrambled BSSID field.

Figure 88A:
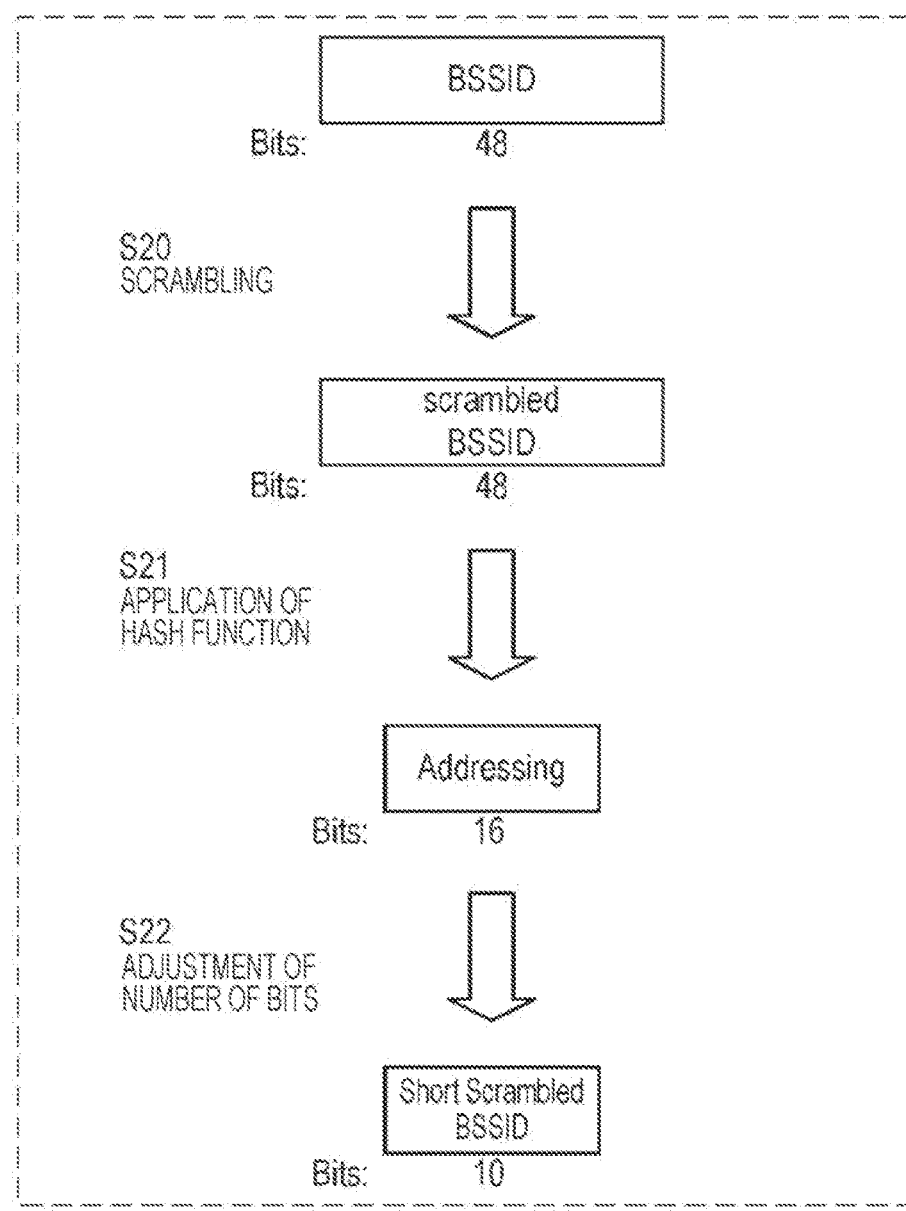
FIG. 88A is a diagram illustrating an example of the procedure of calculating the value of a Short Scrambled BSSID field.
Figure 88B:
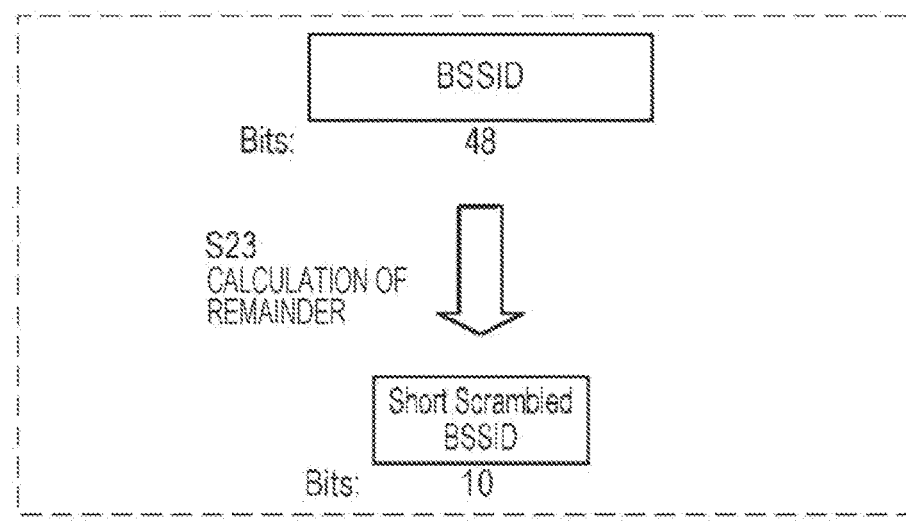
FIG. 88B is a diagram illustrating an example of the procedure of calculating the value of the Short Scrambled BSSID field.

FIGS. 88A, 88B, and 88C each illustrate a procedure in which the communication apparatus (AP) calculates the value of the Short Scrambled BSSID field. As a BSSID, the MAC address of the AP of the BSS may be used. The procedure in FIG. 88A is similar to the procedure in FIG. 6. However, 96-bit data is input in FIG. 6 because RA and TA are input, whereas 48-bit data is input in FIG. 88A.

In step S20 in FIG. 88A, the communication apparatus (AP) scrambles the value of BSSID. As in step S1 in FIG. 6, any one of the methods illustrated in FIGS. 7, 8, 17, 18, 39, 40, 64, and 65 may be used as a scrambling method. As a seed of scrambling, the value of Scrambler Initialization of the PHY Header (see FIG. 87), the CDOWN value of the sSSW frame, some bits of the CDOWN value (for example, the lower 4 bits), or the like may be used.

In step S21 in FIG. 88A, the communication apparatus (AP) performs calculation with a hash function on the scrambled BSSID value. As in step S2 in FIG. 6, a Fowler-Nol-Vo (FNV) hash function, a Cyclic Redundancy check (CRC) code, or the like may be used as a hash function.

In step S22 in FIG. 88A, the communication apparatus (AP) discards the lower 6 bits of the calculated hash value (called Addressing as in FIG. 6), generates a value of the Short Scrambled BSSID field by using the upper 10 bits, and transmits the sSSW frame.

In step S23 in FIG. 88B, the communication apparatus (AP) divides the value of BSSID by a divisor that is predetermined in accordance with the seed and calculates a remainder. FIG. 88D illustrates an example of a relationship between seeds and divisors. In the sSSW frame in FIG. 87, the Short Scrambled BSSID field has 10 bits, and is thus 1023 at maximum. Thus, the divisor is a value smaller than or equal to 1023. In addition, by using an odd number as a divisor, the remainder calculated in accordance with the value of BSSID is likely to vary, and the probability that a different remainder is calculated for a different BSSID increases. In addition, by using a different divisor in accordance with a seed, a calculated remainder changes. That is, by using a different divisor in accordance with a seed, an effect equivalent to that in the scrambling in step S20 is obtained.

In step S24 in FIG. 88C, the communication apparatus (AP) calculates XOR by using the upper 24 bits and the lower 24 bits of BSSID. In step S25 in FIG. 88C, the communication apparatus (AP) divides the calculated XOR value by using a divisor in FIG. 88D, thereby calculating a remainder. In FIG. 88C, the number of input bits of division is smaller than in FIG. 88B, and thus it is suitable for calculation using a CPU.

In step S24 in FIG. 88C, BSSID is divided into upper 24 bits and lower 24 bits, but may be divided into upper 16 bits and lower 32 bits. This is a method suitable for performing calculation using a 32-bit CPU. In step S24 in FIG. 88C, the communication apparatus (AP) may divide BSSID into three portions: upper 16 bits, middle 16 bits, and lower 16 bits, and may calculate XOR for the three inputs. This is a method suitable for calculation using a 16-bit CPU.

Figure 88E:
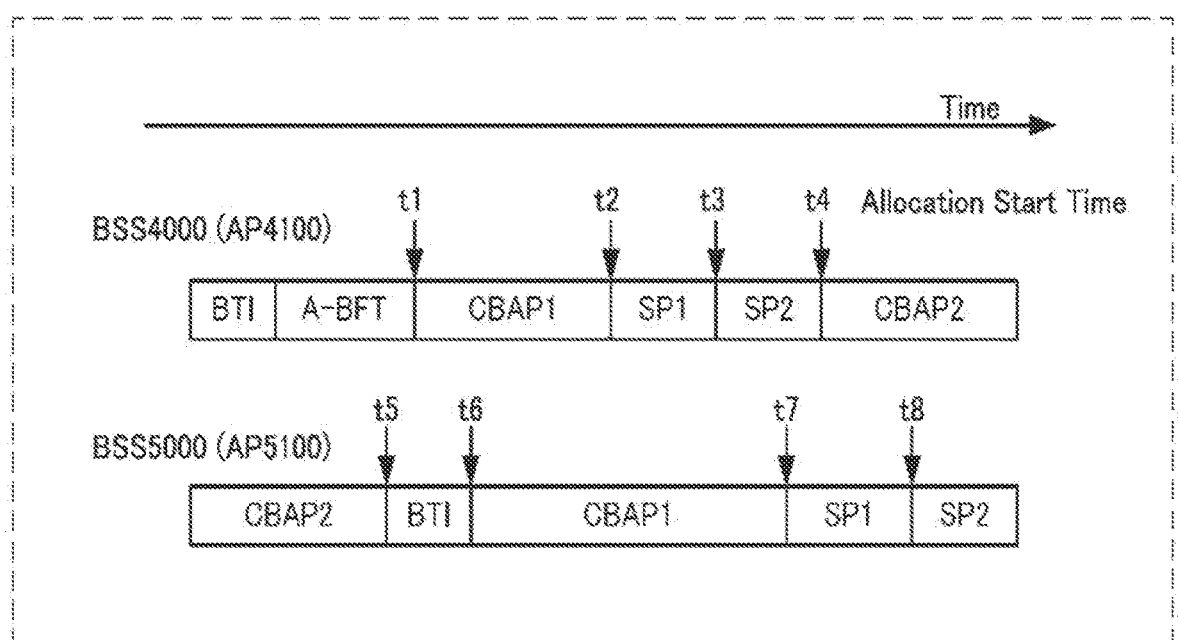
FIG. 88E is a diagram for describing Allocation Start Time.

The communication apparatus (AP) may use Allocation Start Time instead of BSSID when calculating the value of the Short Scrambled BSSID field. FIG. 88E is a diagram illustrating the Allocation Start Time when there are two BSSs: BSS 4000 and BSS 5000.

The BSS 4000 is scheduled by an AP 4100 and includes an access period, such as BTI, A-BFT, Contention based access period (CBAP), and Service period (SP). The Allocation Start Time is the time to start the access period.

As illustrated in FIG. 88E, in different BSSs, the start time of the access period is less likely to match. For example, the communication apparatus (AP) of the BSS 4000 performs SLS in SP1 at Allocation Start Time t2. The communication apparatus (STA) of the BSS 5000 receives an sSSW frame that is transmitted in SP1 by the communication apparatus (AP) of the BSS 4000 at Allocation Start Time t7.

Thus, by including Allocation Start Time in the Short Scrambled BSSID field, the communication apparatus (STA) that has received an sSSW frame is able to determine BSS.

In the 11ad standard, the Allocation Start subfield that is used to give notice of Allocation Start Time has 4 octets (32 bits). The communication apparatus (AP) may include the lower 10 bits of Allocation Start Time in the Short Scrambled BSSID field.

In addition, the communication apparatus (AP) may include 10 bits (for example, the fourth bit to the thirteenth bit) as part of Allocation Start Time in the Short Scrambled BSSID field. When Allocation Start Time is equal to a multiple of 8 and a change in lower bits is small, it is possible to increase the probability that the Short Scrambled BSSID field has a different value in each BSS, which is effective.

In addition, the communication apparatus (AP) may include a remainder obtained by dividing Allocation Start Time by a divisor illustrated in FIG. 88D in the Short Scrambled BSSID field. Accordingly, it is possible to increase the probability that the Short Scrambled BSSID field has a different value in each BSS.

In addition, when calculating a value of the Short Scrambled BSSID field, the communication apparatus (AP) may determine a random value (BI ID) at a Beacon Interval (BI) instead of using the BSSID, and may include the BI ID in the value of the Short Scrambled BSSID field.

Figure 88F:
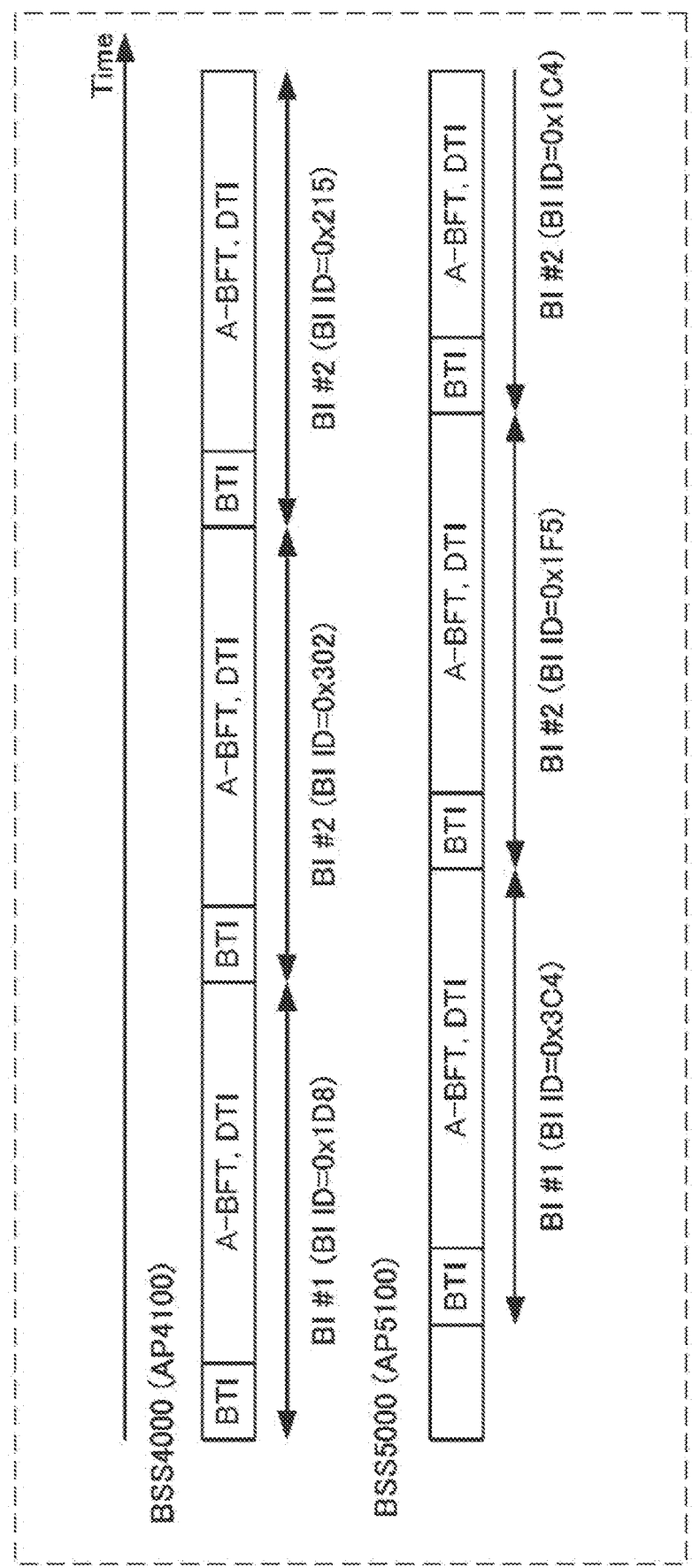
FIG. 88F is a diagram illustrating a timing chart illustrating an example of BI ID.

FIG. 88F is a timing chart illustrating an example of the BI ID. The communication apparatus (AP 4100) determines a BI ID for each BI by using a random number and notifies an STA in the BSS 4000 of the determined BI ID by using a beacon within the BTI period. Also, the communication apparatus (AP 5100) determines a BI ID for each BI by using a random number and notifies an STA in the BSS 5000 of the determined BI ID by using a beacon within the BTI period.

Thus, the probability that the BI ID of the BSS 4000 and the BI ID of the BSS 5000 have the same value is low. By including the BI ID in the Short Scrambled BSSID field, the communication apparatus (STA) that has received the sSSW frame is able to determine the BSS.

The communication apparatus (AP) may calculate a value of a BI ID by using the value of the Timestamp field of the beacon frame instead of determining a value of a BI ID by using a random number.

The value of the Timestamp field is the value of a timing synchronization function (TSF) timer and has 8 octets (64 bits). The communication apparatus (AP) may extract some bits from the value of the Timestamp field as in the foregoing Allocation Start Time or calculate a remainder and may perform transmission in accordance with the number of bits of the Short Scrambled BSSID field.

A description will be given of a case where a communication apparatus (STA) receives an sSSW frame transmitted by a communication apparatus (AP) in ISS. In the description, an AID corresponding to a transmission address and an AID corresponding to a reception address are used as values of the Short TA field and the Short RA field, respectively. The same applies to a case where the Addressing values in FIG. 32 are used as the values of the Short TA field and the Short RA field.

The communication apparatus (STA) compares the received value of the Short RA field with the communication apparatus (STA). If both do not match, the communication apparatus (STA) determines that the sSSW frame is not addressed to the communication apparatus (STA) and discards the sSSW frame.

The communication apparatus (STA) may determine whether the received value of the Short TA field is included in the list of AIDs of BSS, and if the value is not included in the list, the communication apparatus (STA) may determine that the sSSW frame is not transmitted from an STA in the same BSS and discard the sSSW frame. The list of AIDs of BSS is a list of AIDs that have already been used in the BSS (i.e., AID given to any one associated STA). Information about the list of AIDs of BSS is transmitted to the STA in the BSS from the AP by using a beacon or an announce frame.

The communication apparatus (STA) compares the received value of the Short Scrambled BSSID field with the value of the Short Scrambled BSSID calculated from the BSSID of the BSS to which the communication apparatus (STA) belongs. If the values do not match, the communication apparatus (STA) may determine that the sSSW frame is not transmitted from an STA in the same BSS and discard the sSSW frame.

The communication apparatus (STA) performs comparison on the Short RA field, the Short TA field, and the Short Scrambled BSSID field in the above-described manner. If the communication apparatus (STA) does not discard the sSSW frame, the communication apparatus (STA) performs RSS in response to the sSSW frame. The comparison of the Short TA field may be omitted.

After transmitting the sSSW frame in FIG. 87 in ISS, the communication apparatus (AP) receives an sSSW frame as RSS from the communication apparatus (STA). If the sSSW frame as RSS is not normally received, the communication apparatus (AP) may change the seed value to calculated the value of Short Scrambled BSSID in step S20 in FIG. 88A (or step S23 in FIG. 88B or step S24 in FIG. 88C), and transmit the sSSW frame as ISS again.

In the case where the sSSW frame as RSS is not normally received, for example, the value of Short RA and the value of Short Scrambled BSSID conflict with each other, a plurality of STAs simultaneously transmit sSSW frames and thus packets collide with each other, and an HCS error or FCS error (CRC error) is detected in the data received by the communication apparatus (AP).

In addition, for example, the value of Short RA and the value of Short Scrambled BSSID conflict with each other, a plurality of STAs transmit sSSW frames in the same RSS period and thus an abnormal CDOWN value and an inconsistent value of Short SSW Feedback are detected, and the STA as a source of each sSSW frame is not determined.

If the sSSW frame in RSS is not normally received, the communication apparatus (AP) changes the seed value to calculate a value of Short Scrambled BSSID, and transmits the sSSW frame as ISS again. Thus, it is possible to decrease the probability that the value of Short Scrambled BSSID conflicts again and to increase the probability of normally receiving the sSSW frame in RSS.

That is, in the frame format in FIG. 5, scrambling is applied to calculate Addressing. In the frame format in FIG. 87, a Short Scrambled BSSID field is included in addition to an Addressing field, and scrambling is applied to calculate the Short Scrambled BSSID field. Thus, both the frame formats in FIGS. 5 and 87 are able to decrease the probability of conflict caused by changing the seed value. In addition, in both the frame formats in FIGS. 5 and 87, a continuous conflict can be prevented by performing ISS with a changed seed value when an sSSW frame is not normally received in RSS, and the probability of success in SLS can be increased.

If the communication apparatus (AP) receives an sSSW frame as RSS (i.e., the value of the Direction field is 1) and if the received values of Short RA and Short TA match the values of Short RA and Short TA of the sSSW frame transmitted by the communication apparatus (AP) as ISS, the communication apparatus (AP) responds by using SSW-Feedback. If the values do not match, the communication apparatus (AP) discards the received sSSW frame. That is, comparison of Addressing is performed by using that TA and RA of the sSSW frame transmitted in ISS are identical to TA and RA of the sSSW frame received in RSS.

In RSS, unlike in ISS, an expected value of Short TA is specified, and thus a low probability of conflict can be realized by comparing Addressing values. That is, as a result of including the Short Scrambled BSSID field in the sSSW frame in ISS, a low probability of conflict can be realized and the probability of success in SLS can be increased.

In the twenty-sixth embodiment, the communication apparatus 100 scrambles the value of BSSID, includes a Short Scrambled BSSID calculated by applying a hash function in an sSSW frame, and transmits the sSSW frame. Thus, it is possible to increase the probability of normally receiving the sSSW frame in RSS and to increase the probability of succeeding in SLS.

Twenty-Seventh Embodiment

Transmission Operation of Communication Apparatus

Figure 89:
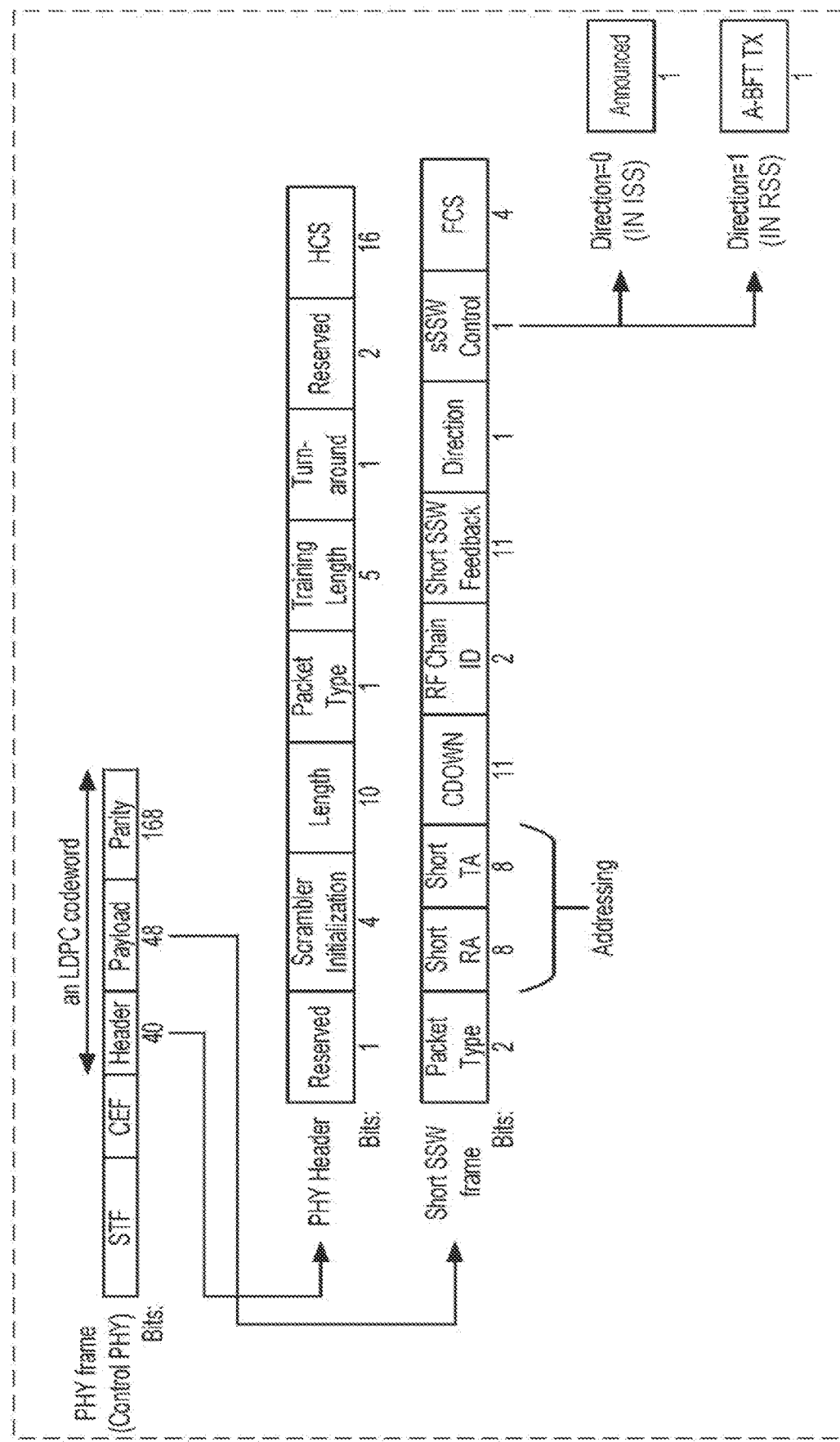
FIG. 89 is a diagram illustrating the configuration of an sSSW frame according to a twenty-seventh embodiment.

FIG. 89 illustrates the configuration of an sSSW frame according to a twenty-seventh embodiment. In the sSSW frame in FIG. 89, compared with the sSSW frame in FIG. 5, the Addressing field includes an 8-bit Short RA field and an 8-bit Short TA field. The Reserved field is replaced with an sSSW Control field.

Hereinafter, a description will be given of a case where a communication apparatus (AP) transmits sSSW frames and a communication apparatus (STA) receives the sSSW frames. The same applies to a case where the communication apparatus (STA) transmits sSSW frames and the communication apparatus (AP) receives the sSSW frames and a case where the communication apparatus (STA) transmits sSSW frames and a communication apparatus (STA) receives the sSSW frames.

In the sSSW frame in FIG. 89, the communication apparatus (AP) may use, as a value of the Short RA field and a value of the Short TA field, Addressing values for RA and TA (Addressing-RA and Addressing-TA) calculated by applying scrambling and CRC to RA and TA, as in FIG. 32.

In the sSSW frame in FIG. 89, the communication apparatus (AP) may use the value of the AID of the STA as the values of Short RA and Short TA.

In the sSSW frame in FIG. 89, the communication apparatus (AP) or the communication apparatus (STA) transmits an sSSW frame. If the destination is not an STA that is not an AP, the AID of the STA as a destination may be used as the value of Short RA. If the destination of the sSSW frame is an AP, an Addressing value that is calculated by applying scrambling and CRC on RA (i.e., the MAC address of the AP as a destination) may be used as in FIG. 32. That is, Short RA may be calculated by using a method that varies in accordance with whether the destination is an AP or STA.

In addition, when the communication apparatus (AP) transmits an sSSW frame, the communication apparatus (AP) may use, as the value of Short TA, an Addressing value that is calculated by applying scrambling and CRC to TA (i.e., the MAC address of the AP as a source) as in FIG. 32. Also, when the communication apparatus (STA) transmits an sSSW frame, the communication apparatus (STA) may use, as the value of Short TA, the AID of the STA as a source. If the Addressing value calculated by the communication apparatus (AP) is equal to 255, an Addressing value using another seed may be used. This is because the AID equal to 255 means broadcast, and thus it is necessary for the communication apparatus (STA) to determine whether the frame received by the communication apparatus (STA) is an sSSW frame addressed to the AP or a broadcasted sSSW frame.

In addition, in the sSSW frame in FIG. 89, the communication apparatus (AP) may use a calculated random number instead of the Addressing value that is calculated by applying scrambling and CRC to TA (i.e., the MAC address of the AP). FIG. 90 illustrates an example of a relationship between seeds and random numbers. The communication apparatus (AP) may determine an Addressing value for each seed by using a random number. The communication apparatus (AP) may include the Addressing value determined for each seed in a beacon frame or an announce frame and transmit the frame. The communication apparatus (AP) may determine an Addressing value by using a random number excluding 255 (i.e., 0 to 254). Accordingly, the frame can be easily distinguished from a broadcast frame.

When the communication apparatus (AP) determines an Addressing value of the AP in FIG. 90 and the communication apparatus (STA) transmits an association request to the communication apparatus (AP), the communication apparatus (AP) may select, using a random number, a value that is not included in the AP Addressing table in FIG. 90 and determine the selected value to be the AID of the communication apparatus (STA). Accordingly, the communication apparatus (STA) is able to easily determine whether Short TA and Short RA of the received sSSW frame in FIG. 90 are the address of the AP and the address of the STA, respectively.

Figure 91:
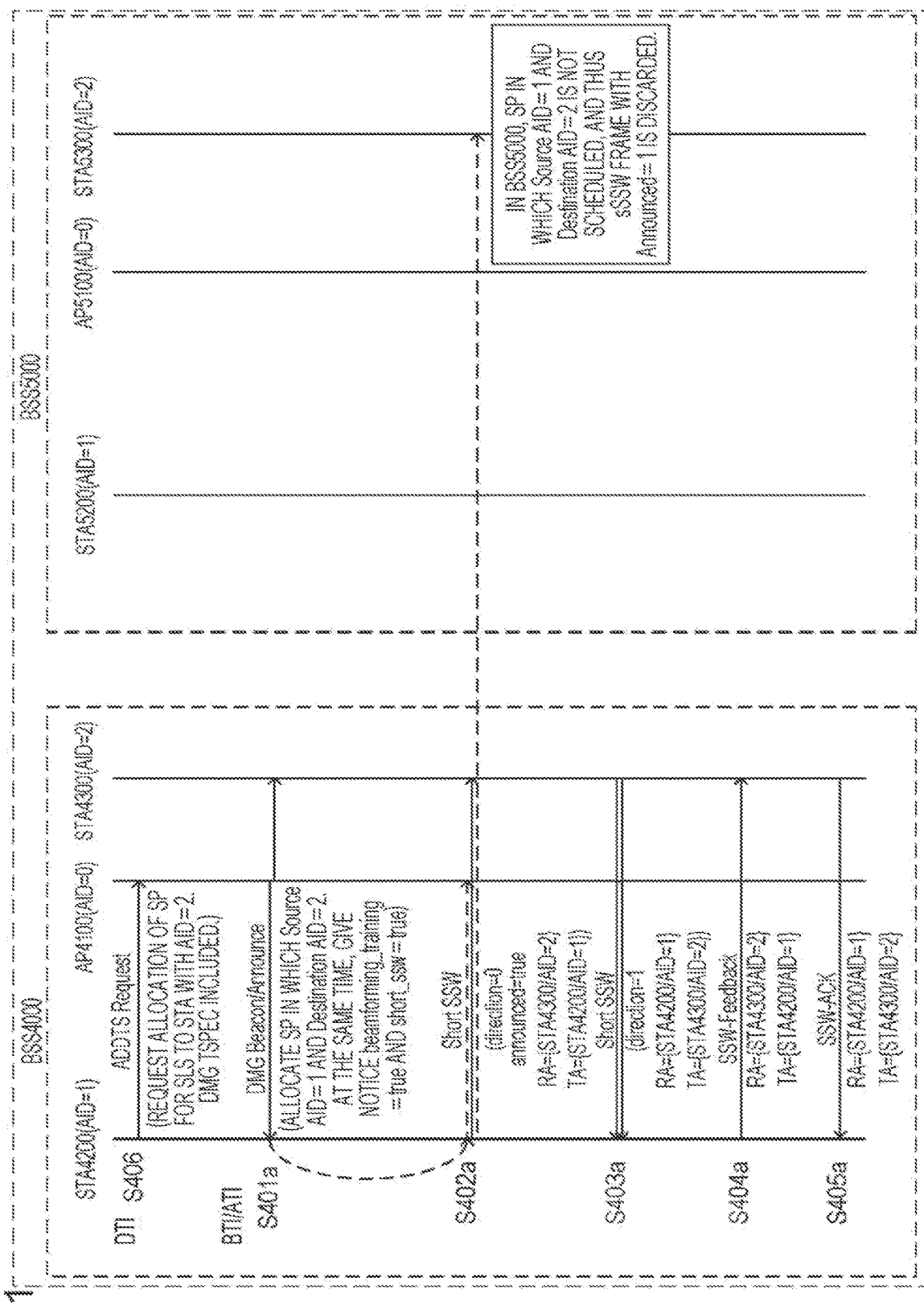
FIG. 91 is a diagram illustrating a procedure in which STAs perform SLS by using the sSSW frame in FIG. 89.

With reference to FIG. 91, a description will be given of a procedure in which an STA 4200 and an STA 4300 perform SLS by using the sSSW frame in FIG. 89. The STA 4200 and the STA 4300 are associated with the AP 4100. The BSS 4000 is a BSS managed by the AP 4100. In addition, there is the BSS 5000 managed by the AP 5100 in addition to the BSS 4000, and an STA 5200 and an STA 5300 are associated with the AP 5100. The AIDs of the AP 4100, the STA 4200, and the STA 4300 are 0, 1, and 2, respectively. The AIDs of the AP 5100, the STA 5200, and the STA 5300 are 0, 1, and 2, respectively.

Step S401*a* and steps S402*a* to S405*a* in FIG. 91 are the same as steps S401 to S405 in FIG. 61, but TA and RA are different. FIG. 61 illustrates the procedure of SLS between the AP 1000 and the STA 2000, but FIG. 91 illustrates SLS between the STA 4200 and the STA 4300, and thus RA and TA are the AP 4100 and the STA 4300, instead of the AP 1000 and the STA 2000.

In step S406, the STA 4200 transmits an add traffic stream (ADDTS) request frame to the AP 4100 and requests allocation of a service period (SP). The ADDTS frame may include a Directional Multi-Gigabit Traffic Specification (DMG TSPEC) element, and the DMG TSPEC element may include detailed information about allocation of the SP. The DMG TSPEC element may include, for example, a Destination AID field (i.e., the AID of the STA 4300), a Source AID field (i.e., the AID of the STA 4200), a BF Control field including information indicating that SLS using Short SSW is performed in the SP, and so forth.

In step S401*a*, the AP 4100 performs scheduling for allocating the SP in which the STA 4200 and the STA 4300 perform SLS and transmits a DMG Beacon frame or an announce frame that includes information about the allocated SP.

In step S402*a*, the STA 4200 performs ISS by using the SP period scheduled in step S401*a*. In the sSSW frame transmitted by the STA 4200 in step S402*a*, Short RA may be the AID of the STA 4300 and Short TA may be the AID of the STA 4200. In the sSSW frame transmitted by the STA 4200 in step S402*a*, the sSSW Control field is set to 1. Since step S402*a* is ISS, the STA 4200 uses the sSSW Control field of the sSSW frame as an Announced field.

That is, in step S402*a*, the STA 4200 sets the Announced field of the sSSW frame to 1 to indicate that the sSSW frame is transmitted using the SP.

In step S402*a*, the STA 4300 receives the sSSW frame. In the sSSW frame received by the STA 4300, the value of Short RA is 3, which matches the AID of the STA 4300. In addition, the Announced field of the sSSW frame is set to 1 and the STA 4300 is able to use the SP allocated to step S401*a* (i.e., the Destination AID of the SP is the AID of the STA 4300), and thus the STA 4300 determines that the received sSSW frame is addressed to the STA 4300 and performs processing of SLS.

In step S402*a*, the STA 5300 of the BSS 5000 receives the sSSW frame from the STA 4200 of the BSS 4000. In the sSSW frame received by the STA 5300, the value of Short RA is 3, which matches the AID of the STA 5300. However, the STA 5300 is not given the schedule of the SP although the Announced field of the sSSW frame is set to 1, and thus the STA 5300 determines that the received sSSW frame is not addressed to the STA 5300 and discards the sSSW frame.

Figure 92:
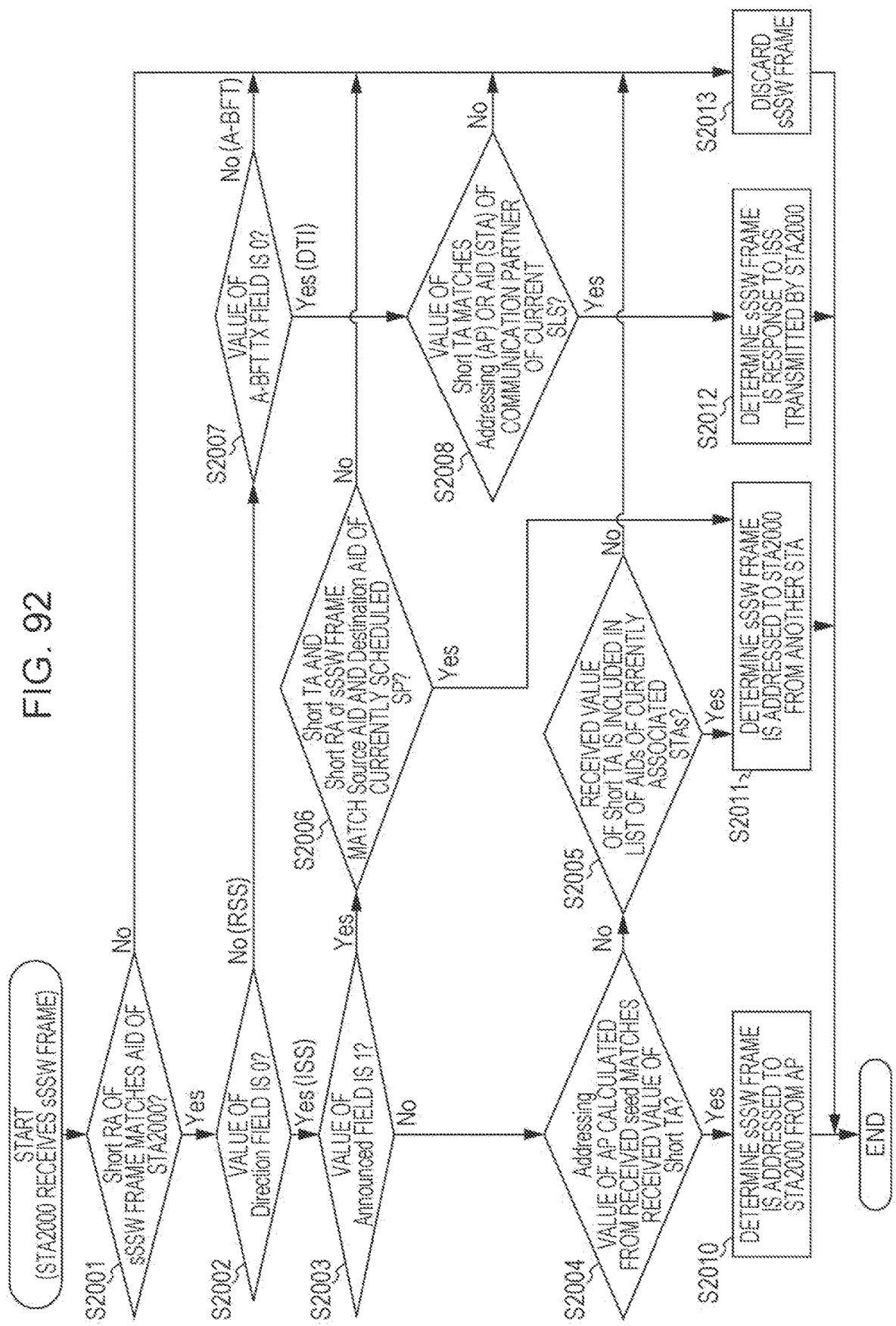
FIG. 92 is a flowchart illustrating processing when a communication apparatus (STA) receives an sSSW frame.

FIG. 92 is a flowchart illustrating the processing when the communication apparatus (STA 2000) receives an sSSW frame. In the case of using the format of the sSSW frame illustrated in FIG. 89 and using A-BFT, the content of the CDOWN field and the Short SSW Feedback field is switched in accordance with the format of the sSSW frame illustrated in FIG. 84.

In step S2001, the communication apparatus (STA 2000) determines whether the value of Short RA of the sSSW frame matches the AID of the communication apparatus (STA 2000). If the values do not match, the communication apparatus (STA 2000) discards the sSSW frame (step S2013).

In S2002, the communication apparatus (STA 2000) refers to the value of the Direction field and determines which of ISS and RSS is performed.

In the case of ISS, in step S2003, the communication apparatus (STA 2000) refers to the value of the Announced field. If the value is 1, the communication apparatus (STA 2000) determines that SLS is scheduled in the SP, and the processing proceeds to step S2006. If the value of the Announced field is 0, the communication apparatus (STA 2000) determines that SLS is not scheduled in the SP.

In step S2004, the communication apparatus (STA 2000) determines the Addressing value of the AP corresponding to the received seed value. For example, the communication apparatus (STA 2000) calculates the value of Addressing-TA in accordance with FIG. 32. In addition, for example, the communication apparatus (STA 2000) determines the Addressing value of the AP corresponding to the seed by using the table illustrated in FIG. 90. The Addressing values in FIG. 90 are examples, and an actual value may be a value reported from the communication apparatus (AP) through a beacon frame or an announce frame.

Subsequently, the communication apparatus (STA 2000) compares the determined Addressing value of the AP with the received value of Short TA. If the values match, the communication apparatus (STA 2000) determines that the received sSSW frame is a frame transmitted from the AP and is addressed to the communication apparatus (STA 2000), and performs processing of the sSSW frame (step S2010). If the values do not match, the communication apparatus (STA 2000) performs step S2005.

In step S2005, the communication apparatus (STA 2000) determines whether the received value of Short TA is included in the list of AIDs of STAs that are currently associated. The list of AIDs of STAs that are currently associated is, in other words, a list of AIDs of STAs belonging to the same BSS as the communication apparatus (STA 2000). If the received value of Short TA is not included in the list, the communication apparatus (STA 2000) determines that the received sSSW frame is not a frame transmitted from an STA in the same BSS and discards the sSSW frame (step S2013). On the other hand, if the received value of Short TA is included in the list, the communication apparatus (STA 2000) determines that the sSSW frame is likely to be from an STA in the same BSS and determines that the received sSSW frame is addressed to the communication apparatus (STA 2000) (step S2011).

In step S2006, the communication apparatus (STA 2000) determines whether the values of Short TA and Short RA of the received sSSW frame respectively match the Source AID and the Destination AID of the SP that is currently scheduled. If they do not match, the communication apparatus (STA 2000) determines that the received sSSW frame is not a frame transmitted from an STA in the same BSS and discards the sSSW frame (step S2013). If they match, the communication apparatus (STA 2000) determines that the received sSSW frame is addressed to the communication apparatus (STA 2000) (step S2011).

In step S2006, the communication apparatus (STA 2000) makes a determination "match" if the AID of the STA 2000 is included in the Source AID or the Destination AID of the SP that is currently scheduled, and may omit comparison of Short TA with Source AID and Short RA with Destination AID. In this case, the communication apparatus (STA 2000) may proceed to step S2005 if the determination in step S2006 is "Yes", although it is different from FIG. 92. Accordingly, check of Short TA can be easily performed in step S2005.

In step S2007, the communication apparatus (STA 2000) refers to the value of the A-BFT TX field of the received sSSW frame. If the value is 0, the communication apparatus (STA 2000) performs determination in step S2008. If the value of the A-BFT TX field of the received sSSW frame is 1, the communication apparatus (STA 2000) does not receive sSSW in A-BFT, that is, the AP receives sSSW in A-BFT, and thus the communication apparatus (STA 2000) discards the received sSSW frame (step S2013).

In step S2008, the communication apparatus (STA 2000) determines whether the value of Short TA of the received sSSW frame matches the Addressing (when the communication partner is AP) or AID (when the communication partner is STA) of the communication partner of SLS that is currently performed. In other words, if the communication apparatus (STA 2000) is not an initiator, the determination result in step S2008 is "No".

If the communication apparatus (STA 2000) is an initiator, the communication apparatus (STA 2000) determines whether Short TA of the received sSSW frame matches the Addressing or AID of a responder. If they match, the communication apparatus (STA 2000) determines that the received sSSW frame is a response to ISS transmitted by the communication apparatus (STA 2000), that is, RSS from the responder, and performs processing of the sSSW frame (step S2012). If the determination result in step S2008 is "No" (mismatch), the communication apparatus (STA 2000) discards the received sSSW frame (step S2013).

Figure 93:
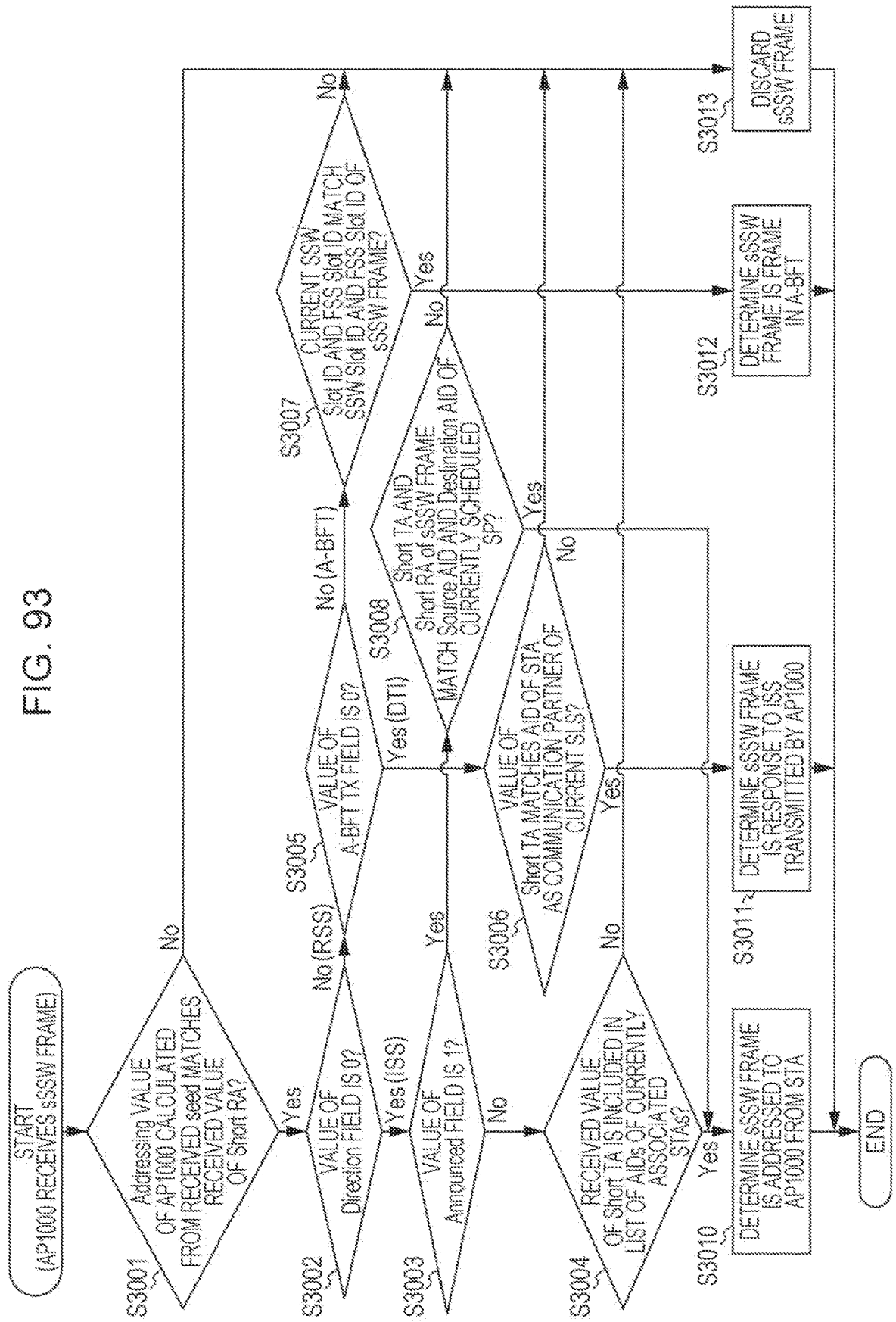
FIG. 93 is a flowchart illustrating processing when a communication apparatus (AP) receives an sSSW frame.

FIG. 93 is a flowchart illustrating the processing when the communication apparatus (AP 1000) receives an sSSW frame.

In step S3001, the communication apparatus (AP 1000) calculates an Addressing value corresponding to the seed value of the received sSSW frame. Subsequently, the communication apparatus (AP 1000) determines whether the calculated Addressing value matches the value of the Short RA field of the received sSSW frame. If both do not match, the communication apparatus (AP 1000) determines that the received sSSW frame is not addressed to the communication apparatus (AP 1000) and discards the sSSW frame (step S3013).

In step S3002, the communication apparatus (AP 1000) refers to the value of the Direction field and determines which of ISS and RSS is performed.

In the case of ISS, in step S3003, the communication apparatus (AP 1000) refers to the value of the Announced field. If the value is 1, the communication apparatus (AP 1000) determines that SLS is scheduled in the SP, and the processing proceeds to step S3008. If the value of the Announced field is 0, the communication apparatus (AP 1000) determines that SLS is not scheduled in the SP.

In step S3004, the communication apparatus (AP 1000) determines whether the received value of Short TA is included in the list of AIDs of STAs that are currently associated. If the received value of Short TA is not included in the list, the communication apparatus (AP 1000) determines that the received sSSW frame is not a frame transmitted from an STA in the same BSS and discards the sSSW frame (step S3013). On the other hand, if the received value of Short TA is included in the list, the communication apparatus (AP 1000) determines that the sSSW frame is likely to be from an STA in the same BSS and determines that the received sSSW frame is addressed to the communication apparatus (AP 1000) (step S3010).

In step S3005, the communication apparatus (AP 1000) refers to the value of the A-BFT TX field of the received sSSW frame. If the value is 0, the communication apparatus (AP 1000) determines that the state is DTI and performs determination in step S3006. If the value of the A-BFT TX field of the received sSSW frame is 1, the communication apparatus (AP 1000) determines that the state is A-BFT and performs determination in step S3007.

In step S3006, the communication apparatus (AP 1000) determines whether the value of Short TA of the received sSSW frame matches the AID of the STA as a communication partner of SLS that is currently performed. In other words, if the communication apparatus (AP 1000) is not an initiator, the determination result in step S3006 is "No".

If the communication apparatus (AP 1000) is an initiator, the communication apparatus (AP 1000) determines whether Short TA of the received sSSW frame matches the AID of the responder. If the Short TA matches the AID, the communication apparatus (AP 1000) determines that the received sSSW frame is a response to ISS transmitted by the communication apparatus (AP 1000), that is, RSS from the responder, and performs processing of the sSSW frame (step S3011). If the determination result in step S3006 is "No" (mismatch), the communication apparatus (AP 1000) discards the received sSSW frame (step S3013).

In step S3007, the communication apparatus (AP 1000) determines whether the SSW Slot ID and the FSS Slot ID in A-BFT match the values of the SSW Slot ID and the FSS Slot ID of the received sSSW frame. The determination method used in step S3007 is the same as that in the modification example of the fourteenth embodiment (described above with reference to FIGS. 84, 85A, and 85B).

Step S3008 is the same as step S2006 in FIG. 92.

Step S3004 in FIG. 93 is the same as step S2005 in FIG. 92. In both steps, the probability that the sSSW frame is properly discarded decreases as the number of STAs belonging to the BSS increases. However, the ratio of wrong determination of an address, that is, the probability that an sSSW frame transmitted from an STA of a different BSS is determined to be a frame addressed to the communication apparatus (AP 1000) or the communication apparatus (STA 2000) and is not properly discarded is different between step S3004 in FIG. 93 and step S2005 in FIG. 92.

In FIG. 92, check of Short RA in step S2001, which is performed before step S2005, is performed based on the AID. In addition, the number of AIDs used in the BSS is proportional to the number of STAs. Thus, the probability that there is an STA that makes a wrong determination "Yes" in step S2001 with respect to the sSSW frame transmitted from an STA belonging to another BSS increases in proportion to the number of STAs in the BSS. In addition, changing the AID after association is difficult. Thus, if a situation occurs where a wrong determination is made, wrong determination is made continuously and it is difficult to continue SLS.

On the other hand, in step S3001 in FIG. 93, the number of Addressing values to be compared is 1 for each AP. Thus, the probability of wrong determination does not increase even if the number of STAs in the BSS increases. In addition, even if a wrong determination is made, the communication apparatus (STA) is able to retransmit the sSSW frame by changing the seed value, and thus a situation can be prevented from occurring where a wrong determination is continuously made in the communication apparatus (AP 1000).

Figure 94:
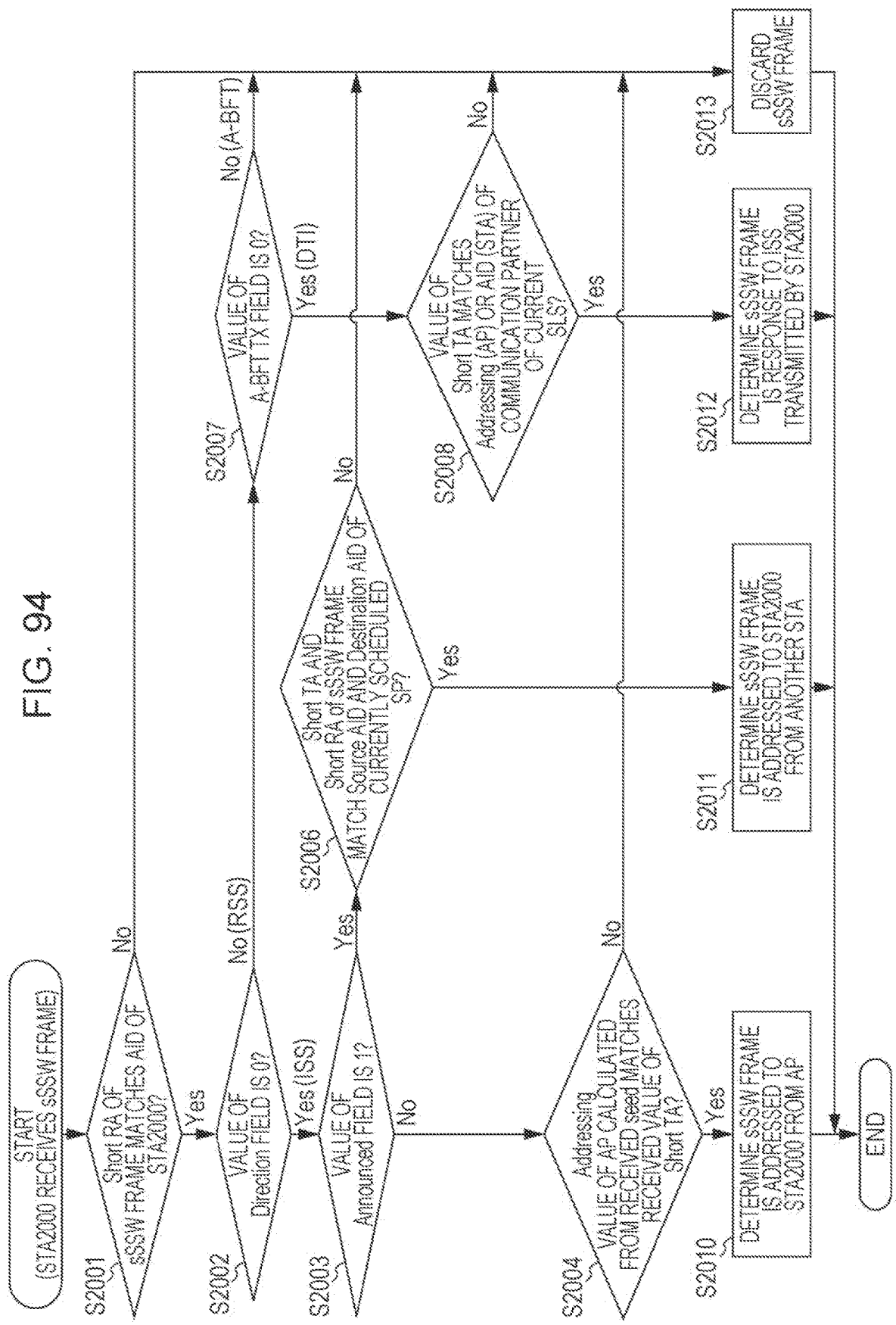
FIG. 94 is a flowchart illustrating processing when a communication apparatus (STA) receives an sSSW frame.

If neither of the destination (RA) and the source (TA) is an AP, the communication apparatus (STA 2000) may make the SP necessary. In other words, if neither of RA and TA is an AP, the Announced field of the sSSW frame is set to 1. The reception processing of the communication apparatus (STA 2000) in this case is illustrated in FIG. 94. FIG. 94 does not include step S2005, unlike FIG. 92. That is, the SP is necessary in the case of transmitting an sSSW frame in which neither of RA and TA is an AP. Thus, the communication apparatus (STA 2000) is able to omit step S2005, in which wrong determination of an address is likely to occur in FIG. 92, and is able to decrease the probability of wrong determination of an address at the time of receiving the sSSW frame.

If wrong determination of an address occurs in the sSSW frame in which neither of RA and TA is an AP, SP may be scheduled at another time and the sSSW frame may be retransmitted. Accordingly, it is possible to decrease the probability that wrong determination of an address continuously occurs.

If either of the destination (RA) and the source (TA) is an AP, the communication apparatus (STA 2000) may transmit an sSSW frame without using the SP. If RA is an AP, the communication apparatus (AP 1000) is able to decrease the probability of wrong determination of an address by using a match determination in step S3001 in FIG. 93. If TA is an AP, the communication apparatus (STA 2000) is able to decrease the probability of wrong determination of an address by using a match determination in step S2004 in FIG. 94.

In addition, if there is no effective wireless link with any terminal (AP and STA) in the BSS, that is, if it is difficult to transmit ADDTS Request in step S406 in FIG. 91, the communication apparatus (STA) may transmit an sSSW frame by setting the Announced field to 0 in step S402a without using an SP for the AP, that is, by omitting steps S406 and S401a in FIG. 91. As a result of performing SLS for the AP by using sSSW frames, the communication apparatus (STA) is able to establish an effective wireless link and becomes able to transmit an ADDTS Request frame to the AP, and is thus able to perform SLS using the SP for an STA other than the AP.

In the case of transmitting an sSSW frame to an STA that is not an AP, the communication apparatus (STA) may make the SP necessary.

Another Method for Setting SP for Transmitting sSSW Frames

Figure 95:
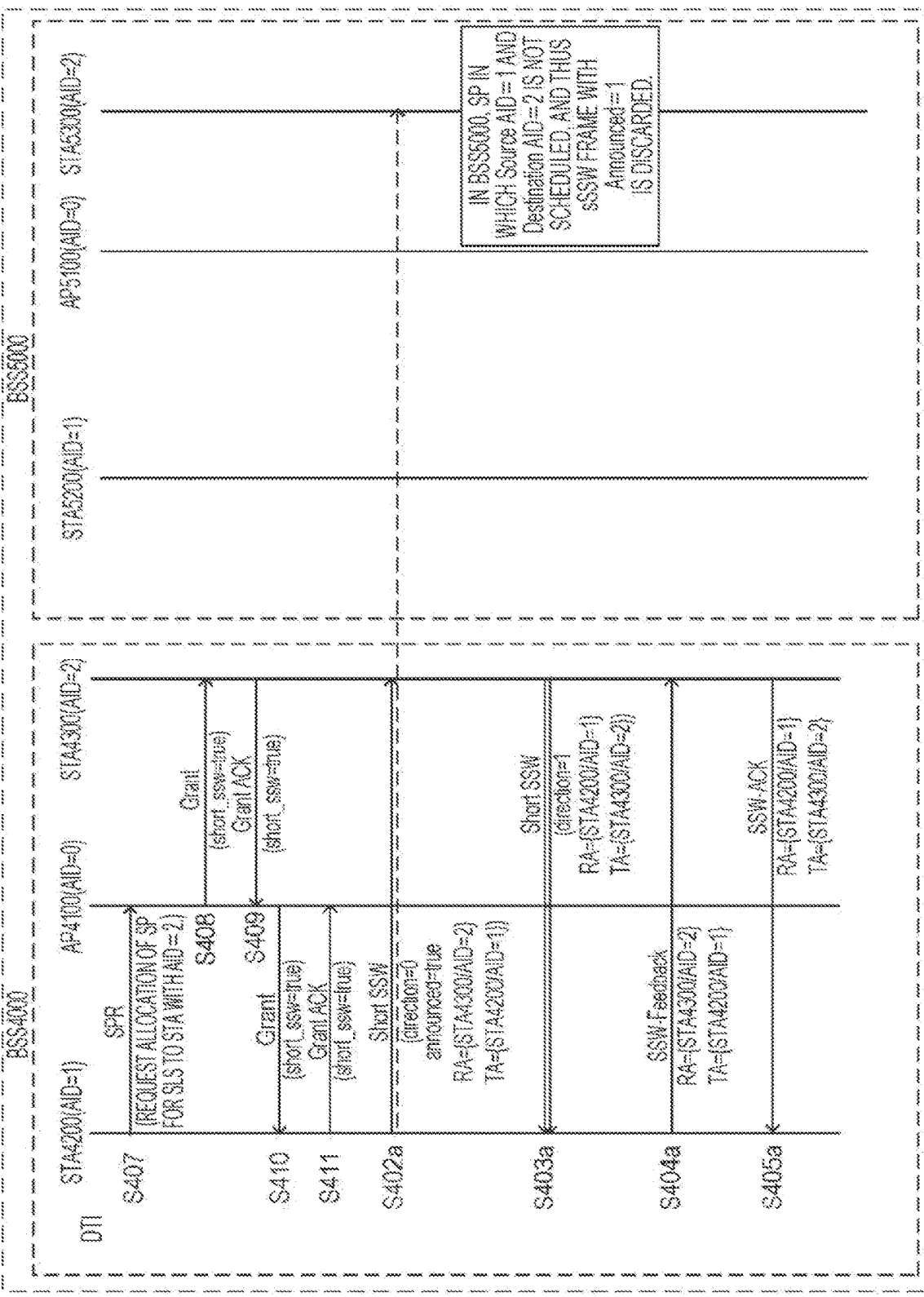
FIG. 95 is a diagram illustrating a procedure in which STAs perform SLS by using the sSSW frame in FIG. 89.

FIG. 95 illustrates a method for setting an SP for transmitting sSSW frames, which is different from the method in FIG. 91. In FIG. 95, the same steps as those in FIG. 91 are denoted by the same numerals, and the description thereof is not given.

In step S407, the STA 4200 transmits, to the AP 4100, a Service Period Request (SPR) frame for requesting an SP for performing SLS using sSSW frames.

In step S408, the AP4100 transmits a Grant frame to the STA 4300 (responder) to notify the STA 4300 that SLS using sSSW frames is scheduled.

In step S409, the STA4300 may transmit Grant ACK to the AP 4100 to notify the AP 4100 that the Grant frame has been normally received and that sSSW frames can be received.

In step S410, the AP4100 transmits a Grant frame to the STA 4200 (initiator) to notify the STA 4200 that SLS using sSSW frames is scheduled.

In step S411, the STA 4200 may transmit Grant ACK to the AP 4100 to notify the AP 4100 that the Grant frame has been normally received and that sSSW frames can be received.

The order of step S408 and step S410 may be inverted. However, by using the order illustrated in FIG. 95, the STA 4200 (initiator) is able to start transmitting sSSW frames in step S402a immediately after transmitting Grant ACK in step S411.

The processing from step S402a is the same as that in FIG. 91. In step S402a (ISS), the STA 4200 transmits an sSSW frame in which the Announced field is set to 1 by using the SP. Thus, an STA belonging to a BSS different from the BSS to which the STA 4200 belongs (for example, STA 5300 of BSS 5000) is able to discard the sSSW frame also when the values of Short TA and Short RA match.

In the twenty-seventh embodiment, the communication apparatus 100 uses an AID as values of Short TA and Short RA representing an STA that is not an AP, and uses an Addressing value corresponding to a seed value as the values of Short TA and Short RA representing an AP. Thus, it is possible to decrease the probability of wrong determination of an address when the communication apparatus (AP) receives an sSSW frame.

In the twenty-seventh embodiment, when the communication apparatus 100 transmits an sSSW frame in which neither of RA and TA is an AP, the communication apparatus 100 transmits the sSSW frame by using an SP, with the Announced field being set to 1, and thus it is possible to decrease the probability of wrong determination of an address when the communication apparatus (STA) receives the sSSW frame.

Twenty-Eighth Embodiment

Figure 96:
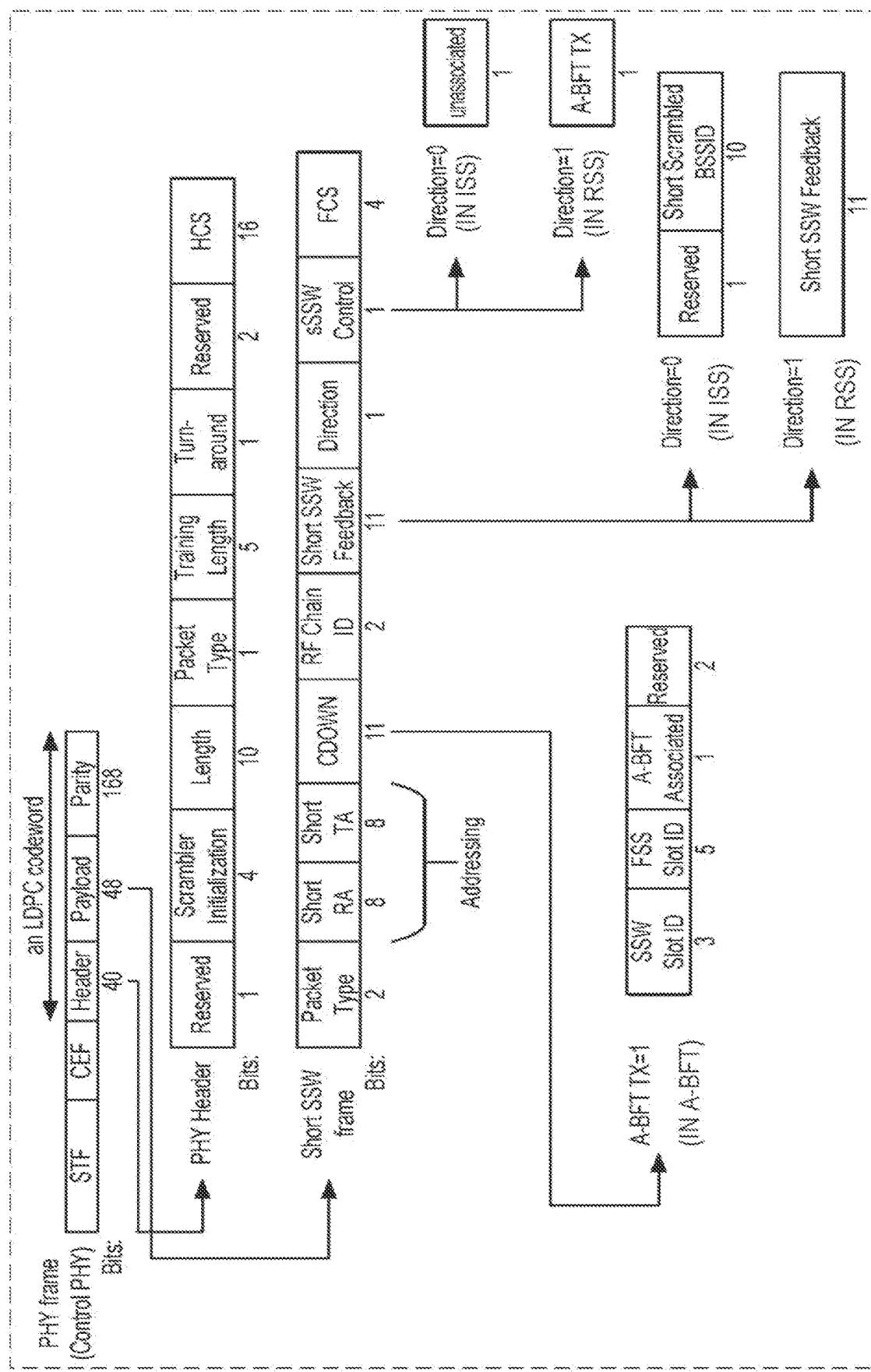
FIG. 96 is a diagram illustrating the configuration of an sSSW frame according to a twenty-eighth embodiment.

FIG. 96 illustrates the configuration of an sSSW frame according to a twenty-eighth embodiment. The sSSW frame in FIG. 96 is different from the sSSW frame in FIG. 87 in that the Reserved field is replaced with an sSSW Control field. When the value of Direction is 1, the sSSW Control field is an A-BFT TX field (same as FIG. 89). When the value of Direction is 0, the sSSW Control field is an unassociated field. When the A-BFT TX field is 1, the CDOWN field can be replaced with four fields as in FIG. 84: an SSW Slot ID field, an FSS Slot ID field, an A-BFT Associated field (Associated field in FIG. 84), and a Reserved field.

Figure 97:
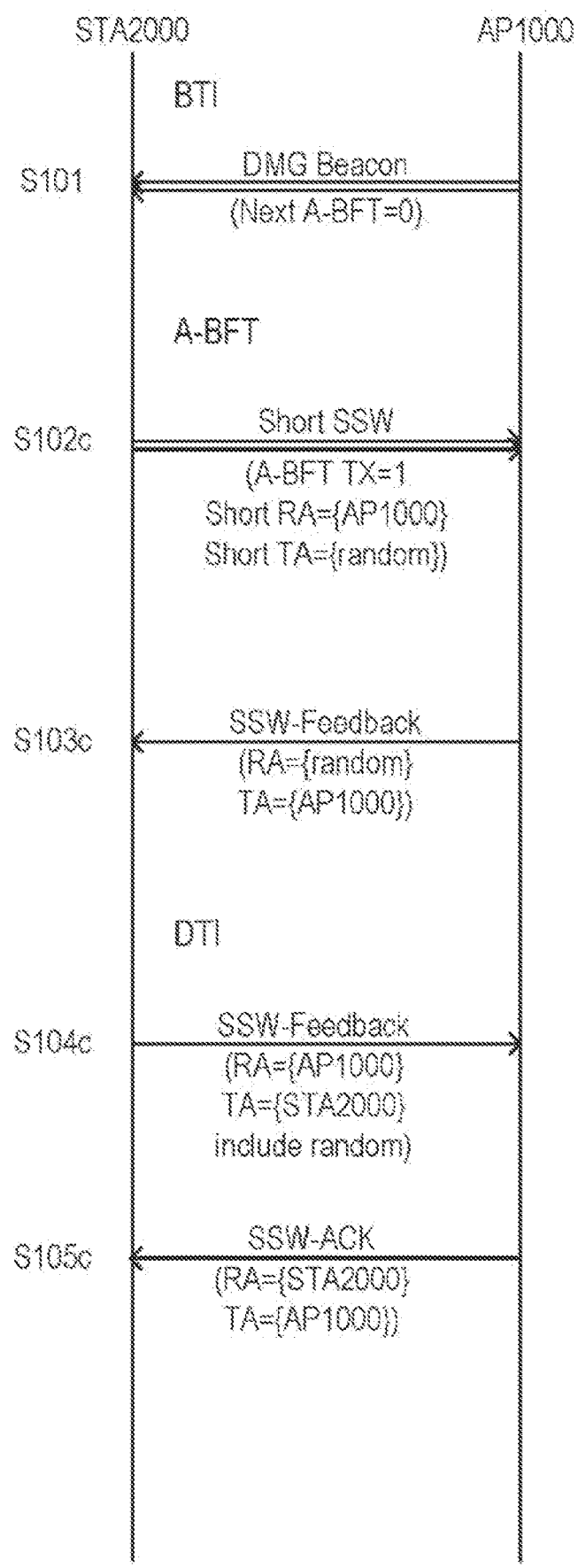
FIG. 97 is a diagram illustrating an example of a procedure in which an AP and an STA perform an initial connection using SLS.

FIG. 97 is a diagram illustrating an example of a procedure in which the AP 1000 and the STA 2000 perform an initial connection using SLS. That is, the STA 2000 is not associated with the AP 1000. FIG. 97 illustrates, like FIGS. 29, 52, and 68, a case where the STA 2000 receives a DMG Beacon frame in which the value of the Next A-BFT field is 0. The same operation is not described here.

In step S102c, the STA 2000 performs RSS by transmitting a plurality of sSSW frames, each being the one illustrated in FIG. 96. At this time, the value of the Direction field is 1 and the value of the A-BFT TX (sSSW Control) field is 1. The STA 2000 sets the value of SSW Slot ID and the value of FSS Slot ID at the time of transmission to the SSW Slot ID field and the FSS Slot ID field, respectively. In addition, to indicate that the STA 2000 is not associated with the AP 1000, the STA 2000 sets the A-BFT Associated field to 0.

The STA 2000 sets the value representing the AP 1000 to the Short RA field. For example, 0 may be used, which is the value of the AID representing the AP. Alternatively, the Addressing value of the AP 1000 corresponding to the seed value may be used. The STA 2000 sets a randomly selected value as the value of the Short TA field.

In step S103c, the AP 1000 transmits an SSW-Feedback frame to the STA 2000. The format of the SSW-Feedback frame is the same as that in FIG. 31. However, the Copy of Addressing field includes the value of the Short TA field transmitted by the STA 2000 in step S102c. Accordingly, when receiving the SSW-Feedback frame, the STA 2000 determines whether the value of Short TA included in the Copy of Addressing field matches the value of Short TA transmitted by the STA 2000 in step S102c. If the two values of Short TA match, the STA 2000 determines that the received SSW-Feedback frame is addressed to the STA 2000.

At the time point of step S103c, the AP 1000 does not know the MAC address of the STA 2000. In step S104c, the STA 2000 transmits an SSW-Feedback frame including an SSW-Feedback field or a MAC frame including an SSW-Feedback field. The MAC frame may include, for example, an SSW frame, an SSW-ACK frame, or the like, or may include an SSW-Feedback field by extending a Probe request frame or the like. At this time, the frame to be transmitted may include the value of Short TA (random) transmitted in step S102c.

In step S104c, the AP 1000 receives the SSW-Feedback frame. The SSW-Feedback frame includes the MAC address of the STA 2000 and information about a best sector number of the AP 1000 selected by the STA 2000 (the value determined by performing ISS in step S101).

By receiving the SSW-Feedback frame, the AP 1000 determines a sector number to be used to transmit a packet addressed to the STA 2000.

In step S105c, the AP 1000 transmits an SSW-ACK frame. The SSW-ACK frame is used as acknowledgement of SSW-Feedback. The AP 1000 compares the value (random) of Short TA received in step S104c with the value (random) of Short TA received in step S102c, and if the two values of Short TA match, the AP 1000 may include the best sector number of the STA 2000 obtained in step S102c (RSS) in the SSW-ACK frame and transmit the SSW-ACK frame.

Figure 98:
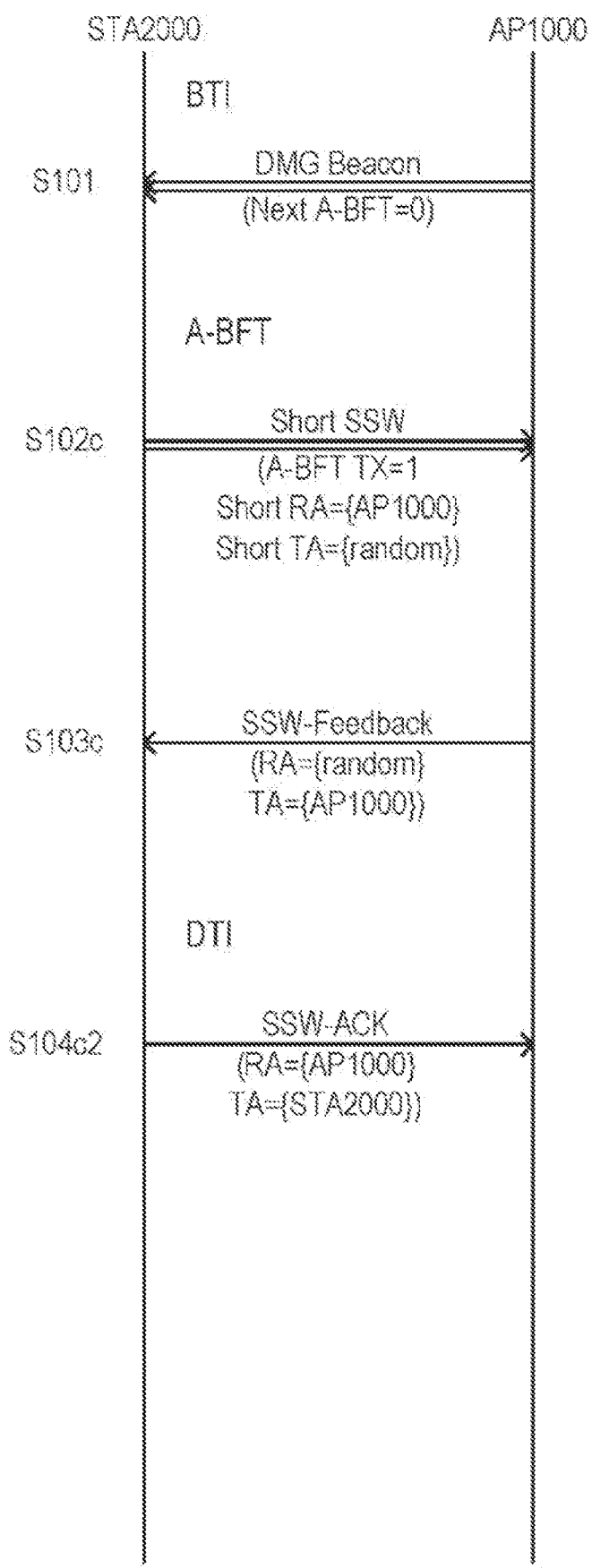
FIG. 98 is a diagram illustrating another example of a procedure in which an AP and an STA perform an initial connection using SLS.

FIG. 98 illustrates another example of a procedure in which the STA 2000 transmits SSW-ACK instead of SSW-Feedback. Steps S101, S102c, and S103c are the same as those in FIG. 97, and thus the description thereof is not given.

In step S104c2, STA 2000 transmits an SSW-ACK frame. The SSW-ACK frame includes the MAC address of the STA 2000 and information about the best sector number of the AP 1000 selected by the STA 2000 (the value determined by performing ISS in step S101).

The AP 1000 receives the SSW-ACK frame and determines a sector number to be used to transmit a packet addressed to the STA 2000.

Accordingly, in the twenty-eighth embodiment, the communication apparatus 100 sets a randomly selected value in the Short TA field of the sSSW frame in A-BFT and transmits the sSSW frame. Thus, even if the communication apparatus 100 is not associated with an AP, the address of the SSW-Feedback frame can be determined, and the time required for SLS can be shortened.

In the twenty-eighth embodiment, when an sSSW frame is used in A-BFT, the communication apparatus 100 transmits a MAC frame including an SSW-Feedback frame in DTI and is thus able to notify the AP of the result of ISS. Accordingly, the communication apparatus 100 is able to shorten the time required for SLS.

Modification Example of Twenty-Seventh Embodiment

A description will be given of other methods in which the communication apparatus 100 calculates the values of the Short RA field and the Short TA field in FIG. 87.

First Method

In a first method, the communication apparatus 100 calculates the values of the Short RA field and the Short TA field by using expressions (26) and (27), respectively.

$$\text{Short } RA = (RA\ AID)\ \text{xor}\ BSS\_color \quad (26)$$

$$\text{Short } TA = (TA\ AID)\ \text{xor}\ BSS\_color \quad (27)$$

RA AID is the AID of the STA that receives an sSSW frame, and TA AID is the AID of the STA that receives an sSSW frame. BSS_color is an 8-bit value that is used by the STA to determine the BSS, is determined by the AP, and is reported to the STA in the BSS by using a beacon frame or an announce frame.

As in expressions (26) and (27), the value calculated through XOR (exclusive OR) of the value of the AID and BSS_color is called "Scrambled AID".

There is no duplication in the value of the AID among STAs in the same BSS, that is, in a single BSS, and thus there is no duplication in Scrambled AID among STAs in the same BSS. That is, the communication apparatus 100 calculates the values of the Short RA field and the Short TA field by using expressions (26) and (27), and thus an address conflict in the same BSS can be prevented.

Here, the communication apparatus (AP) may determine the value of the AID in accordance with a certain order or rule, for example, the AID of the AP is 0, the AID of the STA that is associated first is 1, and the AID of the STA that is associated next is 2. If an address conflict is determined in a plurality of BSSs, there is a high possibility that APs and STAs having the same AID are present in the AIDs compliant with the certain order or rule. Thus, when the communication apparatus (AP) uses the value of the AID as the values of the Short RA field and the Short TA field, the probability of an address conflict increases.

On the other hand, if the communication apparatus (AP) calculates XOR of AID and the value of BSS_color by using expressions (26) and (27), the communication apparatus (AP) is able to decrease the probability of an address conflict in Short RA and Short TA because the value of BSS_color is likely to vary among BSSs.

If BSS color is fixed in the BSS, that is, if BSS color that is determined by the communication apparatus (AP) is not changed, an address conflict occurs in the communication apparatus (STA) in which an address conflict occurs in Short RA and Short TA as long as the AID is not changed (for example, association is cancelled and then association is made again). Such a situation is referred to as "an address conflict occurs continuously".

Figure 99A:
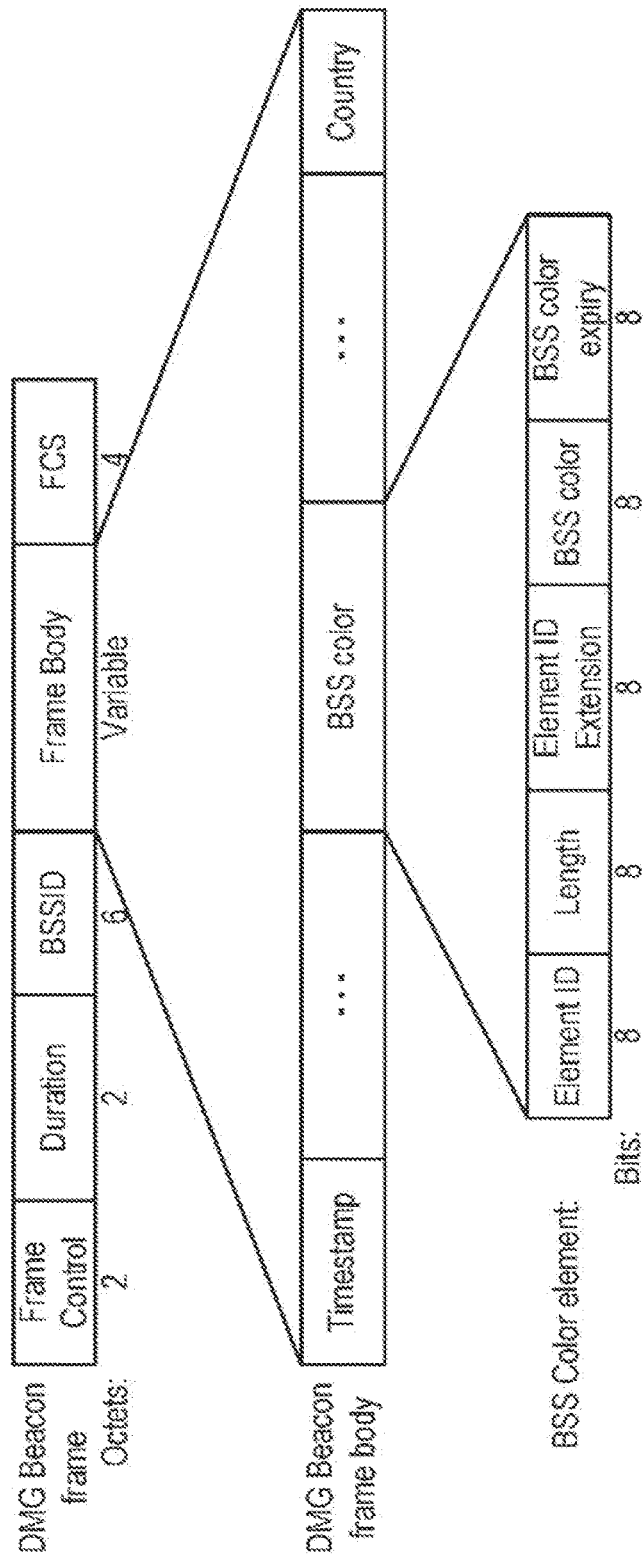
FIG. 99A is a diagram illustrating an example of the configuration of a DMG Beacon frame according to a modification example of the twenty-seventh embodiment.

The communication apparatus (AP) may notify the communication apparatus (STA) of the value of BSS color by using the DMG Beacon frame illustrated in FIG. 99A. In the DMG Beacon frame in FIG. 99A, the DMG Beacon frame body includes a BSS color element. The BSS color element may include an Element ID field, a Length field, an Element ID Extension field, a BSS color field, and a BSS color expiry field.

The Element ID field includes an ID indicating that the element is a BSS color element. The BSS color element is not defined in the 11ad standard, and thus the ID of the BSS color element does not overlap the Element ID that is used in the 11ad standard.

The Length field indicates the data length of the BSS color element.

The Element ID Extension field is used to change the format of the BSS color element in accordance with the value of the Element ID Extension field.

The BSS color field includes the value of BSS color.

The BSS color expiry field includes a validity period of BSS color. For example, if the value of the BSS color expiry field is 3, the communication apparatus (AP) uses the value of BSS color designated in the BSS color field over the following three beacon intervals (3BI). After the validity period indicated in the BSS color expiry field ends, the communication apparatus (AP) uses a default value (for example, 0) of BSS color.

The communication apparatus (AP) determines a value of BSS color that varies in each beacon interval (BI), like the BI ID in FIG. 88F, for example, (i.e., the BI ID in FIG. 88F is equivalent to BSS color), and includes the determined value in the BSS color field of the BSS color element of the DMG Beacon frame in FIG. 99A, thereby being able to update the value of BSS color for each BI and to decrease the probability that an address conflict continuously occurs in Short RA and Short TA.

That is, the communication apparatus (AP) may set the value of the BSS color expiry field to 1 and update the value of BSS color for each BI. In addition, the communication apparatus (AP) may give notice of a new value of BSS color even in the validity period of BSS color and change the value of BSS color. In addition, the communication apparatus (AP) may give notice of the value of BSS color by omitting the BSS color expiry field and make the value of BSS color indicated by the notice effective indefinitely (that is, until a notice of another value of BSS color is given).

After the validity period indicated by the BSS color expiry field ends, the communication apparatus (AP) may forbid the communication apparatus (STA) to use an sSSW frame in the BSS. That is, the communication apparatus (STA) does not use the default value of BSS color. The communication apparatus (STA) may transmit, to the communication apparatus (AP), a frame for requesting distribution of the value of BSS color.

In addition, the communication apparatus (AP) may include a plurality of BSS colors in one DMG Beacon frame and transmit the DMG Beacon frame. Accordingly, the communication apparatus (AP) is able to decrease the frequency of transmitting a BSS color element and to shorten the DMG Beacon frame. In this case, the communication apparatus (AP) applies the value of the DMG color expiry field for each BSS color. That is, each BSS color has a validity period indicated in the DMG color expiry field.

For example, in a case where one DMG Beacon frame includes eight values of BSS color and the value of the DMG color Expiry field is 3, the communication apparatus (STA) is able to use the first BSS color in the first 3BI and use the second BSS color in the second 3BI. That is, the communication apparatus (AP) is able to designate BSS colors for 24 (8×3) BIs by using one DMG Beacon frame.

In a case where the communication apparatus (AP) includes a plurality of BSS colors in one DMG Beacon frame and transmits the DMG Beacon frame, the DMG color expiry field may be called a DMG color period field. In a case where the value of the DMG color period field is 1, the DMG color period field may be omitted. In a case where the DMG color period field is omitted, the communication apparatus (STA) selects BSS color for 1BI from among a plurality of BSS colors and uses the selected BSS color.

In a case where all the BSS colors included in one DMG Beacon frame are applied, the communication apparatus (STA) may determine that the validity period of BSS color ends, repeatedly apply all the BSS colors included in one DMG Beacon frame in order, and determine that the validity period of BSS color does not expire. The communication apparatus (AP) may add, to the BSS color element, for example, a field indicating whether BSS color is repeatedly applied in order and transmit the BSS color element.

Figure 99B:
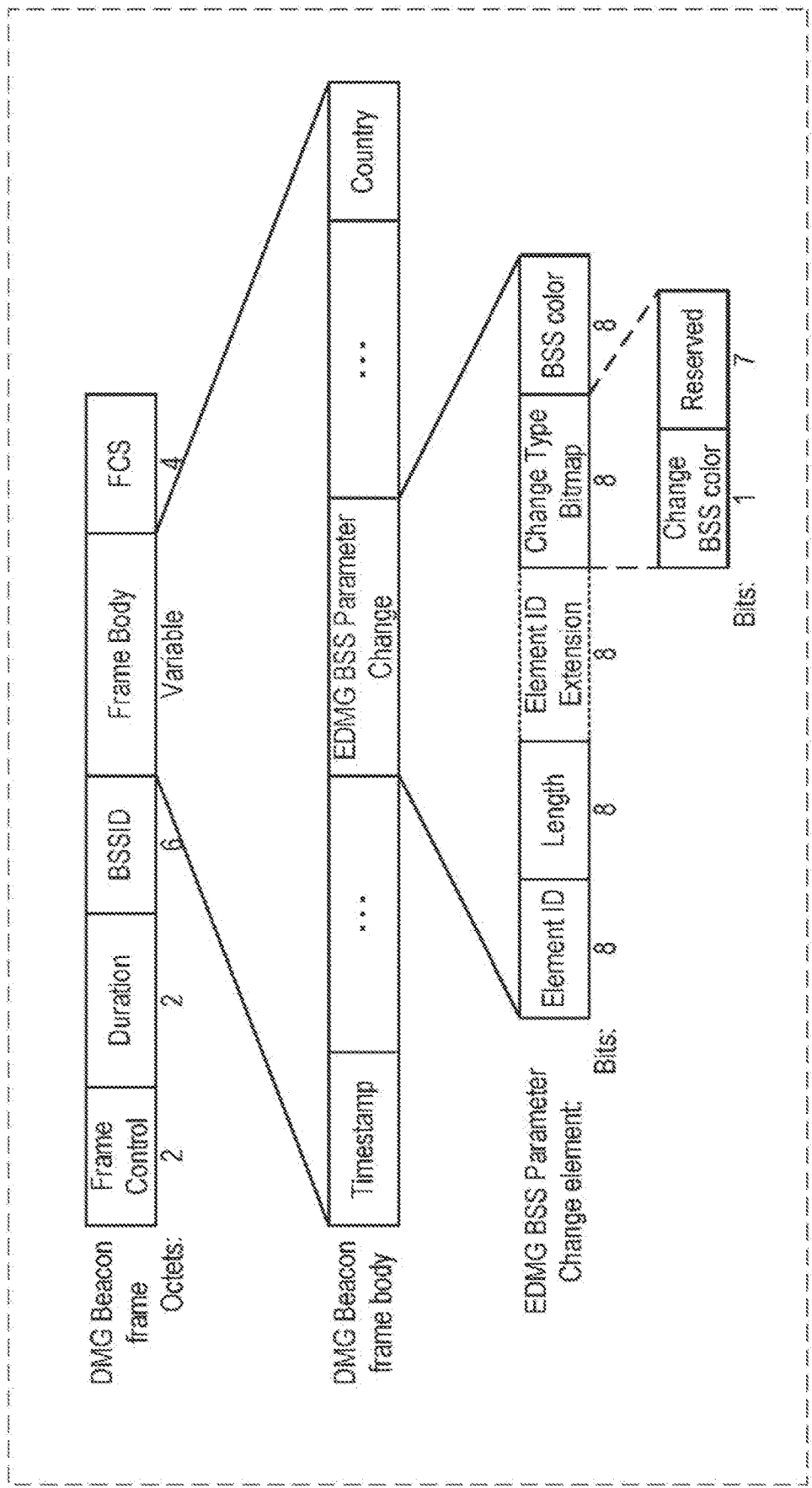
FIG. 99B is a diagram illustrating another example of the configuration of the DMG Beacon frame according to the modification example of the twenty-seventh embodiment.

In addition, the communication apparatus (AP) may notify the communication apparatus (STA) of the value of BSS color by using the DMG Beacon frame illustrated in FIG. 99B. In the DMG Beacon frame in FIG. 99B, the DMG Beacon frame body includes an EDMG BSS Parameter Change element. The EDMG BSS Parameter Change element may include an Element ID field, a Length field, an Element ID Extension field, a Change Type Bitmap field, and a BSS color field. In FIG. 99B, the same fields as those in FIG. 99A have the same functions and thus the description thereof is not given.

In FIG. 99B, the Change Type Bitmap field includes a Change BSS color field and a Reserved field. When the value of the Change BSS color field is 1, the communication apparatus (AP) changes BSS color by using the value of the BSS color field. When the value of the Change BSS color field is 0, the communication apparatus (AP) does not change the value of the BSS color field.

Figure 100:
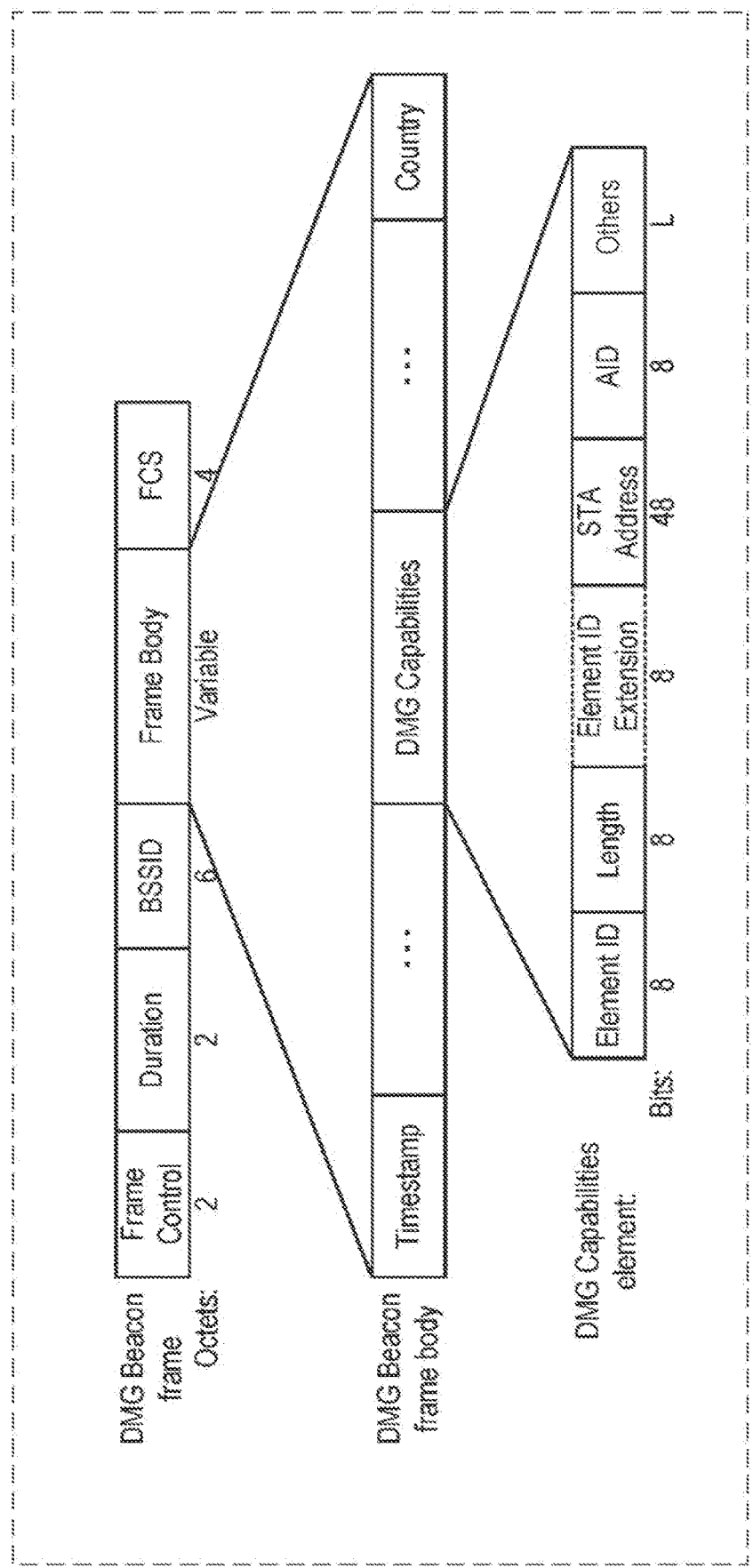
FIG. 100 is a diagram illustrating another example of the configuration of the DMG Beacon frame according to the modification example of the twenty-seventh embodiment.

In addition, the communication apparatus (AP) may notify the communication apparatus (STA) of the value of BSS color by using the DMG Beacon frame illustrated in FIG. 100. In the DMG Beacon frame in FIG. 100, the DMG Beacon frame body includes a DMG Capabilities element. The DMG Capabilities element includes an Element ID field, a Length field, an Element ID Extension field, an STA Address field, an AID field, and other fields defined in the 11ad standard. In FIG. 100, the same fields as those in FIGS. 99A and 99B have the same functions and thus the description thereof is not given.

The STA Address field includes the MAC address of the communication apparatus (AP). The AID field includes a value corresponding to Short RA of the communication apparatus (AP). Here, the AID (RA AID) of the communication apparatus (AP) is 0, and thus expression (26) leads to a result in which Short RA of the communication apparatus (AP) is equal to BSS color. That is, the AID field substantially includes the value of BSS color.

In FIG. 100, the communication apparatus (AP) may omit either the STA Address field or the AID field and transmit the DMG Beacon frame. The communication apparatus (STA) that has received the DMG Beacon frame in FIG. 100 may determine which field is omitted by referring to the value of the Length field. In addition, the communication apparatus (AP) may add, to the DMG Capabilities element, for example, a field indicating which field is omitted.

In FIG. 100, the communication apparatus (AP) includes the value of AID (substantially equal to BSS color) in the DMG Capabilities element defined in the 11ad standard and transmits the DMG Beacon frame. Alternatively, the communication apparatus (AP) may newly specify an element dedicated to the 11ay standard and include the element in the AID field or the BSS color field. For example, the communication apparatus (AP) may include the AID field in an Enhanced DMG (EDMG) Capabilities element (not illustrated) that is newly specified in the DMG Beacon frame body and transmit the DMG Beacon frame.

Second Method

In a second method, the communication apparatus 100 calculates the values of the Short RA field and the Short TA field by using expressions (28) and (29), respectively.

$$\text{Short } RA = ((RA\_AID) + BSS\_\text{color}) \bmod 256 \quad (28)$$

$$\text{Short } TA = ((TA\_AID) + BSS\_\text{color}) \bmod 256 \quad (29)$$

In the second method, unlike in the first method, the communication apparatus 100 uses addition instead of XOR. In addition, the communication apparatus 100 performs mod 256 (modulo operation with a divisor 256) so that a calculation result is within 8 bits and that the value of RA AID and the value of Short_RA correspond to each other in a one-to-one relationship.

In the second method, as in the first method, a different BSS color is used for each BSS, and thus the communication apparatus (AP) is able to decrease the probability of an address conflict in Short RA and Short TA. In addition, in the second method, as in the first method, BSS_color that is updated for each BI is used. Thus, the communication apparatus (AP) is able to decrease the probability that an address conflict continuously occurs in Short RA and Short TA.

Third Method

In a third method, the communication apparatus 100 calculates the values of the Short RA field and the Short TA field by using expressions (30) and (31), respectively.

$$\text{Short } RA = ((RA\_AID) + BSS\_\text{color} \times \text{Seed}) \bmod 256 \quad (30)$$

$$\text{Short } TA = ((TA\_AID) + BSS\_\text{color} \times \text{Seed}) \bmod 256 \quad (31)$$

The communication apparatus 100 may use the value of the Scrambler Initialization field in FIG. 87 as a seed value.

In addition, the communication apparatus 100 may use, as a seed value, the same value as the seed that is used to calculate the value of Short Scrambled BSSID (for example, see FIG. 88D).

In addition, the communication apparatus 100 may use, as a seed value, a value different from the seed that is used to calculate the value of Short Scrambled BSSID. For example, the communication apparatus (AP) may notify the communication apparatus (STA) of the seed value used in expressions (30) and (31) by using a beacon frame.

In the third method, compared with the second method, the communication apparatus 100 multiplies the value of BSS_color by a seed value. Accordingly, the communication apparatus 100 is able to change the values of Short RA and Short TA in accordance with the seed value. That is, in the third method, as in the second method, the communication apparatus (AP) is able to change the values of Short RA and Short TA by changing the value of BSS color.

Furthermore, in the third method, the values of Short RA and Short TA can be changed when the communication apparatus (STA) changes the seed value and transmits an sSSW frame, without changing BSS color.

Accordingly, with the third method, the communication apparatus 100 is able to decrease the probability that an address conflict continuously occurs in Short RA and Short TA.

Fourth Method

In a fourth method, the communication apparatus 100 calculates the values of the Short RA field and the Short TA field by using expressions (32) and (33), respectively.

$$\text{Short } RA = ((RA\_AID) + BSS\_\text{color}) \bmod 255 \text{ (when } RA\_AID \text{ is not 255)}$$

$$\text{Short } RA = 255 \text{ (when } RA\_AID \text{ is 255)} \quad (32)$$

$$\text{Short } TA = ((TA\_AID) + BSS\_\text{color}) \bmod 255 \text{ (when } TA\_AID \text{ is not 255)}$$

$$\text{Short } TA = 255 \text{ (when } TA\_AID \text{ is 255)} \quad (33)$$

In the fourth method, compared with the second method, the communication apparatus 100 uses modulo operation with a divisor 255 (mod 255) instead of modulo operation with a divisor 256 (mod 256). In the fourth method, a broadcast address 255 is 255 regardless of the value of BSS color. Thus, even if the value of BSS color is unknown, a communication apparatus (STA) belonging to another BSS is able to determine whether Short RA is a broadcast address (all bits are 1).

The AID other than the broadcast address changes in accordance with the value of BSS color, and thus the communication apparatus (AP) is able to decrease the probability that an address conflict continuously occurs in Short RA and Short TA.

Fifth Method

In a fifth method, the communication apparatus 100 calculates the values of the Short RA field and the Short TA field by using expressions (34) and (35), respectively.

$$\text{Short } RA = ((RA\_AID) + BSS\_\text{color} \times \text{Seed}) \bmod 255 \text{ (when } RA\_AID \text{ is not 255)}$$

$$\text{Short } RA = 255 \text{ (when } RA\_AID \text{ is 255)} \quad (34)$$

$$\text{Short } TA = ((TA\_AID) + BSS\_\text{color} \times \text{Seed}) \bmod 255 \text{ (when } TA\_AID \text{ is not 255)}$$

$$\text{Short } TA = 255 \text{ (when } TA\_AID \text{ is 255)} \quad (35)$$

In the fifth method, compared with the third method, the communication apparatus 100 uses modulo operation with a divisor 255 (mod 255) instead of modulo operation with a divisor 256 (mod 256). In the fifth method, a broadcast address 255 is 255 regardless of the value of BSS color. Thus, even if the value of BSS color is unknown, a communication apparatus (STA) belonging to another BSS is able to determine whether Short RA is a broadcast address. In addition, the AID other than the broadcast address changes in accordance with the value of BSS color, and thus the communication apparatus (AP) is able to decrease the probability that an address conflict continuously occurs in Short RA and Short TA.

Sixth Method

In a sixth method, as a modification example of the fourth method, the communication apparatus 100 calculates the values of the Short RA field and the Short TA field by using expressions (36) and (37), respectively.

$$\text{Short } RA=1+((RA\ AID-1)+BSS\_\text{color})\bmod 254$$
$$(\text{when } RA\_AID \text{ is not } 0.255)$$

$$\text{Short } RA=0.255\ (\text{when } RA\_AID \text{ is } 0.255) \quad (36)$$

$$\text{Short } TA=1+((TA\ AID-1)+BSS\_\text{color})\bmod 254$$
$$(\text{when } TA\_AID \text{ is not } 0.255)$$

$$\text{Short } TA=0.255\ (\text{when } TA\_AID \text{ is } 0.255) \quad (37)$$

In the sixth method, compared with the fourth method, the communication apparatus 100 uses modulo operation with a divisor 254 (mod 254) instead of modulo operation with a divisor 255 (mod 255). In addition, the communication apparatus 100 subtracts 1 from the AID before the modulo operation and adds 1 after the modulo operation. As a result of the calculation, Short RA has a value other than 0.255 when RA_AID has a value other than 0.255.

Here, the AID of the AP is 0 and thus Short RA and Short TA of the AP are 0 regardless of the value of BSS color. Thus, the sixth method obtains, in addition to the effect of the fourth method, an effect that a communication apparatus (STA) belonging to another BSS is able to determine whether Short RA and Short TA are the address (0) of the AP even if the value of BSS color is unknown.

Seventh Method

In a seventh method, as a modification example of the fifth method, the communication apparatus 100 calculates the values of the Short RA field and the Short TA field by using expressions (38) and (39), respectively.

$$\text{Short } RA=1+((RA\ AID-1)+BSS\_\text{color}\times\text{Seed})\bmod 254$$
$$(\text{when } RA\_AID \text{ is not } 0.255)$$

$$\text{Short } RA=0.255\ (\text{when } RA\_AID \text{ is } 0.255) \quad (38)$$

$$\text{Short } TA=1+((TA\ AID-1)+BSS\_\text{color}\times\text{Seed})\bmod 254$$
$$(\text{when } TA\_AID \text{ is not } 0.255)$$

$$\text{Short } TA=0.255\ (\text{when } TA\_AID \text{ is } 0.255) \quad (39)$$

In the seventh method, compared with the fifth method, the communication apparatus 100 uses modulo operation with a divisor 254 (mod 254) instead of modulo operation with a divisor 255 (mod 255). In addition, the communication apparatus 100 subtracts 1 from the AID before the modulo operation and adds 1 after the modulo operation. As a result of the calculation, Short RA has a value other than 0.255 when RA_AID has a value other than 0.255.

Here, the AID of the AP is 0 and thus Short RA and Short TA of the AP are 0 regardless of the value of BSS color. Thus, the seventh method obtains, in addition to the effect of the fifth method, an effect that a communication apparatus (STA) belonging to another BSS is able to determine whether Short RA and Short TA are the address (0) of the AP even if the value of BSS color is unknown.

In the first method (expressions (26) and (27)), the second method (expressions (28) and (29)), the third method (expressions (30) and (31)), the fourth method (expressions (32) and (33)), the fifth method (expressions (34) and (35)), the sixth method (expressions (36) and (37)), and the seventh method (expressions (38) and (39)), the communication apparatus 100 may use BI ID in FIG. 88F instead of BSS_color. However, BI ID is used as 8 bits, unlike in FIG. 88F.

In addition, in the first method (expressions (26) and (27)), the second method (expressions (28) and (29)), the fourth method (expressions (32) and (33)), the fifth method (expressions (34) and (35)), the sixth method (expressions (36) and (37)), and the seventh method (expressions (38) and (39)), the communication apparatus 100 may use the upper 8 bits of Short Scrambled BSSID in FIG. 87 instead of BSS_color. The communication apparatus 100 is able to change the value of Short Scrambled BSSID in accordance with a seed value (see FIGS. 88A to 88D), and is thus able to decrease the probability that an address conflict continuously occurs.

Figure 101:
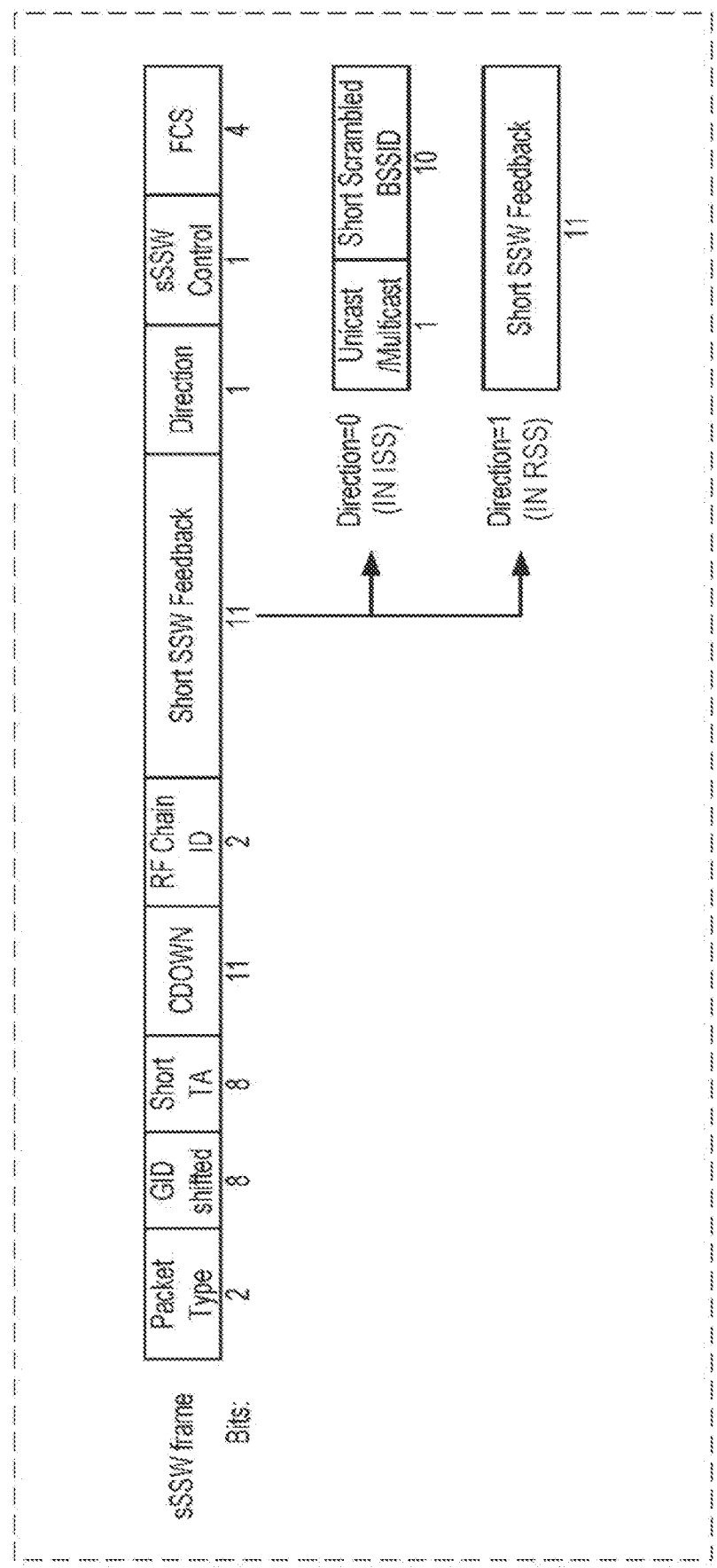
FIG. 101 is a diagram illustrating an example of the format of an sSSW frame according to the modification example of the twenty-seventh embodiment.

In addition, the communication apparatus 100 may calculate the value of Short RA by using Group ID as a reception address instead of RA AID and include the calculated value in sSSW. FIG. 101 is an example of a frame format. Compared with FIG. 87, the sSSW frame in FIG. 101 includes a GID shifted field instead of the Short RA field, and in Short SSW Feedback, a Unicast/Multicast field is included instead of the Reserved field.

In the case of using Group ID as an address (reception address) in multicast communication, the communication apparatus (AP) sets the Unicast/Multicast field to 1. In the case of multicast communication, the communication apparatus (AP) calculates the value of the GID shifted field by using expression (40). This is equivalent to application of the first method (expression (26)) to Group ID instead of AID by the communication apparatus (AP).

$$GID \text{ shifted}=(\text{Group } ID)\ \text{xor}\ BSS\_\text{color} \quad (40)$$

FIG. 102 is a diagram illustrating an example of Group ID. Group ID "0" is reserved and represents a group of STAs, and is thus not used. For example, Group ID "0" may be an AP. Group ID "1" represents, for example, a group of four STAs (AID 1, 3, 30, 35). Group ID "2" represents, for example, a group of three STAs (AID 2, 3, 30), and Group ID "3" represents, for example, a group of four STAs (AID 10, 11, 12, 13). Group ID "255" represents broadcast, that is, all the terminals in the BSS.

In the example illustrated in FIG. 102, Group ID "4" to Group ID "254" are unallocated. If the reception address of an sSSW frame received by the communication apparatus (STA) has an unallocated value (i.e., any of Group ID "4" to Group ID "254"), the communication apparatus (STA) determines that the received sSSW frame is not from the BSS to which the communication apparatus (STA) belongs, and discards the received sSSW frame.

In a case where the communication apparatus (STA) performs broadcasting, the communication apparatus (STA) may define Group ID "255" as an ID representing all STAs including an AP, and may define Group ID "254" as an ID representing all STAs except an AP.

In the second method (expression (28)), the third method (expression (30)), the fourth method (expression (32)), the fifth method (expression (34)), the sixth method (expression (36)), and the seventh method (expression (38)), the communication apparatus (AP) may calculate a value of GID shifted by using the value of Group ID as in expression (40). In addition, the communication apparatus (AP) may use an 8-bit BI ID or the upper 8 bits of Short Scrambled BSSID instead of BSS color to calculate the value of GID shifted.

In the modification example of the twenty-seventh embodiment, the frame format in FIG. 87 has been described. Any of the first, second, third, fourth, fifth, sixth, and seventh methods may be applied to Short RA and Short TA in the frame formats in FIGS. 89 and 96.

In the modification example of the twenty-seventh embodiment, any of the first, second, third, fourth, fifth, sixth, and seventh methods is applied to Short RA and Short TA in the Short SSW frame. Alternatively, any of the first, second, third, fourth, fifth, sixth, and seventh methods may be applied to any frame including an AID as a transmission address or a reception address, other than the Short SSW frame.

For example, when the communication apparatus (STA) receives a data packet including an AID of a reception address in the PHY header, the communication apparatus (STA) may decode the PHY header, and if the AID included in the PHY header does not match the AID of the communication apparatus (STA), the communication apparatus (STA) may discontinue decoding of the data packet. Accordingly, the communication apparatus (STA) is able to omit unnecessary decoding processing and reduce power consumption.

In addition, the communication apparatus (AP) may include, in the PHY header of the data packet, Short RA in which any of the first, second, third, fourth, fifth, sixth, and seventh methods is applied to AID, and transmit the data packet. When the communication apparatus (STA) receives the data packet including Short RA in the PHY header, the communication apparatus (STA) may decode the PHY header, and if Short RA included in the PHY header does not match Short RA of the communication apparatus (STA), the communication apparatus (STA) may discontinue decoding of the data packet.

There is a low probability that Short RA of the data packet transmitted by the communication apparatus of another BSS (another AP) matches Short RA of the communication apparatus (STA), and thus the power consumption in the communication apparatus (STA) can be reduced.

Accordingly, the communication apparatus 100 is able to decrease the probability that an address conflict occurs in Short RA and Short TA.

In addition, the communication apparatus 100 is able to change the values of Short RA and Short TA corresponding to all APs and STAs by changing the value of BSS color and to decrease the probability that an address conflict continuously occurs.

Modification Example of Twenty-Eighth Embodiment

Figure 103:
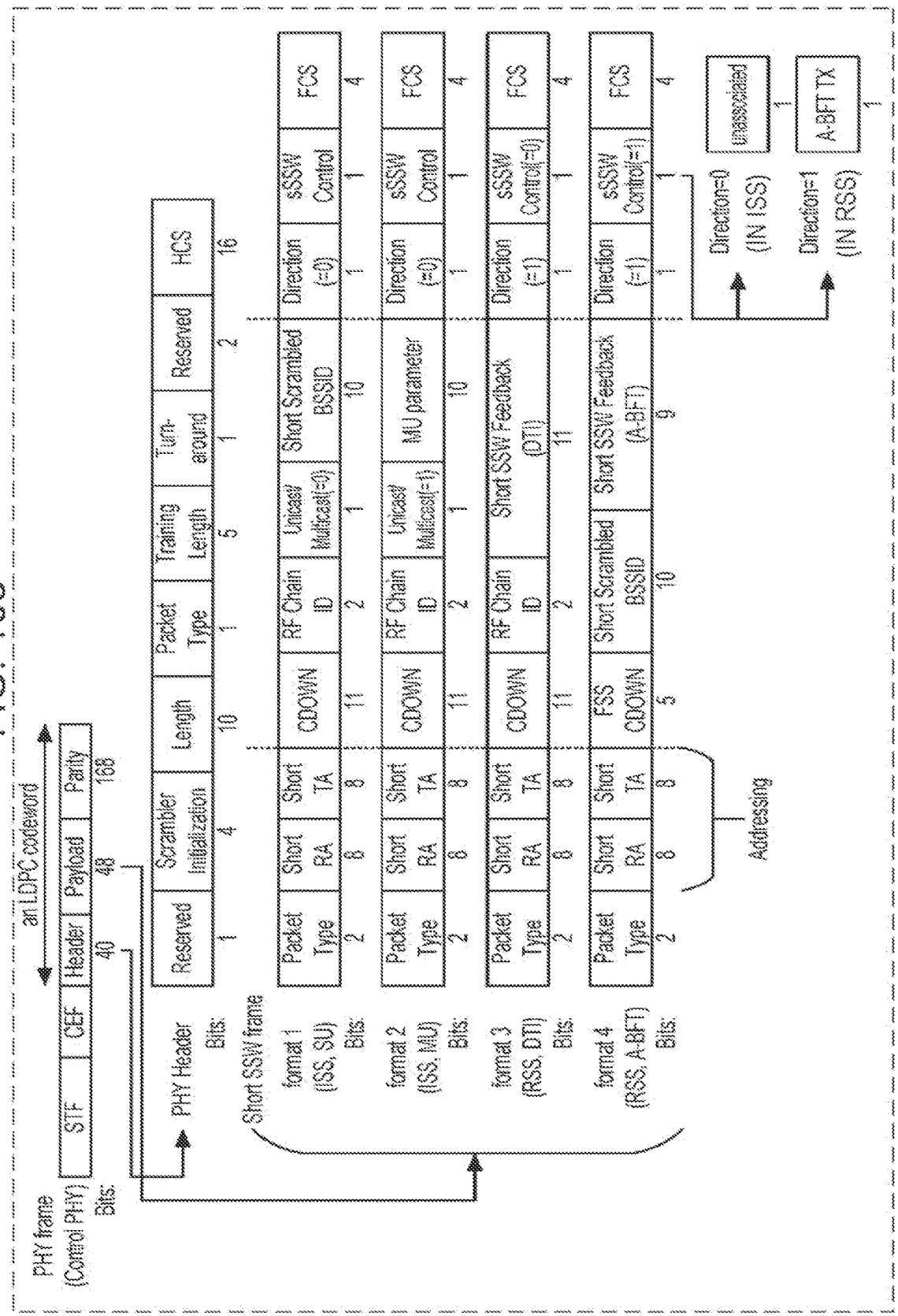
FIG. 103 is a diagram illustrating an example of formats of an sSSW frame according to a modification example of the twenty-eighth embodiment.

FIG. 103 is a diagram illustrating the format of an sSSW frame different from that in FIG. 96 according to the twenty-eighth embodiment. In FIG. 103, the communication apparatus 100 selects one of four sSSW frame formats in accordance with the values of the Direction field, the sSSW Control field, and the Unicast/Multicast field and transmits the sSSW frame.

In FIG. 103, the fields having the same names as those in FIG. 96 have the same functions, and thus the description thereof is not given. Hereinafter, the fields not included in FIG. 96 will be described.

In FIG. 103, when the Direction field is 0, there is a Unicast/Multicast field.

Furthermore, when the Unicast/Multicast field is 0 (i.e., format 1), the sSSW frame is a frame addressed to a single communication apparatus (AP or STA). When the Unicast/Multicast field is 1 (i.e., format 2), the sSSW frame is a frame addressed to a plurality of communication apparatuses (AP or STA).

When the Unicast/Multicast field is 1, the value of the Short RA field is 255 representing broadcast, or a group number (Group ID) representing a plurality of communication apparatuses (STAs). The correspondence between the group number and the communication apparatuses (STAs) is determined by the communication apparatus (AP), and the communication apparatuses (STAs) are notified using a beacon frame or an announce frame.

Furthermore, when the Unicast/Multicast field is 1, there is an MU parameter field. The MU parameter field includes a parameter that is necessary for multicast communication. For example, the MU parameter field includes the duration of multicast communication.

In FIG. 103, when the Direction field is 1, there is a Short SSW Feedback field.

Furthermore, when the sSSW Control field is 0, the Short SSW Feedback field indicates RSS in DTI (i.e., format 3). When the sSSW Control field is 1, the Short SSW Feedback field indicates RSS in A-BFT (i.e., format 4).

With reference to FIG. 104, a description will be given of a method in which the communication apparatus 100 selects one frame format. FIG. 104 is a diagram illustrating the relationship between frame formats and individual fields.

Format 1

When the value of the Direction is 0 and the value of the Unicast/Multicast field is 0, the sSSW frame indicates ISS in unicast communication. In this case, the communication apparatus 100 selects format 1 as the sSSW frame.

Format 1 is the same as "in ISS" in FIG. 96. However, format 1 includes a Unicast/Multicast field instead of a Reserved field.

In format 1, the sSSW Control field is an unassociated field because the Direction field is 0. That is, the communication apparatus (STA) that transmits the sSSW frame sets the value of the unassociated field to 1 when not being associated with the communication apparatus (AP).

Format 2

When the value of the Direction field is 0 and the Unicast/Multicast field is 1, the sSSW frame indicates ISS in multicast communication. In this case, the communication apparatus 100 selects format 2 as the sSSW frame.

Format 2 includes an MU parameter field, unlike format 1. The Short RA field is a group address or a broadcast address.

The Short TA field may include a part (for example, the upper 8 bits) of the Short Scrambled BSSID field by forbidding an STA other than an AP to perform multicast transmission. When the communication apparatus (STA) receives the sSSW frame, if the value of the Unicast/Multicast field is 1, the communication apparatus (STA) determines that the Short TA field includes a part of the Short Scrambled BSSID field, not a transmission address (AID).

Format 3

The value of the Direction field is 1, and thus the sSSW Control field is an A-BFT TX field. When the value of the A-BFT TX field is 0, the sSSW frame means RSS in DTI. In this case, the communication apparatus 100 selects format 3 as the sSSW frame.

Format 3 is the same as "in RSS" in FIG. 96 and "not in A-BFT".

Format 4

The value of the Direction field is 1, and thus the sSSW Control field is an A-BFT TX field. When the value of the A-BFT TX field is 1, the sSSW frame means RSS in A-BFT. In this case, the communication apparatus 100 selects format 4 as the sSSW frame.

Format 4 is another format of "use A-BFT" in FIG. 84. Unlike in FIG. 84, format 4 in FIG. 103 includes an FSS CDOWN field, a Short Scrambled BSSID field, and a Short SSW Feedback field.

The Short Scrambled BSSID field includes the same parameter as that in the Short Scrambled BSSID field of format 1. The Short SSW Feedback field includes the same parameter as that of format 3. However, the maximum value of the Short SSW Feedback field in A-BFT is 511, and thus the number of bits of the Short SSW Feedback field is reduced to 9 bits, compared with format 3.

The FSS CDOWN field of format 4 in FIG. 103 has a function similar to that of the FSS Slot ID field in FIG. 84. The FSS CDOWN field uses, as an initial value, a value obtained by subtracting 1 from the maximum number of sSSW frames that can be transmitted in an SSW Slot, like the CDOWN value in FIG. 75A (5 in FIG. 75A). The communication apparatus 100 transmits sSSW frames while decreasing the value of the FSS CDOWN field by 1 every time the communication apparatus 100 transmits an sSSW frame.

Operation Related to STA Before Association

Before the communication apparatus (STA) is associated with the communication apparatus (AP), the AID of the communication apparatus (STA) is not determined. The values set to the Short TA field and the Short RA field will be described. Here, a description will be given of a case where the Short TA field and the Short RA field are calculated based on an AID.

First, a description will be given of a case where the communication apparatus (STA) before association performs unicast SLS (i.e., designation of the address of the communication apparatus (AP)) for the communication apparatus (AP).

In this case, the communication apparatus (STA) before association may transmit an sSSW frame of format 1 in DTI. In addition, the communication apparatus (STA) before association may transmit an sSSW frame of format 4 in A-BFT.

The communication apparatus (AP) performs RSS using an sSSW frame of format 3 in response to the sSSW frame of format 1 in DTI. In addition, the communication apparatus (AP) transmits SSW Feedback (for example, the frame formats in FIGS. 50 and 51 are used) in response to the sSSW frame of format 4 in A-BFT.

That is, a description will be given of a case where the communication apparatus (STA) before association transmits an sSSW frame of format 1 or format 4 and a case where the communication apparatus (AP) transmits an sSSW frame of format 3 in response to format 1.

A case where the communication apparatus (STA) before association transmits an sSSW frame of format 2 will be described below.

In format 1, when the value of the unassociated field is 1, the communication apparatus (STA) randomly selects a value of Short TA and transmits an sSSW frame. The communication apparatus (STA) may select one of unused values of AID in the same BSS. In addition, the communication apparatus (AP) may notify the communication apparatus (STA) of one of unused AIDs by using a beacon frame. If there is no unused AID or if association is not permitted any more for another reason, the communication apparatus (AP) may give notice indicating that the value of unused AID is 0 (i.e., AID of AP).

The communication apparatus (AP) that has received the sSSW frame of format 1 transmits, as RSS, an sSSW frame of format 3 including Scrambler Initialization (SI) of the same value as SI of the received sSSW frame. The communication apparatus (STA) that has received the sSSW frame of format 3 compares the value of SI of the received sSSW frame with the value of SI of the sSSW frame transmitted by the communication apparatus (STA). If both values match, the communication apparatus (STA) performs processing of the received sSSW frame.

In format 1 or format 4, when the communication apparatus (STA) is not associated with the communication apparatus (AP), the communication apparatus (STA) may transmit an sSSW frame by setting the value of Short RA to a predetermined value (for example, 254) different from the AID of the AP. That is, the communication apparatus (AP) may have a first AID (for example, 0) and a second AID (for example, 254).

The communication apparatus (STA) that has been associated may use the first AID as Short RA representing the AP, and the communication apparatus (STA) that has not been associated may use the second AID as Short RA representing the AP. In addition, the value of the second AID may be 255 (broadcast). That is, it may be predetermined that, when an STA other than the AP transmits a broadcast sSSW frame, the AP may respond thereto.

When the communication apparatus (AP) receives an sSSW frame including the second AID as Short RA, the communication apparatus (AP) may respond thereto without examining whether the value of Short TA of the received sSSW frame is the STA that has already been associated.

When the communication apparatus (STA) is not associated with the communication apparatus (AP), the communication apparatus (STA) may set the value of Short TA to a predetermined value (for example, 255) and transmit the sSSW frame. In this case, the communication apparatus (AP) refers to the value of Short RA of the received sSSW frame, and if the value matches Short RA of the communication apparatus (AP), the communication apparatus (AP) performs processing of the received sSSW frame. The communication apparatus (AP) refers to the value of the Short Scrambled BSSID field of the received sSSW frame, and if the value matches the value of Short Scrambled BSSID of the communication apparatus (AP), the communication apparatus (AP) may perform processing of the received sSSW frame.

Multicast and Broadcast by Communication Apparatus (STA)

The communication apparatus (STA) may transmit an sSSW frame of format 2. The communication apparatus (STA) may be associated or unassociated. When being unassociated (the value of the unassociated field is 1), the communication apparatus (STA) randomly selects the value of Short TA as in format 1 and transmits an sSSW frame.

As an example of multicast or broadcast of an sSSW frame by the communication apparatus (STA), the communication apparatus (STA) performs SLS without designating the address of the AP. The communication apparatus (STA) may set a broadcast address (for example, 255) to Short RA by using sSSW of format 2.

When the communication apparatus (AP) receives an sSSW frame of format 2 in which the Short RA is a broadcast address, the communication apparatus (AP) may perform mediation between other APs and then respond in RSS by using an sSSW frame of format 3.

The communication apparatus (AP) may determine in advance a list of APs (i.e., a group of Aps) for which mediation is to be performed and may notify the other APs of the list. When the communication apparatus (AP) receives an sSSW frame of format 2 in which Short RA is a broadcast address, the communication apparatus (AP) may perform mediation between other APs included in the AP group, perform adjustment so that a plurality of APs do not perform RSS simultaneously, and perform RSS for the communication apparatus (STA).

When the communication apparatus (AP) receives an sSSW frame of format 2 in which Short RA is a broadcast address, an AP having a high reception quality (radio quality) in the AP group may respond in RSS.

In addition, the communication apparatus (AP) may determine a Group ID for each AP group and notify the other APs and the communication apparatus (STA) of the Group ID. The communication apparatus (STA) may calculate the value of Short RA on the basis of the Group ID, include the calculated value in an sSSW frame of format 2, and transmit the sSSW frame, that is, may perform multicast communication.

In addition, the communication apparatus (AP) may refer to the routing table of IP and perform mediation for neighboring APs (for example, within 1 hop).

The communication apparatus (STA) before association performs broadcast or multicast by using an sSSW frame of format 2, thereby being able to start SLS before obtaining the address of the AP. Thus, an initial connection to the AP can be established in a short time.

In addition, the communication apparatus (STA) after association performs broadcast or multicast by using an sSSW frame of format 2, thereby being able to find the AP as a handover destination. That is, the communication apparatus (STA) is able to find another AP having a higher radio quality than that of the AP as a current connection end.

Accordingly, the communication apparatus 100 is able to decrease the probability that an address conflict occurs in Short RA and Short TA in either of DTI and A-BFT.

In the above-described embodiments, a description has been given of, as an example, a case where an aspect of the present disclosure is configured by hardware. However, the aspect of the present disclosure may be implemented by software in cooperation with hardware.

The individual functional blocks used in the description of the embodiments are typically implemented as an LSI, which is an integrated circuit including an input terminal and an output terminal. The integrated circuit may control the individual functional blocks used in the description of the embodiments and may include an input terminal and an output terminal. These may be individually mounted on chips, or some or all of them may be mounted on a single chip. An LSI is used here, but an IC, a system LSI, a super LSI, or an ultra LSI may be used according to the degree of integration.

The technique of integration is not limited to the LSI, and the integration may be realized by a dedicated circuit or a general-purpose processor. After the LSI is manufactured, a Field Programmable Gate Array (FPGA) that is programmable or a reconfigurable processor capable of reconfiguring the connection and setting of the circuit cell in the LSI may be used.

Furthermore, if an integration technology that replaces the LSI emerges from the progress of the semiconductor technologies or other technologies derived therefrom, integration of the functional blocks may be achieved by using the technology. Application of biotechnologies or the like is possible.

A communication apparatus according to the present disclosure includes a PHY frame generating circuit that generates a PHY frame including either of a short Sector Sweep (Short SSW) frame and a Sector Sweep (SSW) frame; and an array antenna that selects, based on the PHY frame, any sector from among a plurality of sectors and transmits the PHY frame. In a case where, in the PHY frame including the Short SSW frame, a Direction field of the Short SSW frame indicates Initiator Sector Sweep (ISS), the PHY frame generating circuit replaces a Short SSW Feedback field indicating an index of a selected best Short SSW with a Short Scrambled Basic Service Set ID (BSSID) field indicating an abbreviated address generated from an address of a destination communication apparatus.

In the communication apparatus according to the present disclosure, the abbreviated address is a value that is obtained by scrambling, based on any field included in the PHY frame, an address of a source communication apparatus and the address of the destination communication apparatus and by performing calculation using a hash function.

In the communication apparatus according to the present disclosure, the PHY frame generating circuit performs the scrambling by using a scrambler initialization value that is included in a PHY header of the PHY frame.

In the communication apparatus according to the present disclosure, the PHY frame generating circuit performs the scrambling by using a CDOWN field that is included in the Short SSW frame of the PHY frame.

In the communication apparatus according to the present disclosure, the abbreviated address is a value that is obtained by scrambling the address of the destination communication apparatus by using a determined value according to a scrambler initialization value that is included in the PHY frame and by performing calculation using a Cyclic Redundancy Check (CRC) code as a hash function.

In the communication apparatus according to the present disclosure, the scrambling is performed by adding the address of the destination communication apparatus and the determined value according to the scrambler initialization value.

A communication method according to the present disclosure includes generating a PHY frame including either of a short Sector Sweep (Short SSW) frame and a Sector Sweep (SSW) frame; selecting, based on the PHY frame, any sector from among a plurality of sectors and transmitting the PHY frame from an array antenna; and in a case where, in the PHY frame including the Short SSW frame, a Direction field of the Short SSW frame indicates Initiator Sector Sweep (ISS), replacing a Short SSW Feedback field indicating an index of a selected best Short SSW with a Short Scrambled Basic Service Set ID (BSSID) field indicating an abbreviated address generated from an address of a destination communication apparatus.

In the communication method according to the present disclosure, the abbreviated address is a value that is obtained by scrambling, based on any field included in the PHY frame, an address of a source communication apparatus and the address of the destination communication apparatus and by performing calculation using a hash function.

In the communication method according to the present disclosure, the scrambling is performed by adding the address of the destination communication apparatus and any field included in the PHY frame.

In the communication method according to the present disclosure, the scrambling uses a scrambler initialization value that is included in a PHY header of the PHY frame.

In the communication method according to the present disclosure, the scrambling uses a CDOWN field that is included in the Short SSW frame of the PHY frame.

In the communication method according to the present disclosure, the abbreviated address is a value that is obtained by scrambling the address of the destination communication apparatus by using a determined value according to a scrambler initialization value that is included in the PHY frame and by performing calculation using a Cyclic Redundancy Check (CRC) code as a hash function.

In the communication method according to the present disclosure, the scrambling is performed by adding the address of the destination communication apparatus and the determined value according to the scrambler initialization value.

An aspect of the present disclosure is preferable for a communication system compatible with the 11ay standard.

What is claimed is:

1. A communication apparatus comprising:
   a frame generating circuit, which, in operation, generates a Short Sector Sweep (SSW) frame including an Address field and a Scrambler Initialization field; and
   a transmitter which, in operation, transmits the generated SSW frame,
   wherein an address value to be set in the Address field is generated by dividing a plurality of bits that form a responder's MAC address into a plurality of words, scrambling each of the plurality of words by using a value of the Scrambler Initialization field as a seed, applying Cyclic Redundancy Check (CRC) encoding to a consecutive concatenation of the plurality of scrambled words, and taking upper bits of a bit sequence generated by the CRC encoding.

2. The communication apparatus according to claim 1, wherein the generation of the address value includes discarding lower bits of the bit sequence generated by the CRC encoding.

3. The communication apparatus according to claim 1, wherein the scrambling is performed by multiplying the value of the Scrambler Initialization field with a certain value, limiting a number of bits of the multiplication result to generate a scrambling pattern, and adding the scramble pattern to each of the plurality of words.

4. The communication apparatus according to claim 1, wherein
   the plurality of bits that form the responder's MAC address are 48 bits; and
   the address value is generated by dividing the 48 bits into three words, each consisting of 16 bits, and adding a scramble pattern to each of the three words, wherein the scramble pattern is generated by using the value of the Scrambler Initialization field.

5. The communication apparatus according to claim 4, wherein the scramble pattern is generated by multiplying the value of the Scrambler Initialization field with a certain value and limiting a number of bits of the multiplication result.

6. The communication apparatus according to claim 1, wherein the upper bits of the bit sequence generated by the CRC encoding are upper 10 bits among 16 bits generated by the CRC encoding.

7. The communication apparatus according to claim 1, wherein
   the SSW frame includes a Direction subfield for indicating a transmission direction;
   when the Direction subfield indicates a Transmission Sector Sweep by a Responder, the SSW frame includes a Short Sector Sweep Feedback subfield; and
   when the Direction subfield indicates a Transmission Sector Sweep by an Initiator, the SSW frame field includes the Address field and a Reserved subfield instead of the Short Sector Sweep Feedback subfield.

8. A communication method comprising:
   generating a Short Sector Sweep (SSW) frame including an Address field and a Scrambler Initialization field; and
   transmitting the generated SSW frame, wherein
   wherein an address value to be set in the Address field is generated by dividing a plurality of bits that form a responder's MAC address into a plurality of words, scrambling each of the plurality of words by using a value of the Scrambler Initialization field as a seed, applying Cyclic Redundancy Check (CRC) encoding to a consecutive concatenation of the plurality of scrambled words, and taking upper bits of a bit sequence generated by the CRC encoding.

9. The communication method according to claim 8, wherein the generation of the address value includes discarding lower bits of the bit sequence generated by the CRC encoding.

10. The communication method according to claim 8, wherein the scrambling is performed by multiplying the value of the Scrambler Initialization field with a certain value, limiting a number of bits of the multiplication result to generate a scrambling pattern, and adding the scramble pattern to each of the plurality of words.

11. The communication method according to claim 8, wherein
    the plurality of bits that form the responder's MAC address are 48 bits; and
    the address value is generated by dividing the 48 bits into three words, each consisting of 16 bits, and adding a scramble pattern to each of the three words, wherein the scramble pattern is generated by using the value of the Scrambler Initialization field.

12. The communication method according to claim 11, wherein the scramble pattern is generated by multiplying the value of the Scrambler Initialization field with a certain value and limiting a number of bits of the multiplication result.

13. The communication method according to claim 8, wherein the upper bits of the bit sequence generated by the CRC encoding are upper 10 bits among 16 bits generated by the CRC encoding.

14. The communication method according to claim 8, wherein
    the SSW frame includes a Direction subfield for indicating a transmission direction;
    when the Direction subfield indicates a Transmission Sector Sweep by a Responder, the SSW frame includes a Short Sector Sweep Feedback subfield; and when the Direction subfield indicates a Transmission Sector Sweep by an Initiator, the SSW frame includes the Address field and a Reserved subfield instead of the Short Sector Sweep Feedback subfield.

\* \* \* \* \*